US012310063B2

(12) United States Patent
Madia et al.

(10) Patent No.: US 12,310,063 B2
(45) Date of Patent: May 20, 2025

(54) METHOD FOR FORMING SEMICONDUCTOR DEVICE WITH TRANSISTORS ON OPPOSITE SIDES OF A DIELECTRIC LAYER

(71) Applicant: TAIWAN SEMICONDUCTOR MANUFACTURING COMPANY, LTD., Hsinchu (TW)

(72) Inventors: Oreste Madia, Brussels (BE); Georgios Vellianitis, Heverlee (BE); Gerben Doornbos, Kessel-Lo (BE); Marcus Johannes Henricus Van Dal, Linden (BE)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 439 days.

(21) Appl. No.: 17/843,493

(22) Filed: Jun. 17, 2022

(65) Prior Publication Data

US 2023/0411482 A1 Dec. 21, 2023

(51) Int. Cl.

| | |
|---|---|
| ***H10D 30/67*** | (2025.01) |
| ***H10D 30/00*** | (2025.01) |
| ***H10D 30/01*** | (2025.01) |
| ***H10D 30/62*** | (2025.01) |
| ***H10D 84/01*** | (2025.01) |
| ***H10D 84/03*** | (2025.01) |

(52) U.S. Cl.

CPC ....... *H10D 30/6735* (2025.01); *H10D 30/031* (2025.01); *H10D 30/6713* (2025.01); *H10D 30/6729* (2025.01); *H10D 30/6755* (2025.01); *H10D 30/6757* (2025.01); *H10D 84/0128* (2025.01); *H10D 84/013* (2025.01); *H10D 84/038* (2025.01); *H10D 30/019* (2025.01); *H10D 30/024* (2025.01); *H10D 30/501* (2025.01); *H10D 30/62* (2025.01)

(58) Field of Classification Search

None

See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |

(Continued)

*Primary Examiner* — Nduka E Ojeh

(74) *Attorney, Agent, or Firm* — Birch, Stewart, Kolasch & Birch, LLP

(57) ABSTRACT

A method includes forming a first dielectric layer over a substrate; forming a first transistor over a first side of the first dielectric layer; removing the substrate to expose a second side of the first dielectric layer opposite to the first side of the second dielectric layer; and forming a second transistor over the second side of the first dielectric layer. Forming the first transistor includes forming a semiconductor layer over the first side of the first dielectric layer; forming a first gate structure over the semiconductor layer; and forming source/drain epitaxy structures on opposite sides of the first gate structure. Forming the second transistor includes forming a semiconductive oxide layer over the second side of the first dielectric layer; forming a second gate structure over the semiconductive oxide layer; and forming source/drain contacts over the semiconductive oxide layer and on opposite sides of the second gate structure.

20 Claims, 96 Drawing Sheets

(56) References Cited

U.S. PATENT DOCUMENTS

| | | | | |
|---|---|---|---|---|
| 9,412,817 | B2 | 8/2016 | Yang et al. | |
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 10,453,752 | B2 | 10/2019 | Van Dal et al. | |
| 11,024,548 | B2 | 6/2021 | Van Dal et al. | |
| 11,322,495 | B2 | 5/2022 | Vellianitis | |
| 2019/0088553 | A1* | 3/2019 | Van Dal | H10D 30/024 |
| 2021/0125986 | A1* | 4/2021 | Vellianitis | H01L 29/78696 |
| 2022/0352158 | A1* | 11/2022 | Cheng | B82Y 10/00 |
| 2024/0063217 | A1* | 2/2024 | Xie | H01L 29/66545 |

* cited by examiner

METHOD FOR FORMING SEMICONDUCTOR DEVICE WITH TRANSISTORS ON OPPOSITE SIDES OF A DIELECTRIC LAYER

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1B:
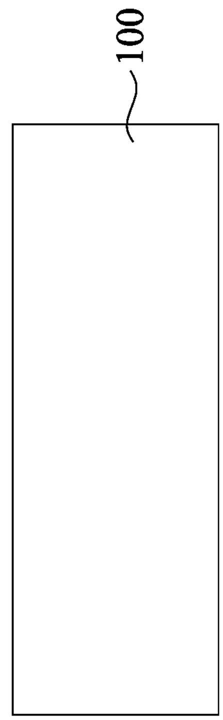
FIGS. 1A to 25D show various stages of manufacturing operations for a semiconductor device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1A to 25D show various stages of manufacturing operations for a semiconductor device according to some embodiments of the present disclosure. In greater details, the semiconductor device discussed in FIGS. 1A to 25D is a complementary FET (CFET). Generally, a CFET includes a first transistor vertically stacked over a second transistor, in which the first and second transistors include different conductivity types. For example, the first transistor and the second transistor may be n-type transistor and p-type transistor, respectively. Alternatively, the first transistor and the second transistor may be p-type transistor and n-type transistor, respectively.

Figure 1A:
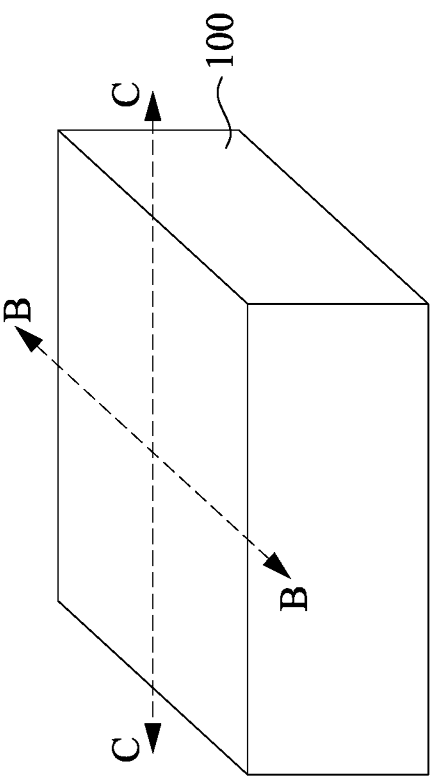
Figure 1C:
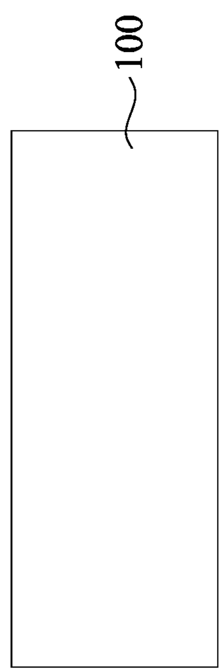

Reference is made to FIGS. 1A to 1C, in which FIG. 1A is a schematic view of a semiconductor device, FIG. 1B is a cross-sectional view along line B-B of FIG. 1A, and FIG. 1C is a cross-sectional view along line C-C of FIG. 1A. Shown there is a substrate 100. In some embodiments, the substrate 10 includes a single crystalline semiconductor layer on at least its surface portion. The substrate 100 may comprise a single crystalline semiconductor material such as, but not limited to Si, Ge, SiGe, GaAs, InSb, GaP, GaSb, InAlAs, InGaAs, GaSbP, GaAsSb and InP. In certain embodiments, the substrate 10 is made of crystalline Si.

Figure 2A:
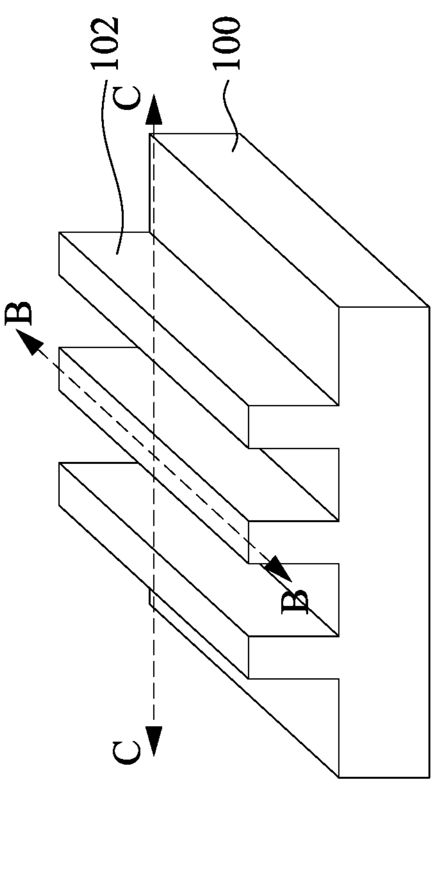
Figure 2B:
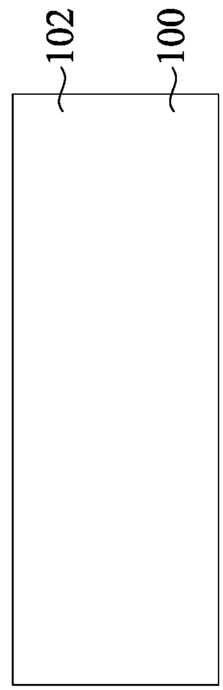
Figure 2C:
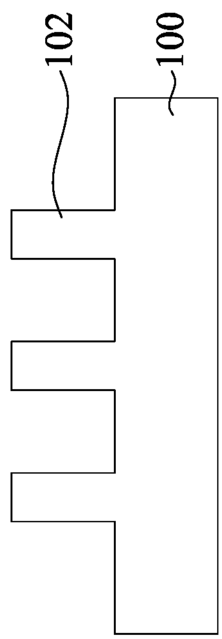

Reference is made to FIGS. 2A to 2C, in which FIG. 2A is a schematic view of a semiconductor device, FIG. 2B is a cross-sectional view along line B-B of FIG. 2A, and FIG. 2C is a cross-sectional view along line C-C of FIG. 2A. The substrate 100 is patterned to form semiconductor strips 102 protruding over the substrate 100. In some embodiments, the semiconductor strips 102 may be formed by, for example, forming a patterned mask over the substrate 100, in which the patterned mask may include openings that expose unwanted portions of the substrate 100, and performing an etching process to remove the unwanted portions of the substrate 100. The remaining portions of the substrate 100 protruding over the substrate 100 are referred to as semiconductor strips 102. In some embodiments, the semiconductor strips 102 can also be referred to as semiconductor fins. In the embodiments of FIGS. 2A to 2C, three semiconductor strips 102 are illustrated, while more or less semiconductor strips 102 may also be applied.

Figure 3B:
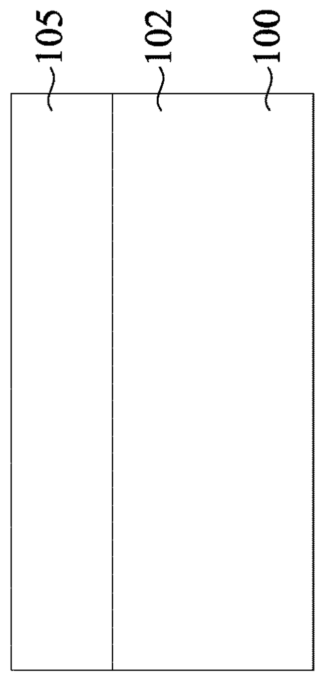
Figure 3A:
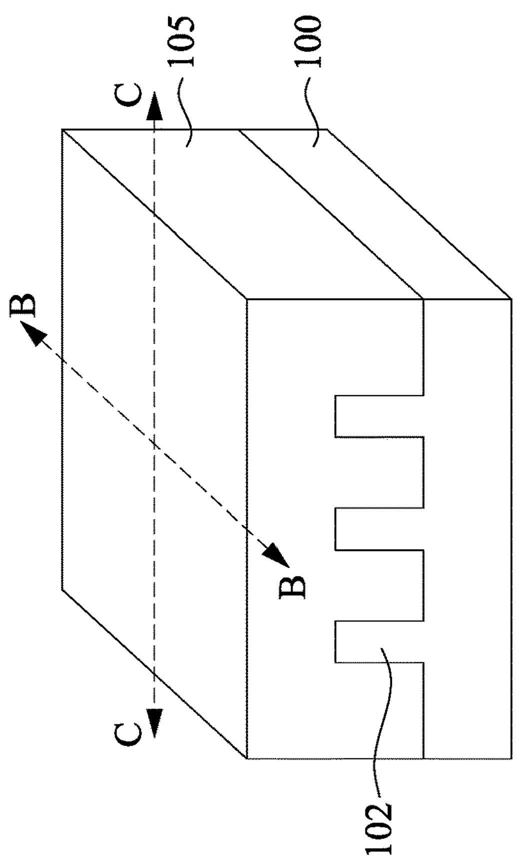
Figure 3C:
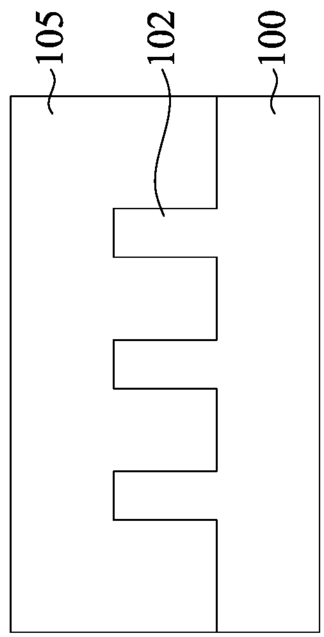

Reference is made to FIGS. 3A to 3C, in which FIG. 3A is a schematic view of a semiconductor device, FIG. 3B is a cross-sectional view along line B-B of FIG. 3A, and FIG. 3C is a cross-sectional view along line C-C of FIG. 3A. A dielectric layer 105 is deposited over the substrate 100 and covering the semiconductor strips 102. In greater details, the dielectric layer 105 may extend to spaces laterally between the semiconductor strips 102, and may be high enough to cover top surfaces of the semiconductor strips 102. The dielectric layer 105 may include silicon oxide, silicon nitride, silicon oxynitride (SiON), SiCN, fluorine-doped silicate glass (FSG), or a low-K dielectric material. In some embodiments, the dielectric layer 105 may be formed by LPCVD (low pressure chemical vapor deposition), plasma-CVD or flowable CVD or any other suitable film formation methods. In some embodiments, polishing process, such as chemical mechanism polishing (CMP), may be optionally performed to planarize the top surface of the dielectric layer 105.

Figure 4B:
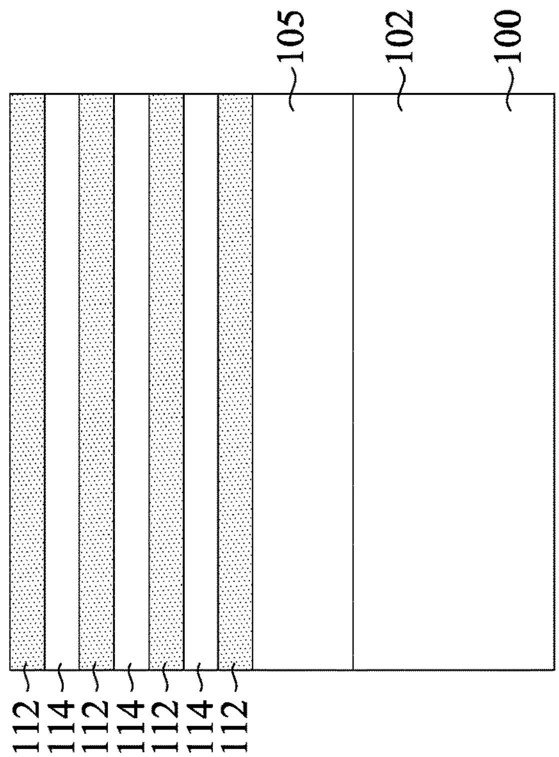
Figure 4A:
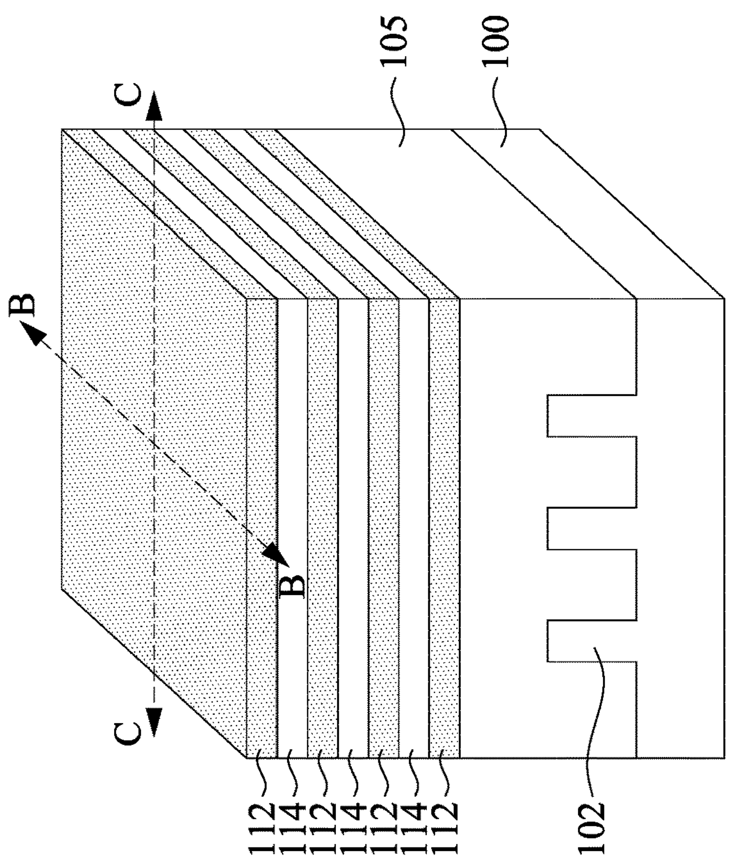
Figure 4C:
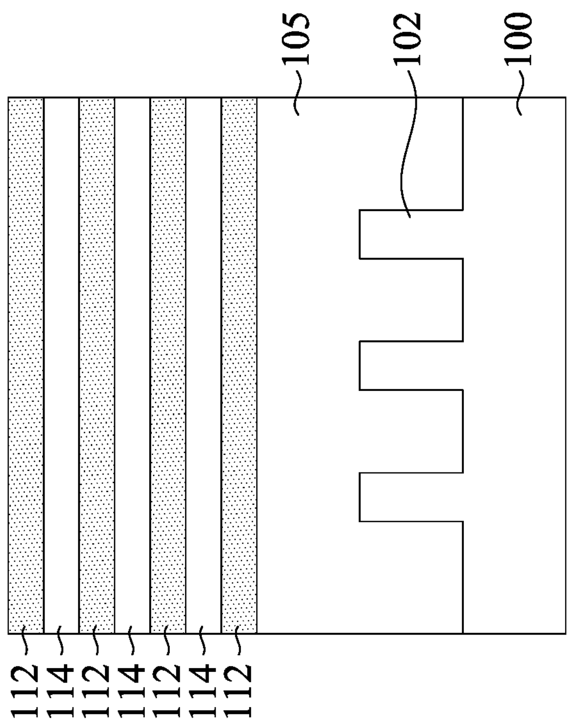

Reference is made to FIGS. 4A to 4C, in which FIG. 4A is a schematic view of a semiconductor device, FIG. 4B is a cross-sectional view along line B-B of FIG. 4A, and FIG. 4C is a cross-sectional view along line C-C of FIG. 4A. First and second semiconductor layers 112 and 114 are alternately formed over the dielectric layer 105. In some embodiments, the second semiconductor layers 114 are made of $Si_xGe_{1-x}$, where (hereinafter may be referred as SiGe). In some other embodiments, the second semiconductor layers 114 are made of germanium (Ge). The first semiconductor layers 112 include a semiconductor material different from the second semiconductor layers 114. In some embodiments, the first semiconductor layers 112 are made of Si. In some other embodiments, the first semiconductor layers 112 are made of $Si_yGe_{1-y}$, where $x<y$. In some embodiments, the first semiconductor layers 112 are made of epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In some embodiments, the first and second semiconductor layers 112 and 114 are formed by epitaxially growth process. In some embodiments, the first and second semiconductor layers 112 and 114 can be referred to as nanostructures, nanosheets, or nanowires.

In some other embodiments, because high-quality crystalline semiconductor layer, such as silicon or silicon germanium, may be hard to form over a surface of a dielectric layer (e.g., the dielectric layer 105), the bottommost one of the first semiconductor layer 112 may be formed by a layer transfer process. For example, a layer of the first semiconductor layer 112 is deposited on a carrier substrate, and then the first semiconductor layer 112 is attached to the exposed surface of the dielectric layer 105. Afterwards, the carrier substrate is removed from the first semiconductor layer 112, leaving the first semiconductor layer 112 over the dielectric layer 105. The transferred first semiconductor layer 112 with high-quality crystalline may act as the bottommost first semiconductor layer 112, and the following first and second semiconductor layers 112 and 114 can be epitaxially grown over the bottommost first semiconductor layer 112.

Figure 5B:
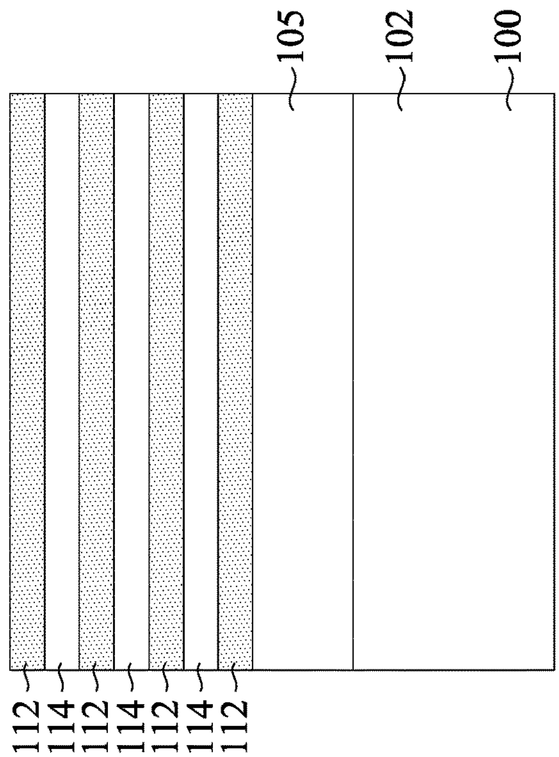
Figure 5A:
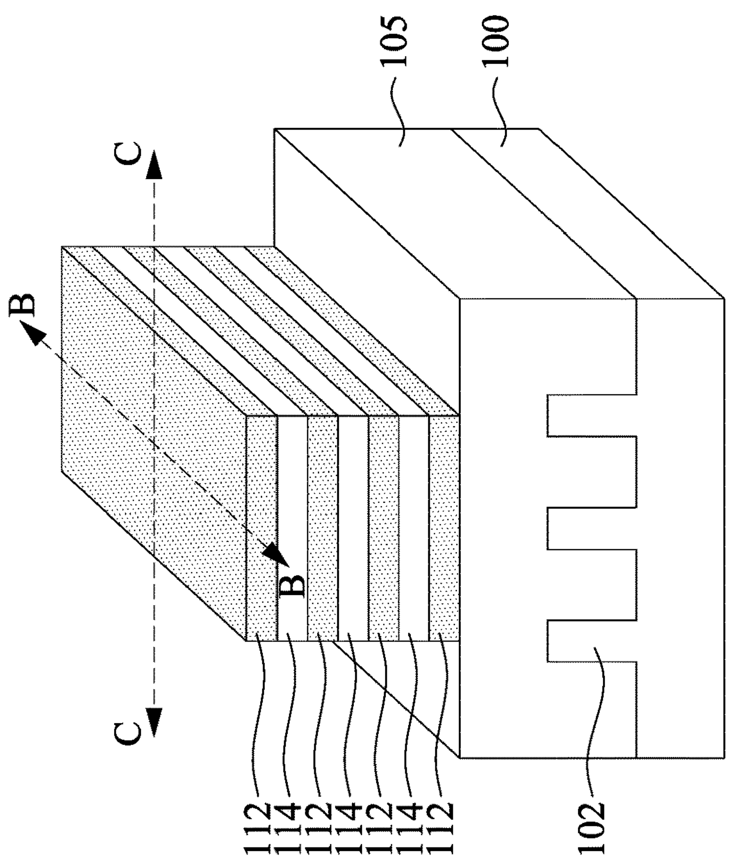
Figure 5C:
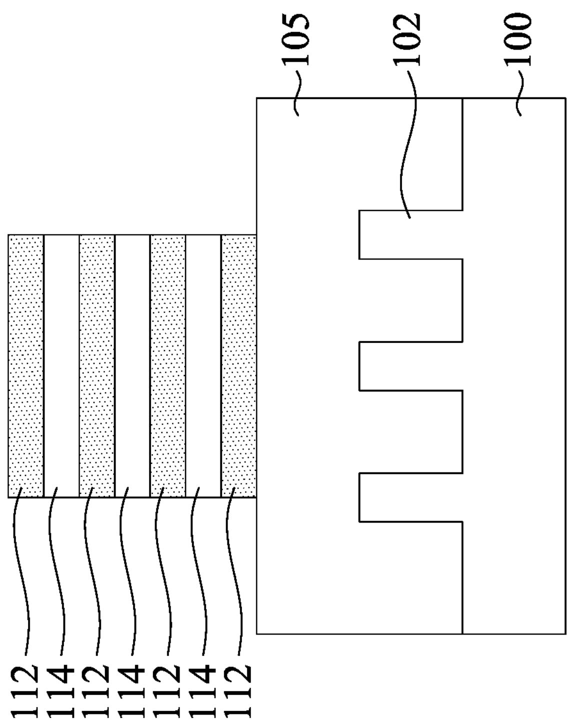

Reference is made to FIGS. 5A to 5C, in which FIG. 5A is a schematic view of a semiconductor device, FIG. 5B is a cross-sectional view along line B-B of FIG. 5A, and FIG. 5C is a cross-sectional view along line C-C of FIG. 5A. The first and second semiconductor layers 112 and 114 are patterned. In some embodiments, the first and second semiconductor layers 112 and 114 can be patterned by one or more photolithography and etching operations. After the patterning process, the patterned first and second semiconductor layers 112 and 114 can be collectively referred to as a fin structure.

Figure 6B:
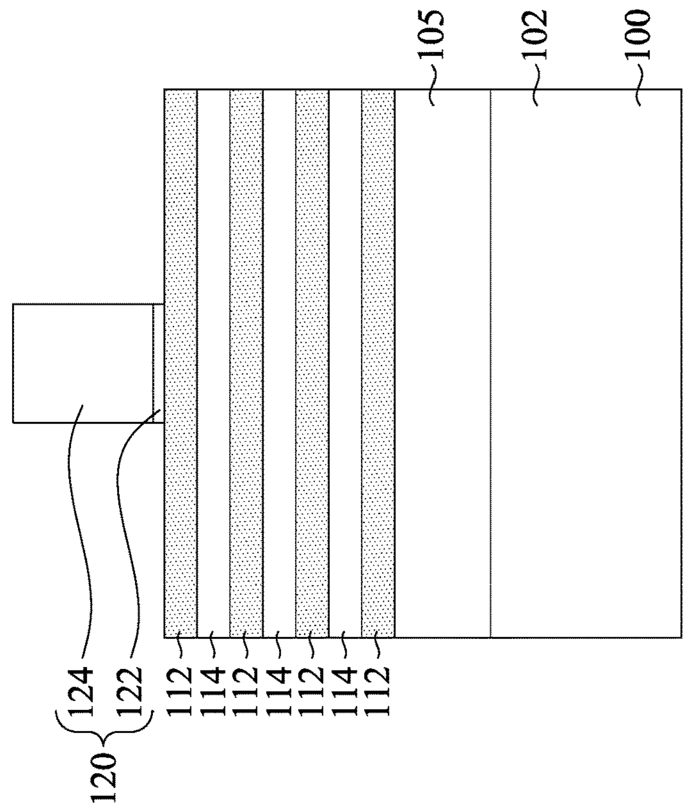
Figure 6A:
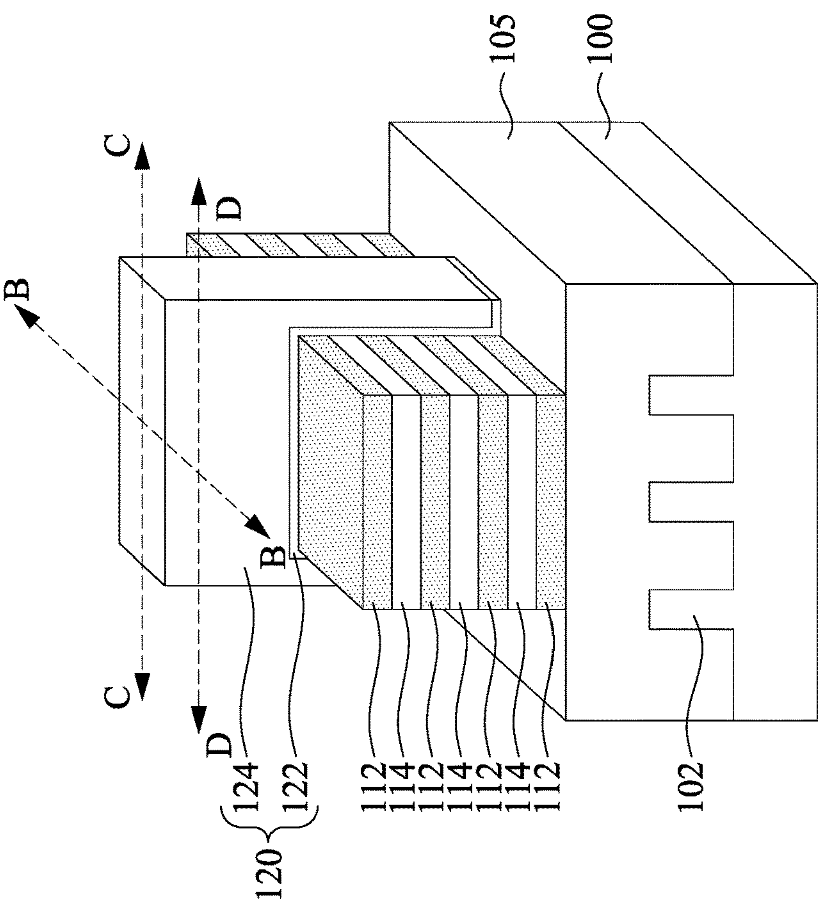
Figure 6D:
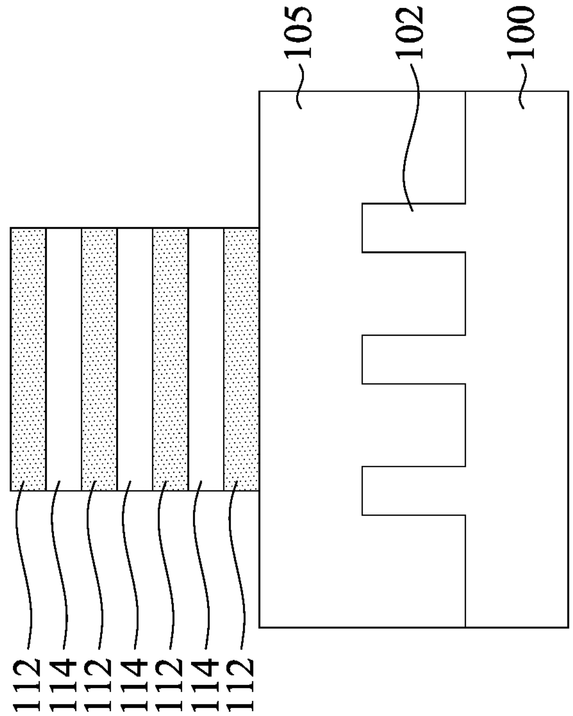
Figure 6C:
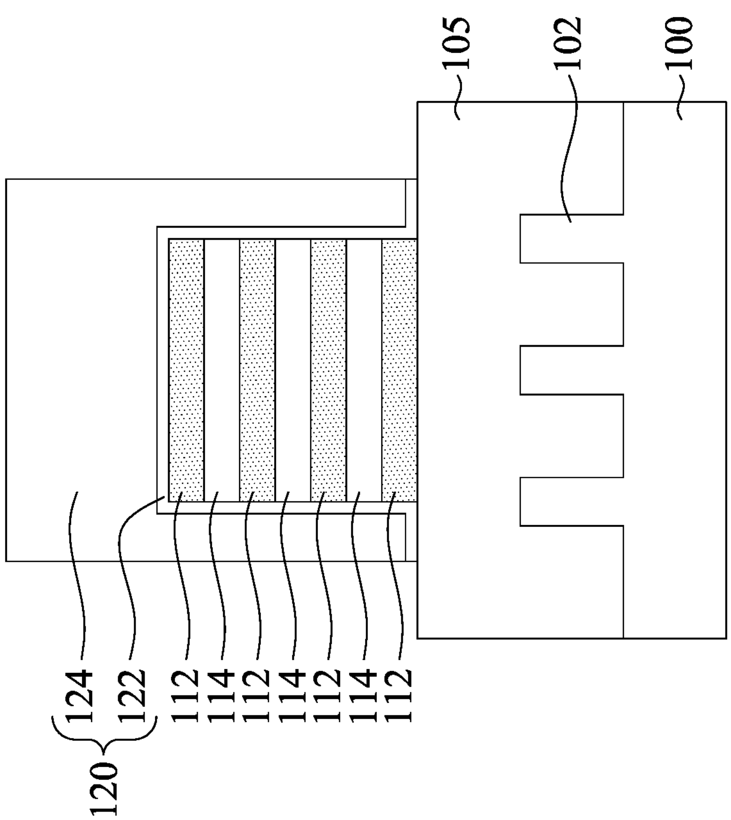

Reference is made to FIGS. 6A to 6D, in which FIG. 6A is a schematic view of a semiconductor device, FIG. 6B is a cross-sectional view along line B-B of FIG. 6A, FIG. 6C is a cross-sectional view along line C-C of FIG. 6A, and FIG. 6D is a cross-sectional view along line D-D of FIG. 6A. A dummy gate structure 120 is formed over the dielectric layer 105 and crossing the stack of the first and second semiconductor layers 112 and 114. The dummy gate structure 120 includes a dummy gate dielectric 122 and a dummy gate electrode 124 over the dummy gate dielectric 122.

In some embodiments, a dummy gate dielectric layer is formed over the structure as shown in FIGS. 5A to 5C. The dummy gate dielectric layer includes one or more layers of silicon oxide, silicon nitride and/or silicon oxynitride. Afterwards, a dummy gate electrode layer is then deposited on the dummy gate dielectric layer. The dummy gate electrode layer includes silicon such as poly crystalline silicon or amorphous silicon. The dummy gate dielectric layer and the dummy gate electrode layer may be patterned to form the dummy gate structure 120. In some embodiments, the dummy gate electrode layer may be subjected to a planarization operation. The dummy gate dielectric 122 and the dummy gate electrode 124 may be deposited using CVD, including LPCVD and PECVD, PVD, ALD, or other suitable process.

Figure 7B:
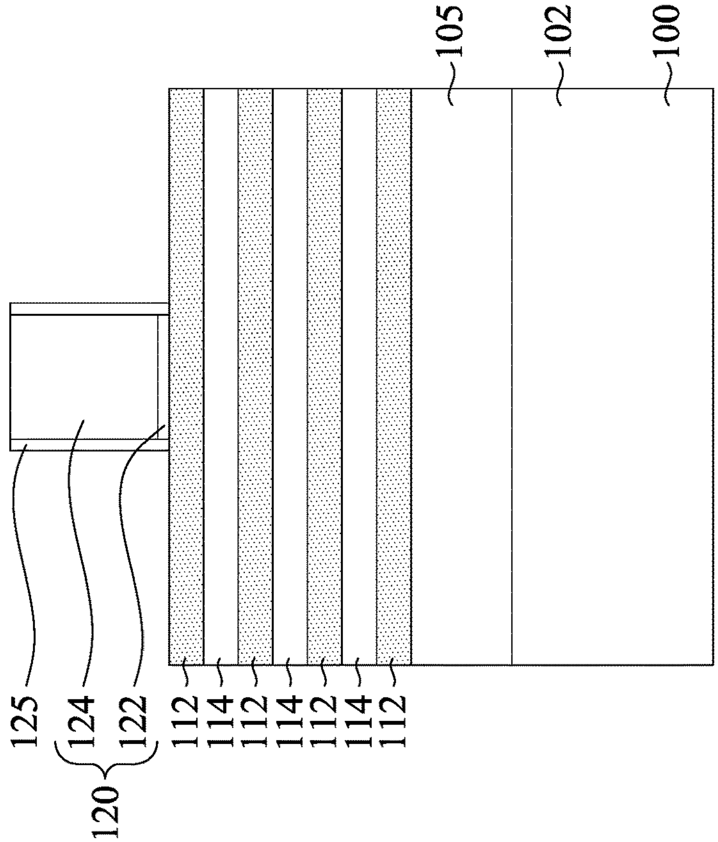
Figure 7A:
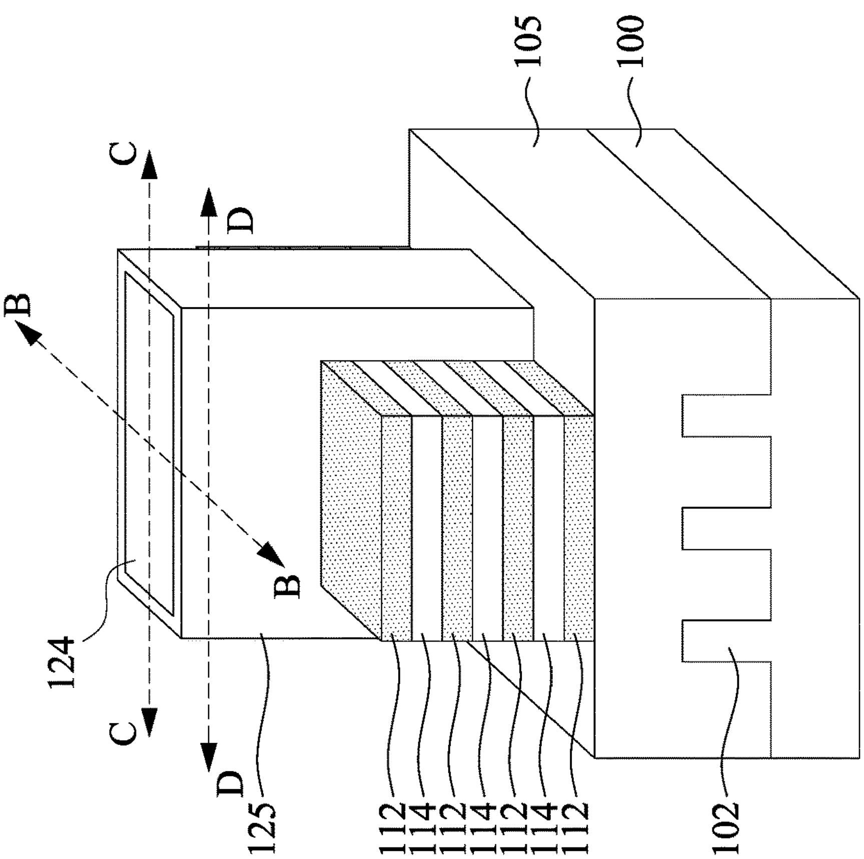
Figure 7C:
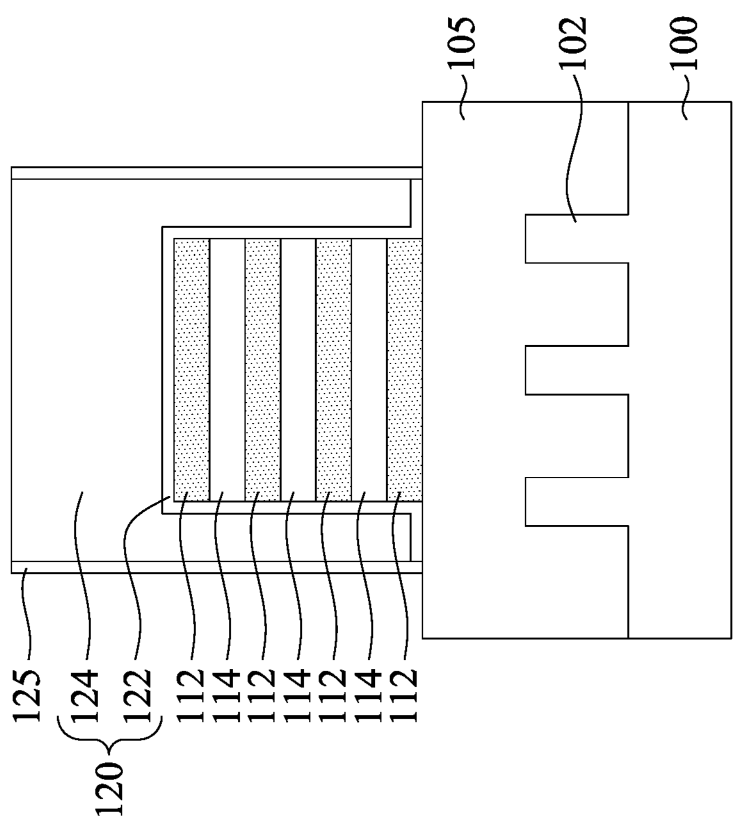
Figure 7D:
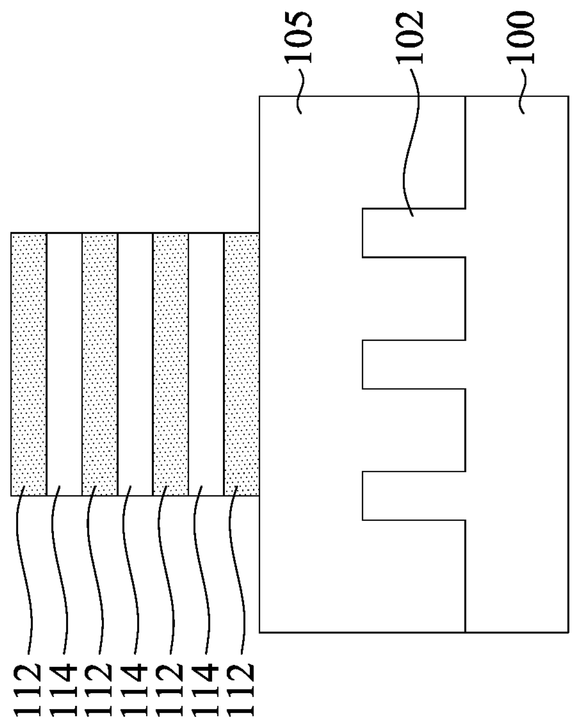

Reference is made to FIGS. 7A to 7D, in which FIG. 7A is a schematic view of a semiconductor device, FIG. 7B is a cross-sectional view along line B-B of FIG. 7A, FIG. 7C is a cross-sectional view along line C-C of FIG. 7A, and FIG. 7D is a cross-sectional view along line D-D of FIG. 7A. Gate spacers 125 are formed on sidewalls of the dummy gate structure 120. In some embodiments, the gate spacers 125 may be formed by depositing a spacer material blanket over the dummy gate structure 120, and performing an anisotropic etching on the spacer material using, for example, reactive ion etching (RIE). During the anisotropic etching process, spacer material is removed from horizontal surfaces, leaving the spacer material on the vertical surfaces such as the sidewalls of the dummy gate structure 120. In some embodiments, the gate spacers 125 may be silicon nitride-based material, such as SiN, SiON, SiCON or SiCN and combinations thereof, or any other suitable insulating material.

Figure 8B:
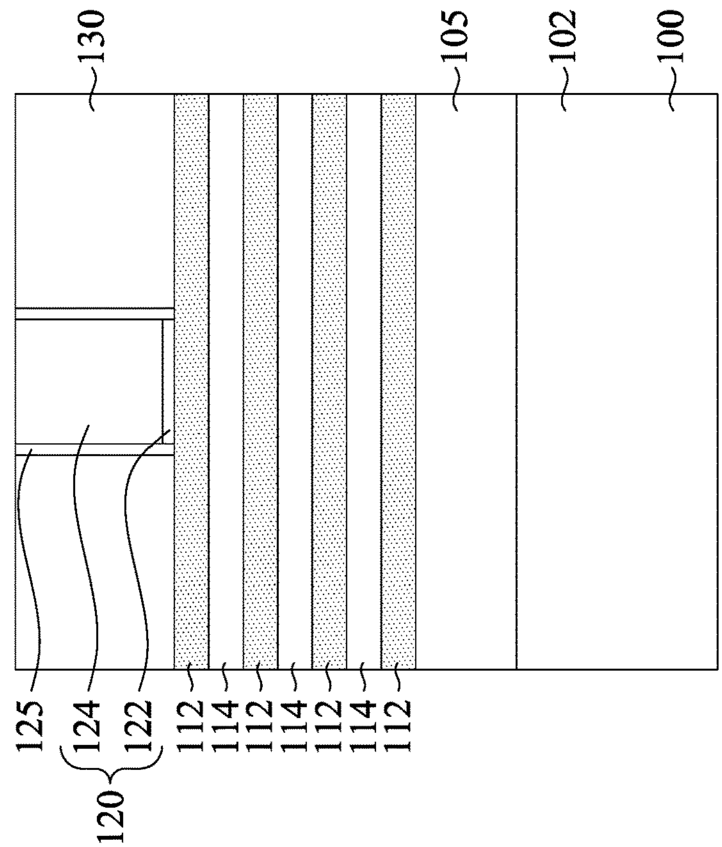
Figure 8A:
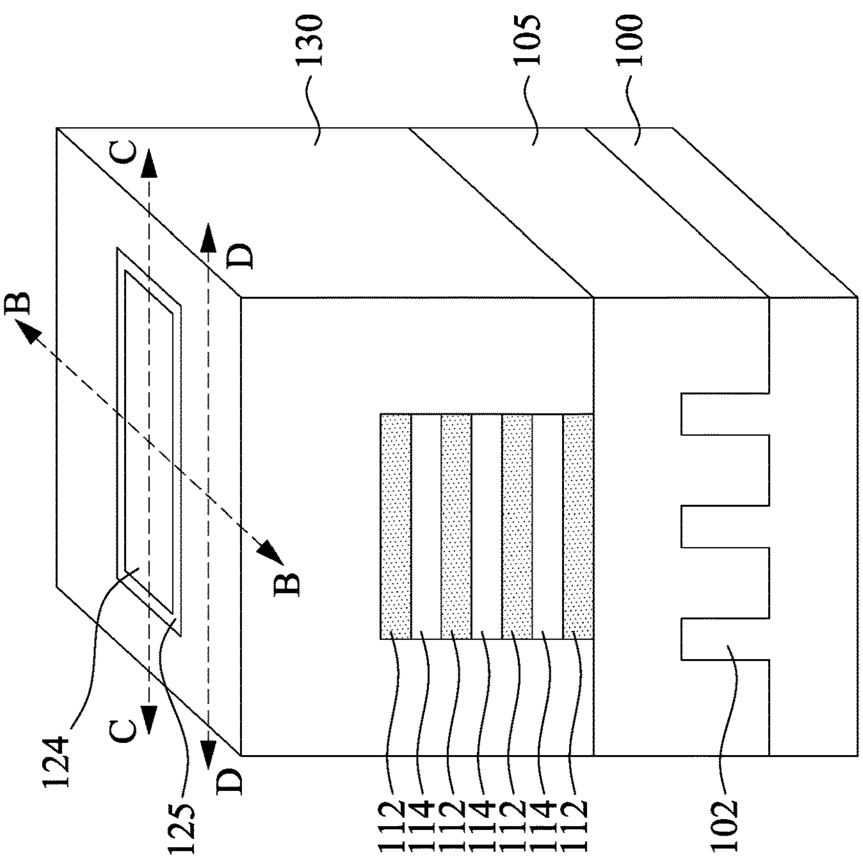
Figure 8C:
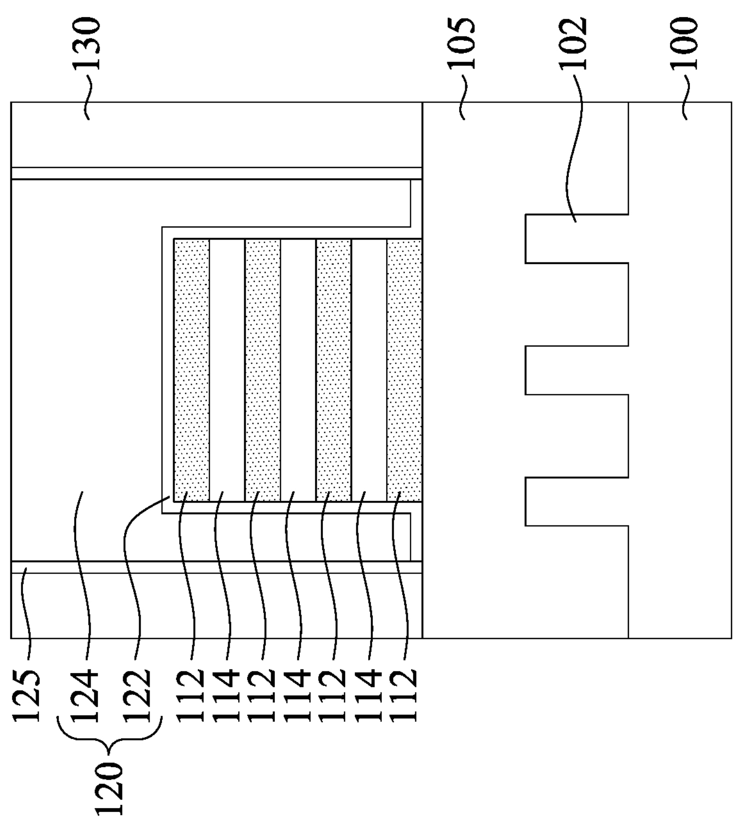
Figure 8D:
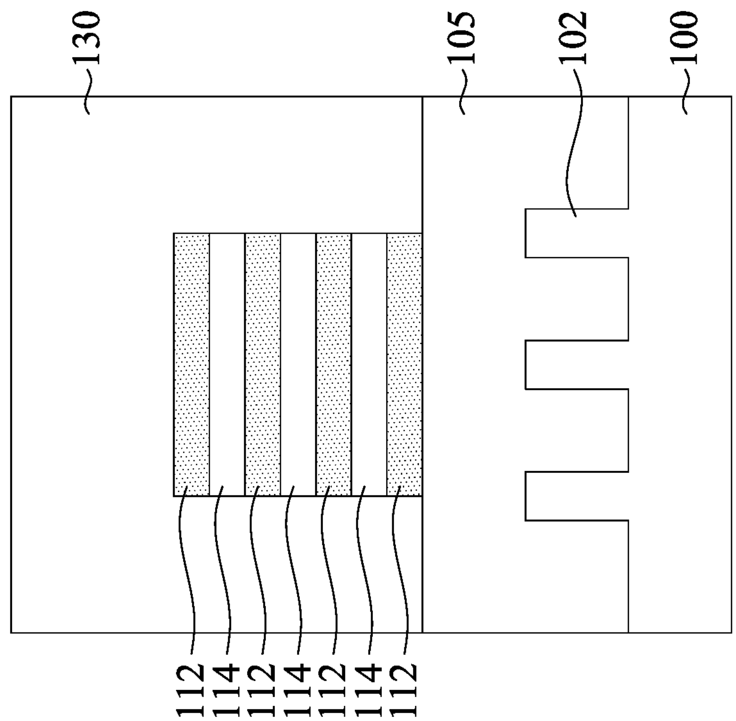

Reference is made to FIGS. 8A to 8D, in which FIG. 8A is a schematic view of a semiconductor device, FIG. 8B is a cross-sectional view along line B-B of FIG. 8A, FIG. 8C is a cross-sectional view along line C-C of FIG. 8A, and FIG. 8D is a cross-sectional view along line D-D of FIG. 8A. An interlayer dielectric (ILD) layer 130 is deposited over the dielectric layer 105 and laterally surrounding the dummy gate structure 120. In some embodiments, the ILD layer 130 may be formed by depositing a dielectric material, and then performing a CMP process until top surface of the dummy gate structure 120 is exposed.

In some embodiments, the ILD layer 130 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the ILD layer 130 can be deposited by CVD, plasma-enhanced CVD (PECVD), atomic layer deposition (ALD), plasma-enhanced ALD (PEALD) or the like, or combinations thereof.

Figure 9B:
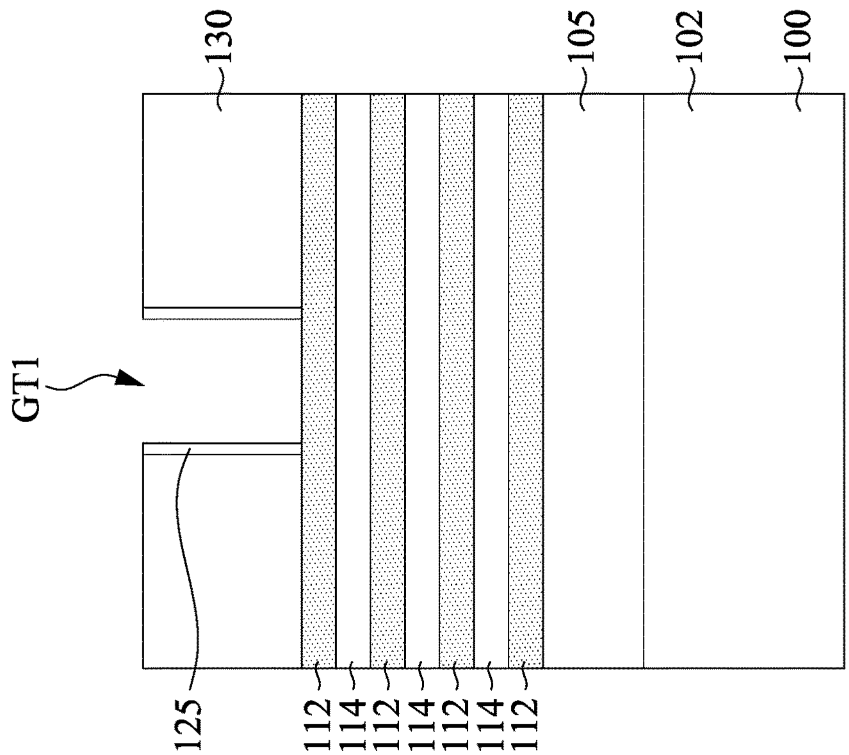
Figure 9A:
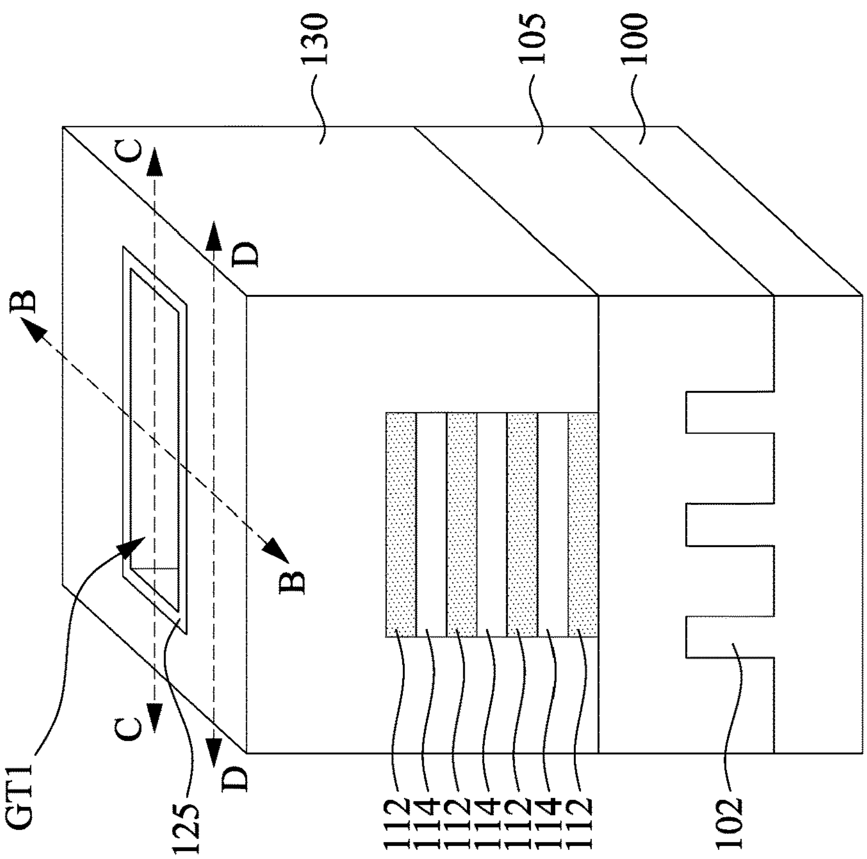
Figure 9C:
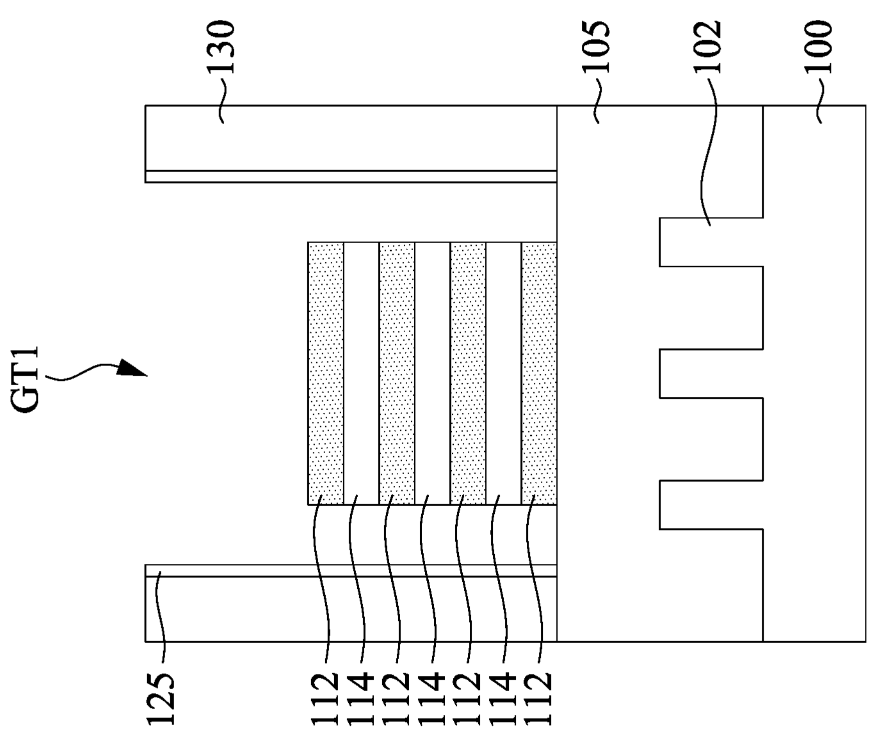
Figure 9D:
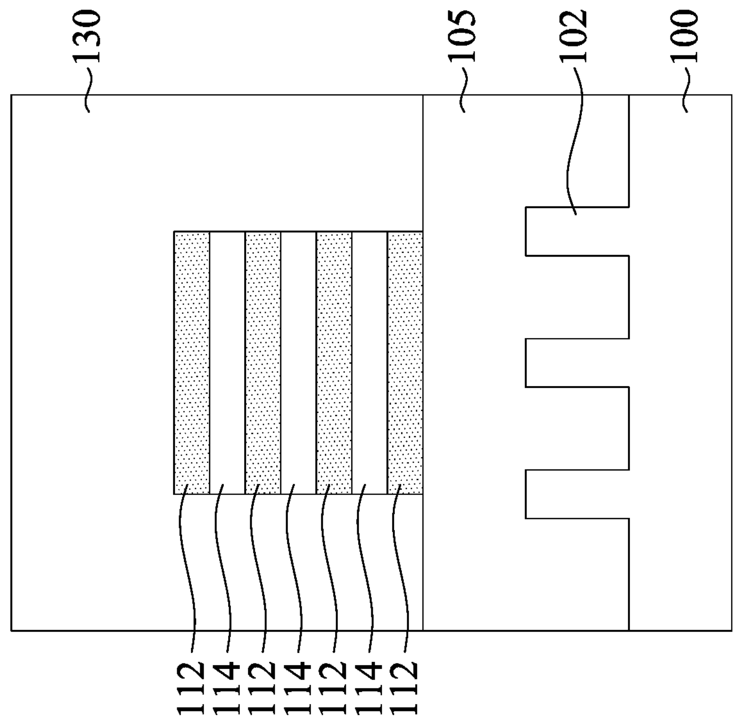

Reference is made to FIGS. 9A to 9D, in which FIG. 9A is a schematic view of a semiconductor device, FIG. 9B is a cross-sectional view along line B-B of FIG. 9A, FIG. 9C is a cross-sectional view along line C-C of FIG. 9A, and FIG. 9D is a cross-sectional view along line D-D of FIG. 9A. The dummy gate structure 120 is removed to form a gate trench GT1. In greater details, after the dummy gate structure 120 is removed, portions of the first and second semiconductor layers 112 and 114 are exposed (see FIG. 9C). In some embodiments, the dummy gate structure 120 can be removed using plasma dry etching and/or wet etching.

Figure 10B:
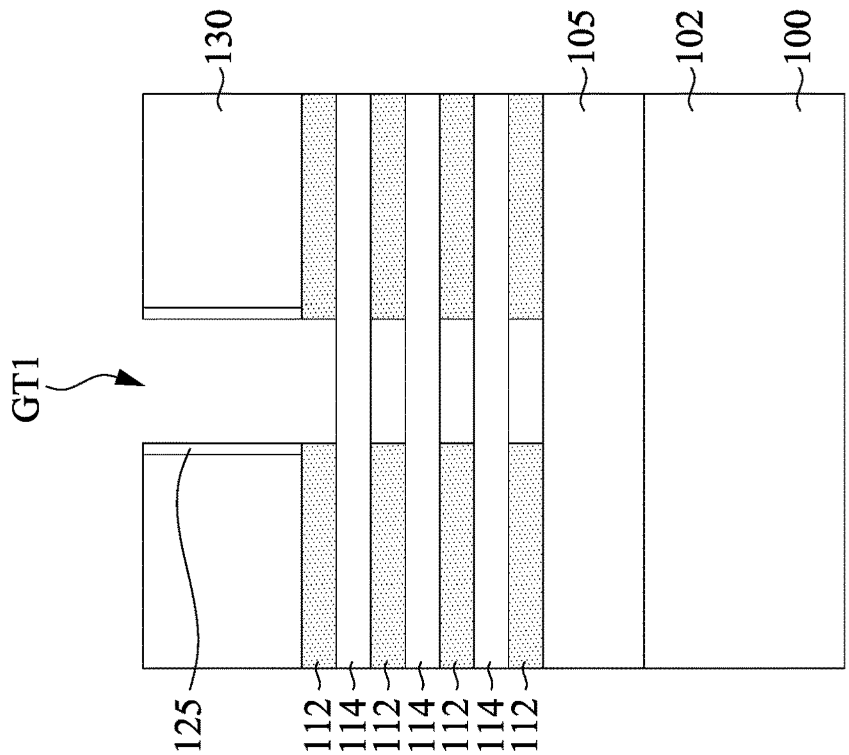
Figure 10A:
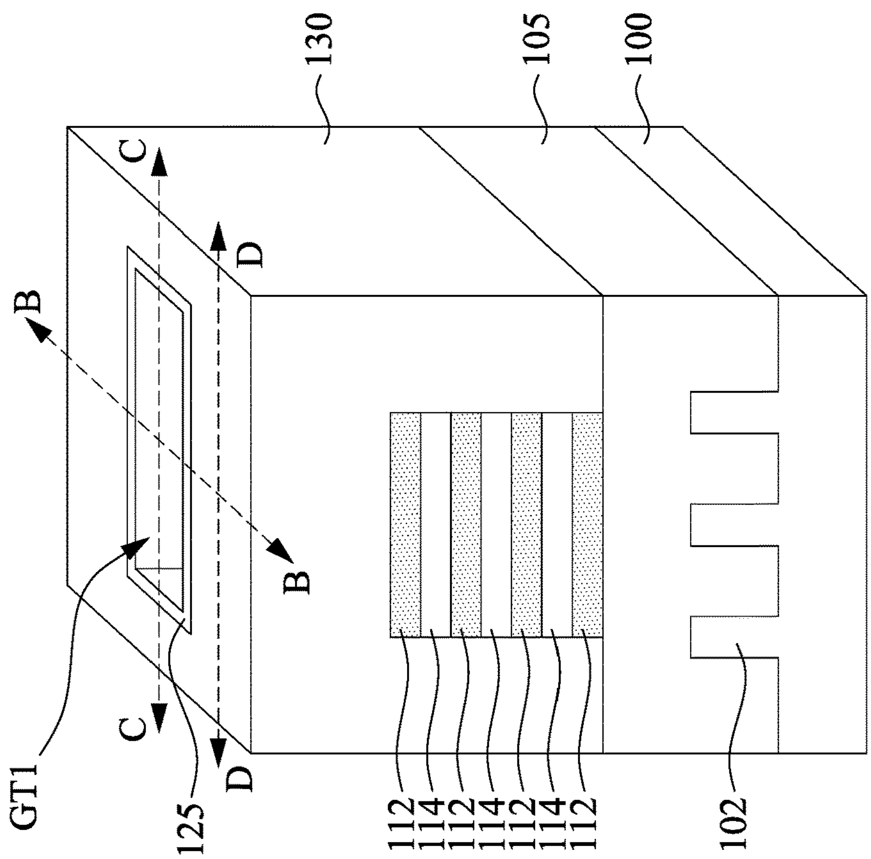
Figure 10D:
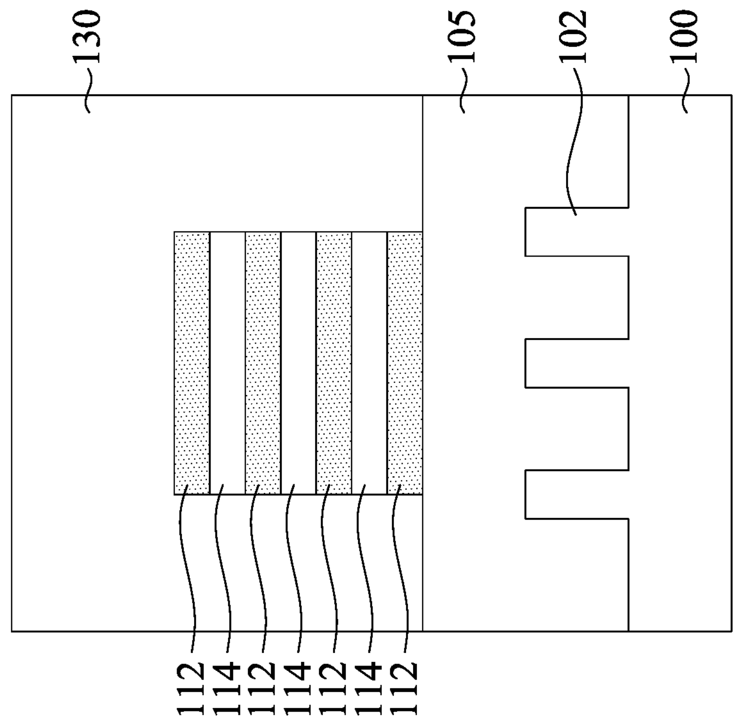
Figure 10C:
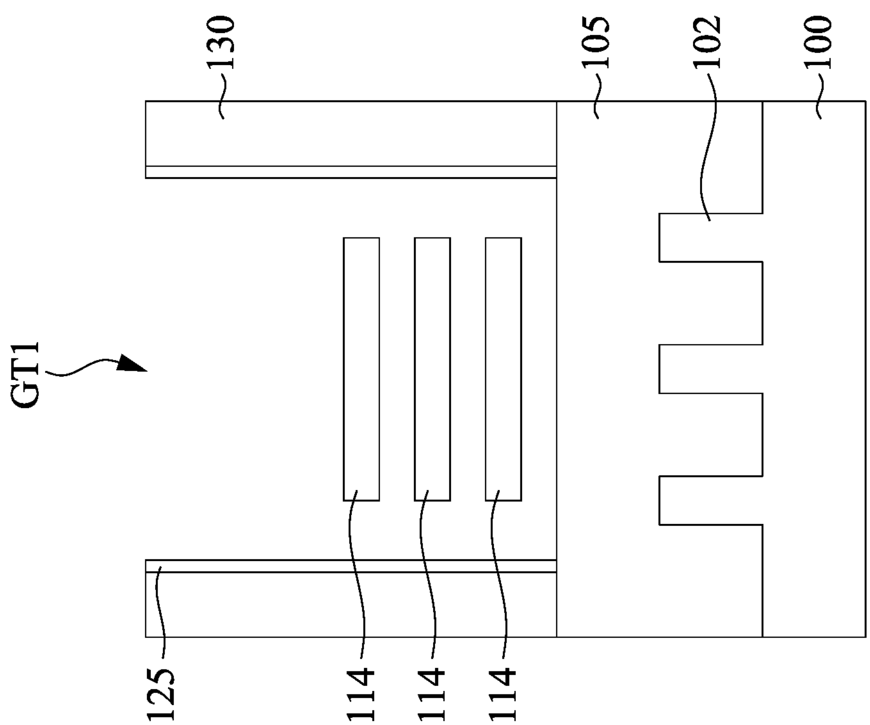

Reference is made to FIGS. 10A to 10D, in which FIG. 10A is a schematic view of a semiconductor device, FIG. 10B is a cross-sectional view along line B-B of FIG. 10A, FIG. 10C is a cross-sectional view along line C-C of FIG. 10A, and FIG. 10D is a cross-sectional view along line D-D of FIG. 10A. Portions of the first semiconductor layers 112 are removed through the gate trench GT1, leaving portions of the second semiconductor layers 114 suspended over the substrate 100. In some embodiments, the first semiconductor layers 112 may be using an etching process having etching selectivity between the first semiconductor layers 112 and the second semiconductor layers 114. For example, the second semiconductor layers 114 may include higher etching resistance to the etching process than the first semiconductor layers 112.

Figure 11B:
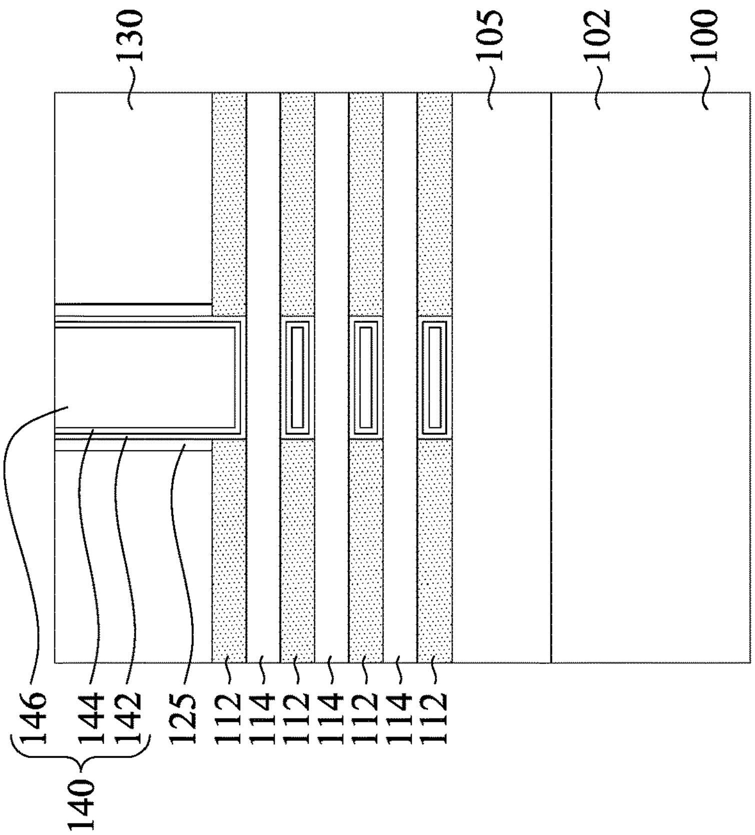
Figure 11A:
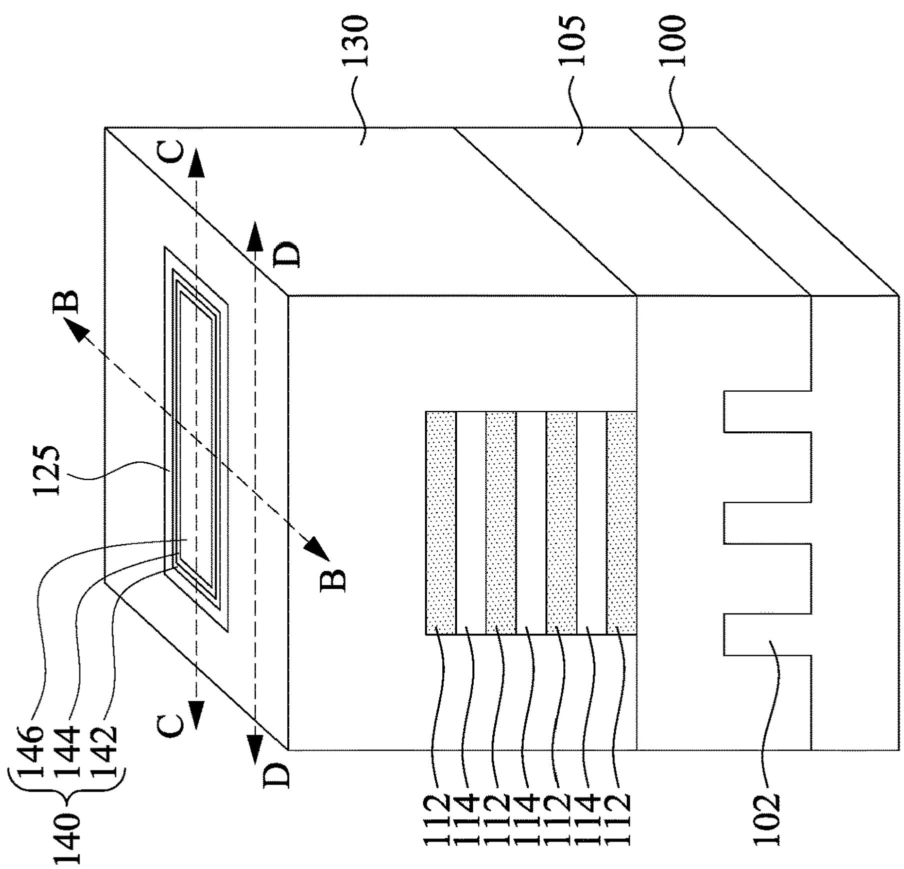
Figure 11C:
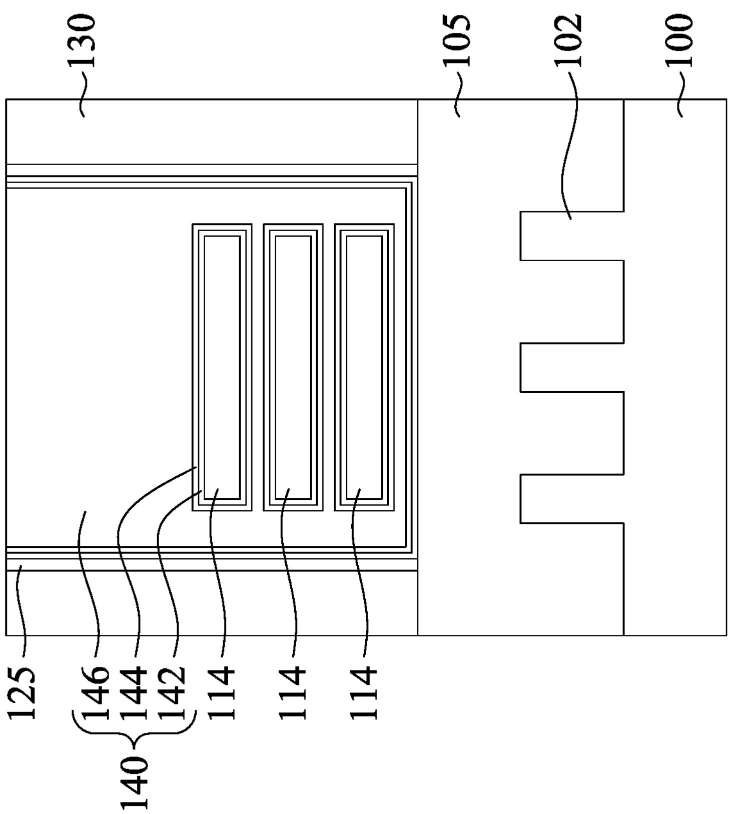
Figure 11D:
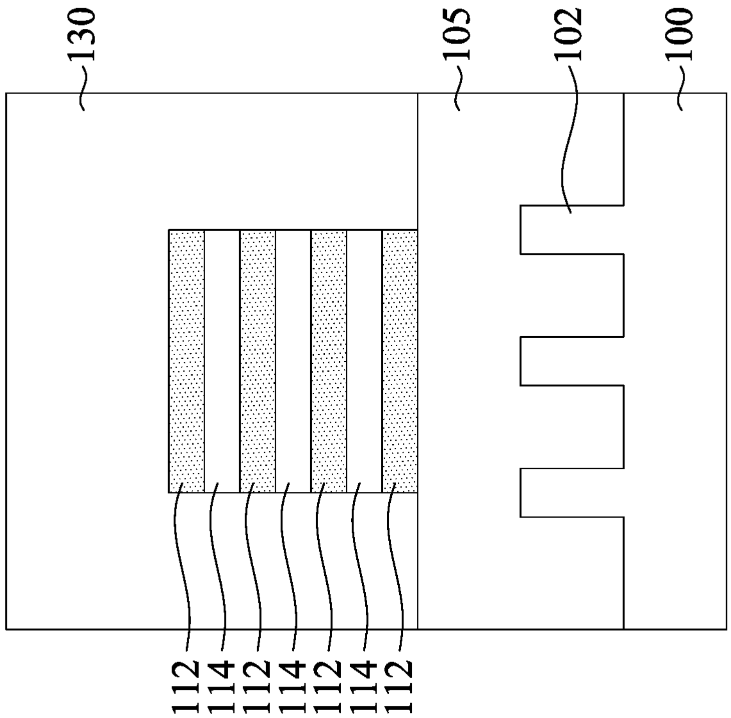

Reference is made to FIGS. 11A to 11D, in which FIG. 11A is a schematic view of a semiconductor device, FIG. 11B is a cross-sectional view along line B-B of FIG. 11A, FIG. 11C is a cross-sectional view along line C-C of FIG. 11A, and FIG. 11D is a cross-sectional view along line D-D of FIG. 11A. A gate structure 140 is formed in the gate trench GT1 (see FIGS. 10A to 10D) and may wrap around each of the exposed second semiconductor layers 114. In greater details, the gate structure 140 may include a gate dielectric layer 142, a work function metal layer 144 over the gate dielectric layer 142, and a gate electrode 146 over the work function metal layer 144. A chemical mechanism polishing (CMP) process may be performed to the gate structure 140 until top surface of the ILD layer 130 is exposed. In some embodiments, the portions of the second semiconductor layers 114 wrapped by the gate structure 140 can be referred to as channel regions.

In some embodiments, the gate dielectric layer 142 may include one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 142 includes an interfacial layer (not shown) formed between the second semiconductor layers 114 and the dielectric material. The gate dielectric layer 142 may be formed by CVD, ALD or any suitable method. In one embodiment, the gate dielectric layer 142 is formed using a highly conformal deposition process such as ALD in order to ensure the formation of a gate dielectric layer having a uniform thickness around each of the second semiconductor layers 114.

In some embodiments, the work function metal layer 144 may be made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HiTi, TiSi and TaSi is used as the work function metal layer 144, and for the p-channel FET, one or more of TiAlC, Al, TiAl, TaN, TaAlC, TiN, TiC and Co is used as the work function metal layer 144. The work function metal layer 144 may be formed by ALD, PVD, CVD, e-beam evaporation, or other suitable process.

In some embodiments, the gate electrode 146 may include one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode 146 may be formed by CVD, ALD, electro-plating, or other suitable method.

Figure 12B:
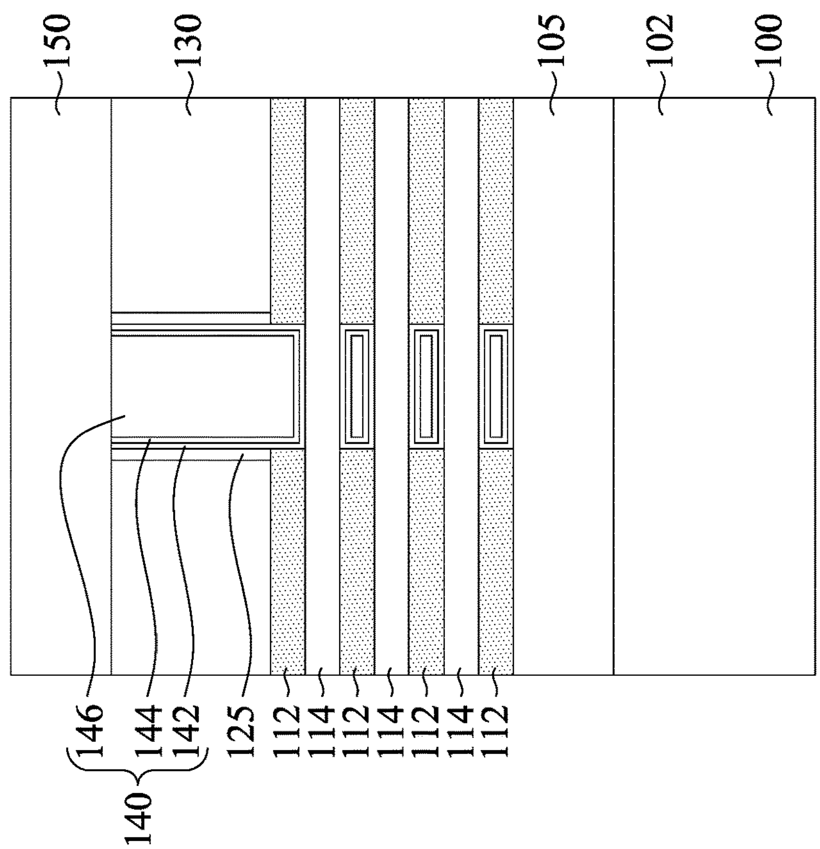
Figure 12A:
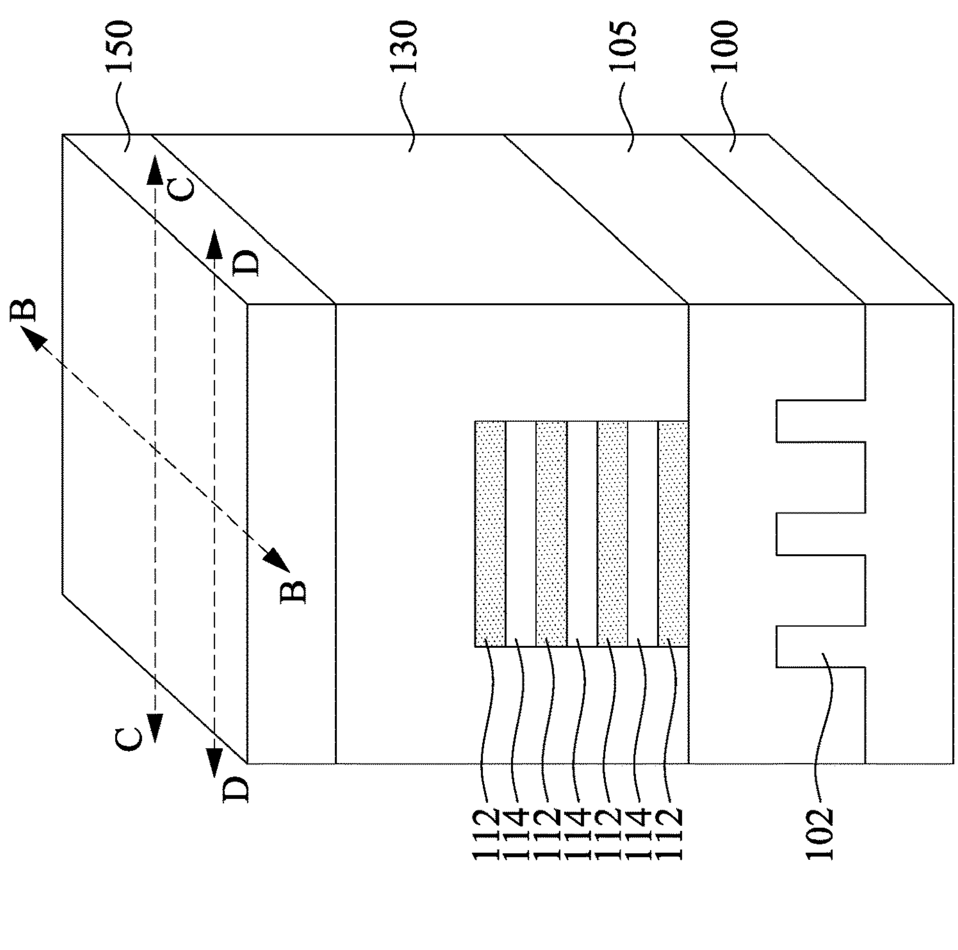
Figure 12D:
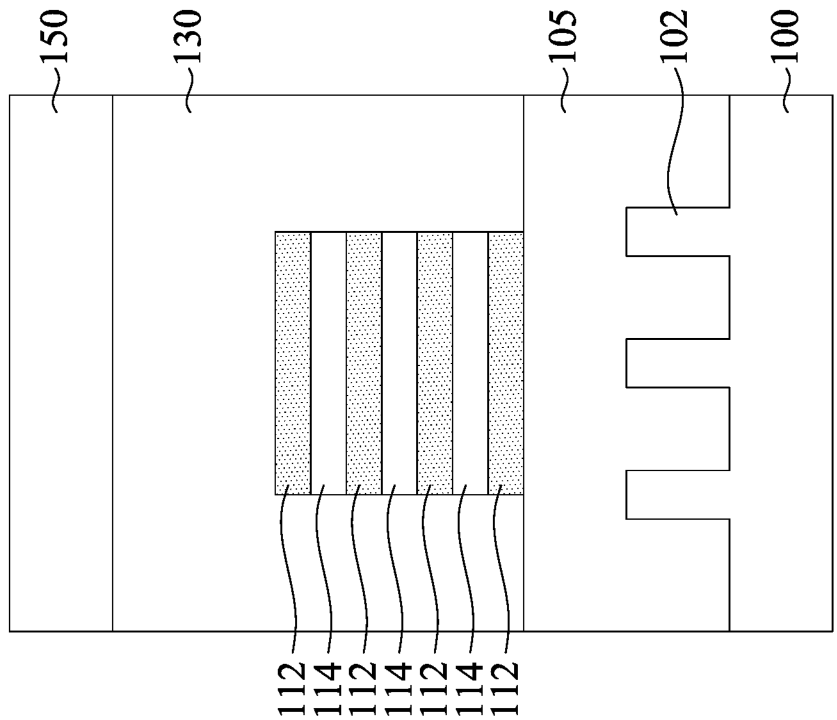
Figure 12C:
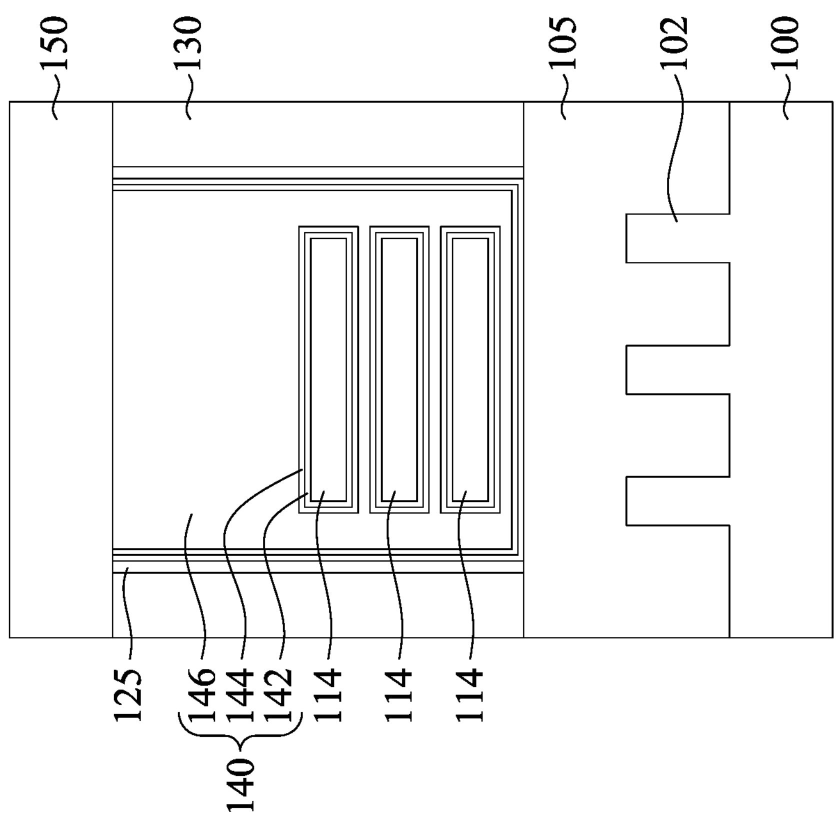

Reference is made to FIGS. 12A to 12D, in which FIG. 12A is a schematic view of a semiconductor device, FIG. 12B is a cross-sectional view along line B-B of FIG. 12A, FIG. 12C is a cross-sectional view along line C-C of FIG. 12A, and FIG. 12D is a cross-sectional view along line D-D of FIG. 12A. An interlayer dielectric (ILD) layer 150 is deposited over the ILD layer 130 and covering the gate structure 140. In some embodiments, material and method of forming the ILD layer 150 may be similar to those of the ILD layer 130.

Figure 13B:
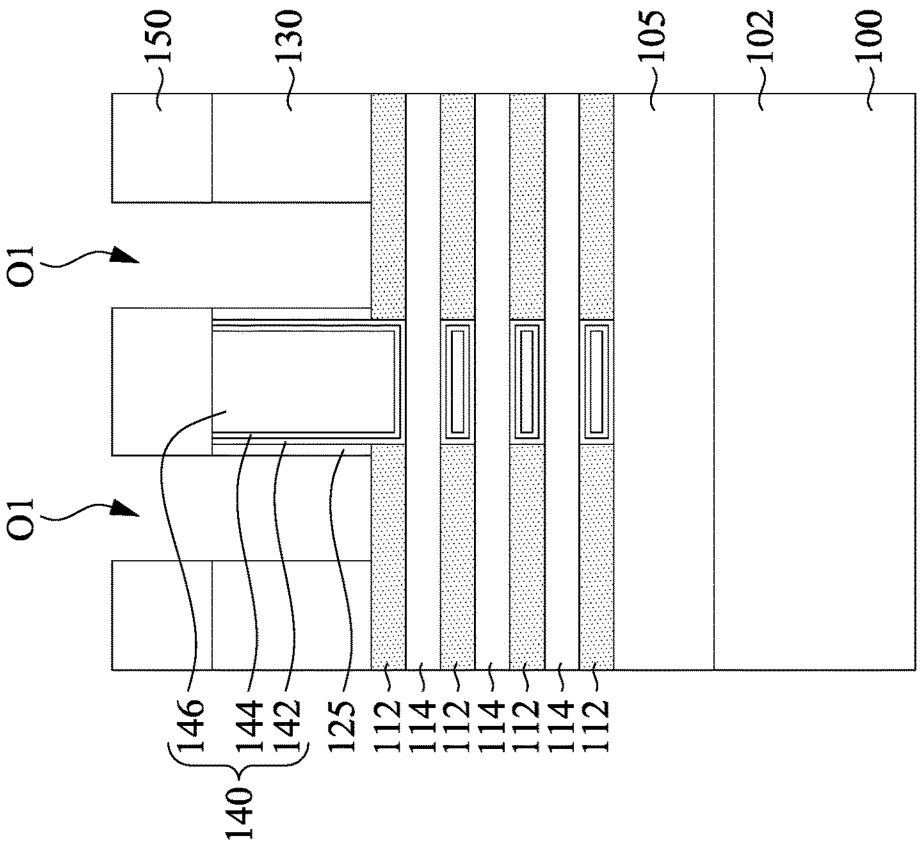
Figure 13A:
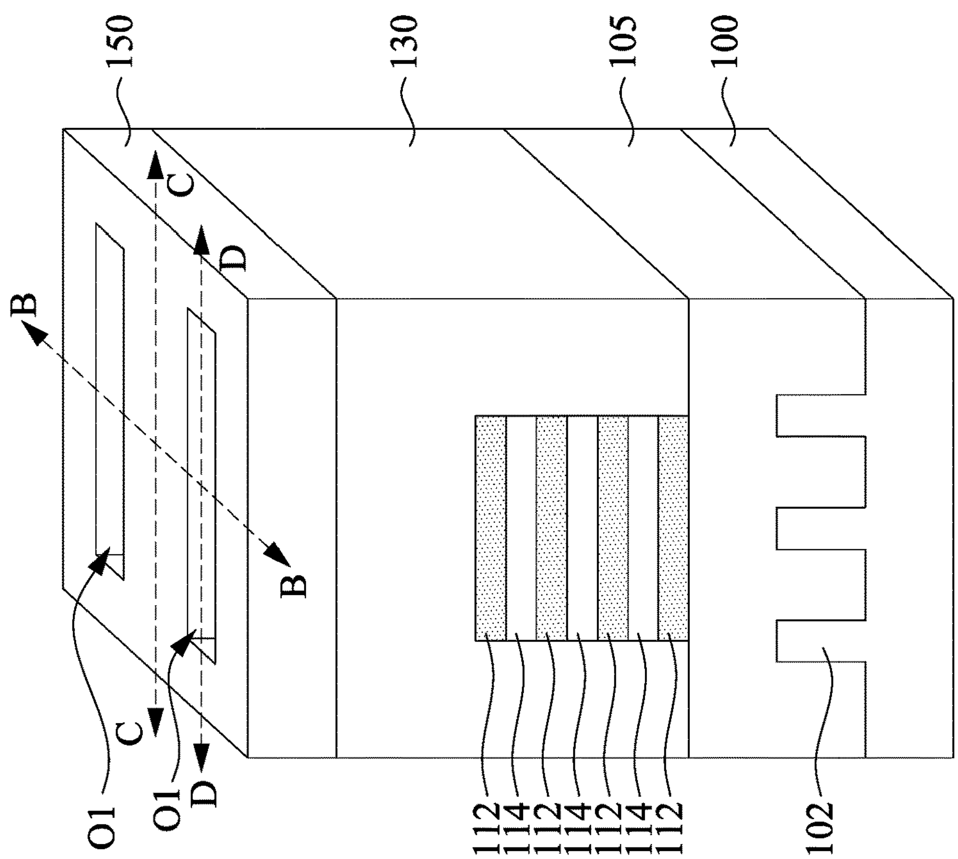
Figure 13D:
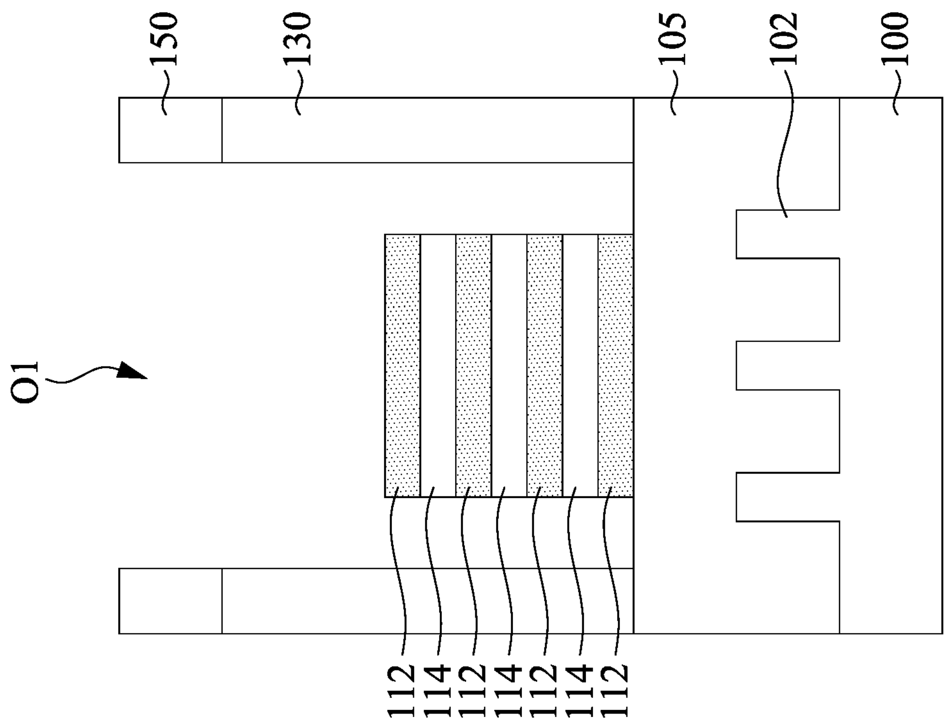
Figure 13C:
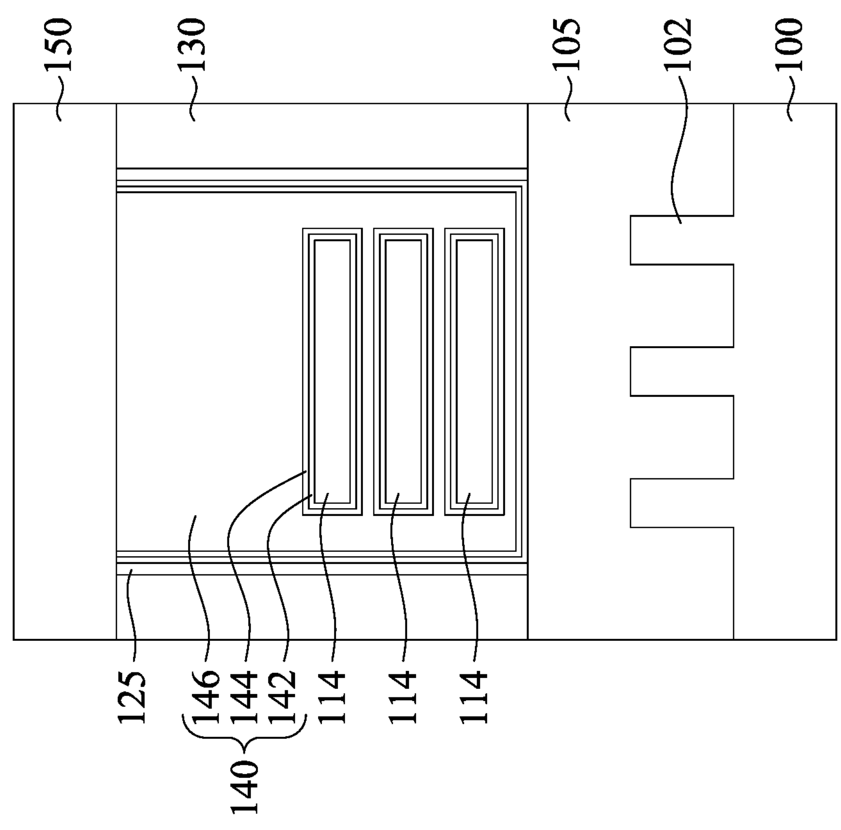

Reference is made to FIGS. 13A to 13D, in which FIG. 13A is a schematic view of a semiconductor device, FIG. 13B is a cross-sectional view along line B-B of FIG. 13A, FIG. 13C is a cross-sectional view along line C-C of FIG. 13A, and FIG. 13D is a cross-sectional view along line D-D of FIG. 13A. Source/drain openings O1 are formed in the ILD layers 130 and 150 to expose portions of the first and second semiconductor layers 112 and 114 (see FIG. 13D). In some embodiments, the source/drain openings O1 may be formed by using one or more lithography and etching operations.

Figure 14A:
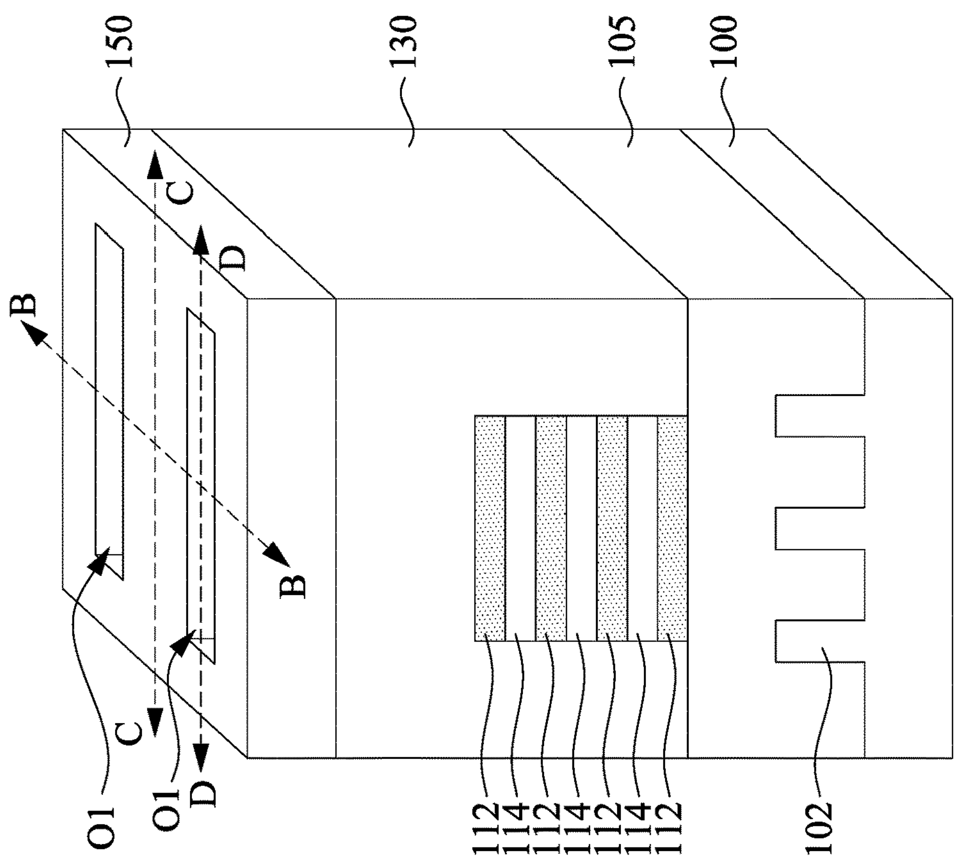
Figure 14B:
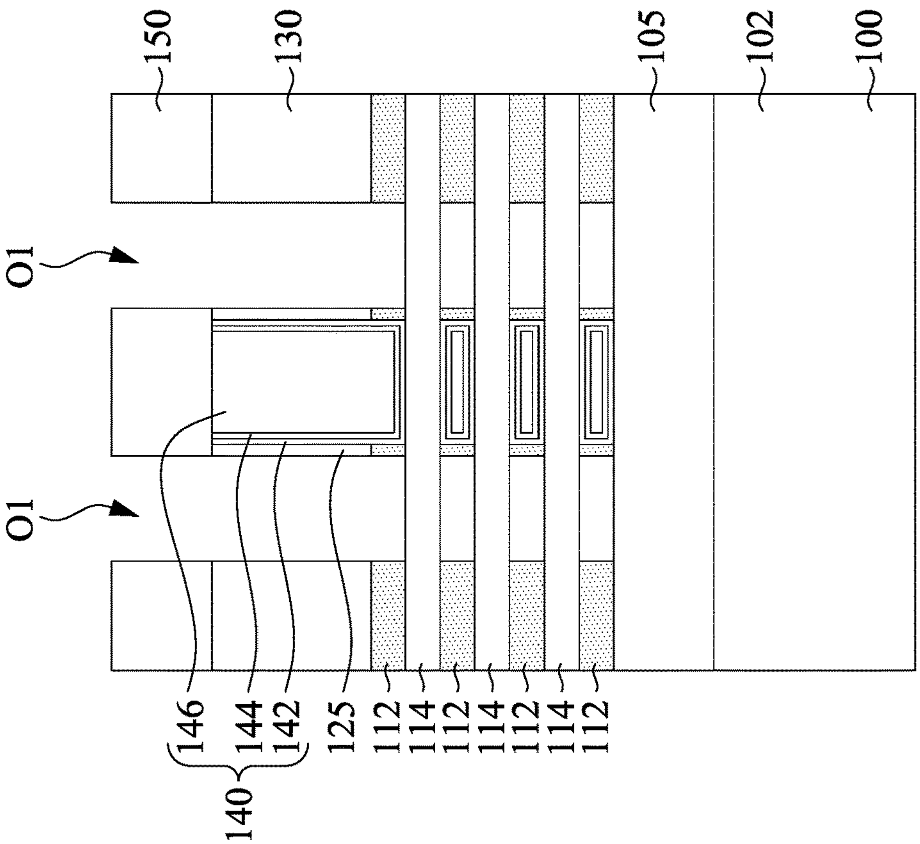
Figure 14D:
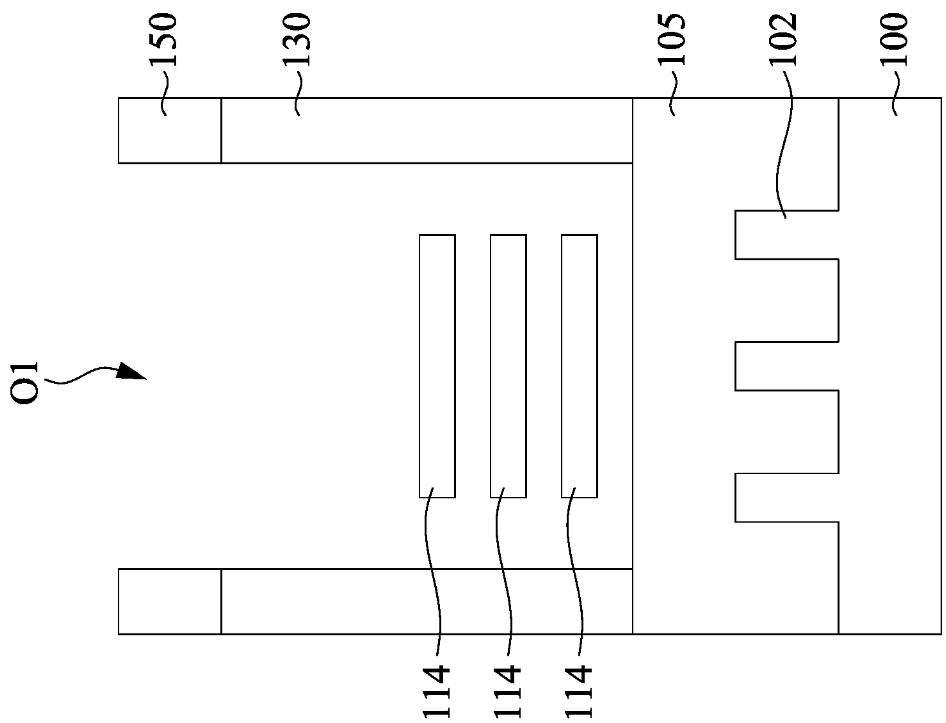
Figure 14C:
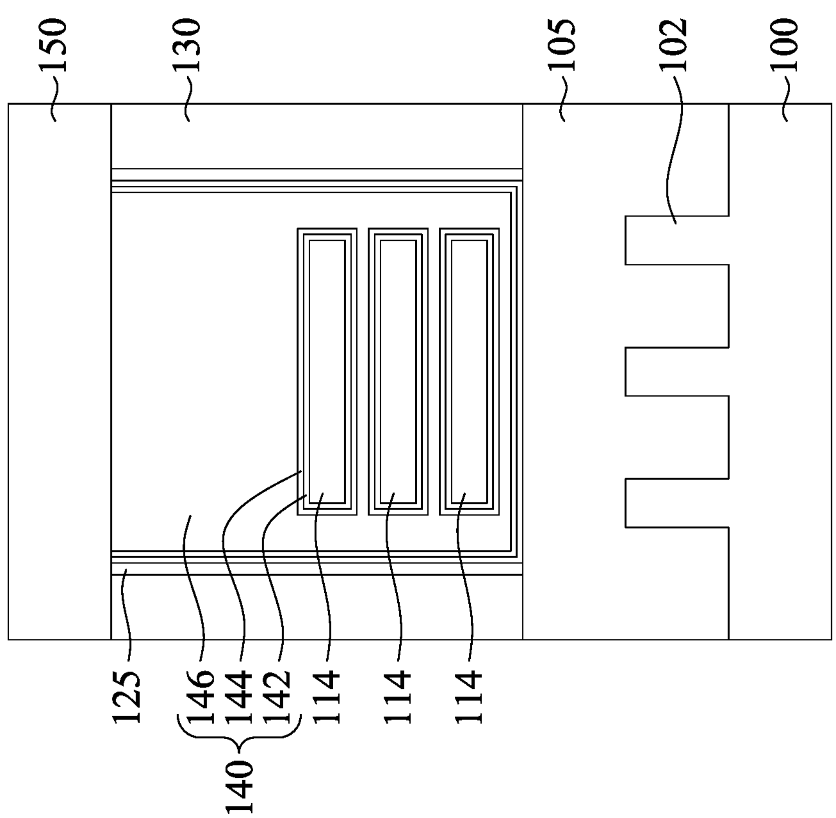

Reference is made to FIGS. 14A to 14D, in which FIG. 14A is a schematic view of a semiconductor device, FIG. 14B is a cross-sectional view along line B-B of FIG. 14A, FIG. 14C is a cross-sectional view along line C-C of FIG. 14A, and FIG. 14D is a cross-sectional view along line D-D of FIG. 14A. Portions of the first semiconductor layers 112 are removed through the source/drain openings O1, leaving portions of the second semiconductor layers 114 suspended over the substrate 100. In some embodiments, the first semiconductor layers 112 may be using an etching process having etching selectivity between the first semiconductor layers 112 and the second semiconductor layers 114. For example, the second semiconductor layers 114 may include higher etching resistance to the etching process than the first semiconductor layers 112.

Figure 15B:
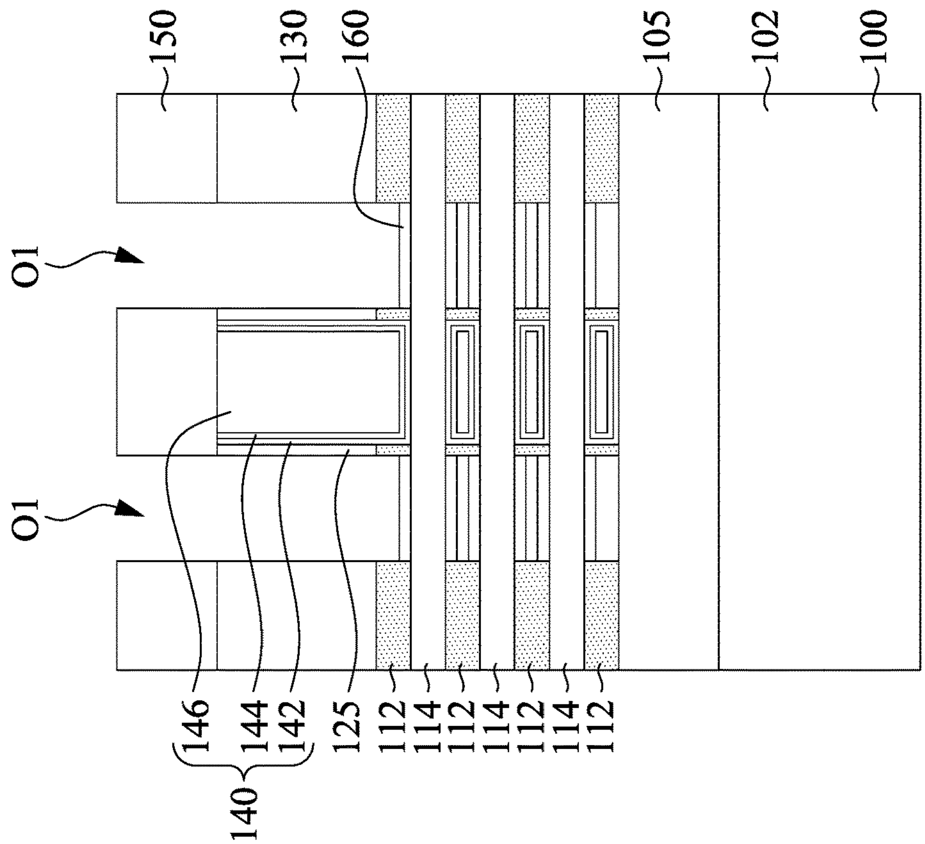
Figure 15A:
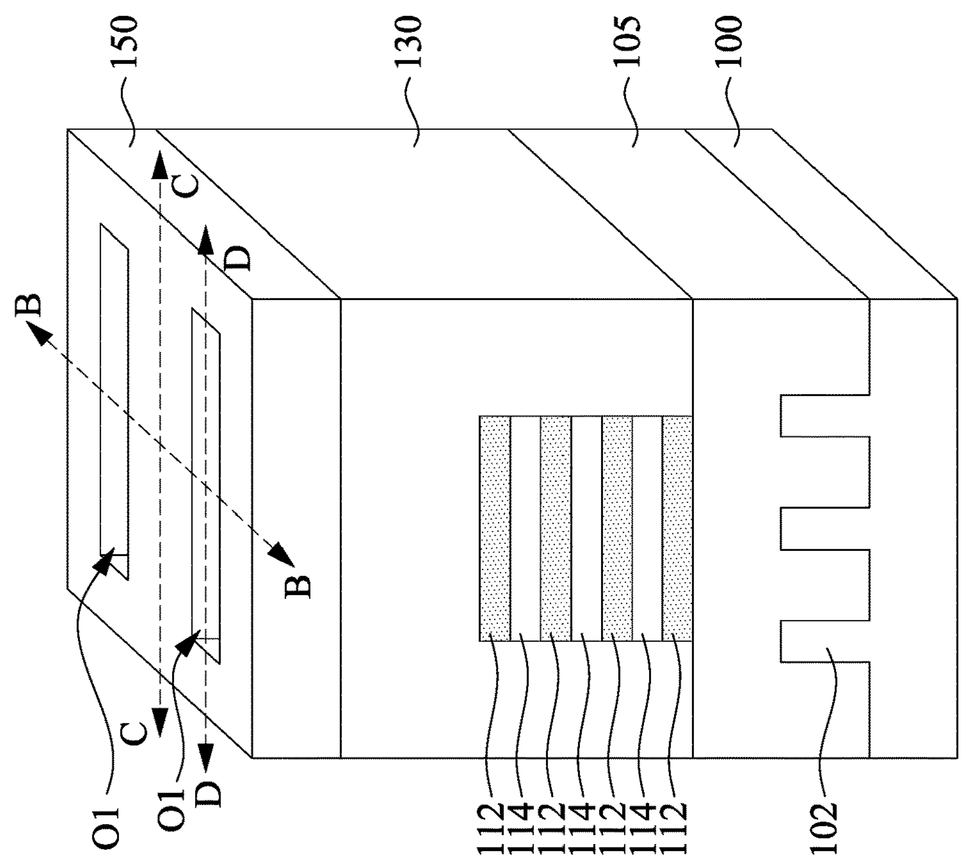
Figure 15D:
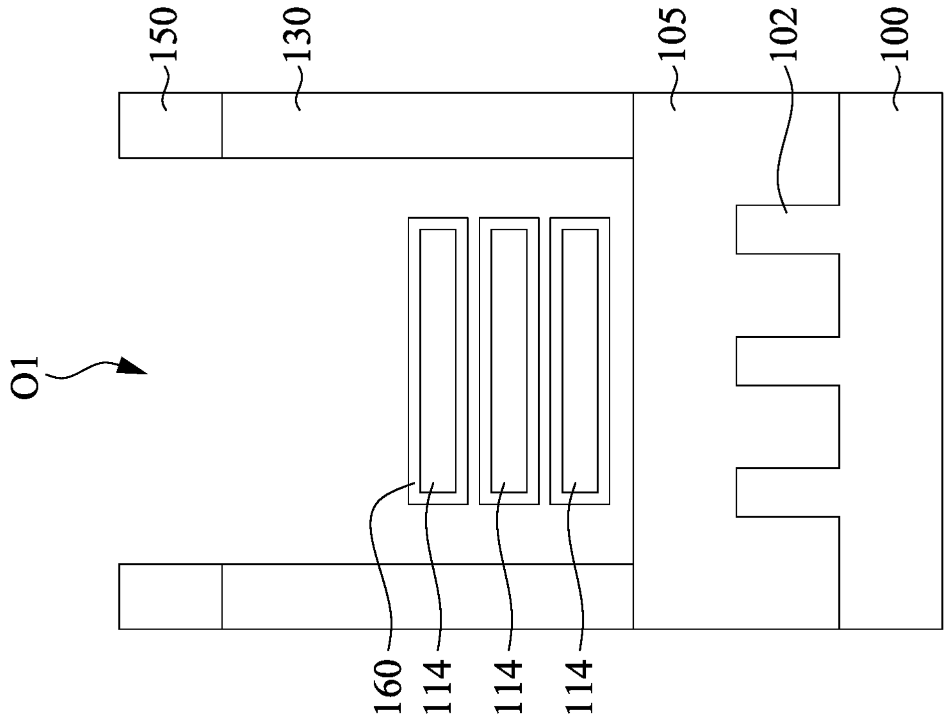
Figure 15C:
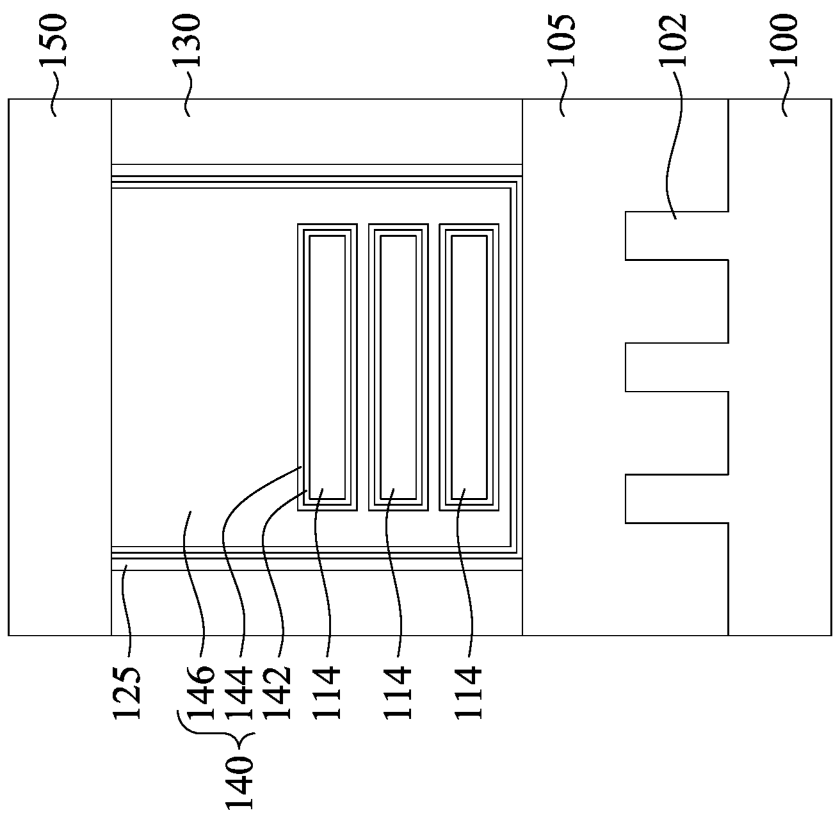

Reference is made to FIGS. 15A to 15D, in which FIG. 15A is a schematic view of a semiconductor device, FIG. 15B is a cross-sectional view along line B-B of FIG. 15A, FIG. 15C is a cross-sectional view along line C-C of FIG. 15A, and FIG. 15D is a cross-sectional view along line D-D of FIG. 15A. Source/drain epitaxy structures 160 are formed over the exposed second semiconductor layers 114. In some embodiments, the source/drain epitaxy structures 160 may include SiGe doped with B for a p-type GAA FET. In some embodiments, the source/drain epitaxy structures 160 may wrap around each of the second semiconductor layers 114.

In some embodiments, the second semiconductor layers 114, the gate structure 140, and the source/drain epitaxy structures 160 may collectively serve as a first transistor. In some embodiments, the first transistor is a p-type device. In some embodiments, the first transistor is a p-type GAA FET with multiple channel regions (e.g., the second semiconductor layers 114) vertically arranged.

Figure 16B:
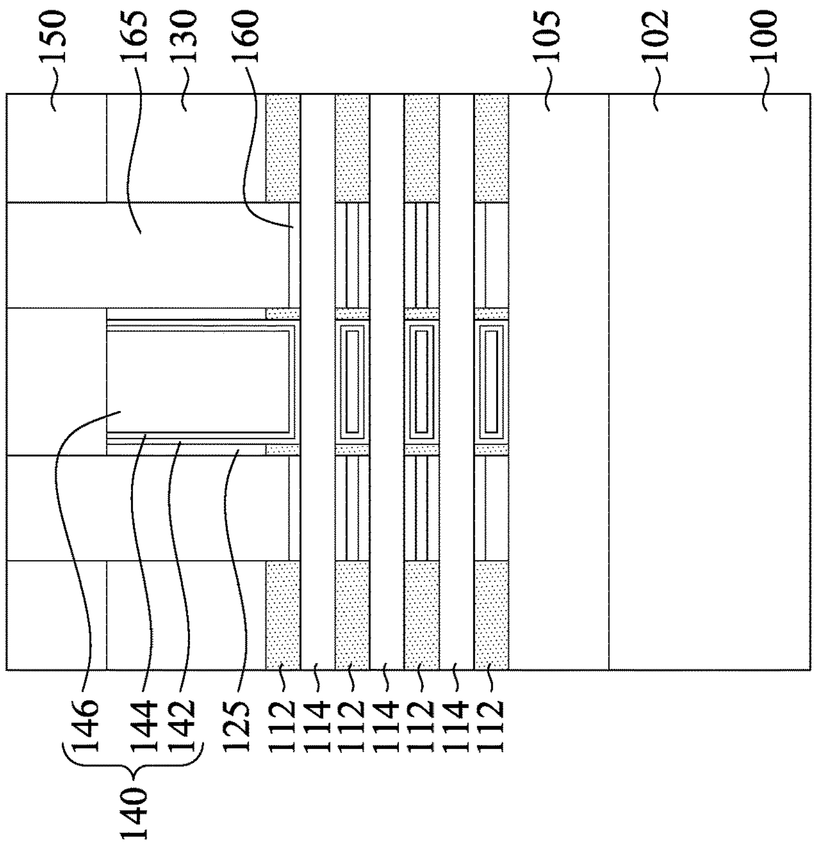
Figure 16A:
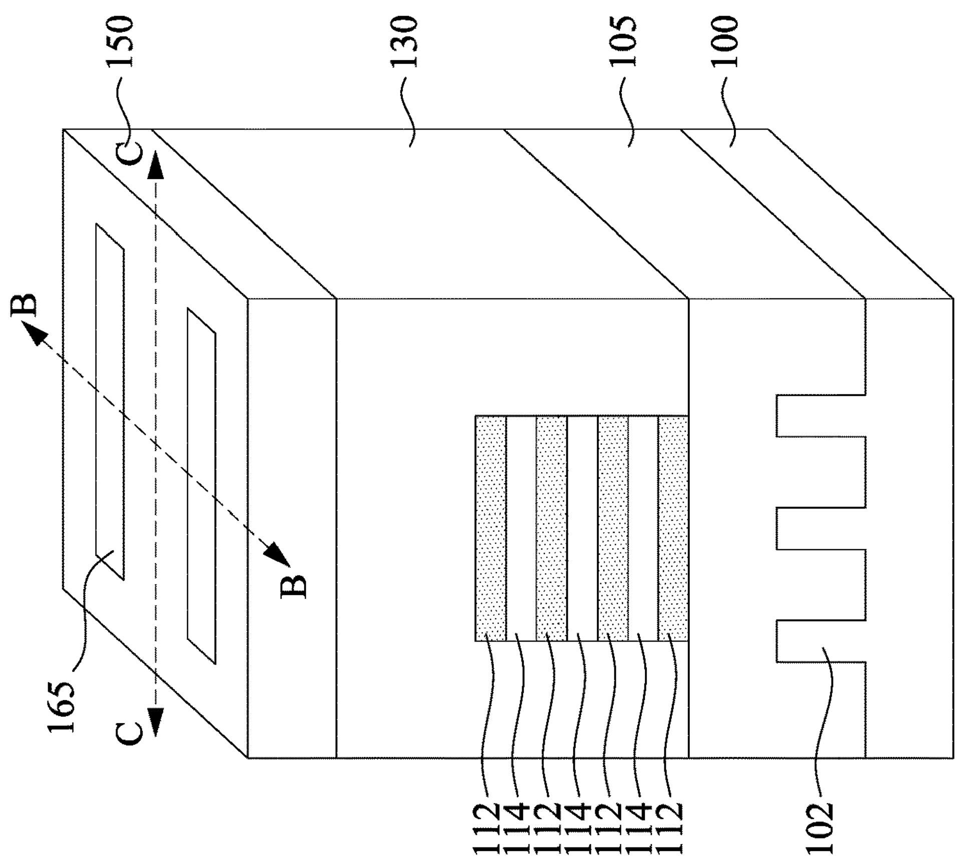
Figure 16C:
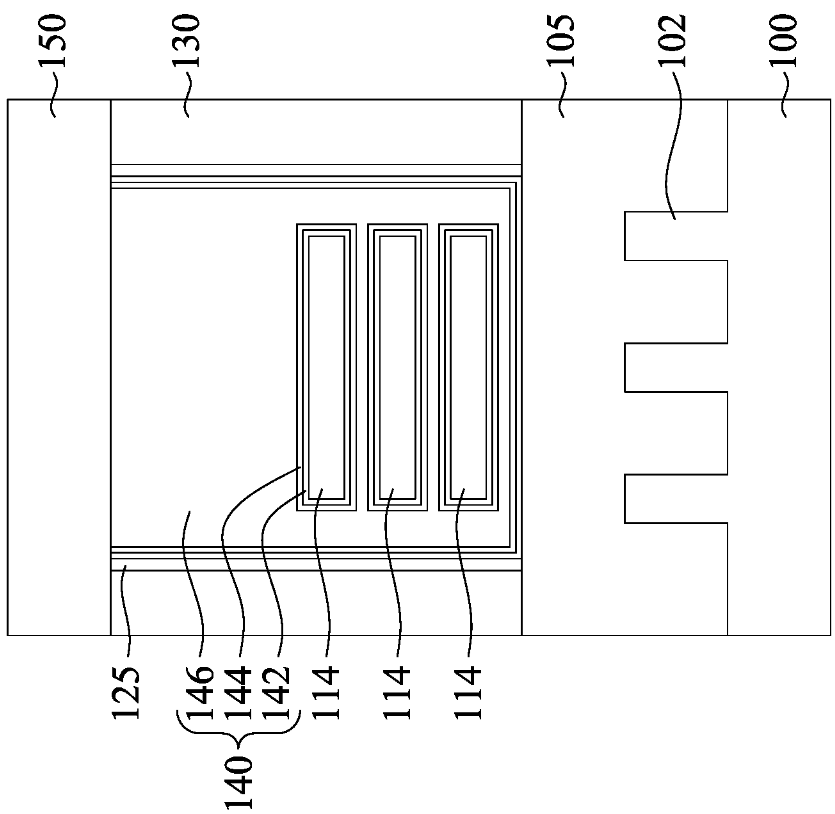
Figure 16D:
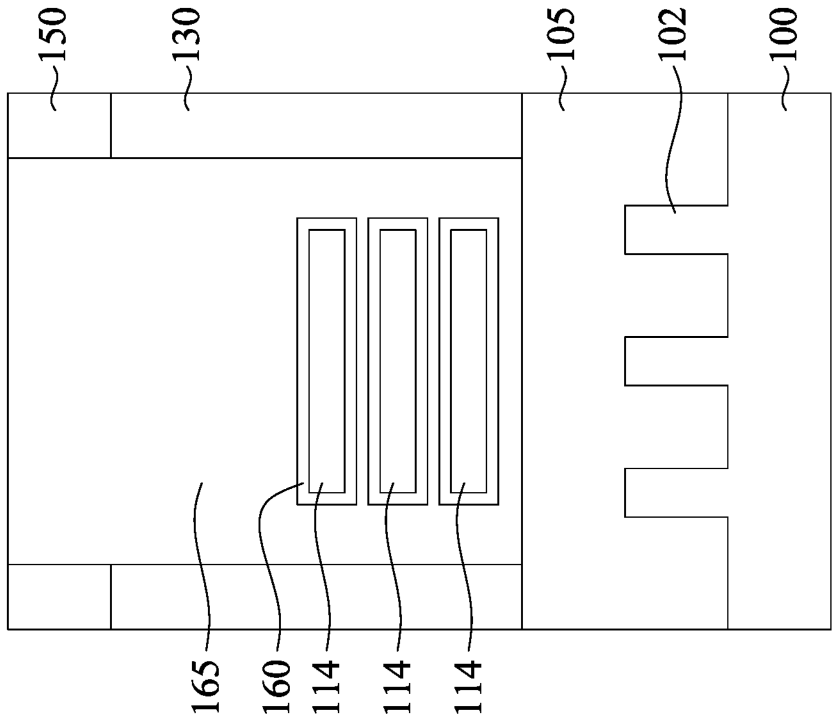

Reference is made to FIGS. 16A to 16D, in which FIG. 16A is a schematic view of a semiconductor device, FIG. 16B is a cross-sectional view along line B-B of FIG. 16A, FIG. 16C is a cross-sectional view along line C-C of FIG. 16A, and FIG. 16D is a cross-sectional view along line D-D of FIG. 16A. Source/drain contacts 165 are formed in the source/drain openings O1 and over the source/drain epitaxy structures 160. In some embodiments, the source/drain contacts 165 may be formed by, for example, depositing a conductive material in the source/drain openings O1, and performing a CMP process to remove excess conductive material until top surface of the ILD layer 150 is exposed. In some embodiments, the conductive material includes one or more layers of Co, Ni, W, Ti, Ta, Cu, Al, TiN and TaN, or any other suitable material.

Figure 17B:
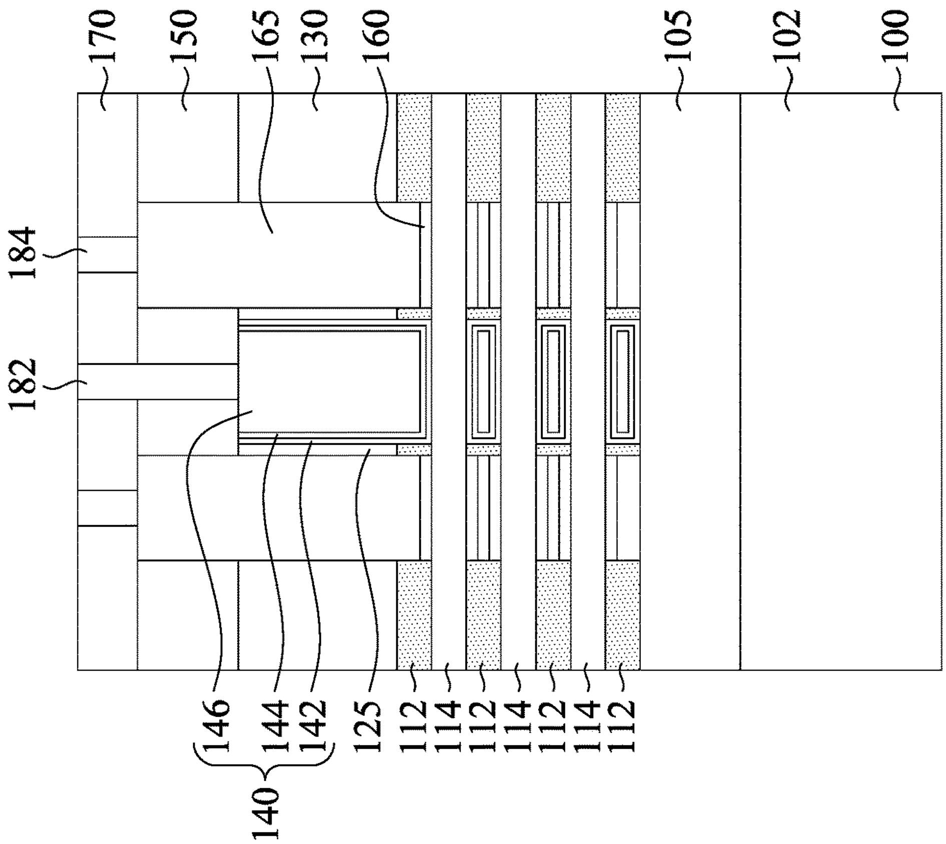
Figure 17A:
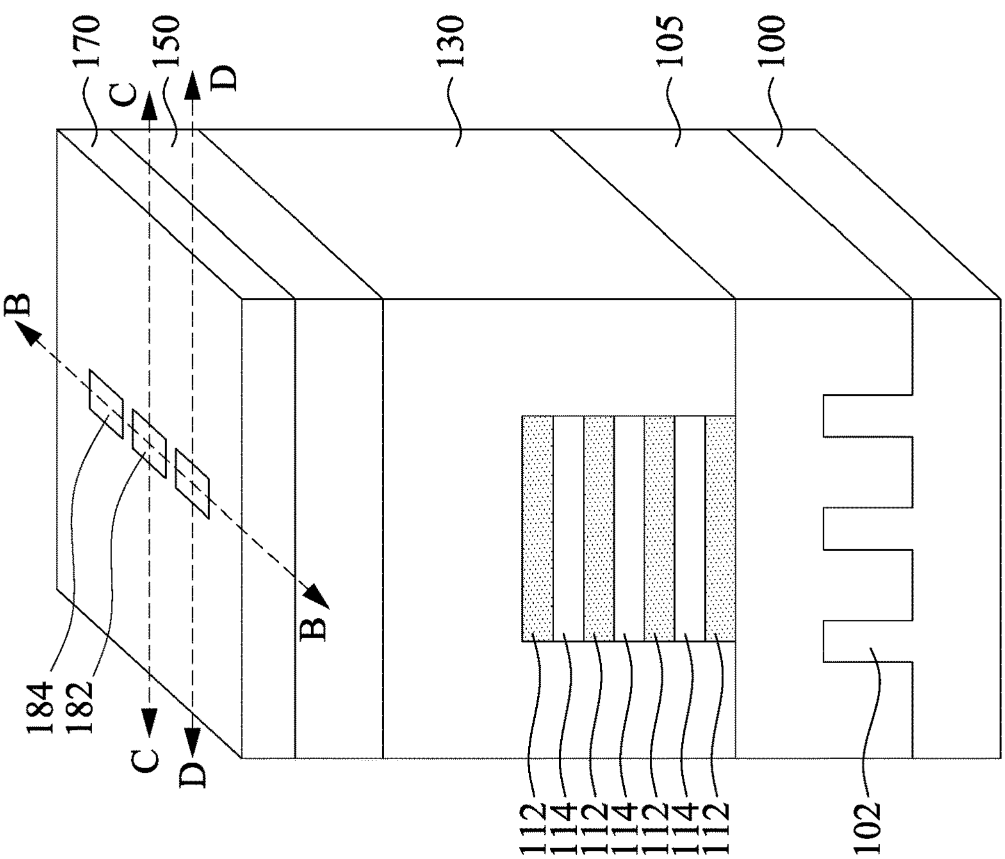
Figure 17D:
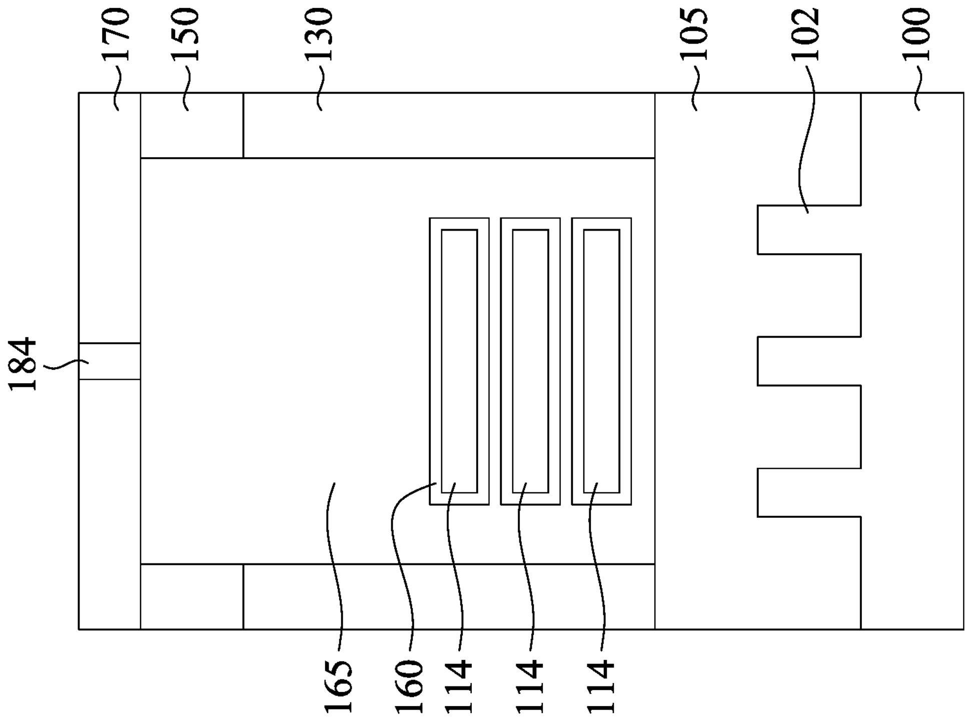
Figure 17C:
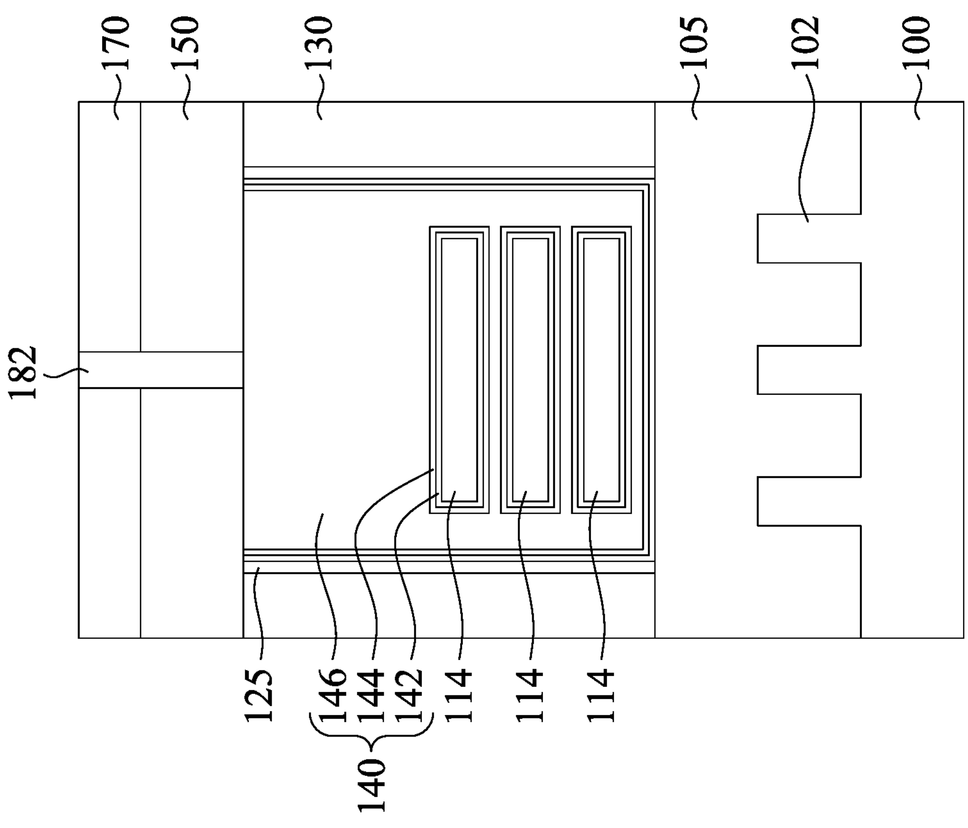

Reference is made to FIGS. 17A to 17D, in which FIG. 17A is a schematic view of a semiconductor device, FIG. 17B is a cross-sectional view along line B-B of FIG. 17A, FIG. 17C is a cross-sectional view along line C-C of FIG. 17A, and FIG. 17D is a cross-sectional view along line D-D of FIG. 17A. An interlayer dielectric (ILD) layer 170 is deposited over the ILD layer 150 and covering the source/drain contacts 165. In some embodiments, material and method of forming the ILD layer 170 may be similar to those of the ILD layer 130.

After the ILD layer 170 is formed, gate via 182 and source/drain vias 184 are formed in the ILD layer 170. In greater details, the gate via 182 is in contact with top surface of the gate structure 140, and the source/drain vias 184 are in contact with top surfaces of the source/drain contacts 165, respectively. In some embodiments, the gate via 182 and the source/drain vias 184 may be formed by, for example, patterning the ILD layer 170 to form openings that expose the gate structure 140 and the source/drain contacts 165, filling the openings with conductive material, and then performing a CMP process to remove excess conductive material until top surface of the ILD layer 170 is exposed. In some embodiments, the conductive material may include W, Co, Ru, TiN, Ti, TaN, Ta, Al, Mo, Ag, Sc, Hf, Sn, Au, Pt, Pd, or combinations thereof.

Figure 18B:
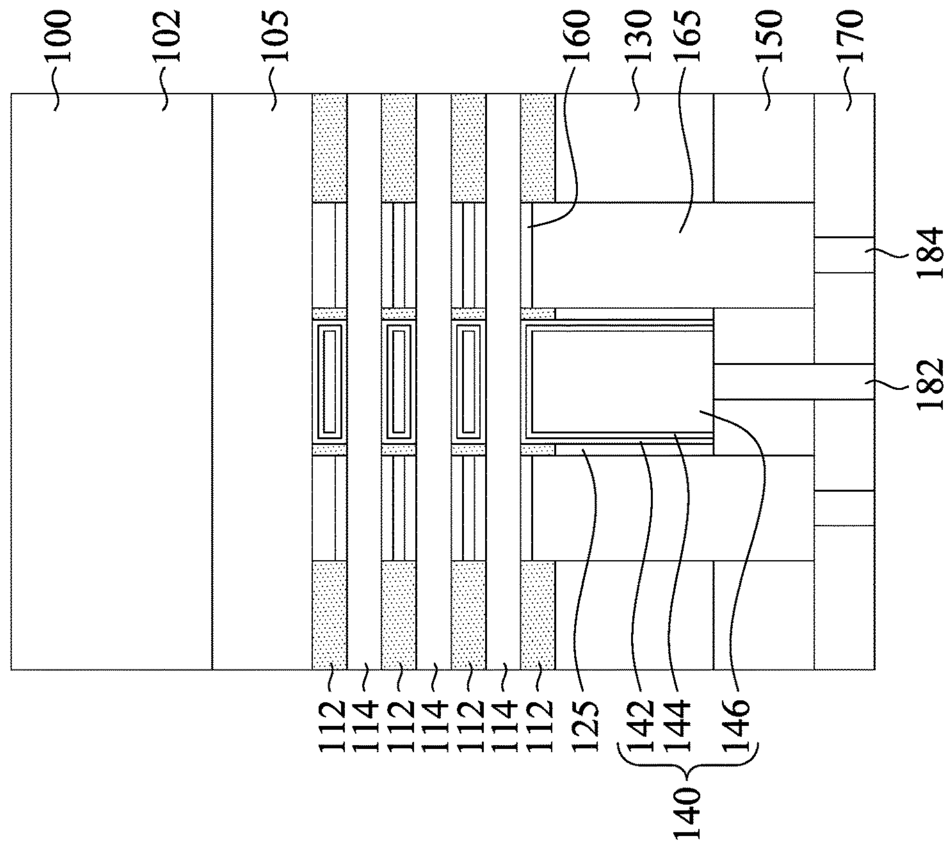
Figure 18A:
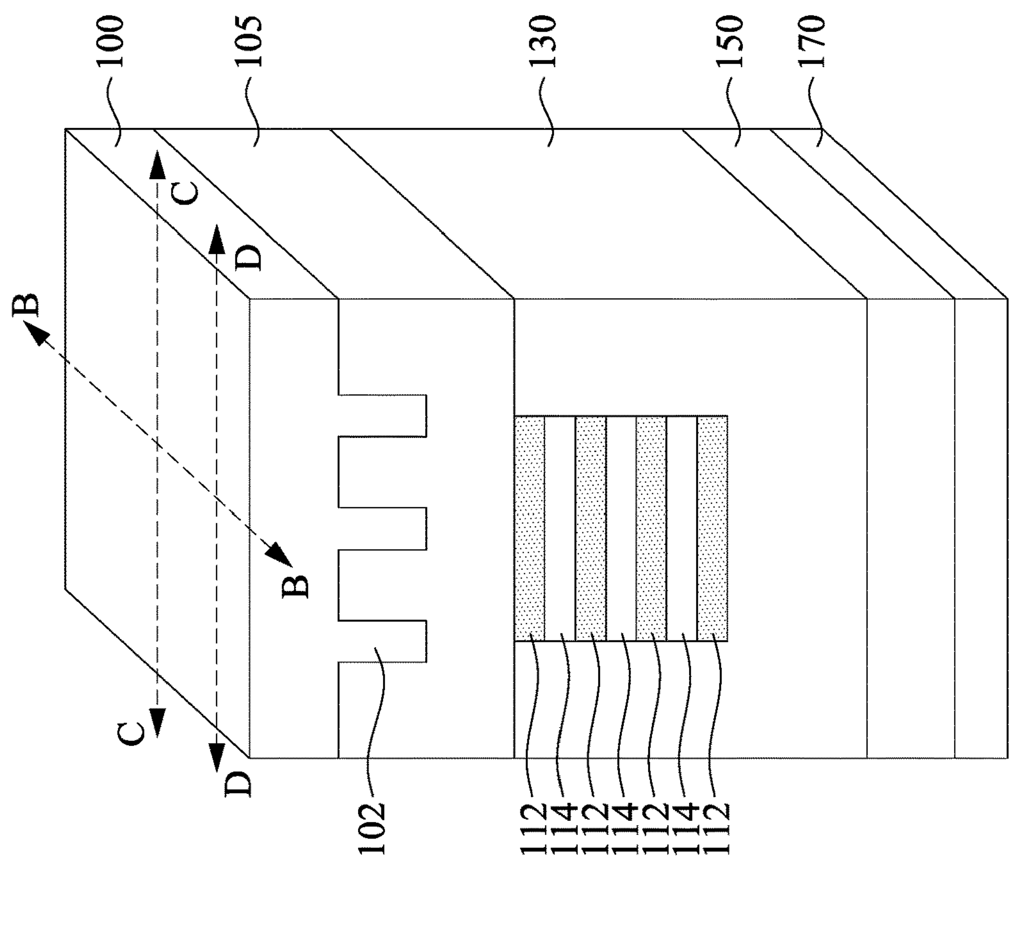
Figure 18D:
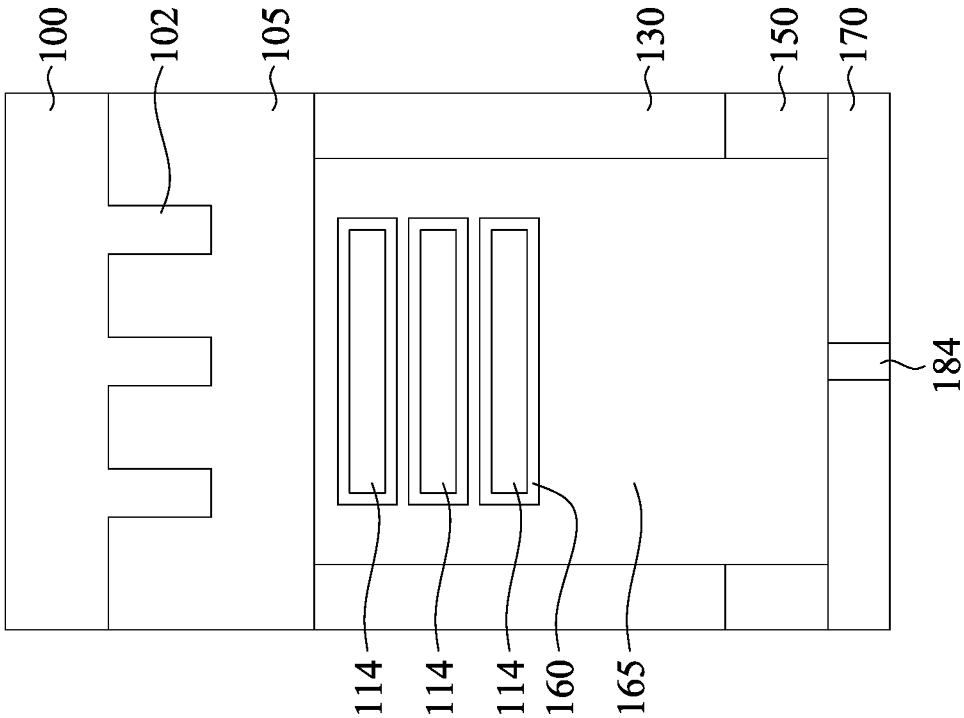
Figure 18C:
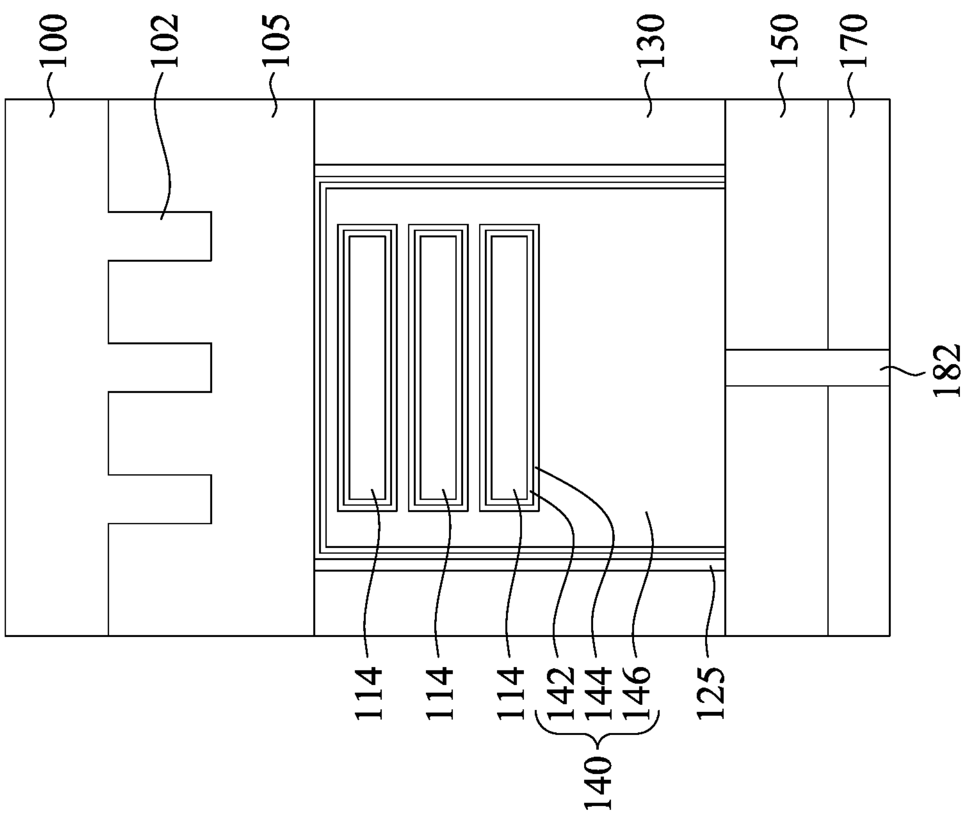

Reference is made to FIGS. 18A to 18D, in which FIG. 18A is a schematic view of a semiconductor device, FIG. 18B is a cross-sectional view along line B-B of FIG. 18A, FIG. 18C is a cross-sectional view along line C-C of FIG. 18A, and FIG. 18D is a cross-sectional view along line D-D of FIG. 18A. The structure of FIGS. 17A to 17D may be flipped over by 180 degrees, such that the back side of the substrate 100 may face upwardly. In some embodiments, the structure of FIGS. 17A to 17D may be supported by a carrier substrate (not shown).

Figure 19B:
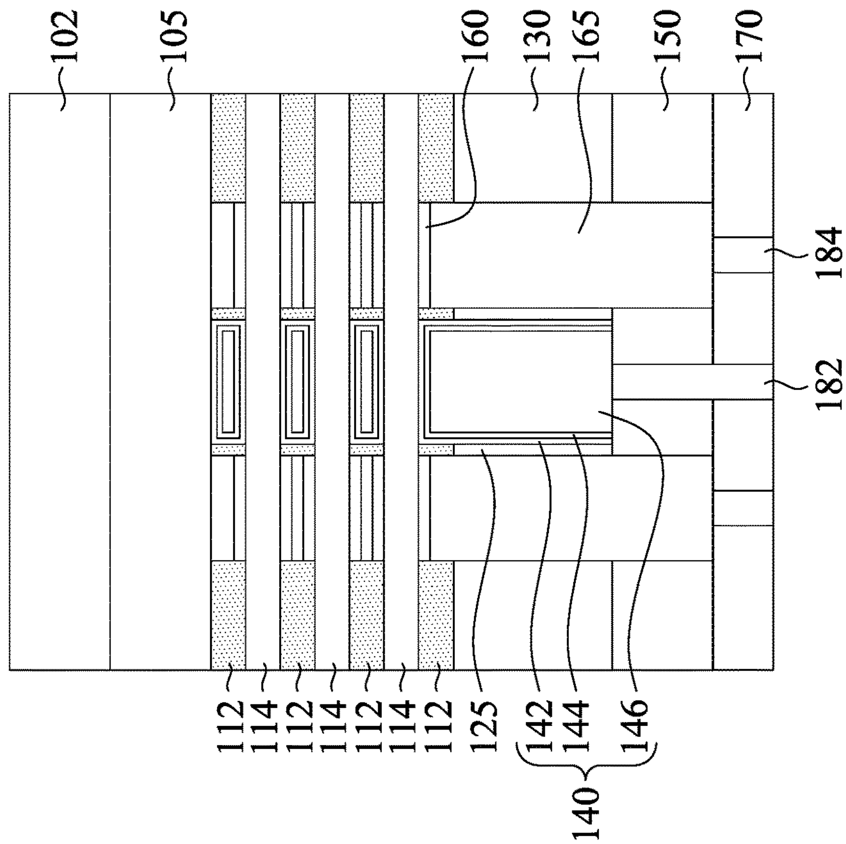
Figure 19A:
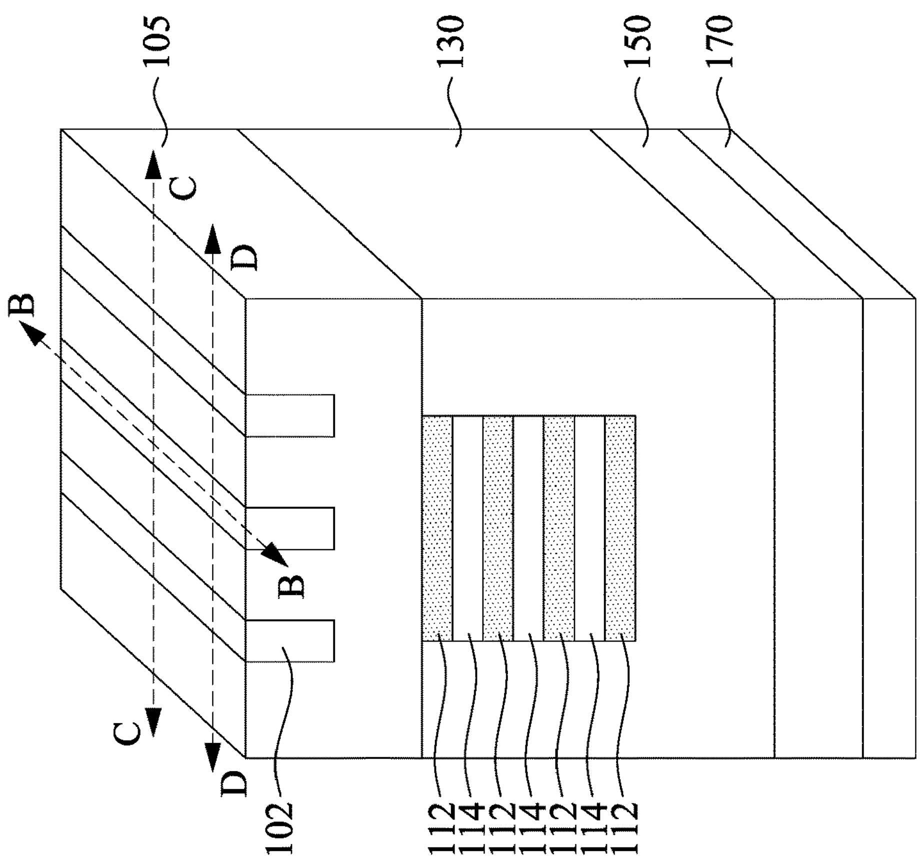
Figure 19D:
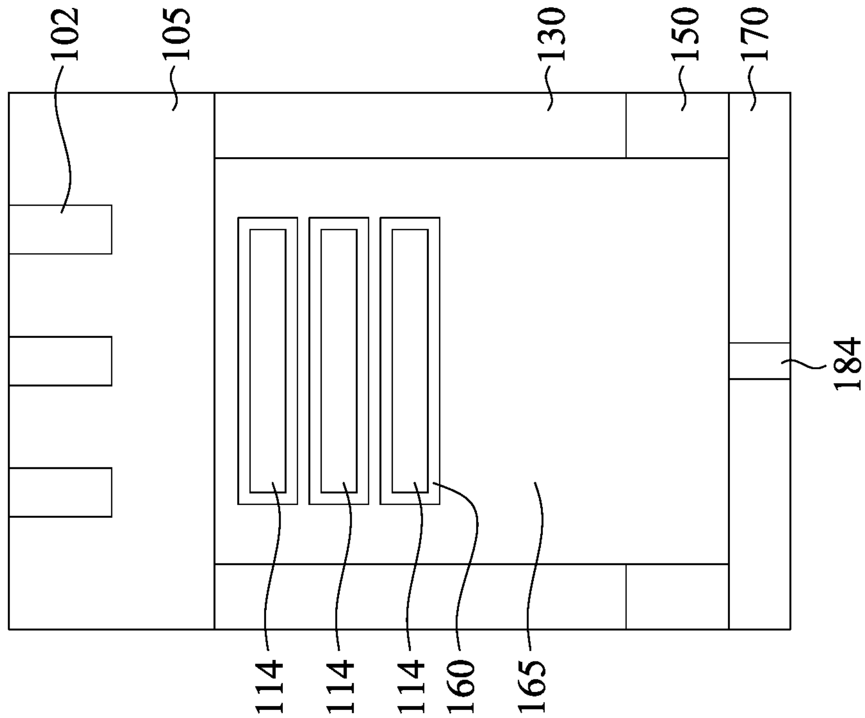
Figure 19C:
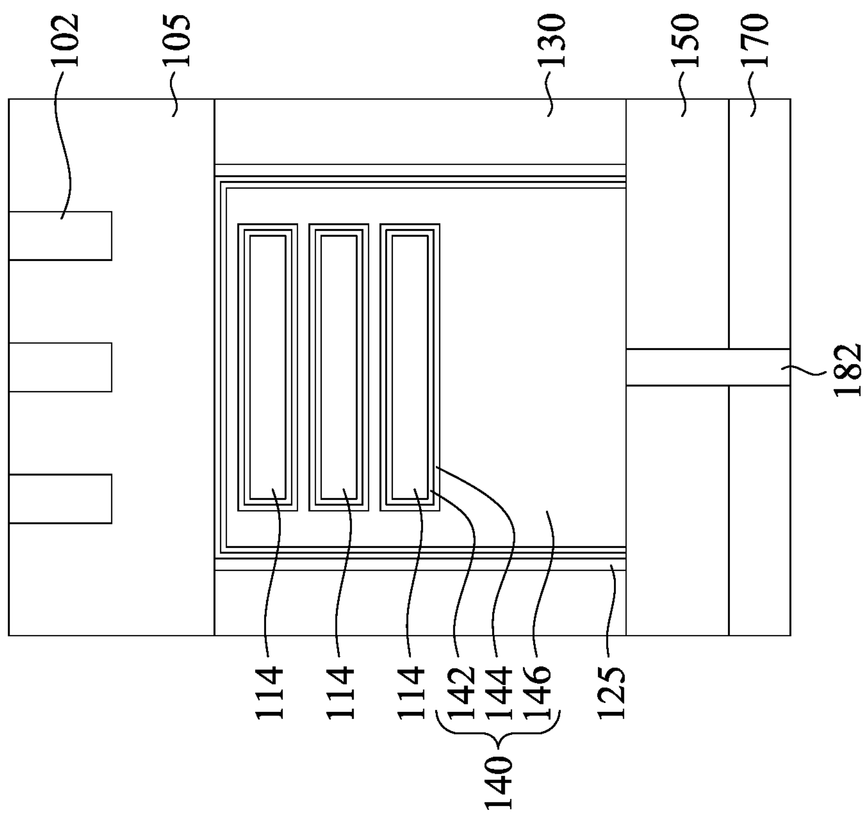

Reference is made to FIGS. 19A to 19D, in which FIG. 19A is a schematic view of a semiconductor device, FIG. 19B is a cross-sectional view along line B-B of FIG. 19A, FIG. 19C is a cross-sectional view along line C-C of FIG. 19A, and FIG. 19D is a cross-sectional view along line D-D of FIG. 19A. A grinding process is performed on the back side of the substrate 100 until the dielectric layer 105 is exposed. In greater details, portions of the substrate 100 may be removed, while the semiconductor strips 102 may remain after the grinding process is completed. After the grinding process is completed, the exposed surfaces of the semiconductor strips 102 are substantially with the exposed surface of the dielectric layer 105.

Figure 20B:
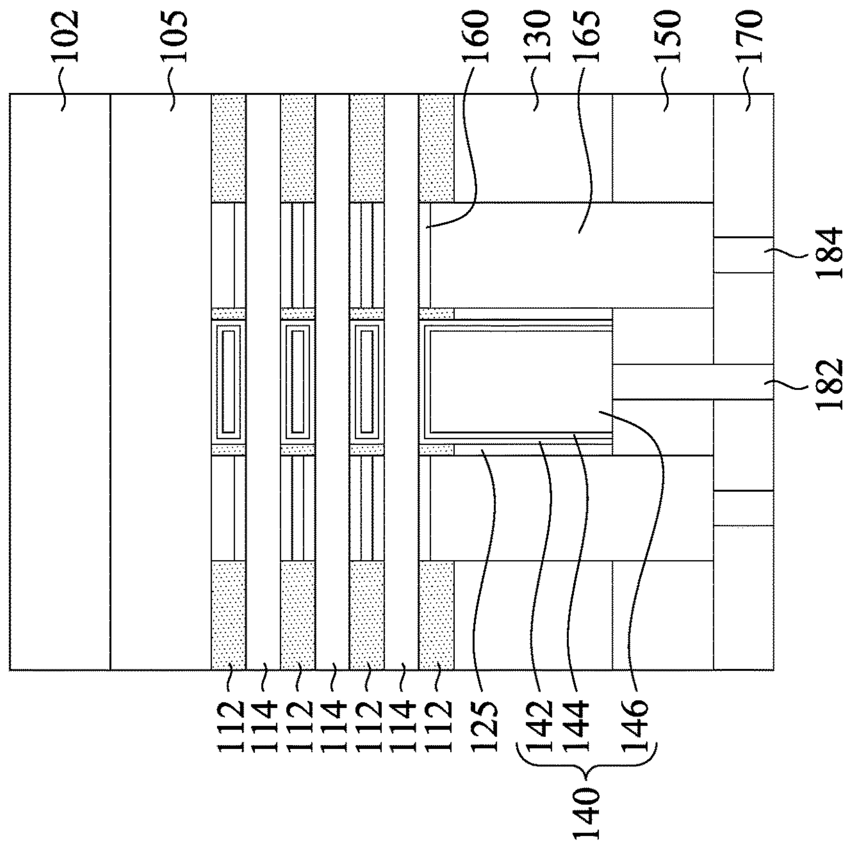
Figure 20A:
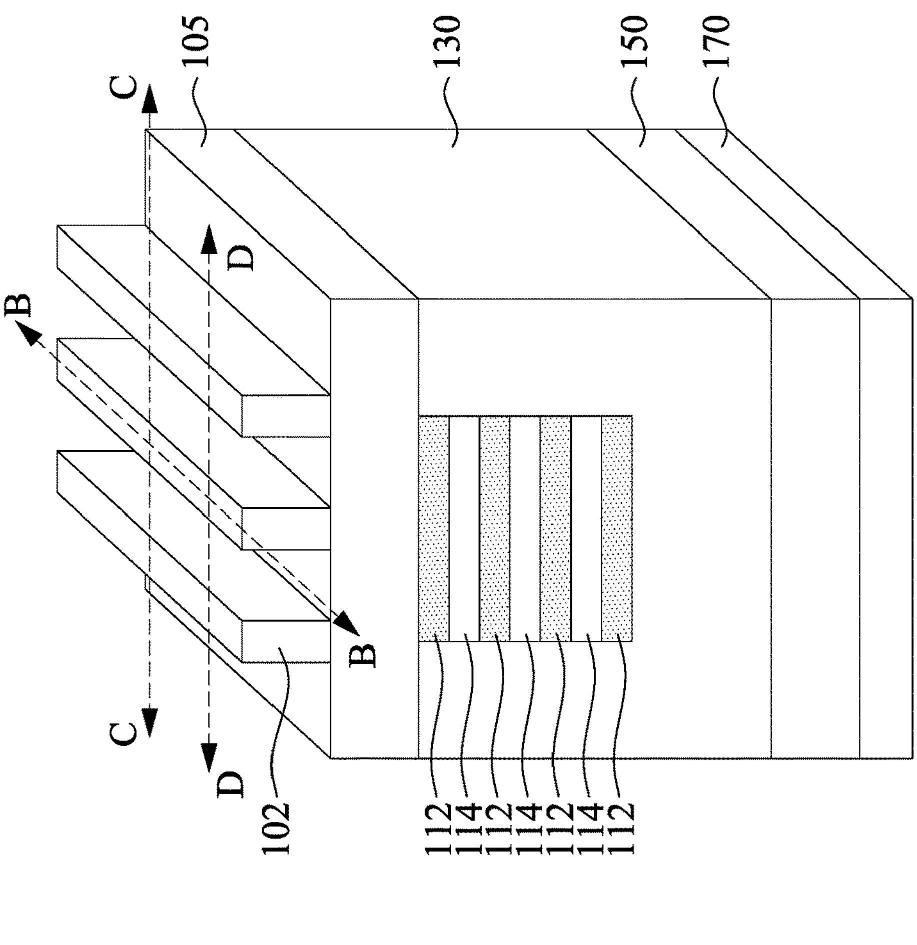
Figure 20D:
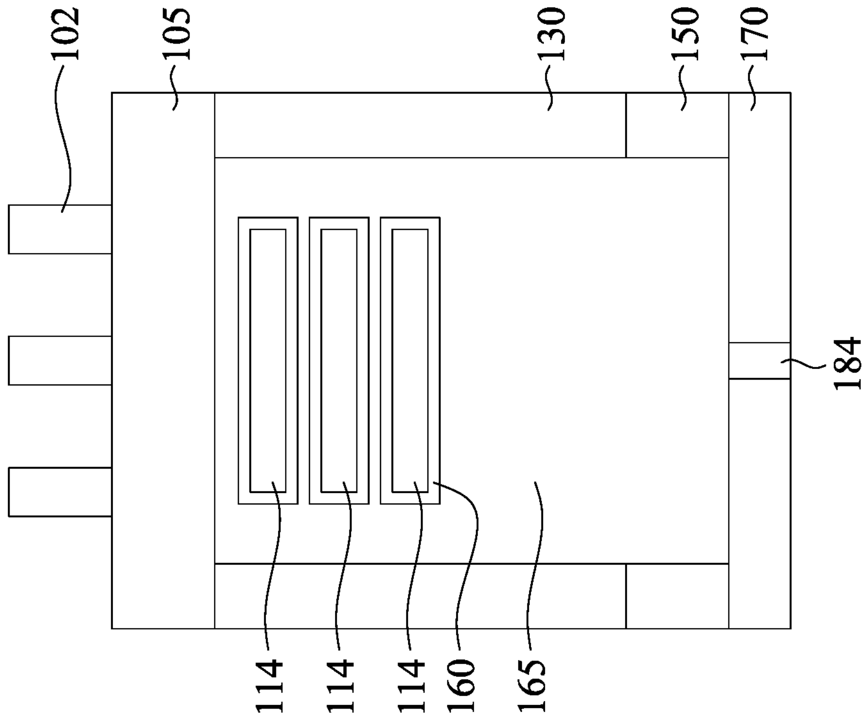
Figure 20C:
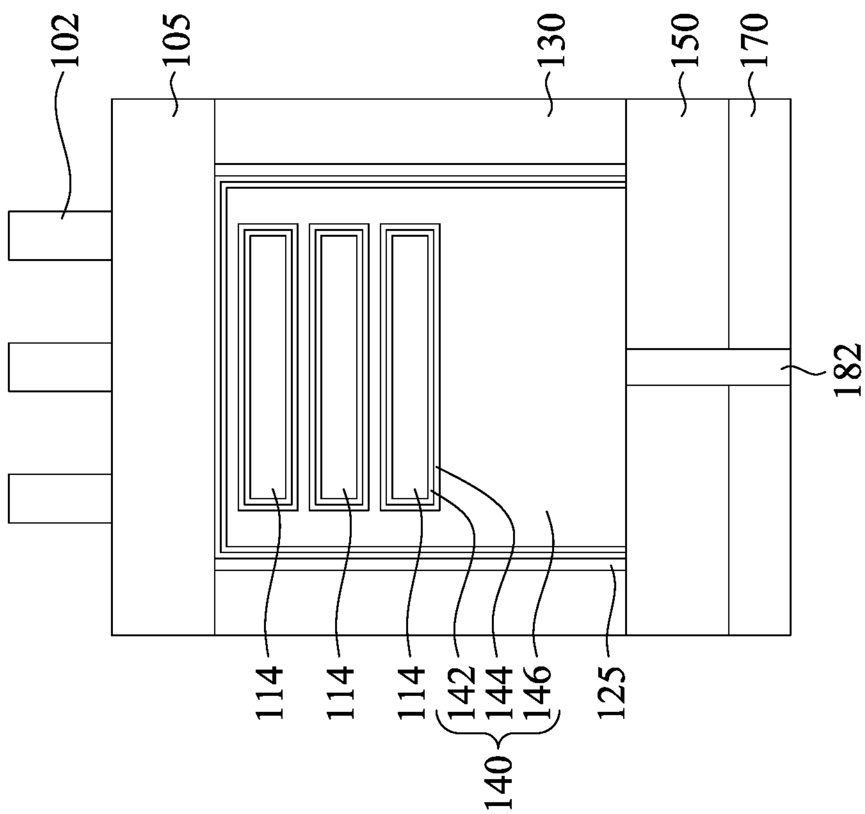

Reference is made to FIGS. 20A to 20D, in which FIG. 20A is a schematic view of a semiconductor device, FIG. 20B is a cross-sectional view along line B-B of FIG. 20A, FIG. 20C is a cross-sectional view along line C-C of FIG. 20A, and FIG. 20D is a cross-sectional view along line D-D of FIG. 20A. The dielectric layer 105 is etched back to lower top surface of the dielectric layer 105. In some embodiments, the etching back process is tuned such that the top surface of the dielectric layer 105 may be substantially level with bottom surfaces of the semiconductor strips 102. After the etching back process is completed, opposite sidewalls of each of the semiconductor strips 102 may be exposed.

Figure 21A:
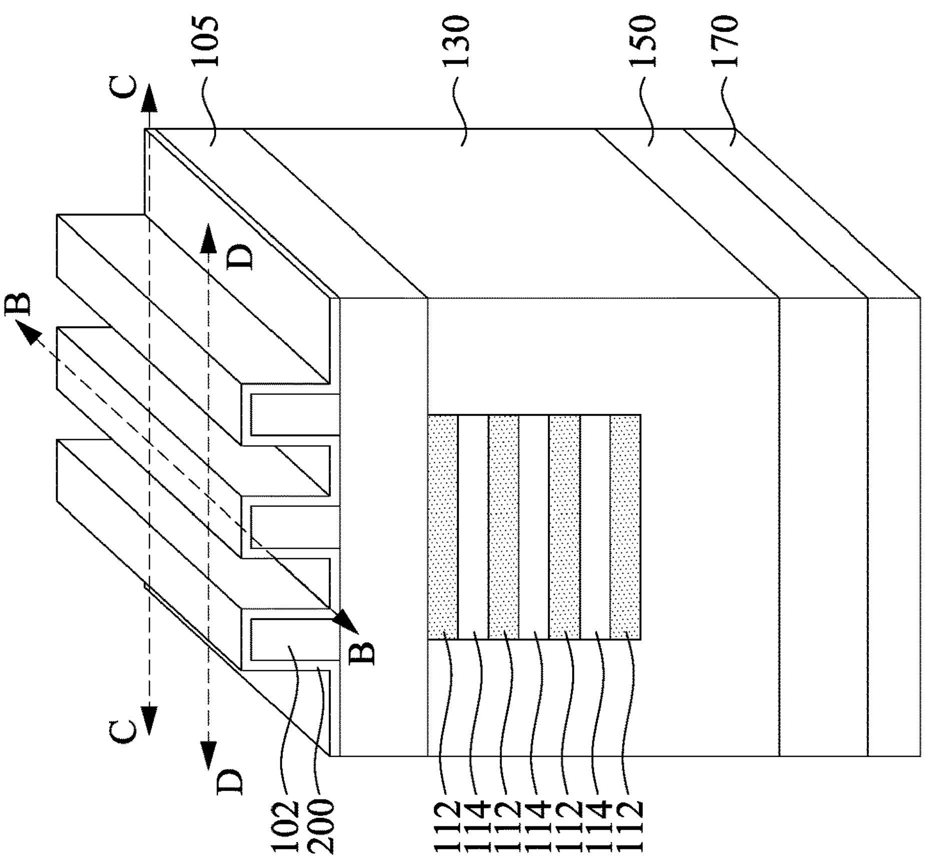
Figure 21B:
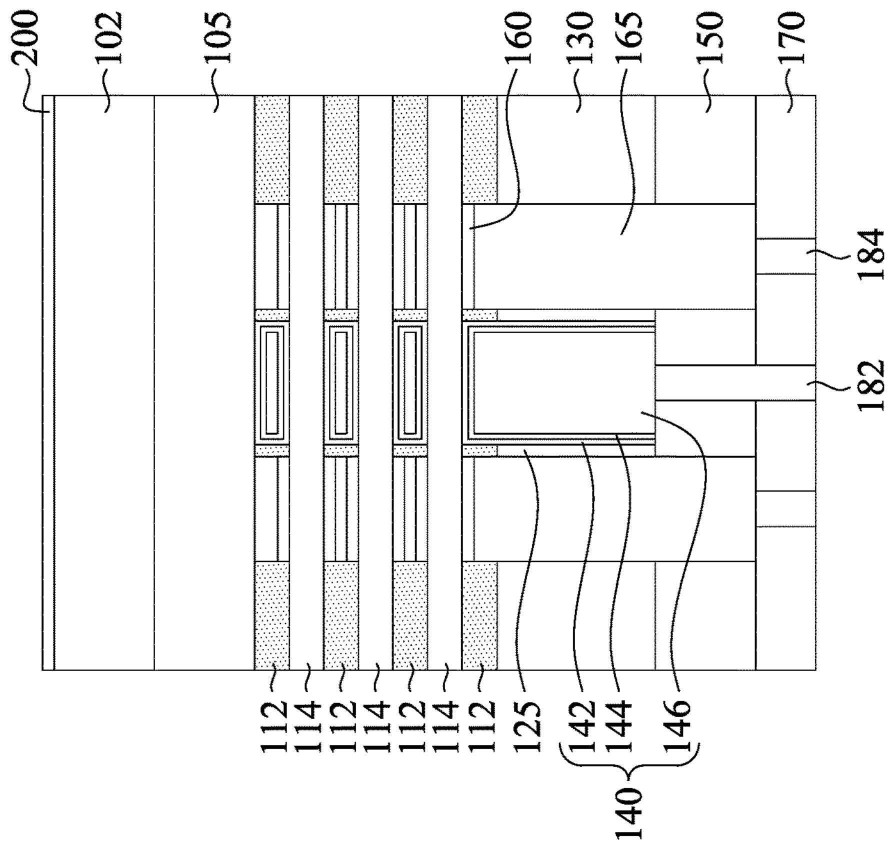
Figure 21D:
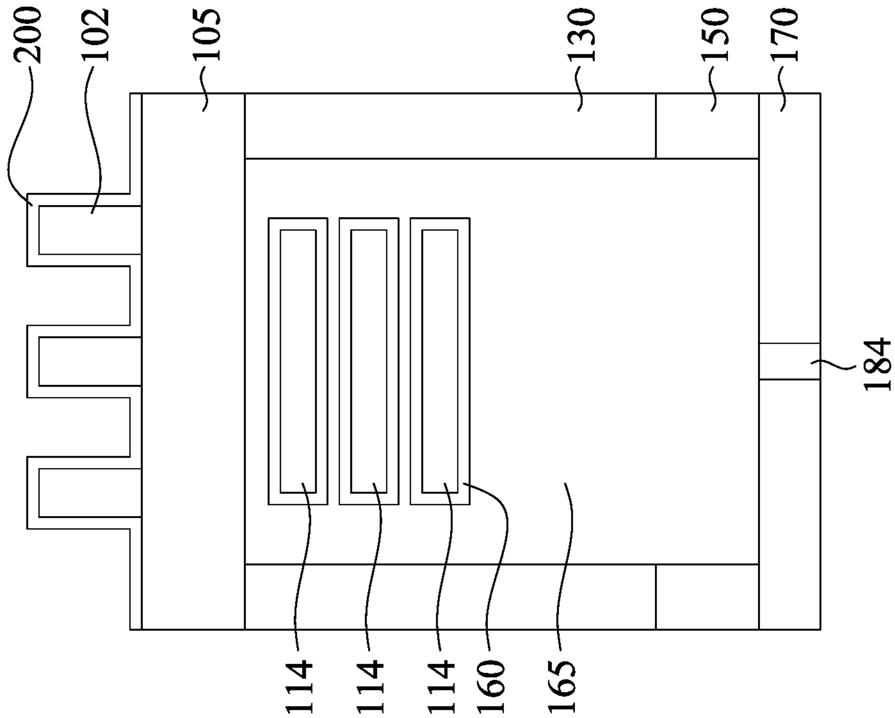
Figure 21C:
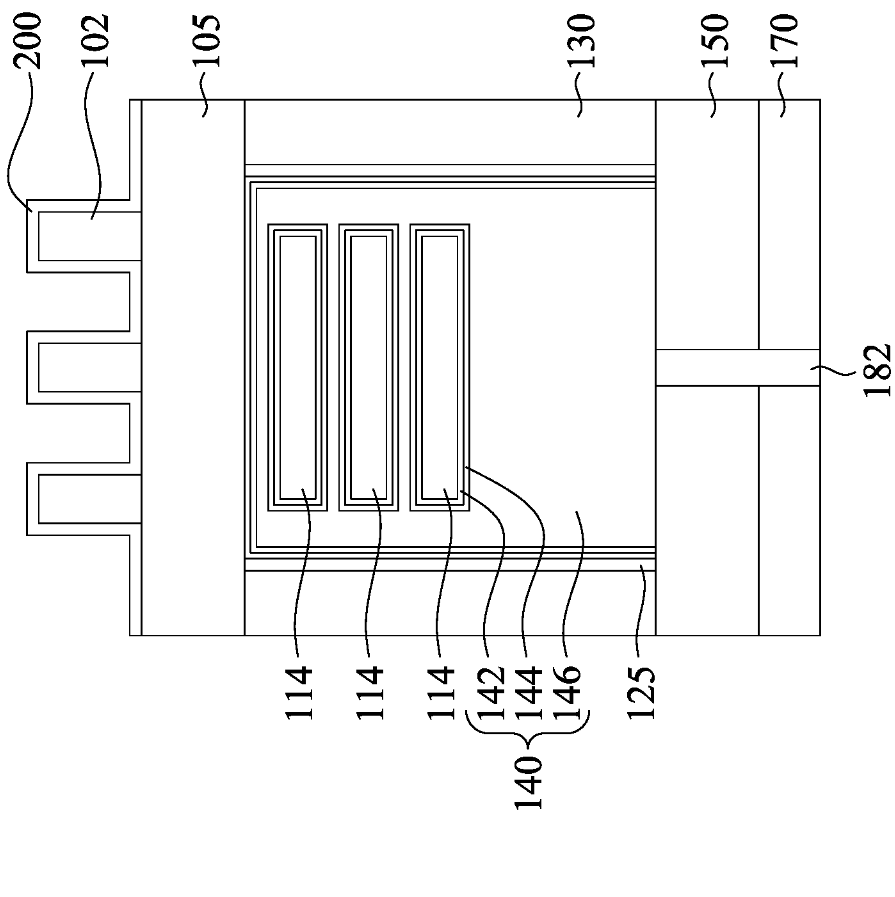

Reference is made to FIGS. 21A to 21D, in which FIG. 21A is a schematic view of a semiconductor device, FIG. 21B is a cross-sectional view along line B-B of FIG. 21A, FIG. 21C is a cross-sectional view along line C-C of FIG. 21A, and FIG. 21D is a cross-sectional view along line D-D of FIG. 21A. A semiconductive oxide layer 200 is deposited over semiconductor strips 102. In greater details, the semiconductive oxide layer 200 may be formed using a highly conformal deposition process, such that the semiconductive oxide layer 200 may line the exposed surfaces of the semiconductor strips 102 and the dielectric layer 105. In some embodiments, the semiconductive oxide layer 200 may include indium gallium zinc oxide (IGZO), or a similar conducting oxide semiconductor material such as indium tin oxide (ITO), indium tungsten oxide (IWO), indium zinc oxide (IZO), zinc tin oxide (ZTO), indium silicon zinc oxide (ISiZO), indium germanium zinc oxide (IGeZO), or magnesium aluminum oxide (MAZO), or combinations thereof. In some embodiments, the semiconductive oxide layer 200 may be deposited by a CVD process or ALD process. In some embodiments, the semiconductive oxide layer 200 may act as a channel layer, and can also be referred to as semiconductive oxide channel layer.

Figure 22B:
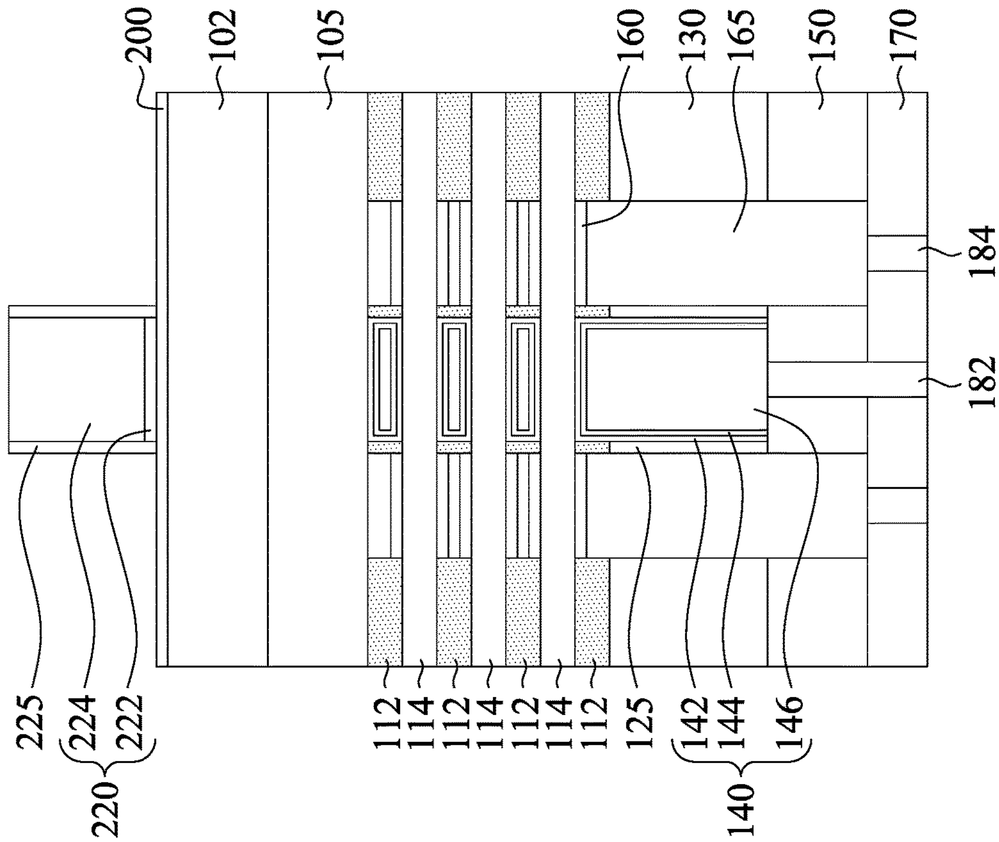
Figure 22A:
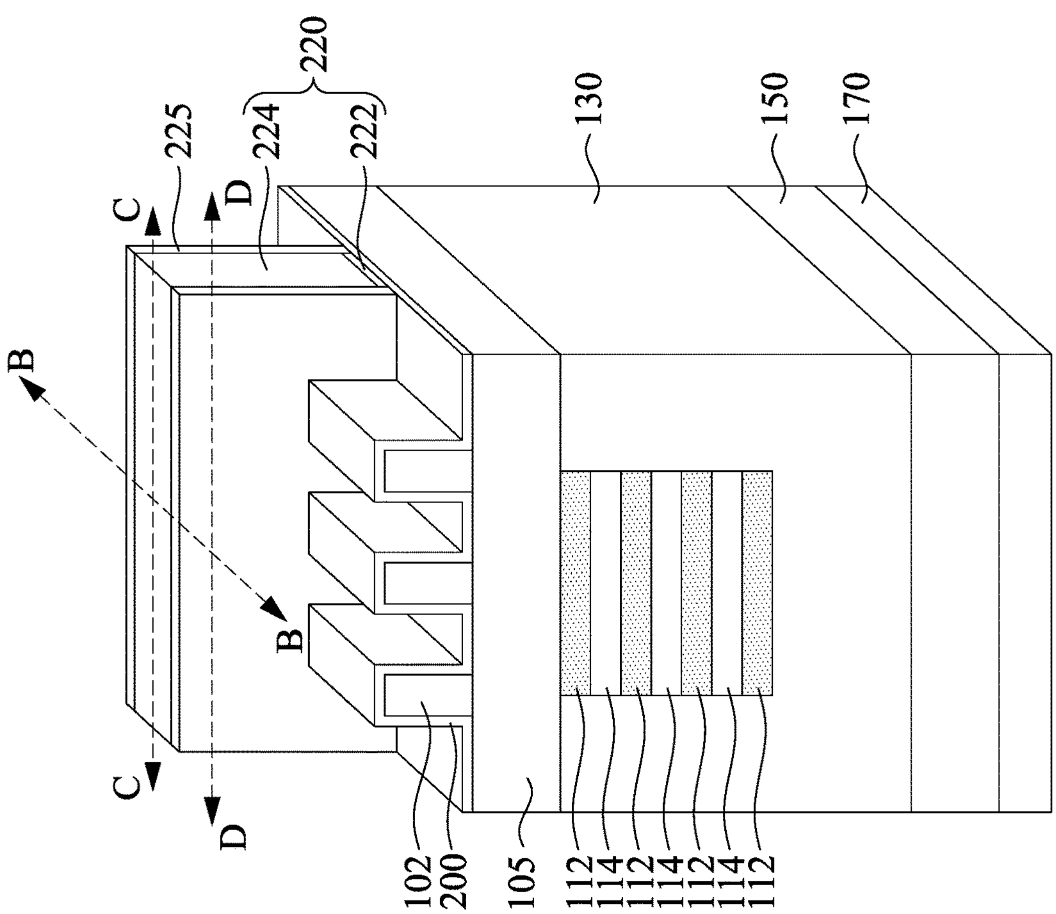
Figure 22D:
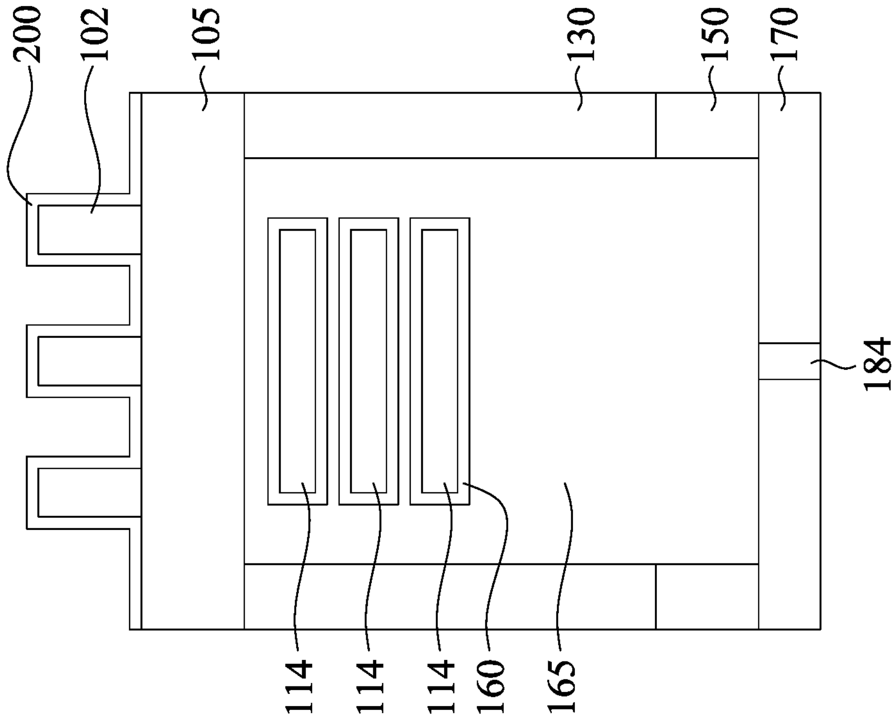
Figure 22C:
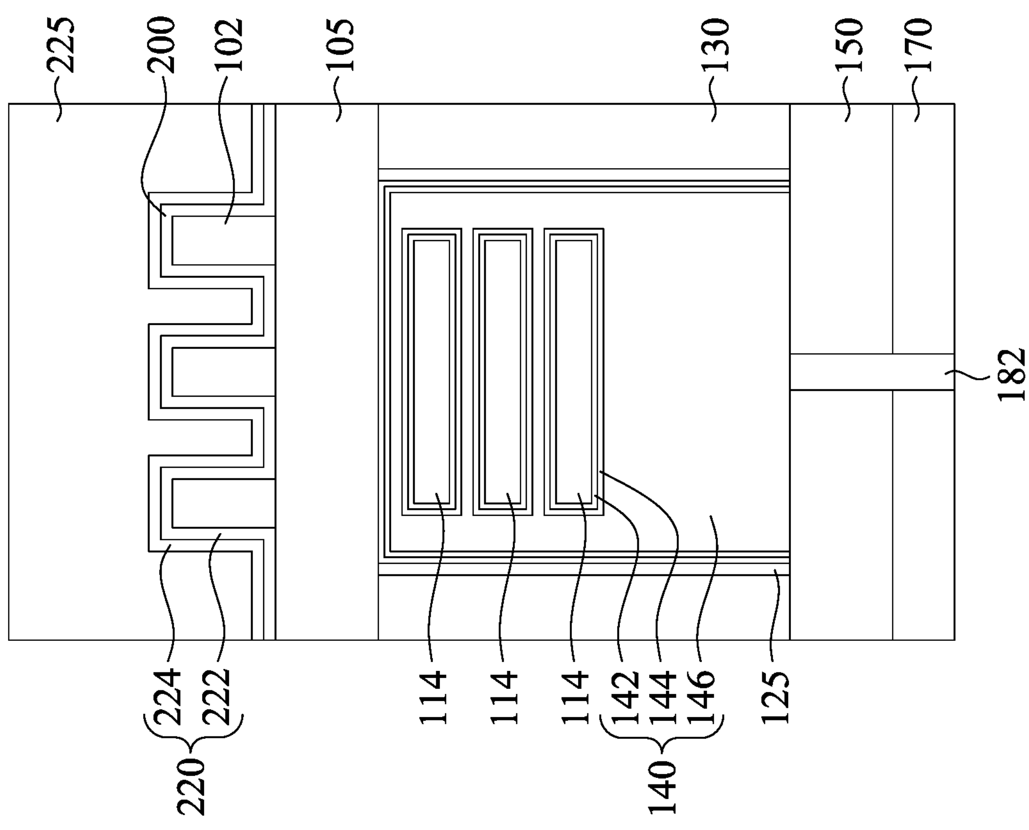

Reference is made to FIGS. 22A to 22D, in which FIG. 22A is a schematic view of a semiconductor device, FIG. 22B is a cross-sectional view along line B-B of FIG. 22A, FIG. 22C is a cross-sectional view along line C-C of FIG. 22A, and FIG. 22D is a cross-sectional view along line D-D of FIG. 22A. A dummy gate structure 220 is formed over the semiconductive oxide layer 200. In some embodiments, the dummy gate structure 220 may cross each of the semiconductor strips 102. The dummy gate structure 220 includes a dummy gate dielectric 222 and a dummy gate electrode 224 over the dummy gate dielectric layer 222. The dummy gate dielectric 222 and the dummy gate electrode 224 may be similar to the dummy gate dielectric 122 and the dummy gate electrode 124, and thus relevant details will not be repeated for brevity.

After the dummy gate structure 220 is formed, gate spacers 225 are formed on sidewalls of the dummy gate structure 220. The gate spacers 225 may be similar to the gate spacers 125, and thus relevant details will not be repeated for brevity.

Figure 23B:
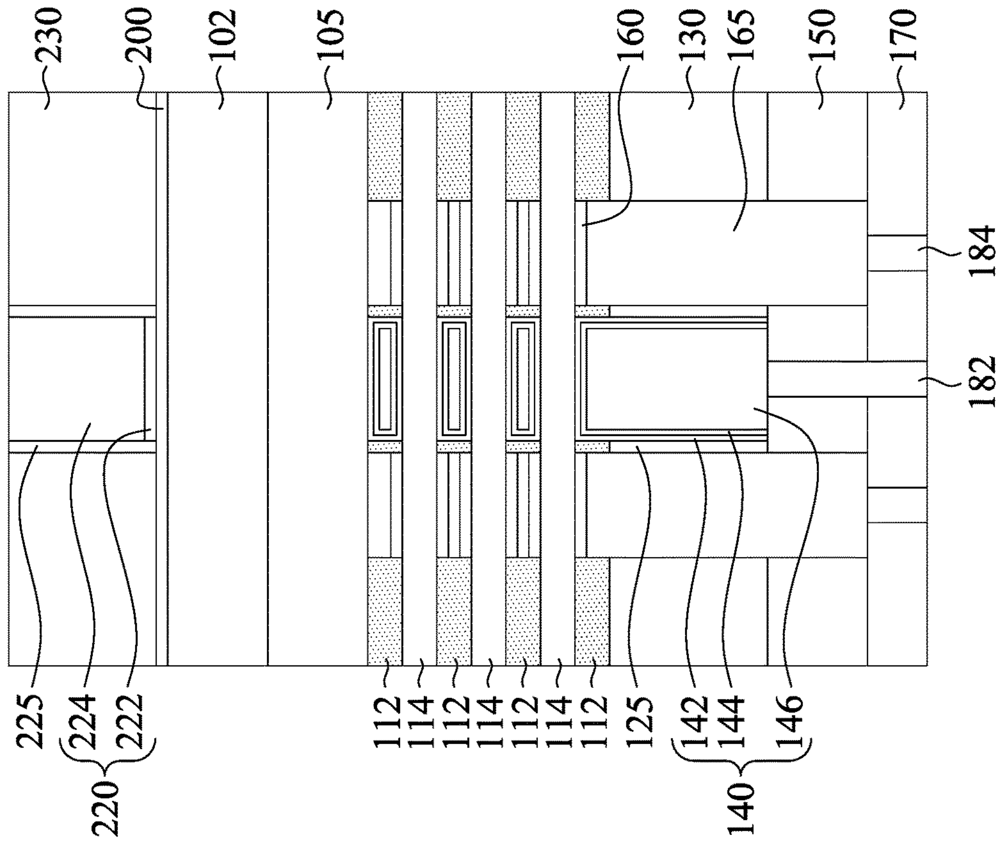
Figure 23A:
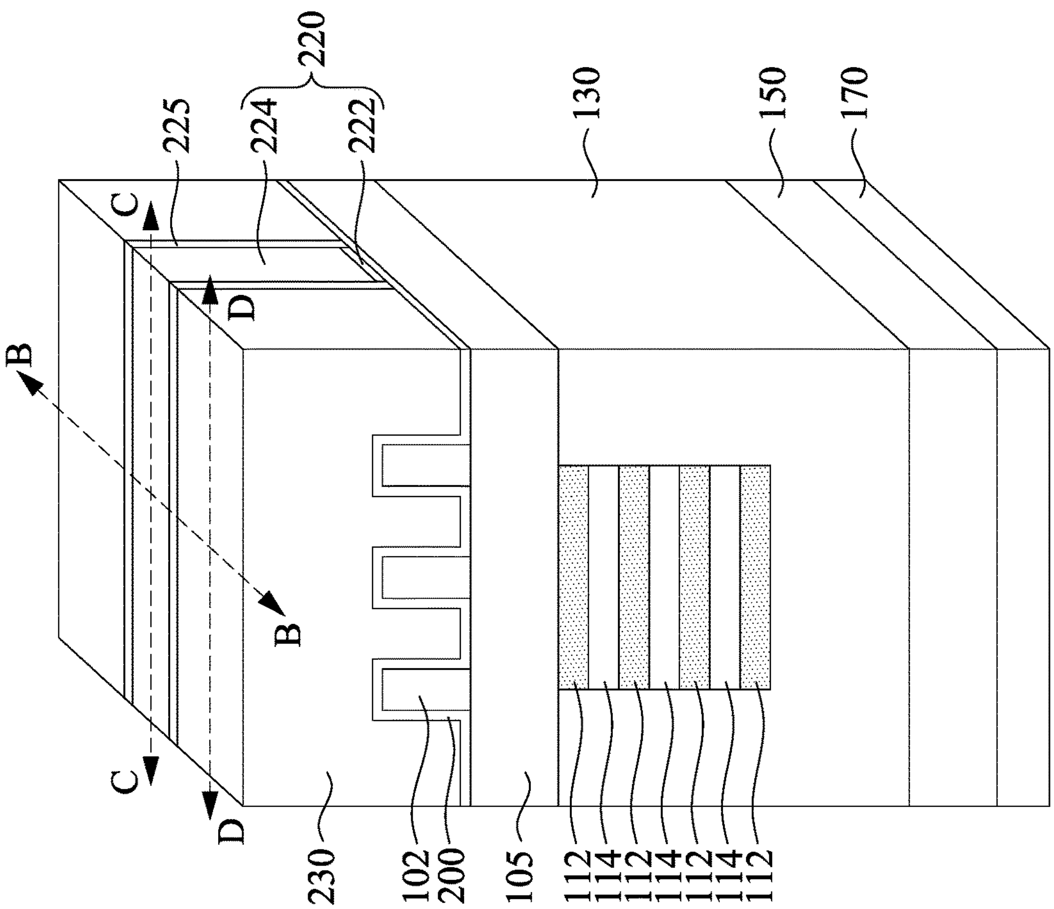
Figure 23C:
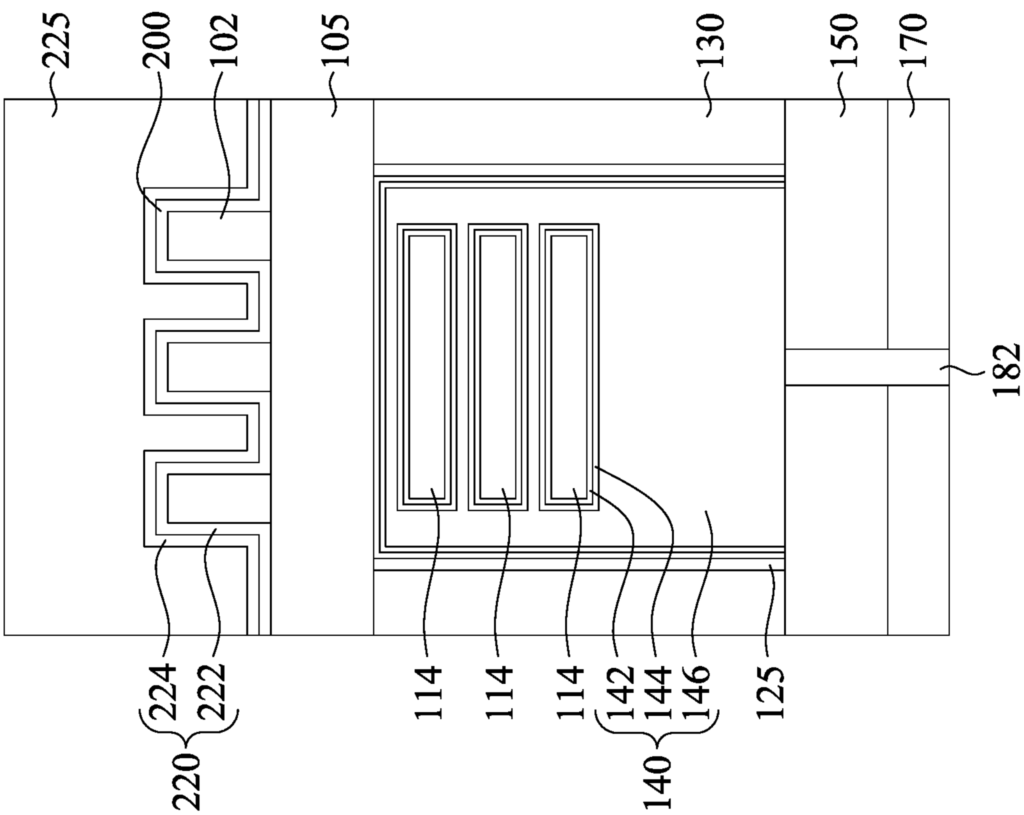
Figure 23D:
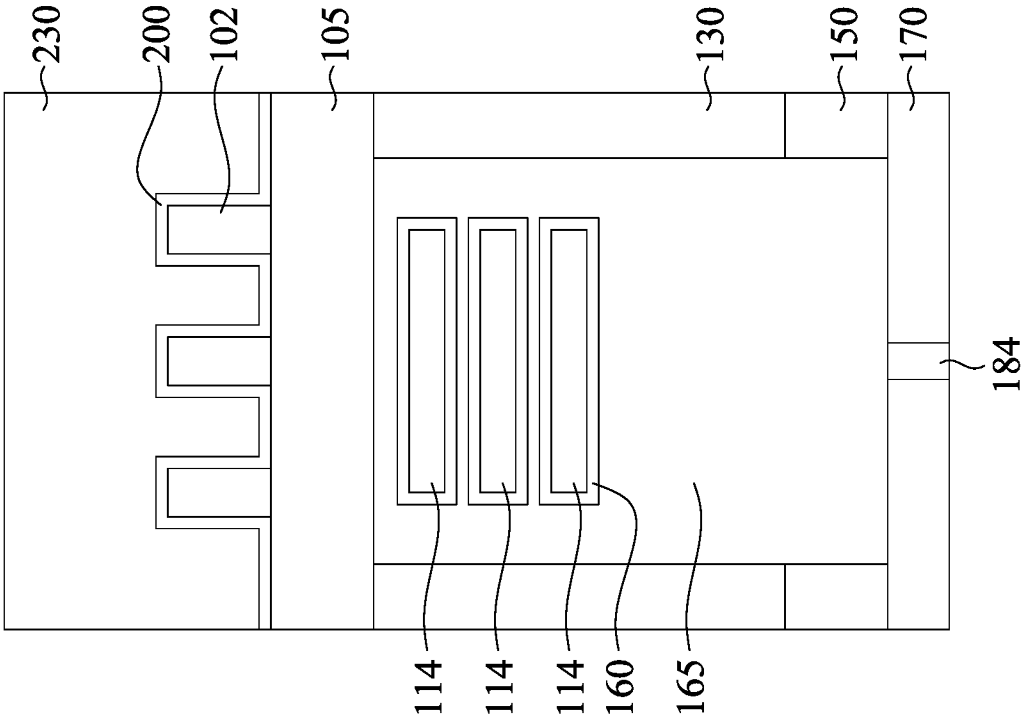

Reference is made to FIGS. 23A to 23D, in which FIG. 23A is a schematic view of a semiconductor device, FIG. 23B is a cross-sectional view along line B-B of FIG. 23A, FIG. 23C is a cross-sectional view along line C-C of FIG. 23A, and FIG. 23D is a cross-sectional view along line D-D of FIG. 23A. An interlayer dielectric (ILD) layer 230 is deposited over the semiconductive oxide layer 200 and laterally surrounding the dummy gate structure 220. In some embodiments, the ILD layer 230 may be formed by depositing a dielectric material, and a CMP process may be performed to the ILD layer 230 until top surface of the dummy gate structure 220 is exposed. The ILD layer 230 may be similar to the ILD layer 130, and thus relevant details will not be repeated for brevity.

Figure 24B:
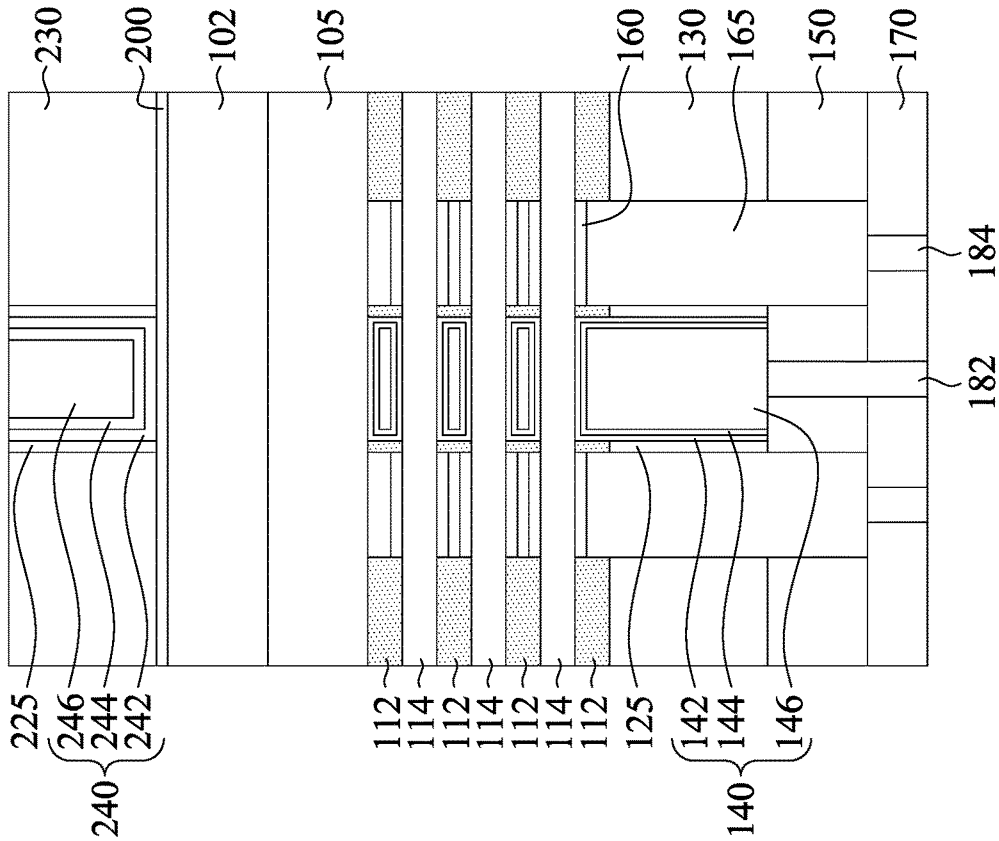
Figure 24A:
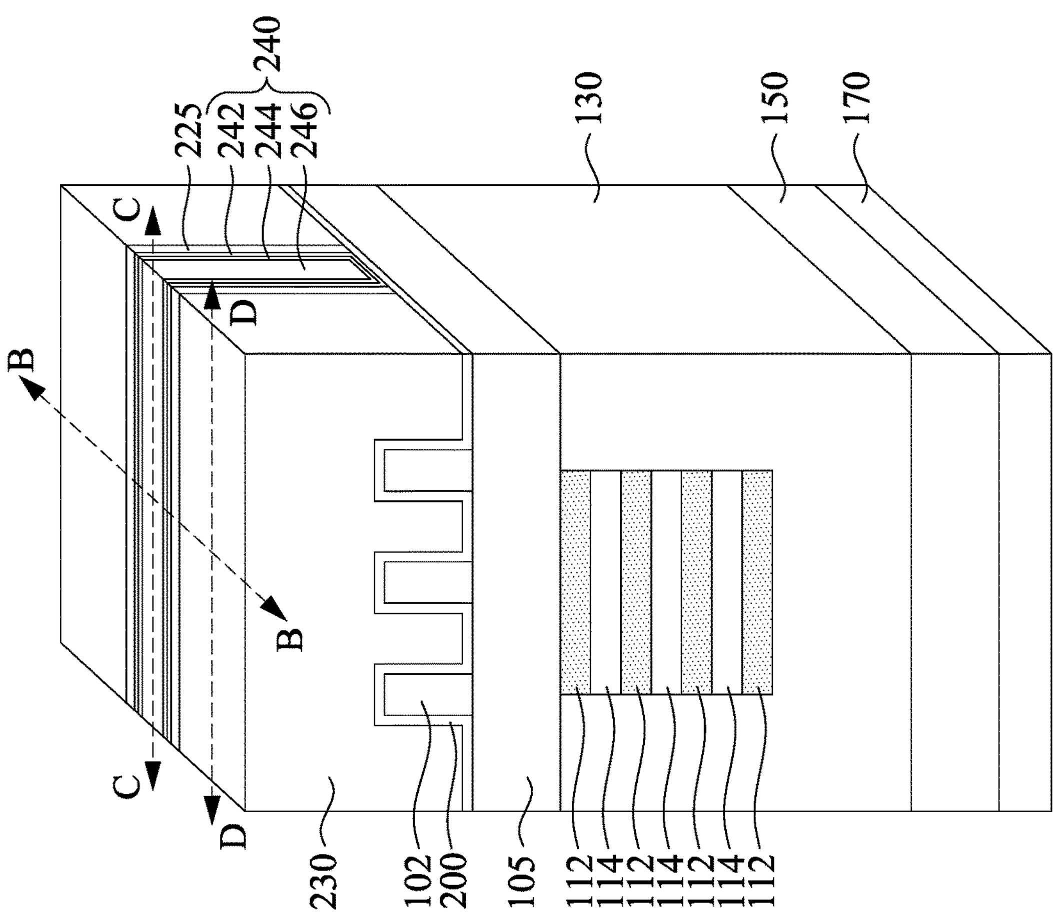
Figure 24D:
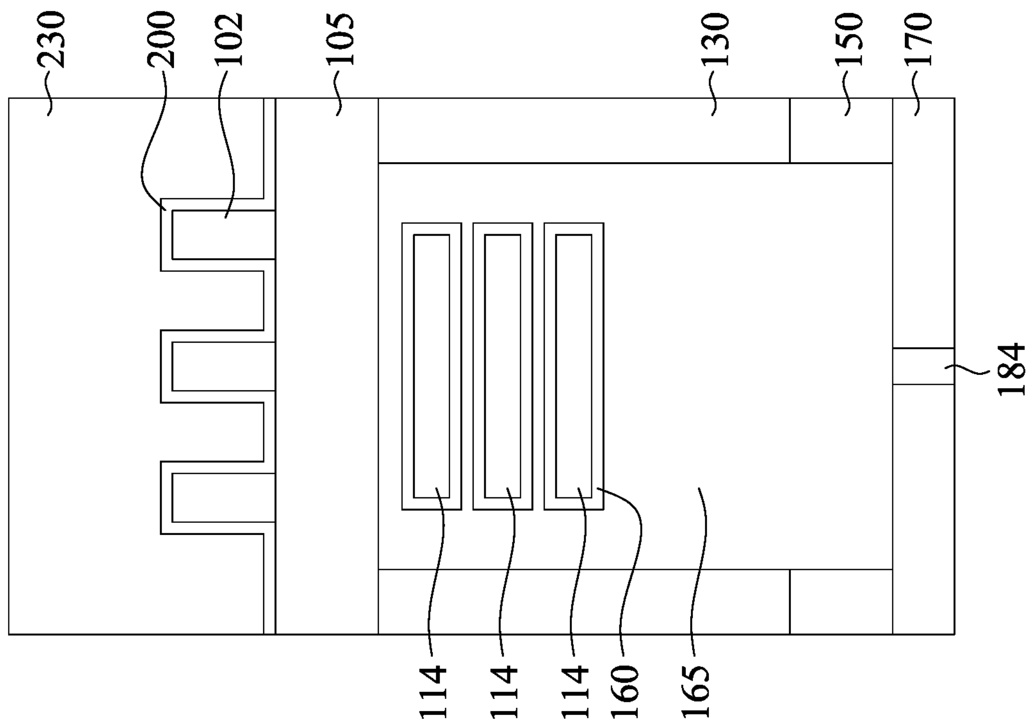
Figure 24C:
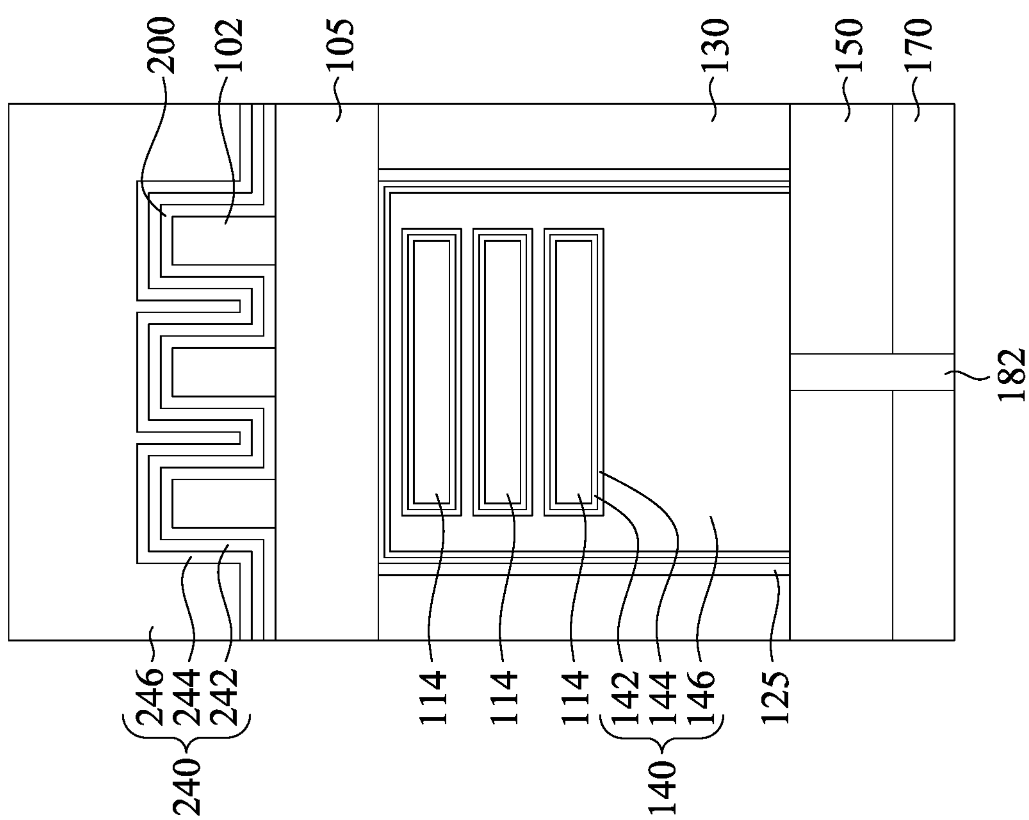

Reference is made to FIGS. 24A to 24D, in which FIG. 24A is a schematic view of a semiconductor device, FIG. 24B is a cross-sectional view along line B-B of FIG. 24A, FIG. 24C is a cross-sectional view along line C-C of FIG. 24A, and FIG. 24D is a cross-sectional view along line D-D of FIG. 24A. The dummy gate structure 220 is replaced with a gate structure 240. For example, the dummy gate structure 220 may be removed to form a gate trench between the gate spacers 225, and then the gate structure 240 may be formed in the gate trench. In some embodiments, the gate structure 240 may include a gate dielectric layer 242, a work function metal layer 244 over the gate dielectric layer 242, and a gate electrode 246 over the work function metal layer 244. The gate dielectric layer 242, the work function metal layer 244, and the gate electrode 246 are similar to the gate dielectric layer 142, the work function metal layer 144, and the gate electrode 146, respectively, and thus relevant details will not be repeated for brevity.

Figure 25A:
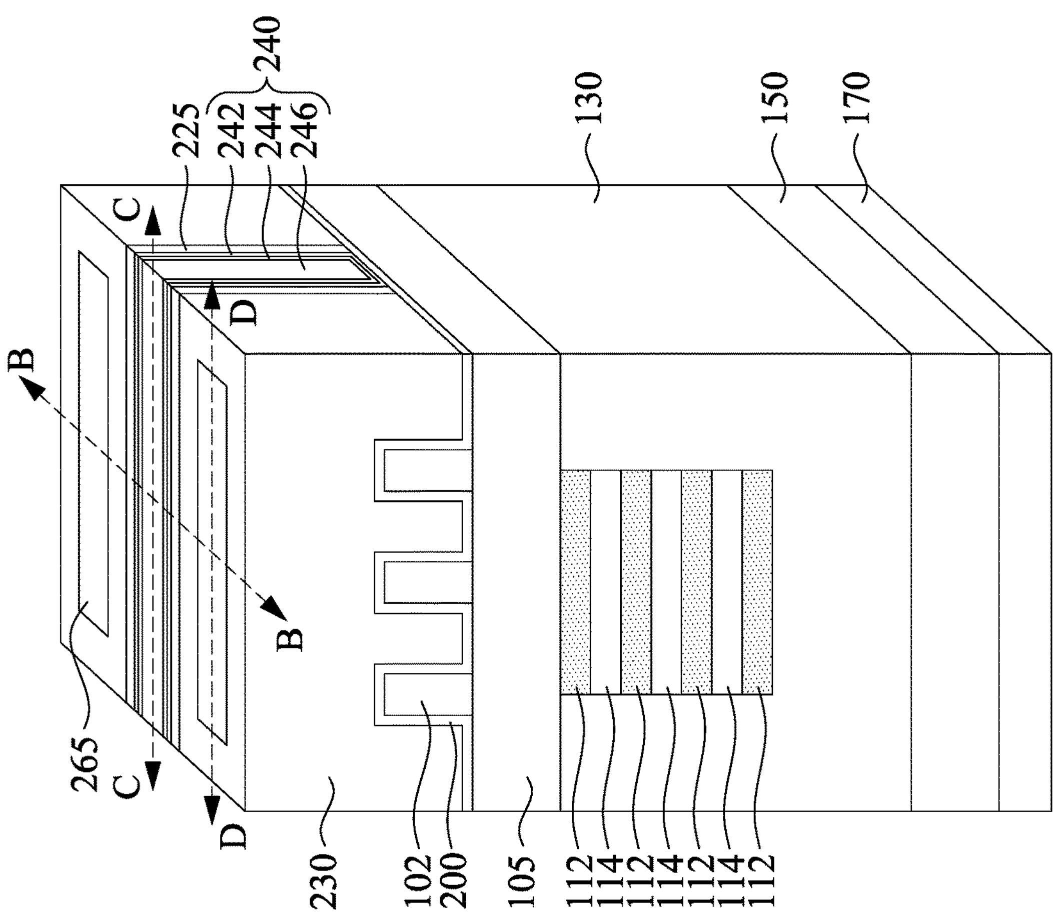
Figure 25B:
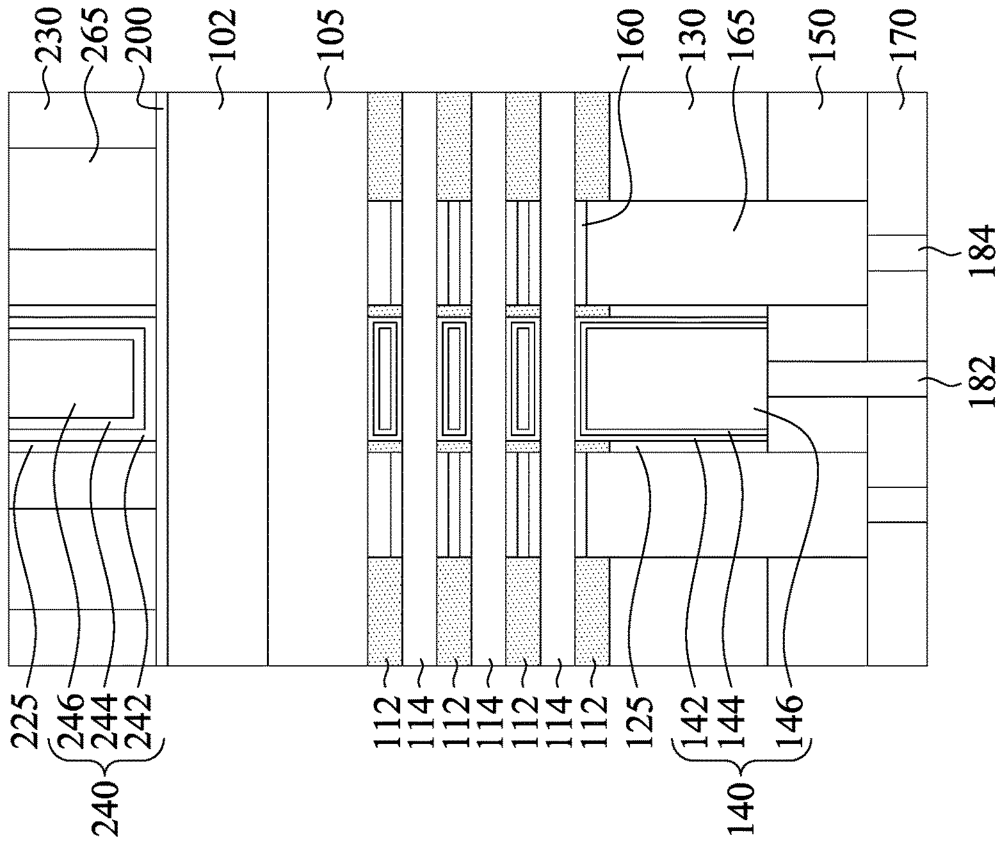
Figure 25D:
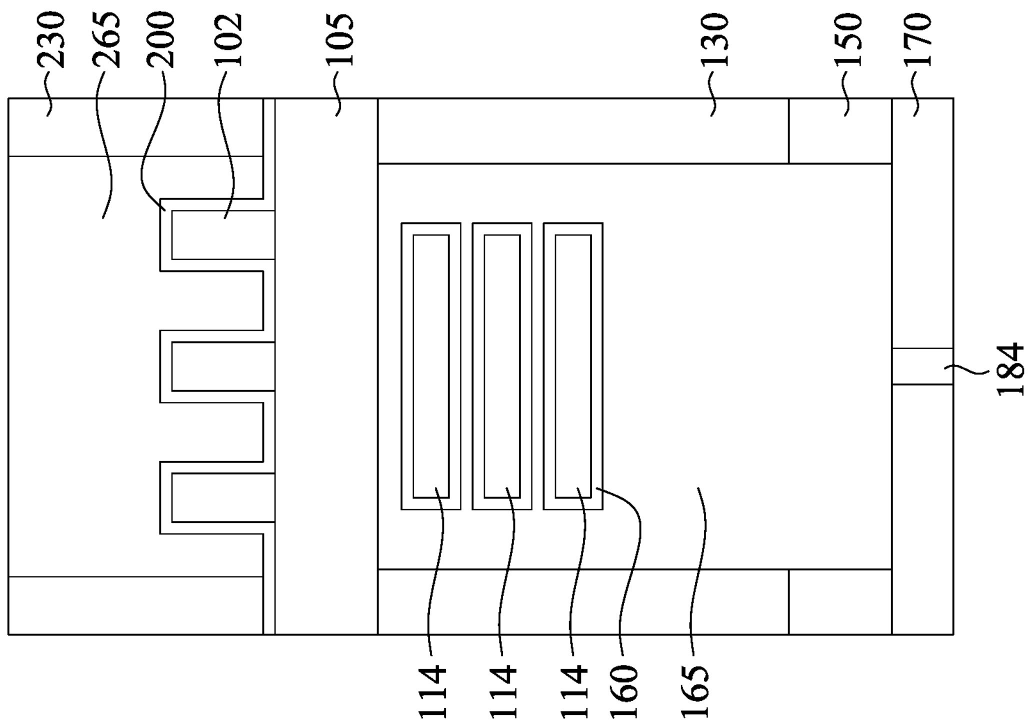
Figure 25C:
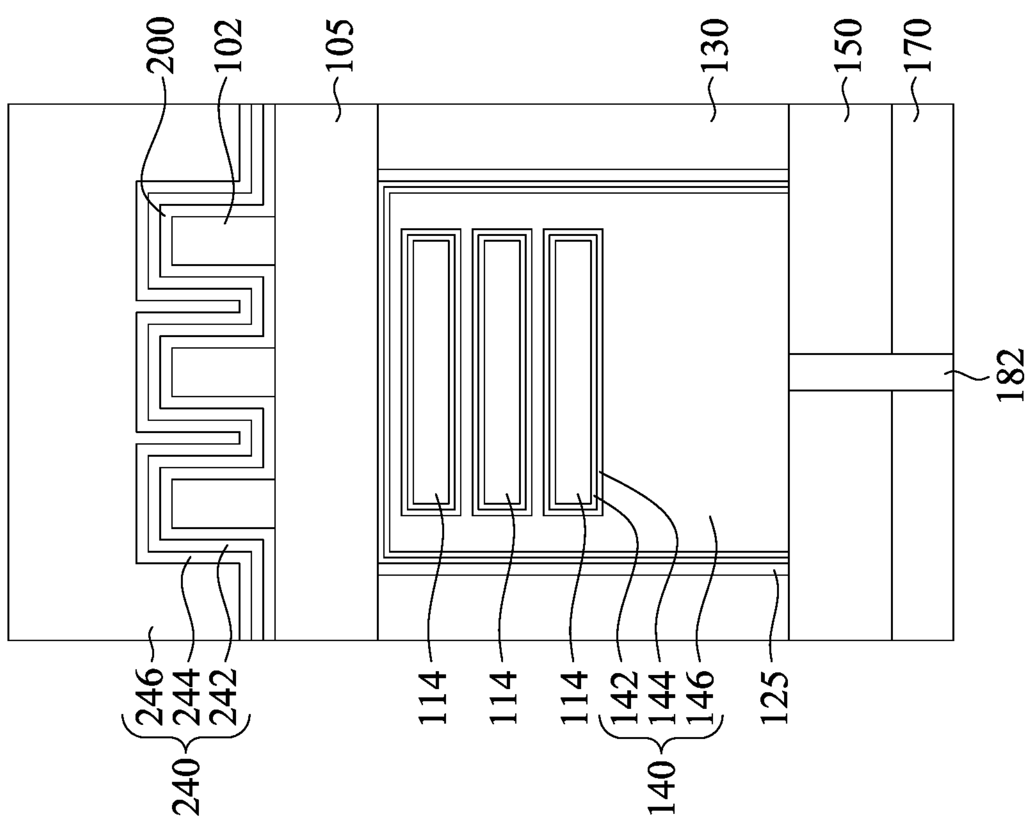

Reference is made to FIGS. 25A to 25D, in which FIG. 25A is a schematic view of a semiconductor device, FIG. 25B is a cross-sectional view along line B-B of FIG. 25A, FIG. 25C is a cross-sectional view along line C-C of FIG. 25A, and FIG. 25D is a cross-sectional view along line D-D of FIG. 25A. Source/drain contacts 265 are formed in the ILD layer 230. In some embodiments, the source/drain contacts 265 may be formed by, for example, etching the ILD layer 230 to form openings exposing the semiconductive oxide layer 200, filling the openings with conductive material, and then performing a CMP process to remove excess conductive material. The source/drain contacts 265 are similar to the source/drain contacts 165, and thus relevant details will not be repeated for brevity.

The source/drain contacts 265 may be in contact with source/drain regions of the semiconductive oxide layer 200, and the gate structure 240 may be in contact with channel region of the semiconductive oxide layer 200. In some embodiments, the gate structure 240, the semiconductive oxide layer 200, and the source/drain contacts 265 may collectively serve as a second transistor. In some embodiments, the second transistor is an n-type device. In some embodiments, the channel layer of the second transistor is conformally disposed on the semiconductor strips 102, which include fin-like structure. Accordingly, the second transistor can also be referred to as an n-type FinFET.

The first transistor formed by the second semiconductor layers 114, the gate structure 140, and the source/drain epitaxy structures 160 may include different conductivity type than the second transistor formed by the gate structure 240, the semiconductive oxide layer 200, and the source/drain contacts 265. In some embodiments, the first transistor is formed on a first side of the dielectric layer 105, and the second transistor is formed on a second side of the dielectric layer 105 opposite to the first side of the dielectric layer 105.

In some embodiments of the present disclosure, a dielectric layer 105 is formed over a substrate 100, and a p-type transistor is formed on a first side of the dielectric layer 105. After the p-type transistor is formed, the structure is flipped over to expose the backside of the substrate 100, and the substrate 100 is removed to expose a second side of the dielectric layer 105. Afterwards, an n-type transistor may be formed on the second side of the dielectric layer 105. Embodiments of the present disclosure provide a method for forming a CFET, in which a p-type transistor and an n-type transistor of the CFET are formed on opposite sides of a dielectric layer. This may improve the quality of each of the p-type transistor and the n-type transistor. If the p-type transistor and the n-type transistor of the CFET are formed on a same side of a dielectric layer (or a substrate), the transistor at bottom tier may sustain the processing of the top tier transistor, which may deteriorate the quality of the bottom tier transistor. Moreover, the p-type transistor may include high-mobility channel materials such as Ge or Ge-rich SiGe, which may include a higher thermal budget. Embodiments of the present disclosure also provide a CFET structure by using semiconductive oxide as a channel layer of the n-type device of the CFET, which results in that the n-type device has a higher thermal budget. Accordingly, after forming the p-type transistor, the n-type transistor can be formed with a lower processing temperature than the p-type transistor, which can prevent the p-type transistor from thermal damage during processing the n-type transistor.

Figure 26B:
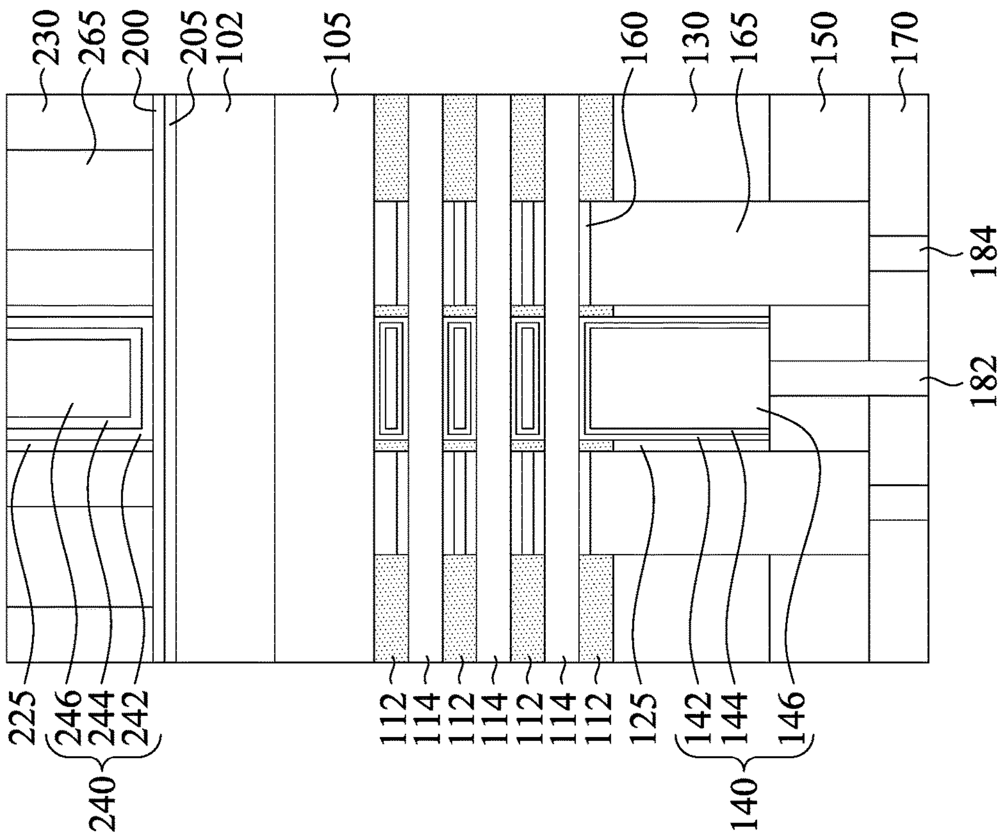
FIGS. 26A to 26D show a semiconductor device according to some embodiments of the present disclosure.
Figure 26A:
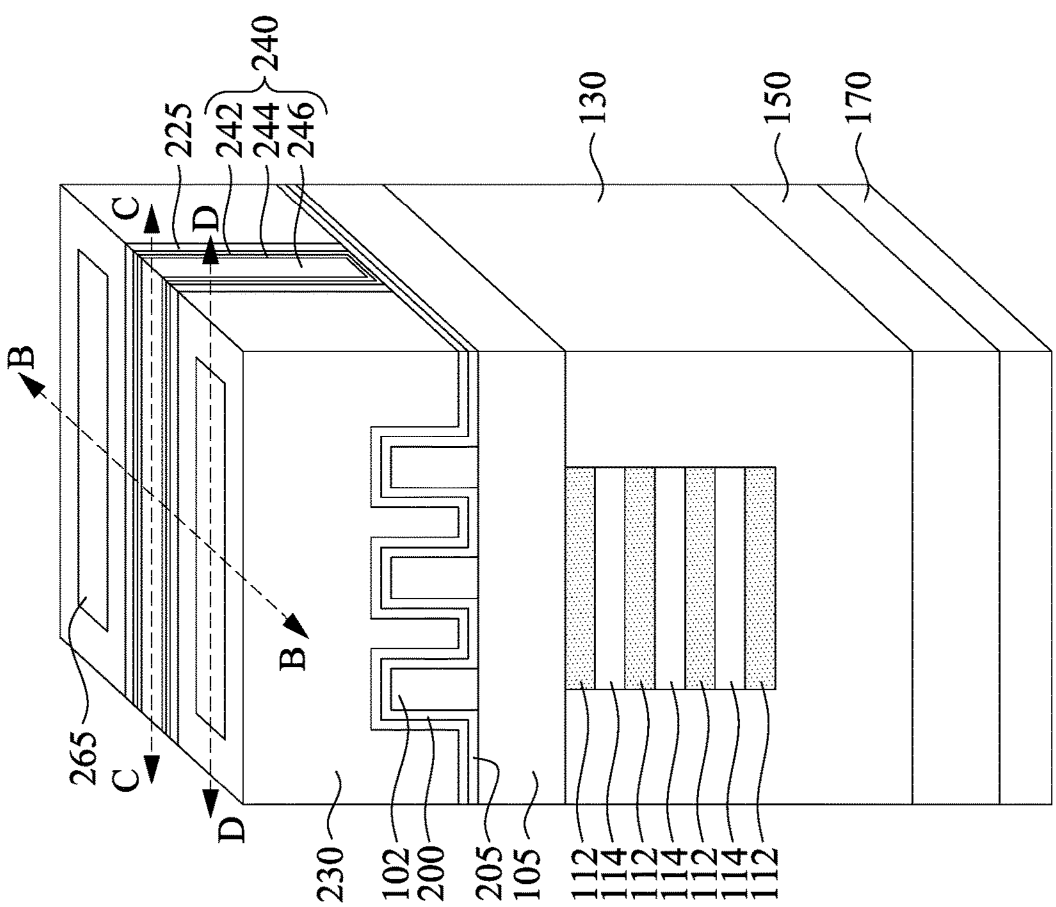
Figure 26C:
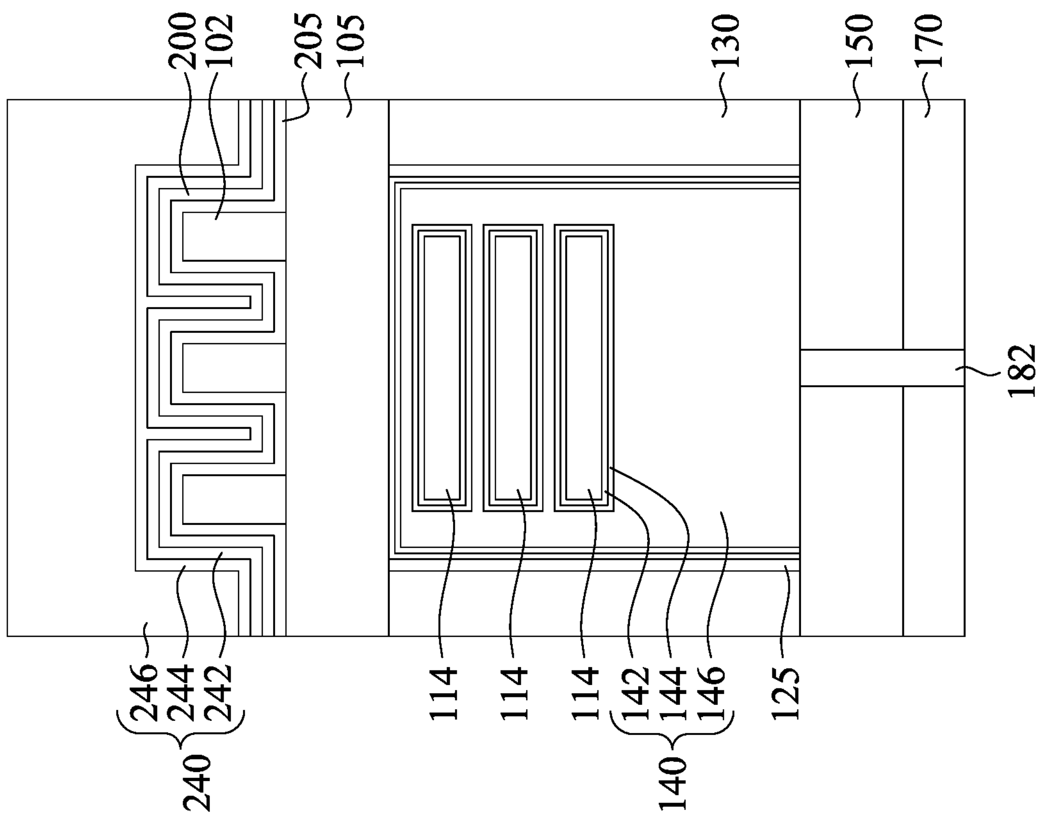
Figure 26D:
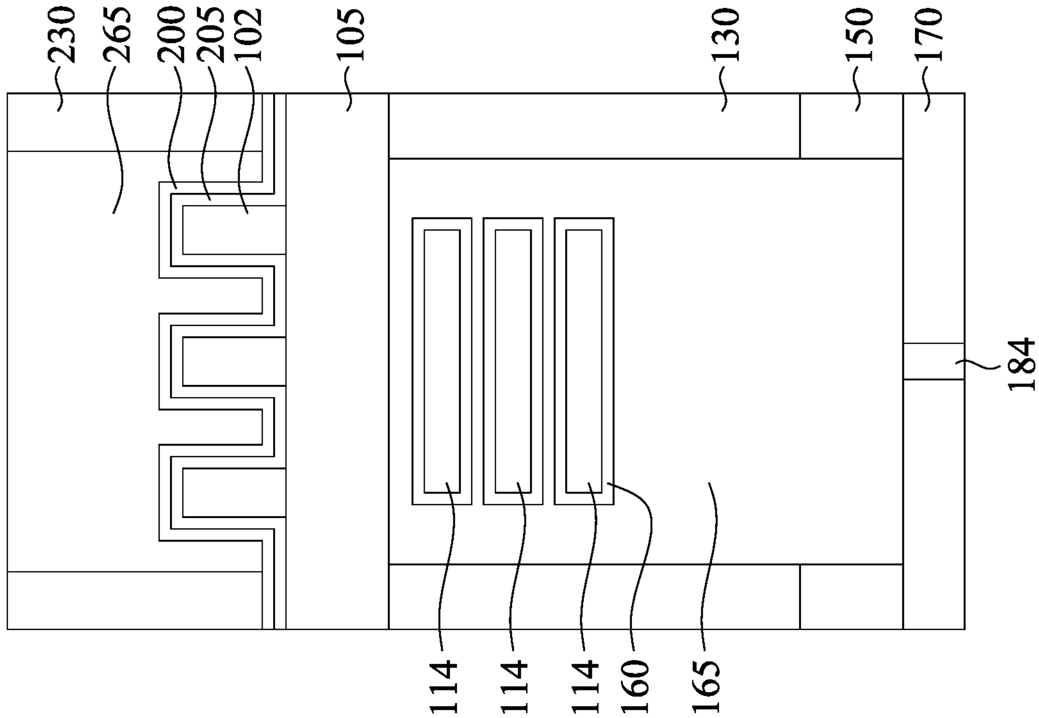

FIGS. 26A to 26D show a semiconductor device according to some embodiments of the present disclosure, in which, in which FIG. 26A is a schematic view of a semiconductor device, FIG. 26B is a cross-sectional view along line B-B of FIG. 26A, FIG. 26C is a cross-sectional view along line C-C of FIG. 26A, and FIG. 26D is a cross-sectional view along line D-D of FIG. 26A. It is noted that the semiconductor device of FIGS. 26A to 26D is similar to the semiconductor device as described with respect to FIGS. 1A to 25D. Accordingly, similar elements are labeled the same, and relevant details will not be repeated for brevity.

The semiconductor device of FIGS. 26A to 26D is different from the semiconductor device of FIGS. 25A to 25D, in that a dielectric layer 205 is deposited over the semiconductor strips 102 prior to depositing the semiconductive oxide layer 200. That is, the semiconductive oxide layer 200 is deposited over the dielectric layer 205, and thus the semiconductive oxide layer 200 may be separated from the semiconductor strips 102 by the dielectric layer 205. In some embodiments, the dielectric layer 205 may be formed using a highly conformal deposition process, such that the dielectric layer 205 may line the exposed surfaces of the semiconductor strips 102 and the dielectric layer 105. In some embodiments, the dielectric layer 205 and the dielectric layer 105 are made of a same material. In some embodiments, the dielectric layer 205 may be deposited by a CVD process or ALD process. In some embodiments, the dielectric layer 205 can also be referred to as a dielectric liner.

FIGS. 27A to 32D show various stages of manufacturing operations for a semiconductor device according to some embodiments of the present disclosure. It is noted that the semiconductor device of FIGS. 27A to 32D is similar to the semiconductor device as described with respect to FIGS. 1A to 25D. Accordingly, similar elements are labeled the same, and relevant details will not be repeated for brevity.

Figure 27B:
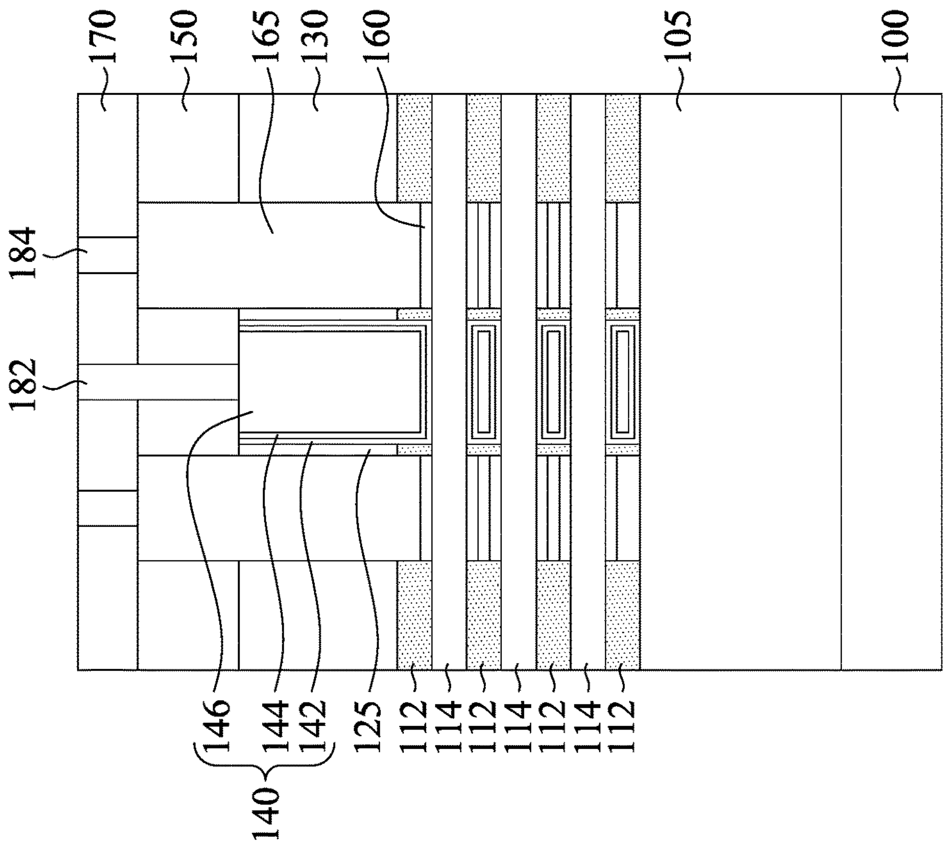
FIGS. 27A to 32D show various stages of manufacturing operations for a semiconductor device according to some embodiments of the present disclosure.
Figure 27A:
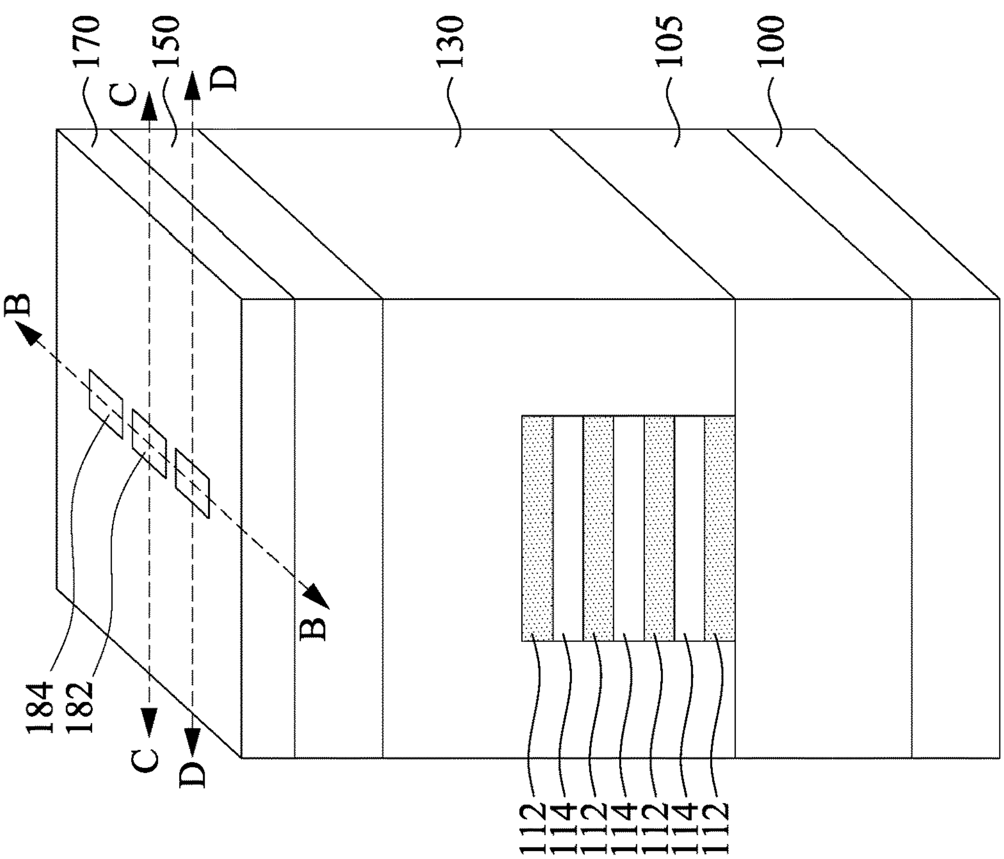
Figure 27D:
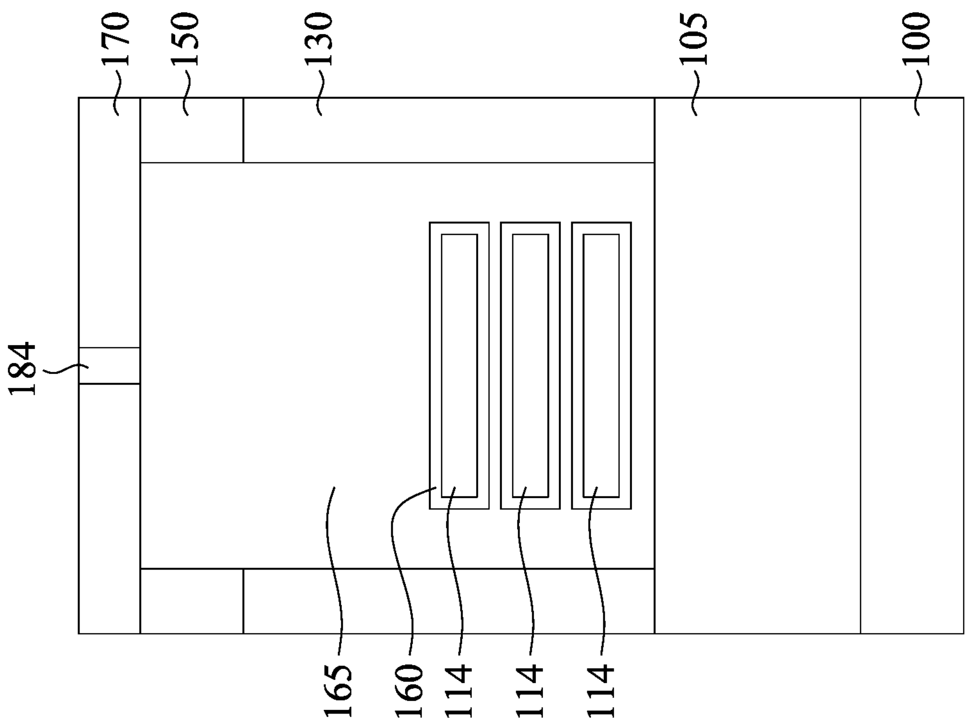
Figure 27C:
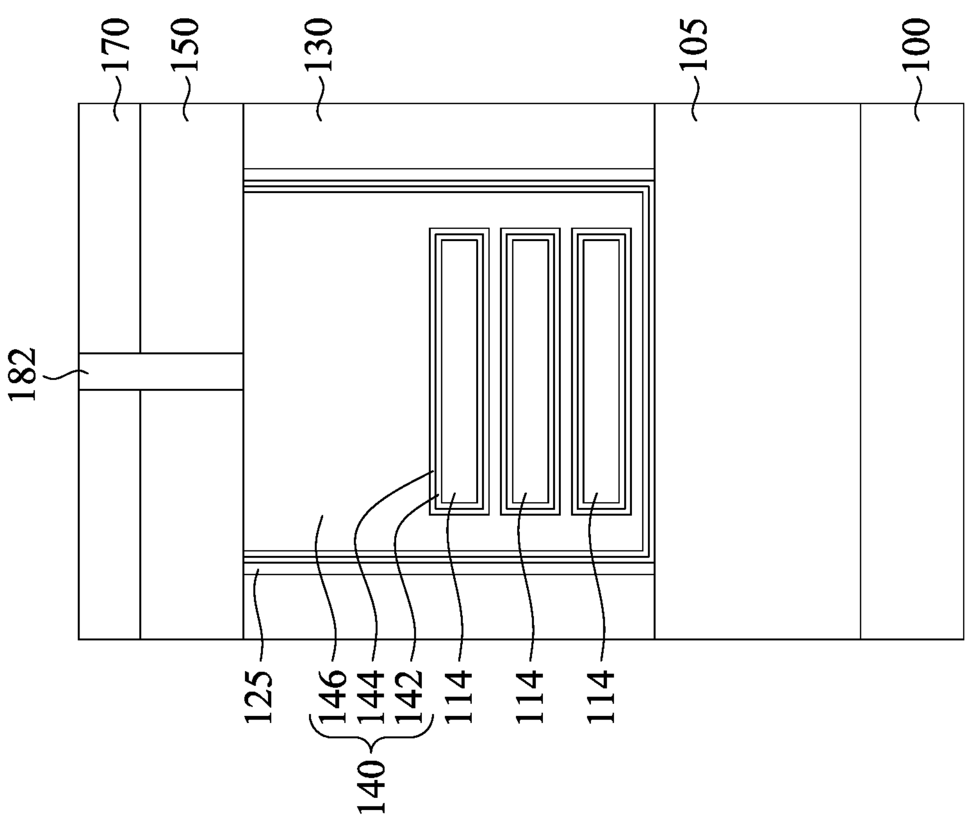

Reference is made to FIGS. 27A to 27D, in which FIG. 27A is a schematic view of a semiconductor device, FIG. 27B is a cross-sectional view along line B-B of FIG. 27A, FIG. 27C is a cross-sectional view along line C-C of FIG. 27A, and FIG. 27D is a cross-sectional view along line D-D of FIG. 27A. FIGS. 27A to 27D are similar to FIGS. 17A to 17D, and the difference between the structure of FIGS. 27A to 27D and the structure of FIGS. 17A to 17D is that the semiconductor strips 102 of FIGS. 17A to 17D are omitted in FIGURES. FIGS. 27A to 27D. For example, the patterning process described in FIGS. 2A to 2C may be omitted, and the resulting structure is shown in FIGS. 27A to 27D. As a result, the dielectric layer 105 may form a flat interface with the surface of the substrate 100.

Figure 28A:
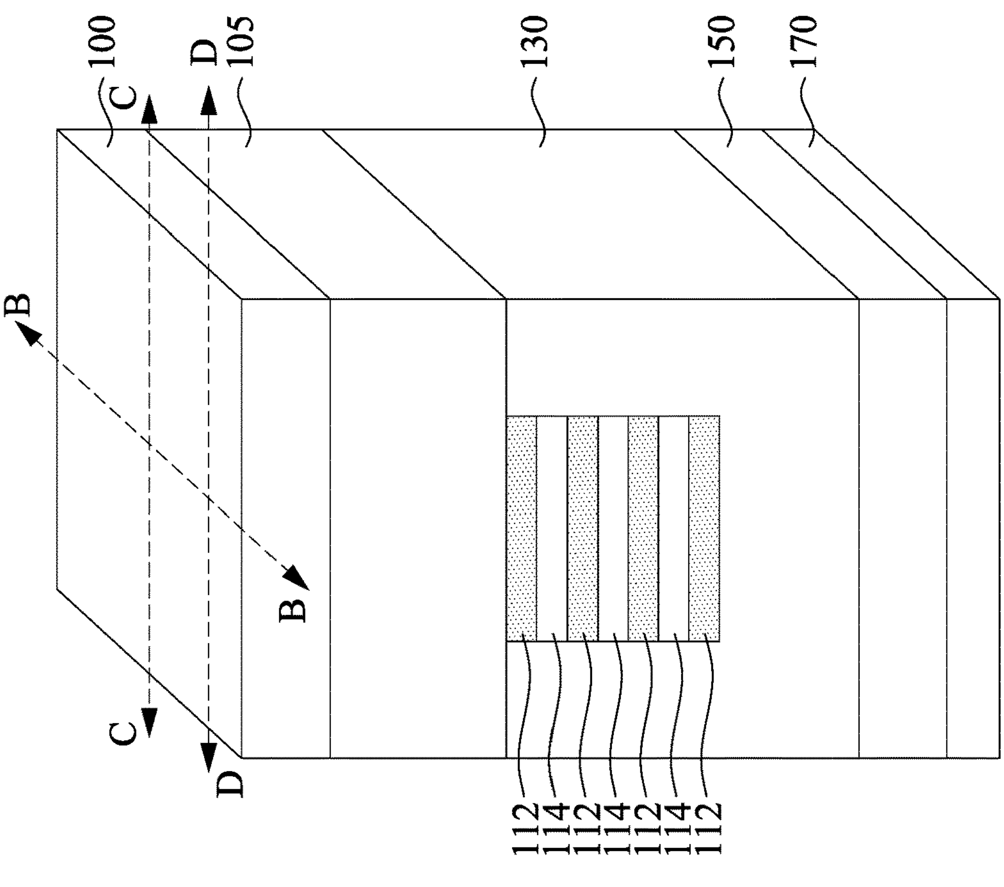
Figure 28B:
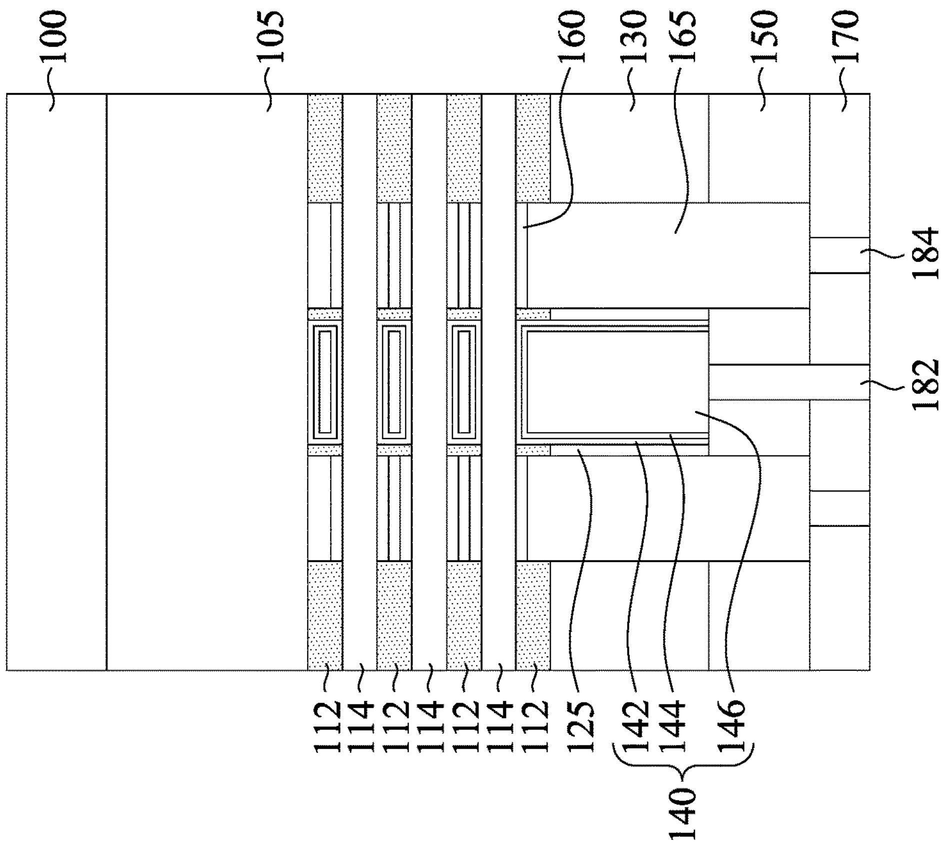
Figure 28D:
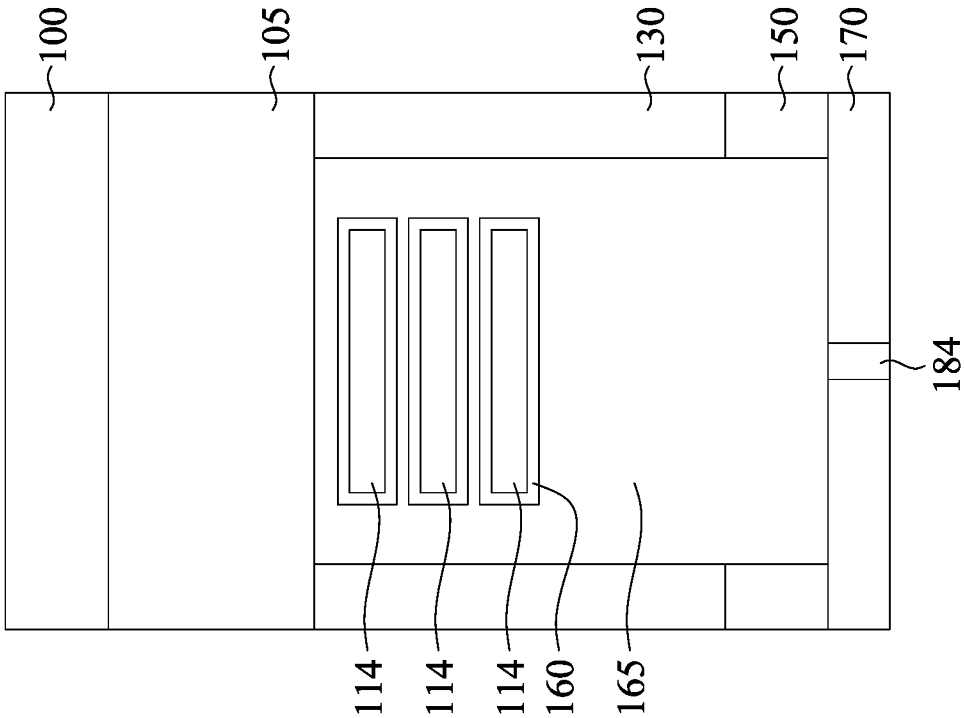
Figure 28C:
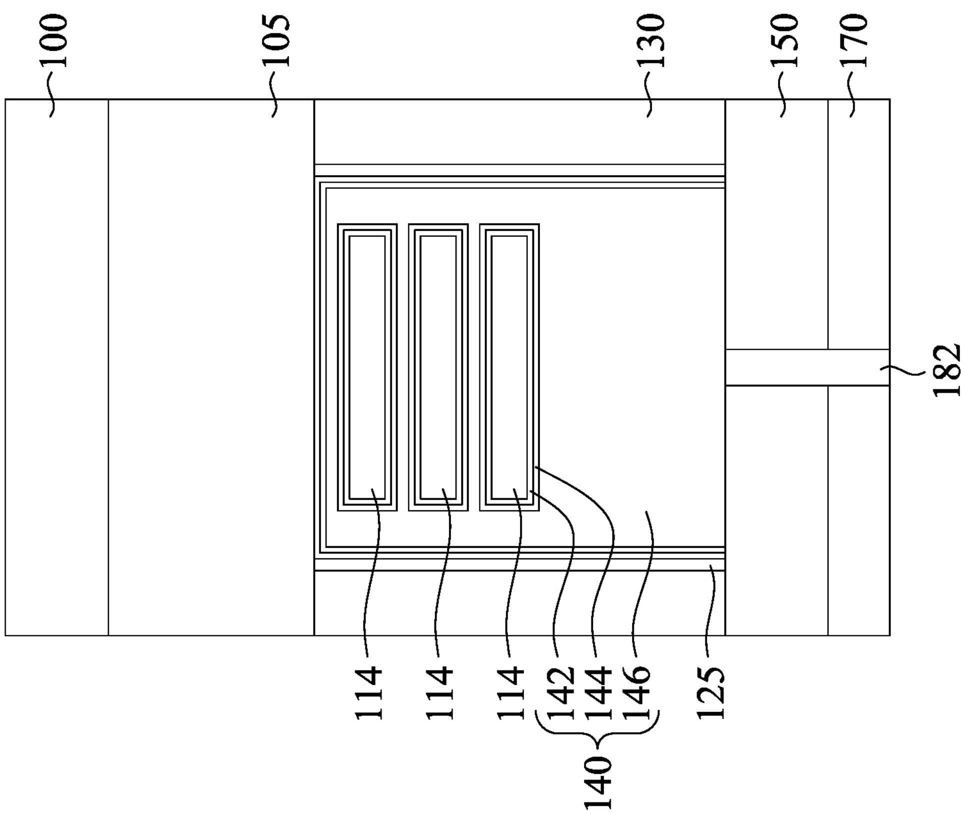

Reference is made to FIGS. 28A to 28D, in which FIG. 28A is a schematic view of a semiconductor device, FIG. 28B is a cross-sectional view along line B-B of FIG. 28A, FIG. 28C is a cross-sectional view along line C-C of FIG. 28A, and FIG. 28D is a cross-sectional view along line D-D of FIG. 28A. The structure of FIGS. 27A to 27D may be flipped over by 180 degrees, such that the back side of the substrate 100 may face upwardly.

Figure 29B:
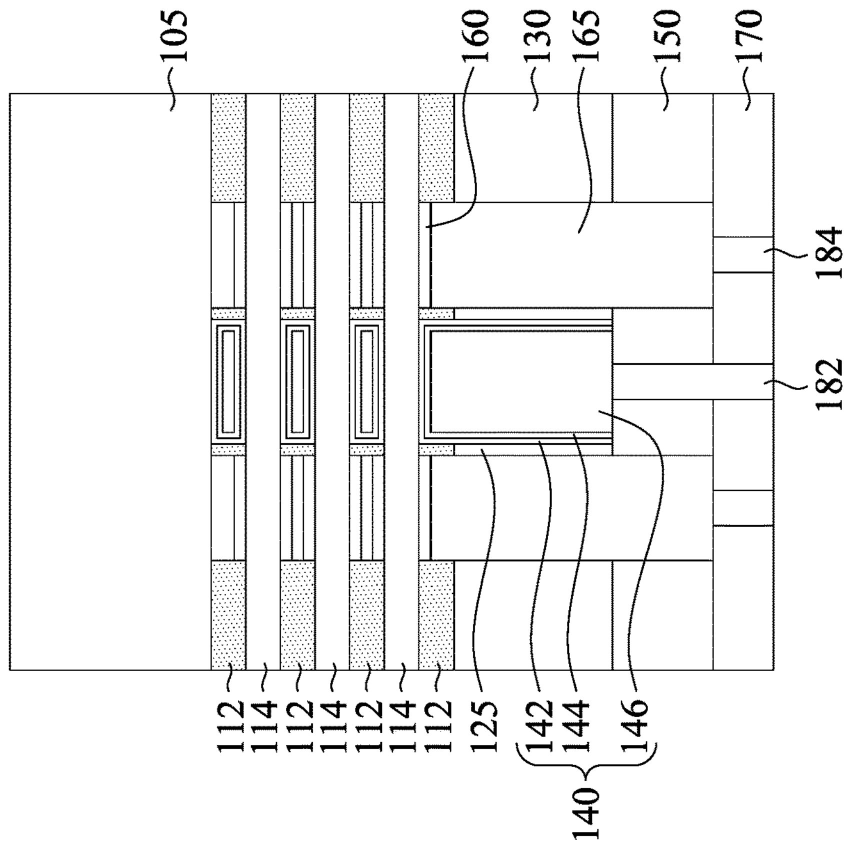
Figure 29A:
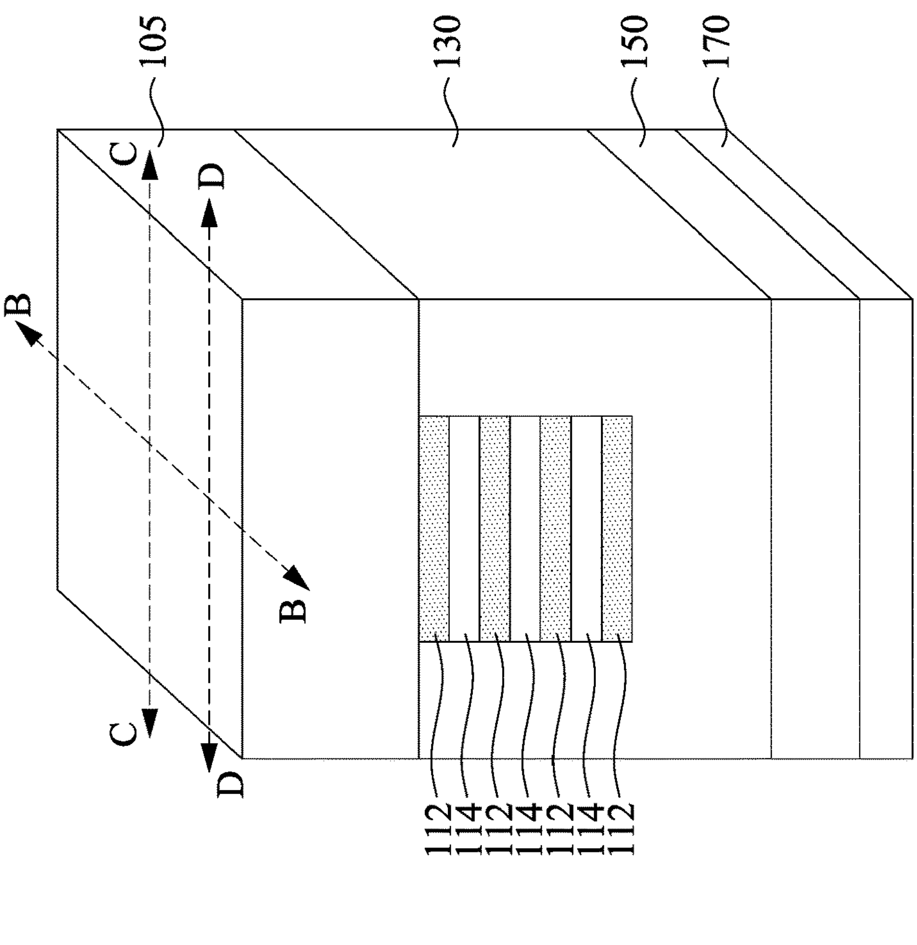
Figure 29D:
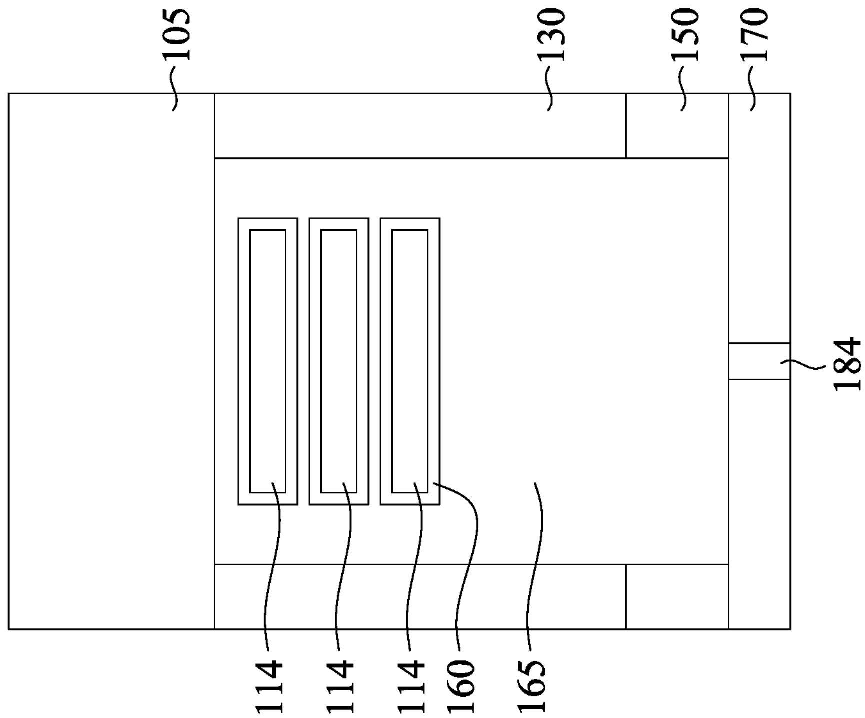
Figure 29C:
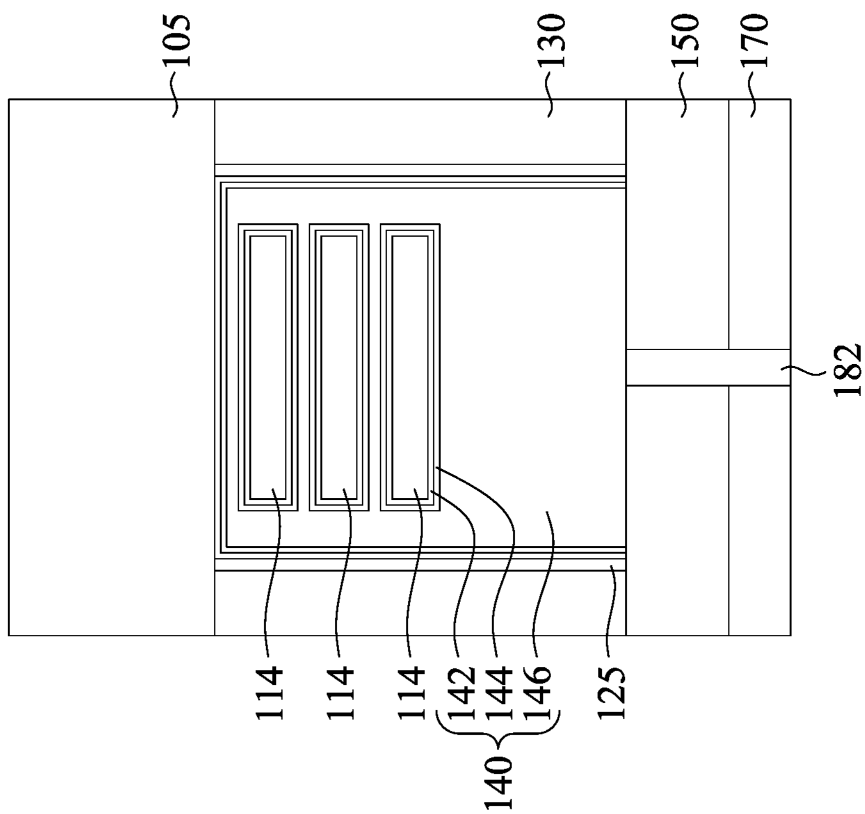

Reference is made to FIGS. 29A to 29D, in which FIG. 29A is a schematic view of a semiconductor device, FIG. 29B is a cross-sectional view along line B-B of FIG. 29A, FIG. 29C is a cross-sectional view along line C-C of FIG. 29A, and FIG. 29D is a cross-sectional view along line D-D of FIG. 29A. A grinding process is performed on the back side of the substrate 100 until the dielectric layer 105 is exposed. In greater details, an entirety of the substrate 100 may be removed from the dielectric layer 105 after the grinding process is completed.

Figure 30B:
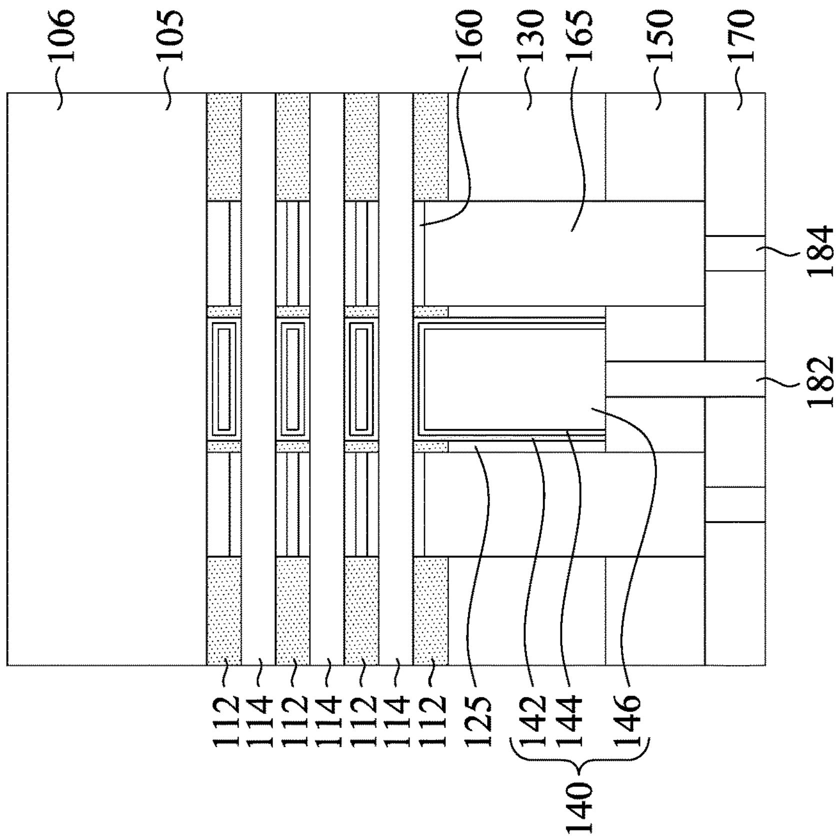
Figure 30A:
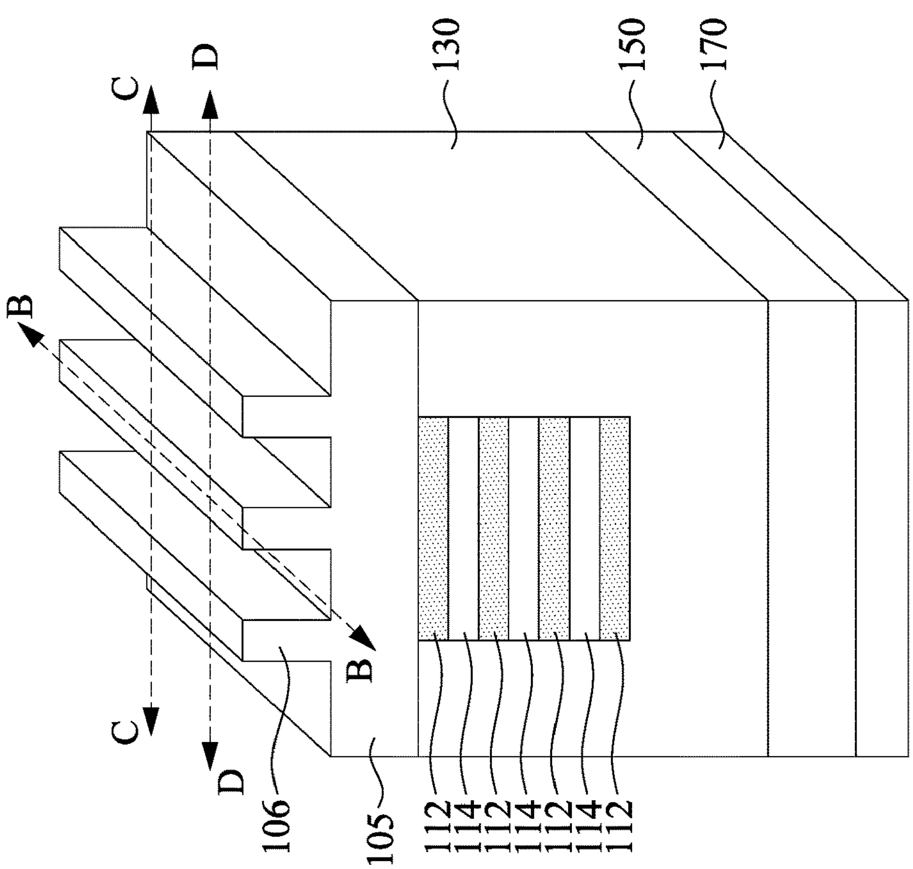
Figure 30D:
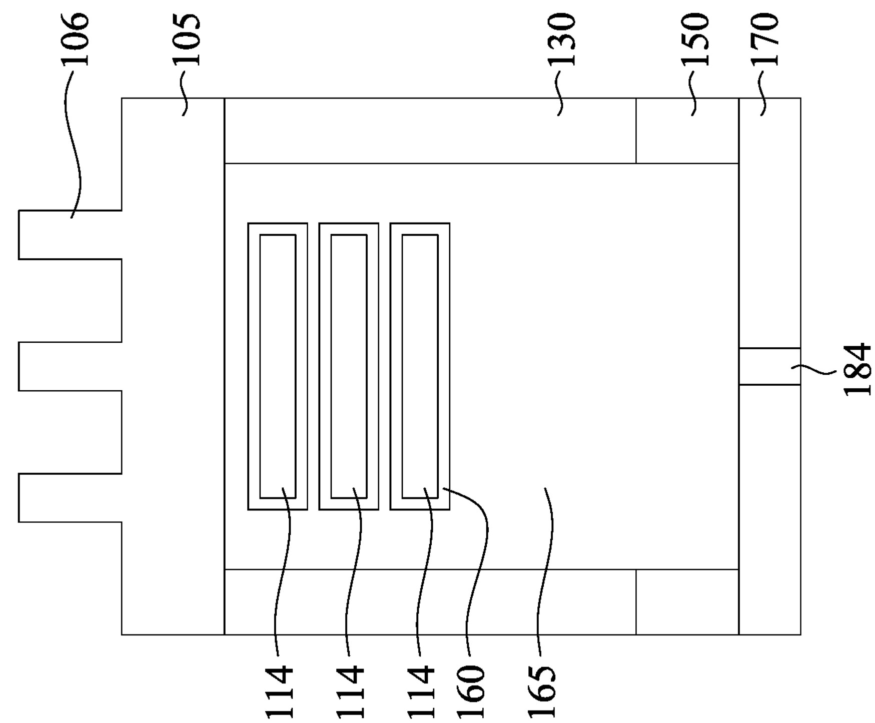
Figure 30C:
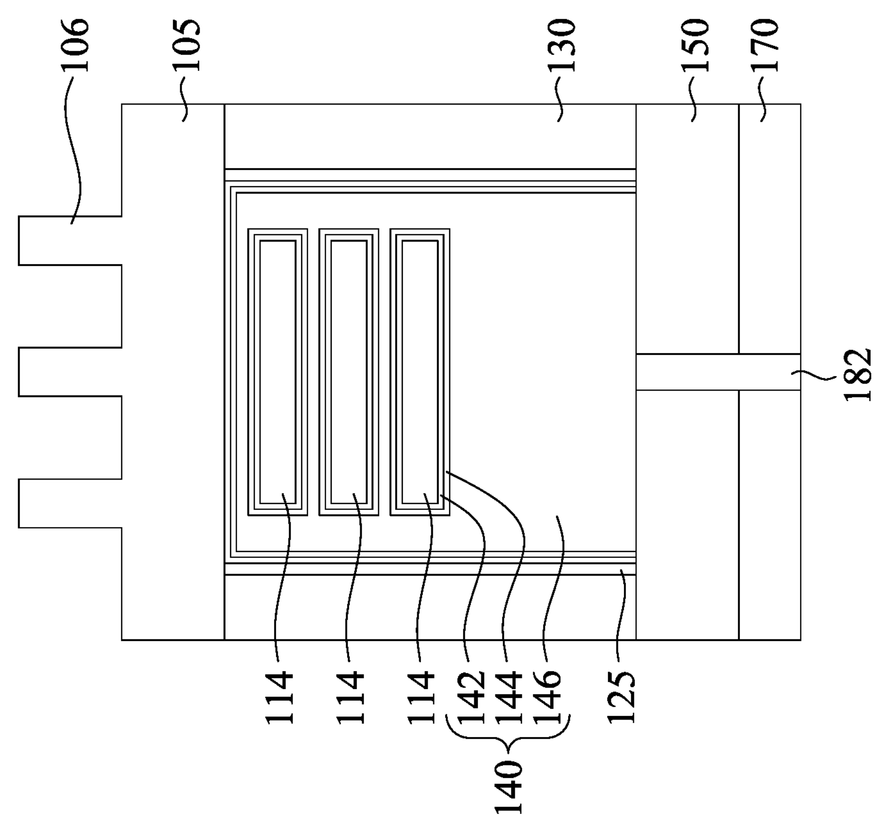

Reference is made to FIGS. 30A to 30D, in which FIG. 30A is a schematic view of a semiconductor device, FIG. 30B is a cross-sectional view along line B-B of FIG. 30A, FIG. 30C is a cross-sectional view along line C-C of FIG. 30A, and FIG. 30D is a cross-sectional view along line D-D of FIG. 30A. The dielectric layer 105 is patterned to form dielectric strips 106, such that dielectric strips 106 protrude from the top surface of the dielectric layer 105. In some embodiments, the dielectric strips 106 may be formed by, for example, forming a patterned mask over the dielectric layer 105, in which the patterned mask may include openings that expose unwanted portions of the dielectric layer 105, and performing an etching process to remove the unwanted portions of the dielectric layer 105. The remaining portions of the dielectric layer 105 protruding over the dielectric layer 105 are referred to as dielectric strips 106. It is noted that the etching process may not etch through the dielectric layer 105. In some embodiments, the dielectric strips 106 can also be referred to as dielectric fin.

Figure 31B:
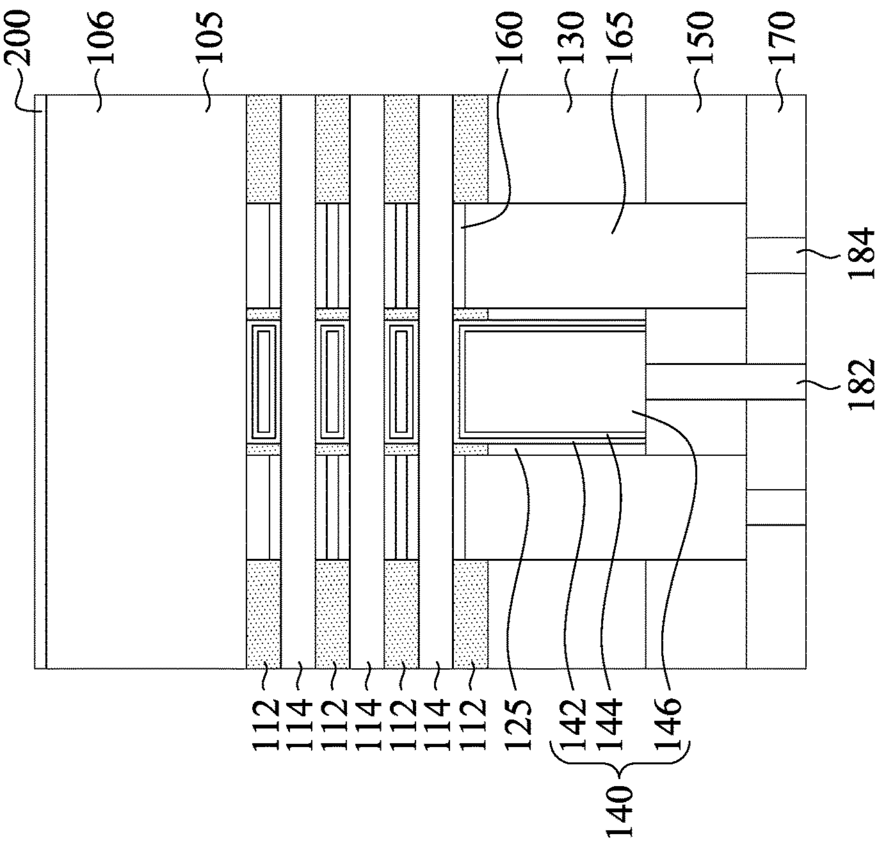
Figure 31A:
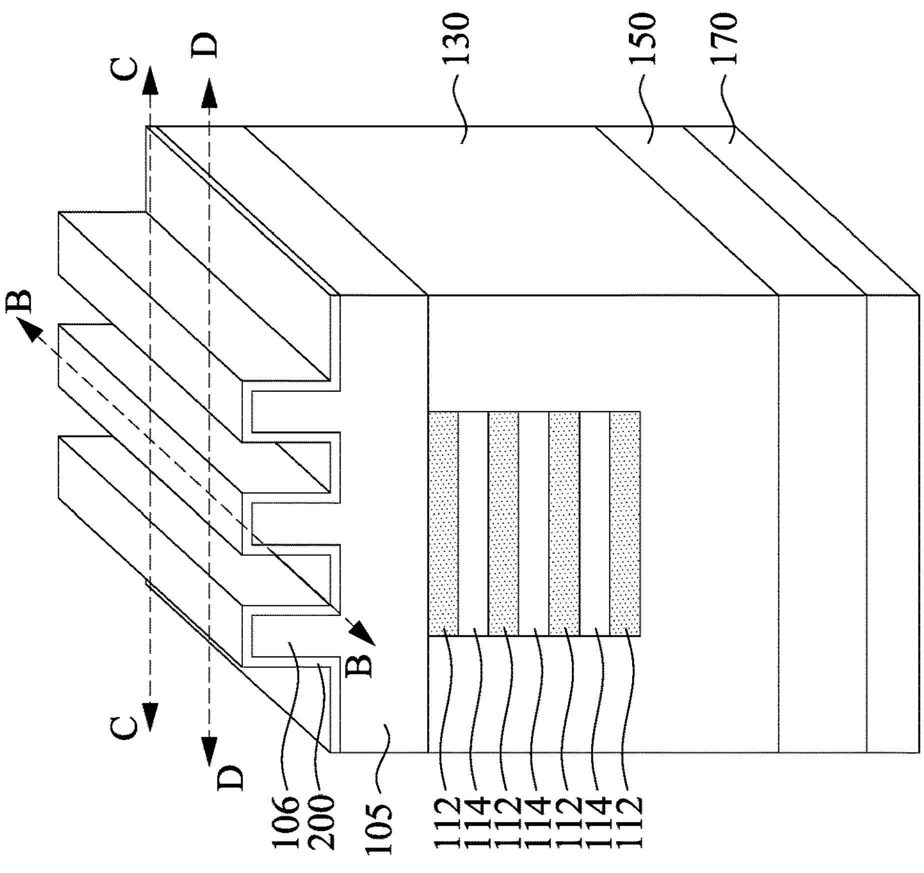
Figure 31D:
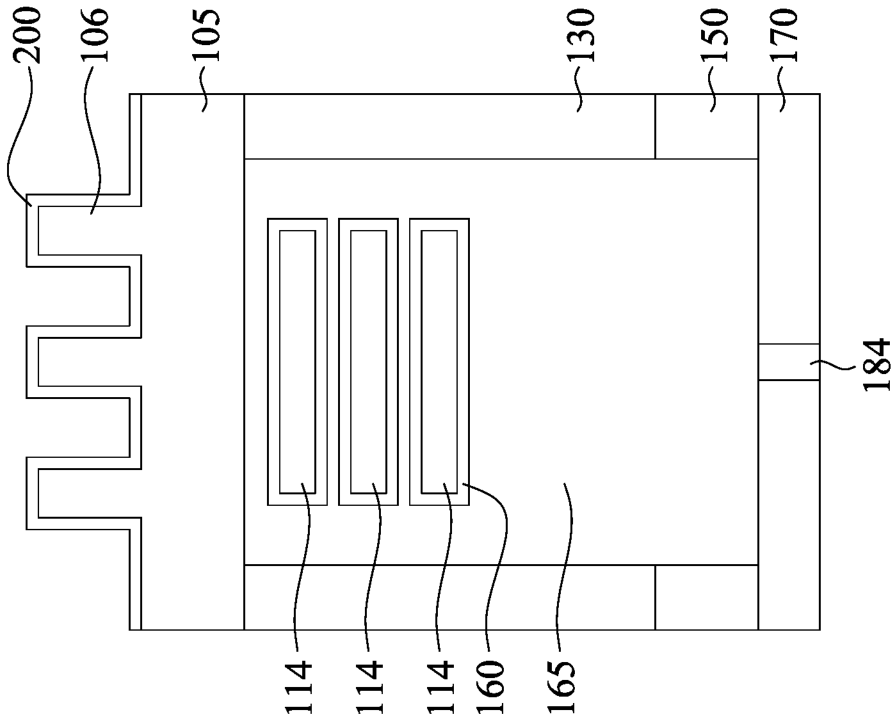
Figure 31C:
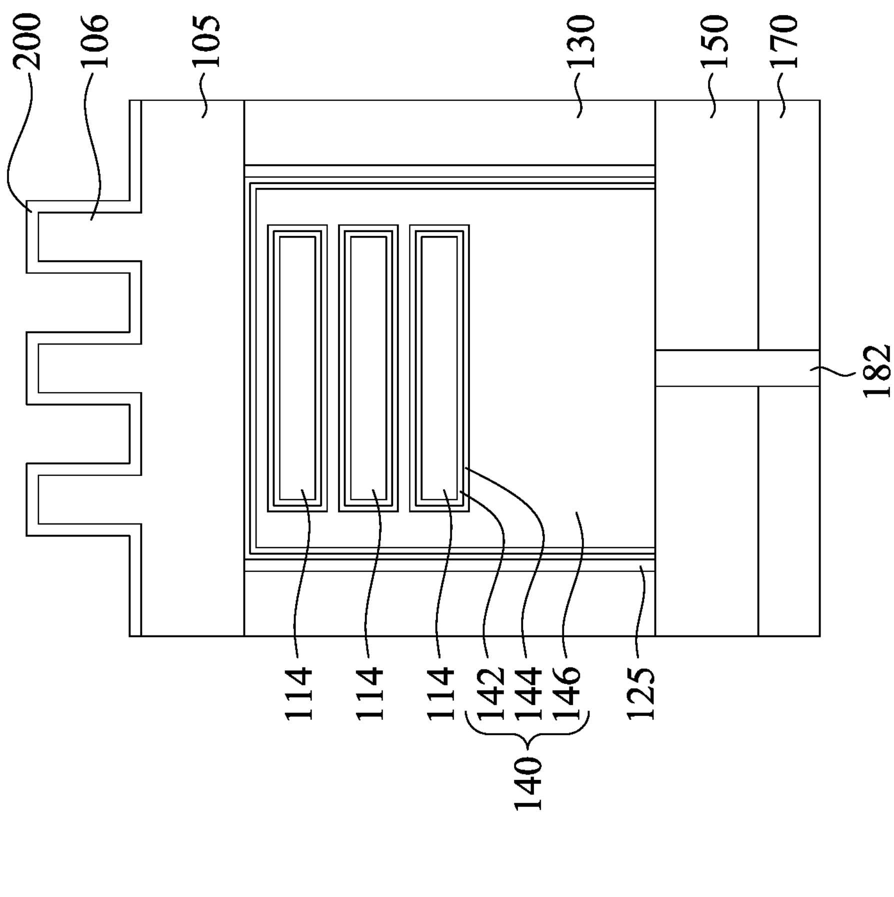

Reference is made to FIGS. 31A to 31D, in which FIG. 31A is a schematic view of a semiconductor device, FIG. 31B is a cross-sectional view along line B-B of FIG. 31A, FIG. 31C is a cross-sectional view along line C-C of FIG. 31A, and FIG. 31D is a cross-sectional view along line D-D of FIG. 31A. A semiconductive oxide layer 200 is deposited over the dielectric strips 106. In greater details, the semiconductive oxide layer 200 may be formed using a highly conformal deposition process, such that the semiconductive oxide layer 200 may line the exposed surfaces of the dielectric strips 106 and the dielectric layer 105.

Figure 32B:
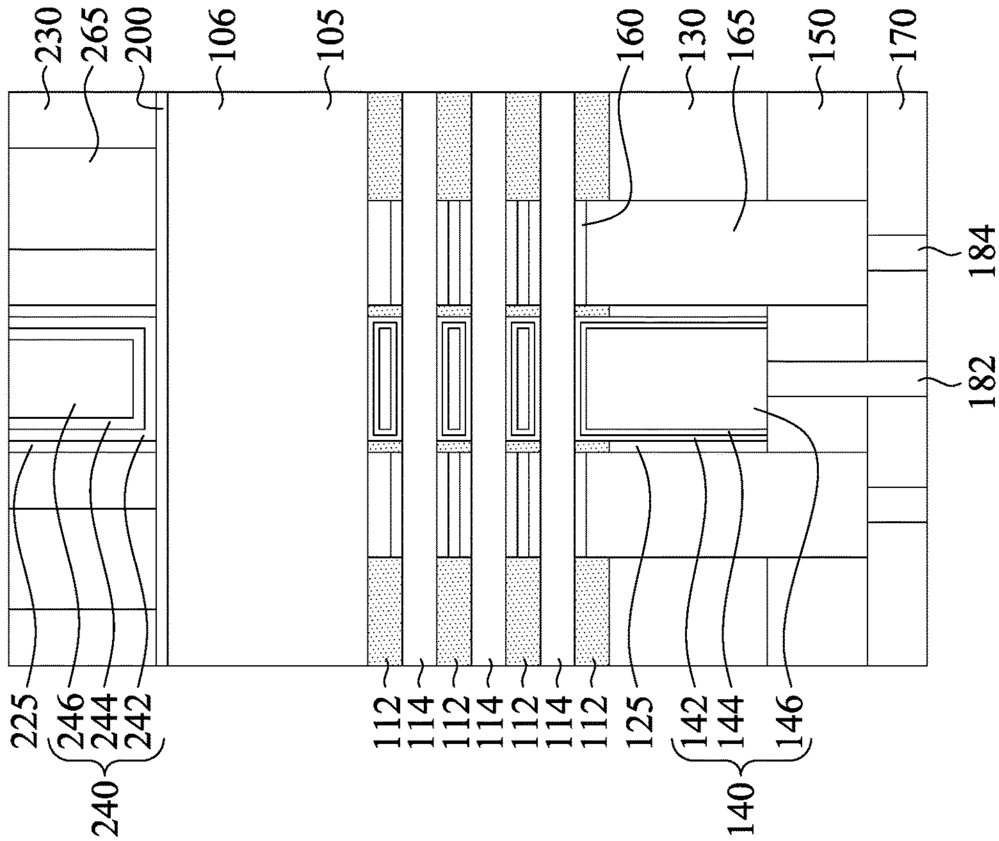
Figure 32A:
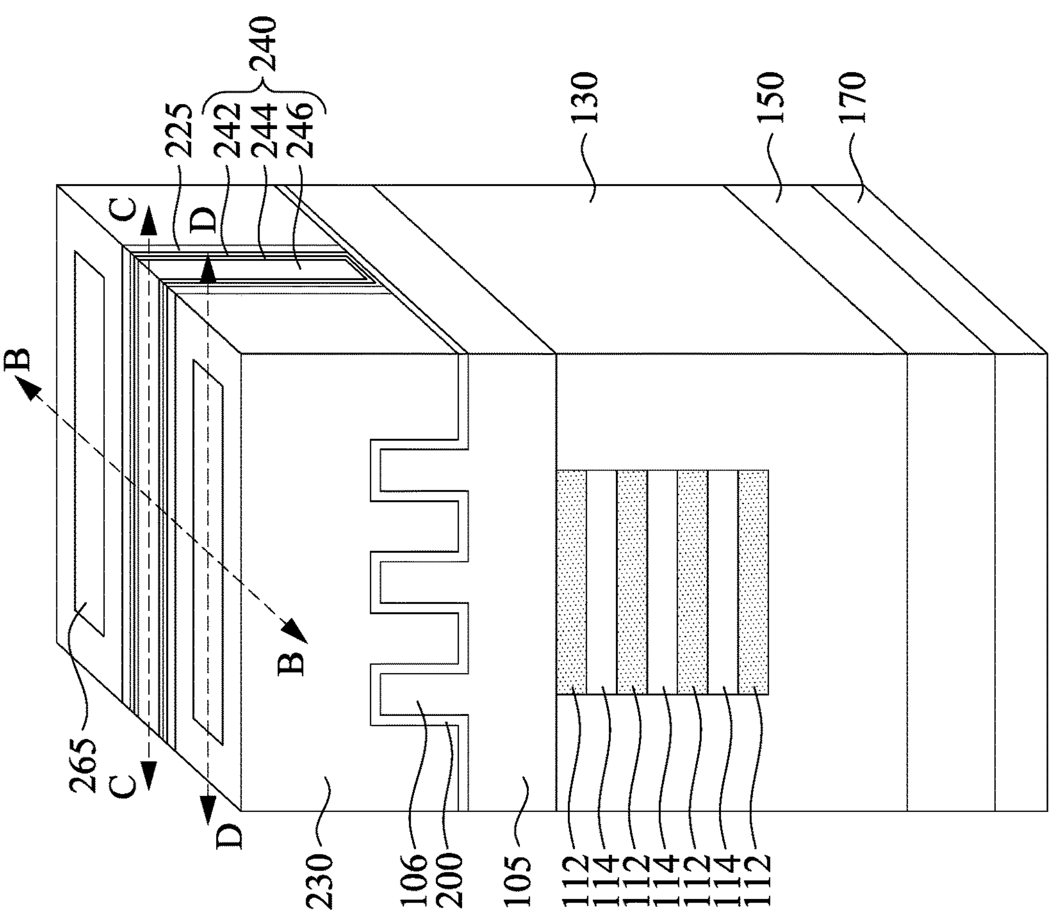
Figure 32D:
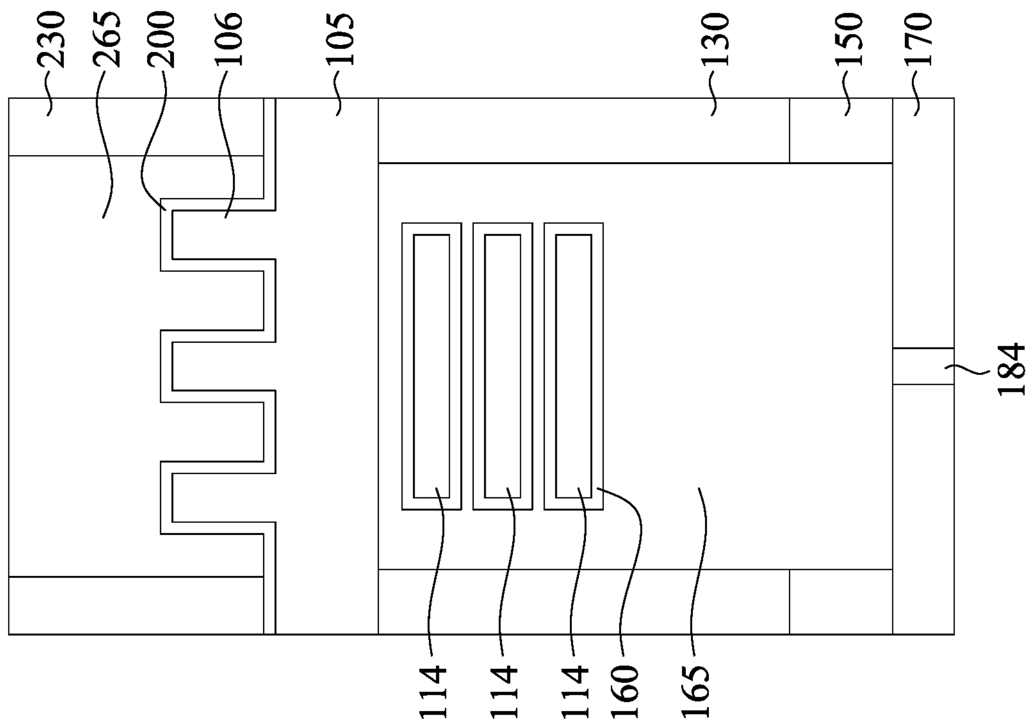
Figure 32C:
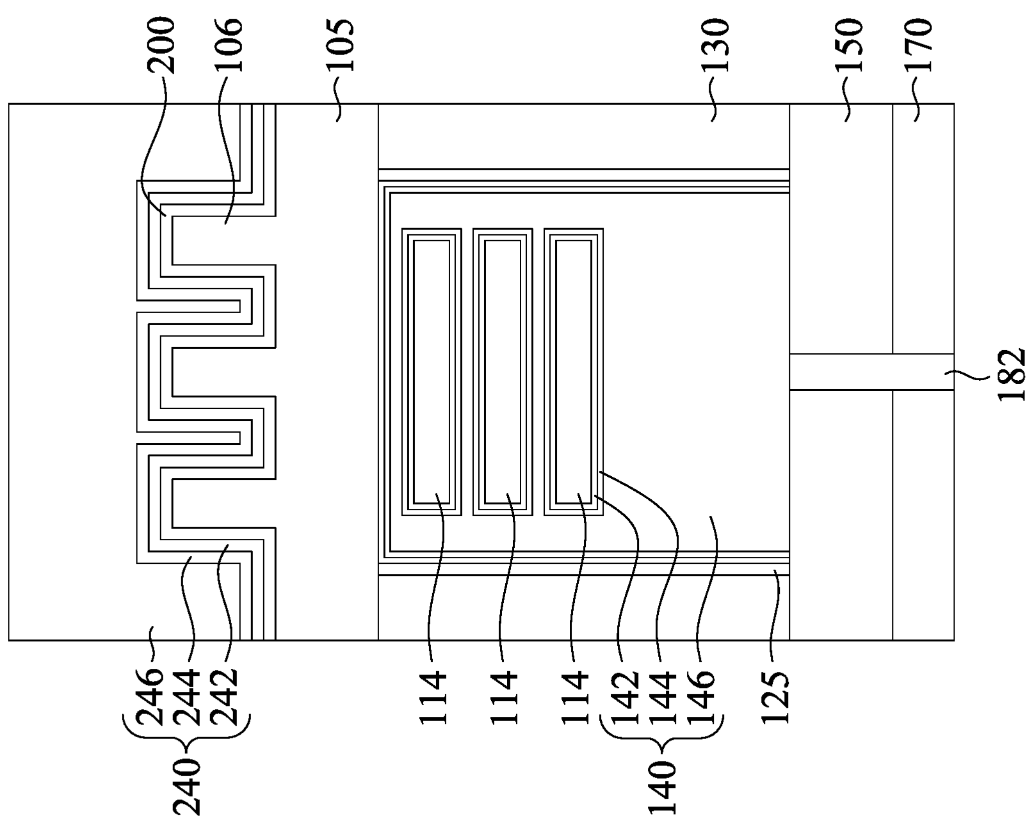

Reference is made to FIGS. 32A to 32D, in which FIG. 32A is a schematic view of a semiconductor device, FIG. 32B is a cross-sectional view along line B-B of FIG. 32A, FIG. 32C is a cross-sectional view along line C-C of FIG. 32A, and FIG. 32D is a cross-sectional view along line D-D of FIG. 32A. The structure of FIGS. 31A to 31D may undergo the process as described in FIGS. 22A to 25D, and the resulting structure is shown in FIG. 32A to 32D.

FIGS. 33A to 39D show various stages of manufacturing operations for a semiconductor device according to some embodiments of the present disclosure. It is noted that the semiconductor device of FIGS. 33A to 39D is similar to the semiconductor device as described with respect to FIGS. 1A to 25D. Accordingly, similar elements are labeled the same, and relevant details will not be repeated for brevity.

Figure 33B:
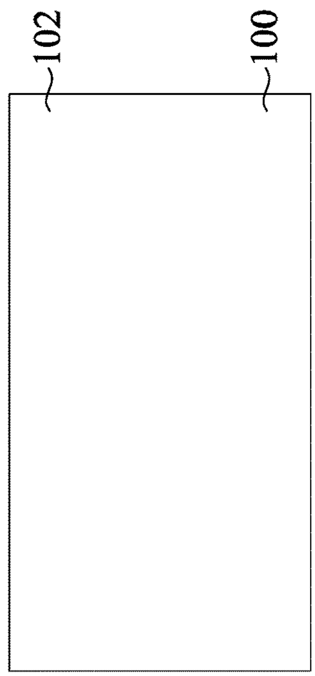
FIGS. 33A to 39D show various stages of manufacturing operations for a semiconductor device according to some embodiments of the present disclosure.
Figure 33A:
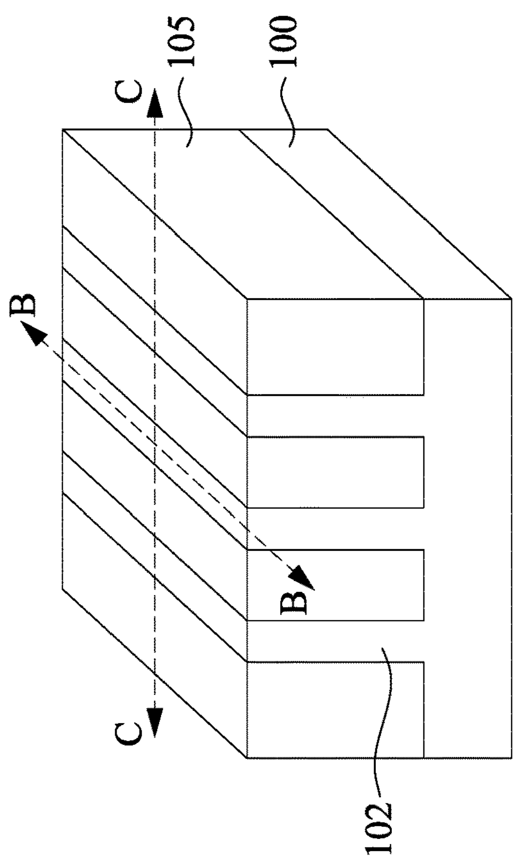
Figure 33C:
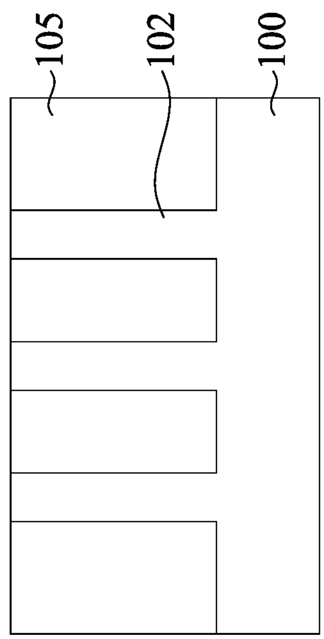

Reference is made to FIGS. 33A to 33C, in which FIG. 33A is a schematic view of a semiconductor device, FIG. 33B is a cross-sectional view along line B-B of FIG. 33A, and FIG. 33C is a cross-sectional view along line C-C of FIG. 33A. In some embodiments, after the dielectric layer 105 is deposited over the semiconductor strips 102 (see FIGS. 3A to 3C), a planarization process, such as CMP process, is performed on the dielectric layer 105 until top surfaces of the semiconductor strips 102 are exposed.

Figure 34B:
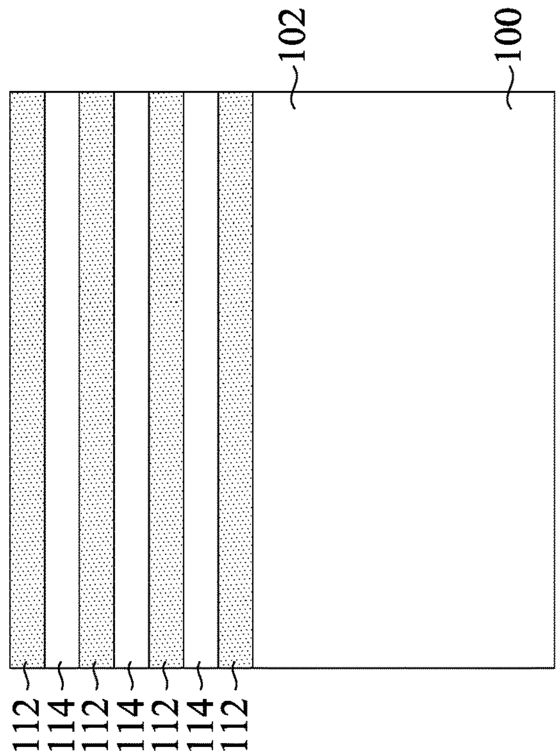
Figure 34A:
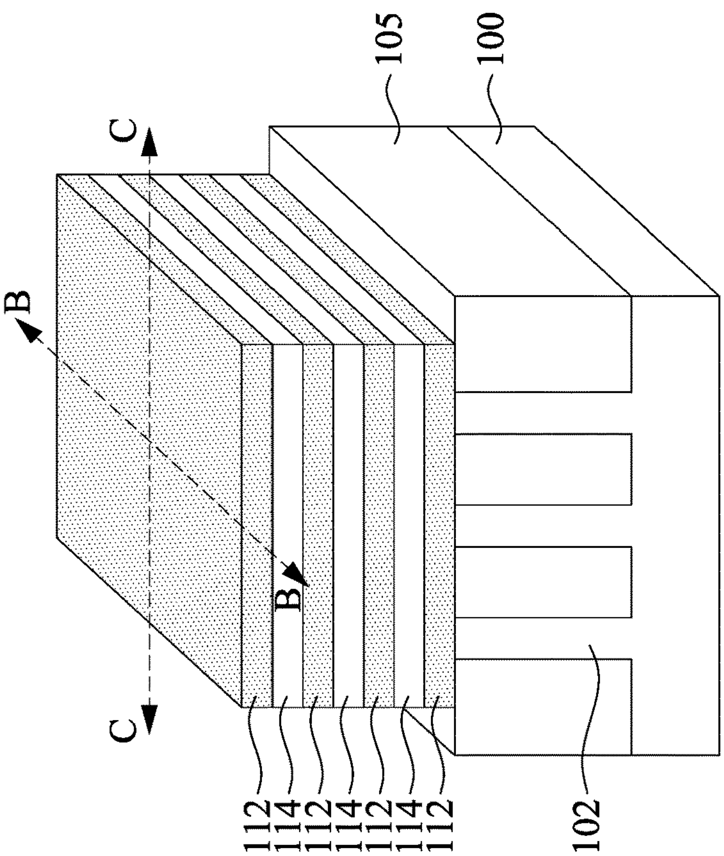
Figure 34C:
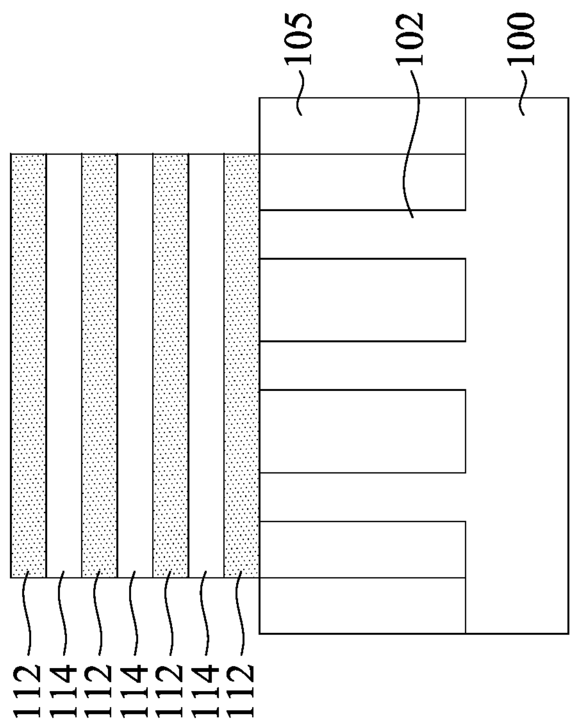

Reference is made to FIGS. 34A to 34C, in which FIG. 34A is a schematic view of a semiconductor device, FIG. 34B is a cross-sectional view along line B-B of FIG. 34A, and FIG. 34C is a cross-sectional view along line C-C of FIG. 34A. First and second semiconductor layers 112 and 114 are alternately formed over the dielectric layer 105 and the semiconductor strips 102. In some embodiments, the bottommost one of the first semiconductor layers 112 may be formed from the exposed surfaces of the semiconductor strips 102 using a selective epitaxial growth (SEG). The bottommost first semiconductor layer 112 has a higher growth rate on a semiconductor surface (e.g., the semiconductor strips 102) than on a dielectric surface (e.g., the dielectric layer 105). Accordingly, the bottommost first semiconductor layer 112 may start from growing on the exposed surfaces of the semiconductor strips 102, and may laterally extend to top surface of the dielectric layer 105. The exposed semiconductor strips 102 will facilitate the formation of the bottommost first semiconductor layer 112, which in turn will improve the quality of the stack of the first and second semiconductor layers 112 and 114.

Figure 35B:
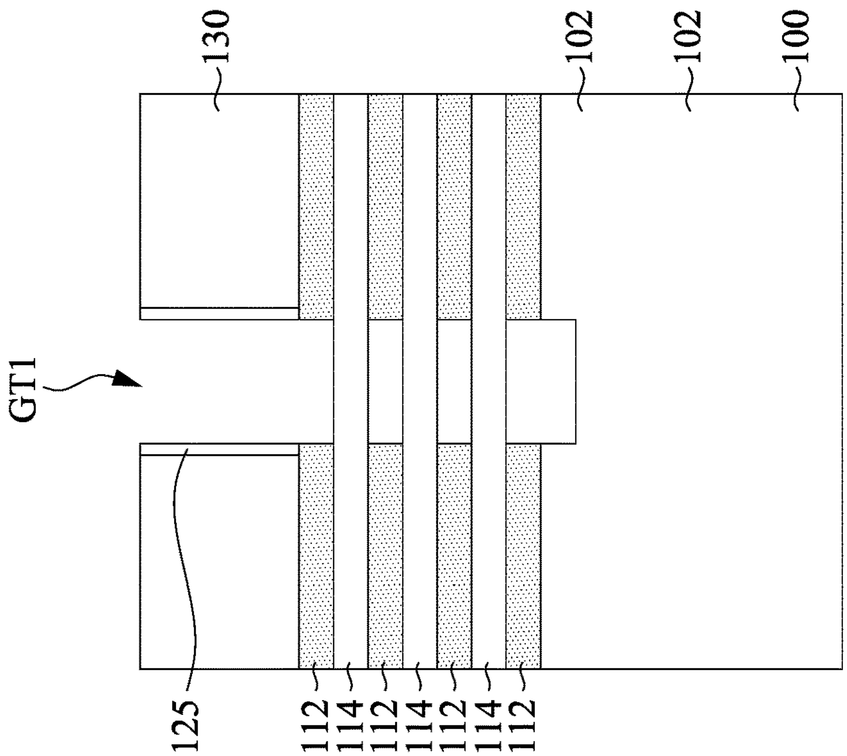
Figure 35A:
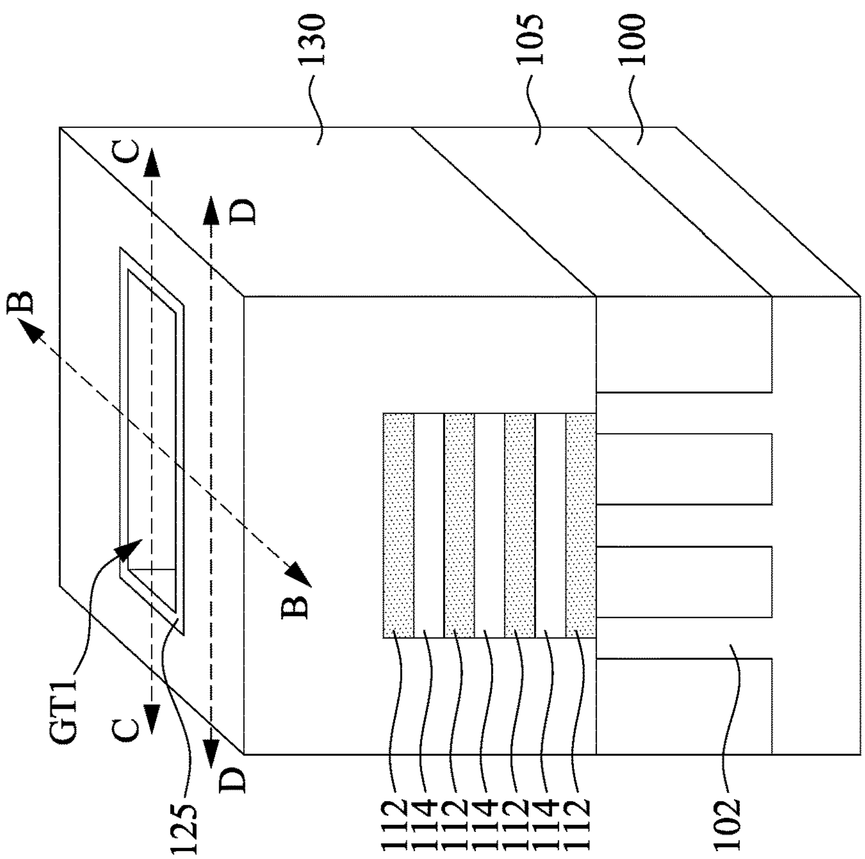
Figure 35D:
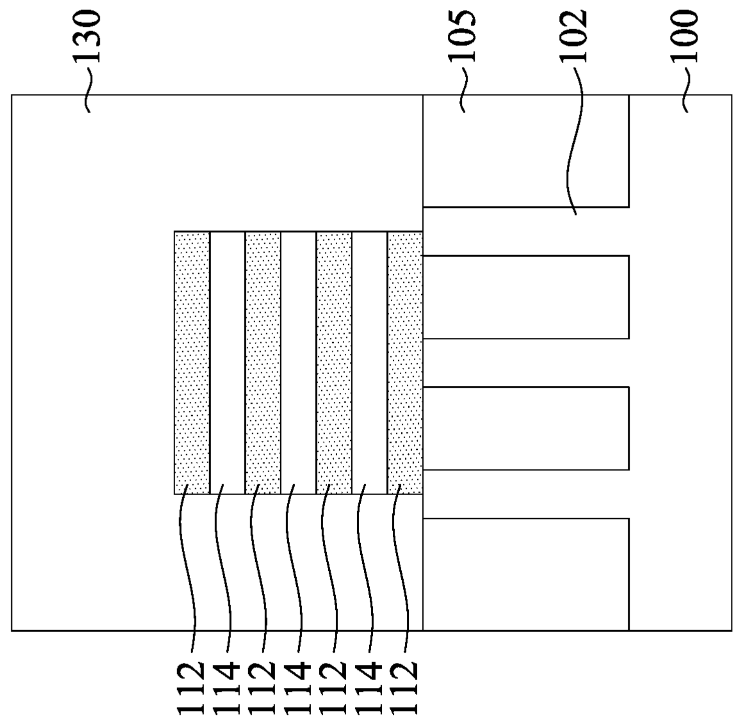
Figure 35C:
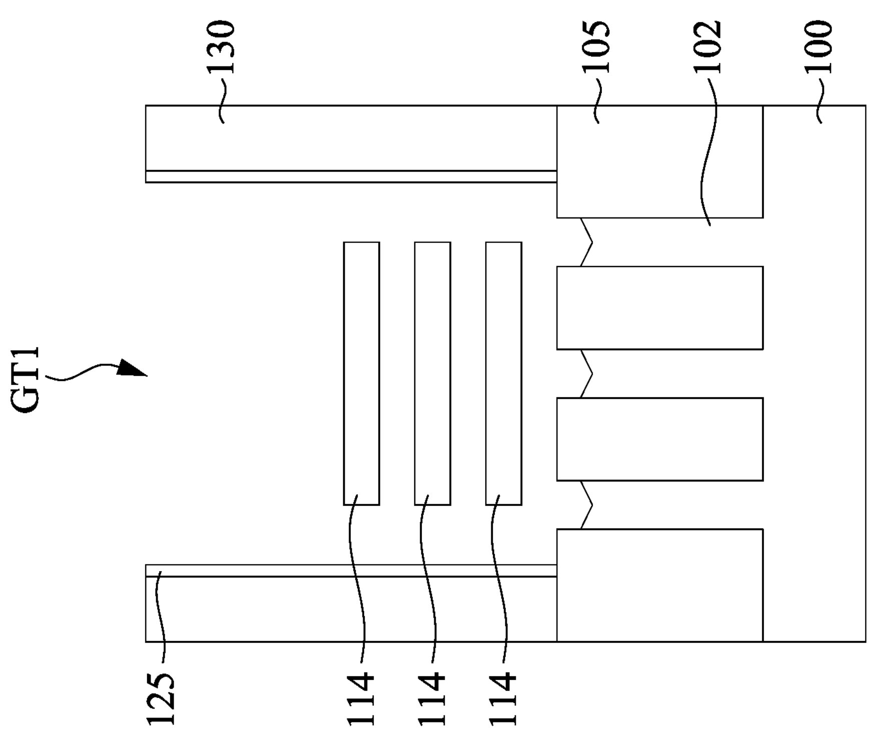

Reference is made to FIGS. 35A to 35D, in which FIG. 35A is a schematic view of a semiconductor device, FIG. 35B is a cross-sectional view along line B-B of FIG. 35A, FIG. 35C is a cross-sectional view along line C-C of FIG. 35A, and FIG. 35D is a cross-sectional view along line D-D of FIG. 35A. The structure of FIGS. 34A to 34C may undergo the processes as described in FIGS. 10A to 10D, and the resulting structure is shown in FIGS. 35A to 35D. In greater details, the first semiconductor layers 112 are removed through the gate trench GT1 by an etching process. In some embodiments where the first semiconductor layers 112 and the semiconductor strips 102 are made of a same material, such as silicon. The semiconductor strips 102 may also be etched during etching the first semiconductor layers 112. Accordingly, top surfaces of the semiconductor strips 102 may be lowered as a result of the etching process, and then recesses may be formed in the dielectric layer 105. Moreover, as shown in the cross-sectional view of FIG. 35C, each semiconductor strip 102 may include a notched top surface after the etching process is completed.

Figure 36B:
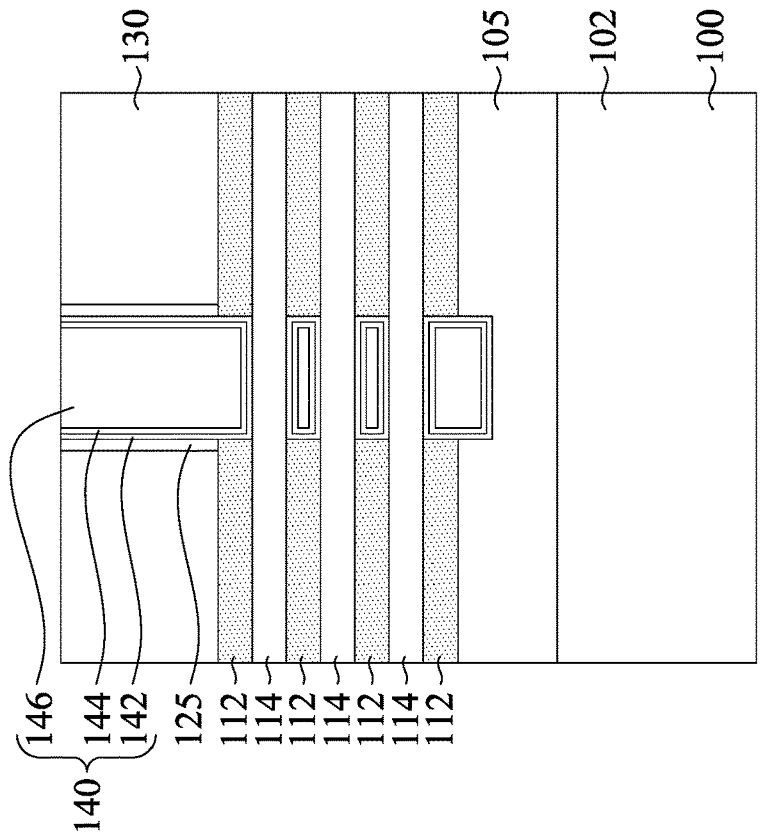
Figure 36A:
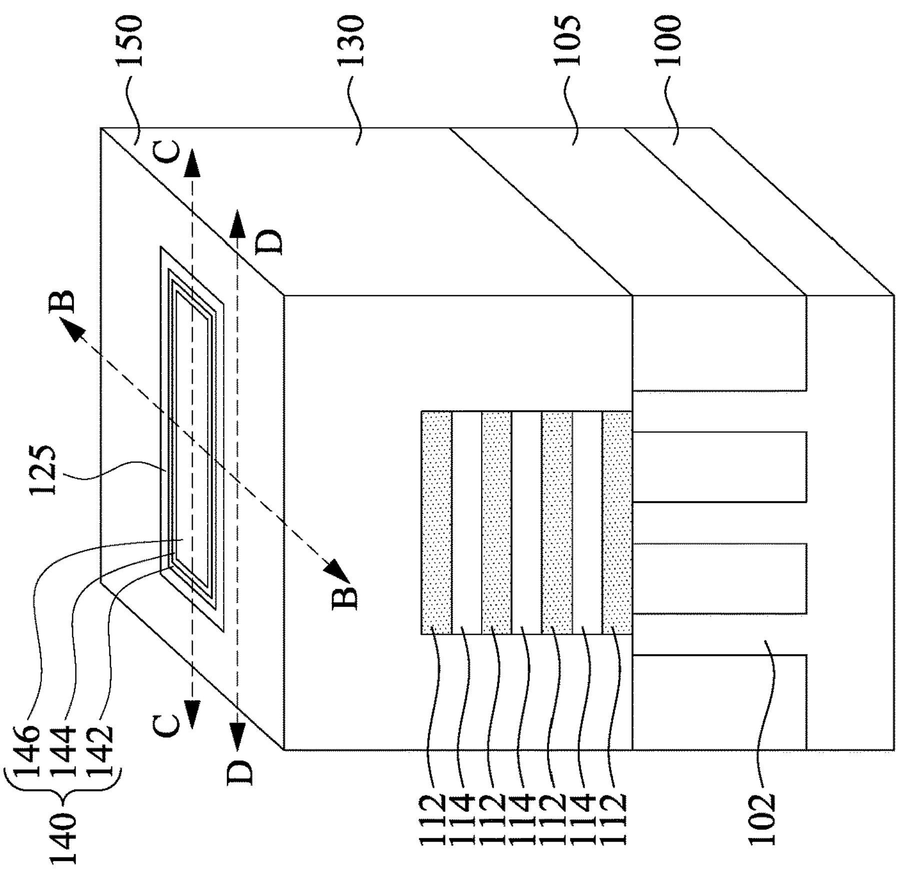
Figure 36D:
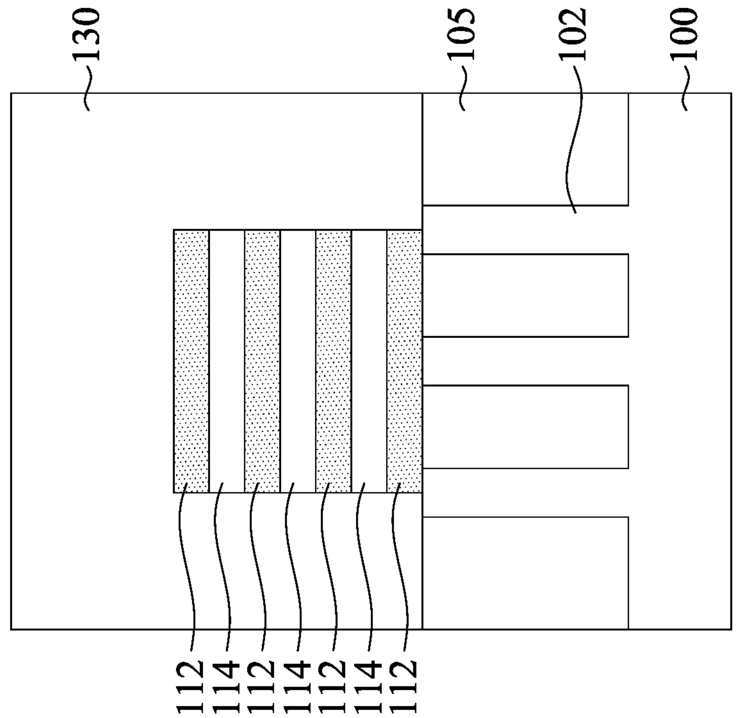
Figure 36C:
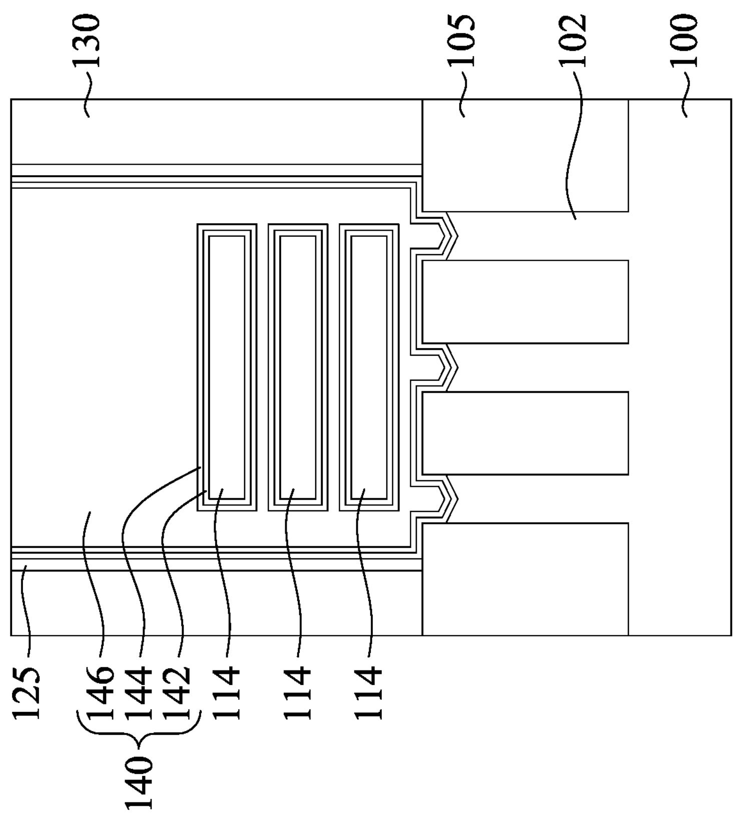

Reference is made to FIGS. 36A to 36D, in which FIG. 36A is a schematic view of a semiconductor device, FIG. 36B is a cross-sectional view along line B-B of FIG. 36A, FIG. 36C is a cross-sectional view along line C-C of FIG. 36A, and FIG. 36D is a cross-sectional view along line D-D of FIG. 36A. A gate structure 140 is formed in the gate trench GT1 (see FIGS. 35A to 35D) and may wrap around each of the exposed second semiconductor layers 114. In greater details, the gate structure 140 may include a gate dielectric layer 142, a work function metal layer 144 over the gate dielectric layer 142, and a gate electrode 146 over the work function metal layer 144. In some embodiments, the gate structure 140 may also be formed in the recesses of the dielectric layer 105 and may be in contact with the top surfaces of the semiconductor strips 102.

Figure 37B:
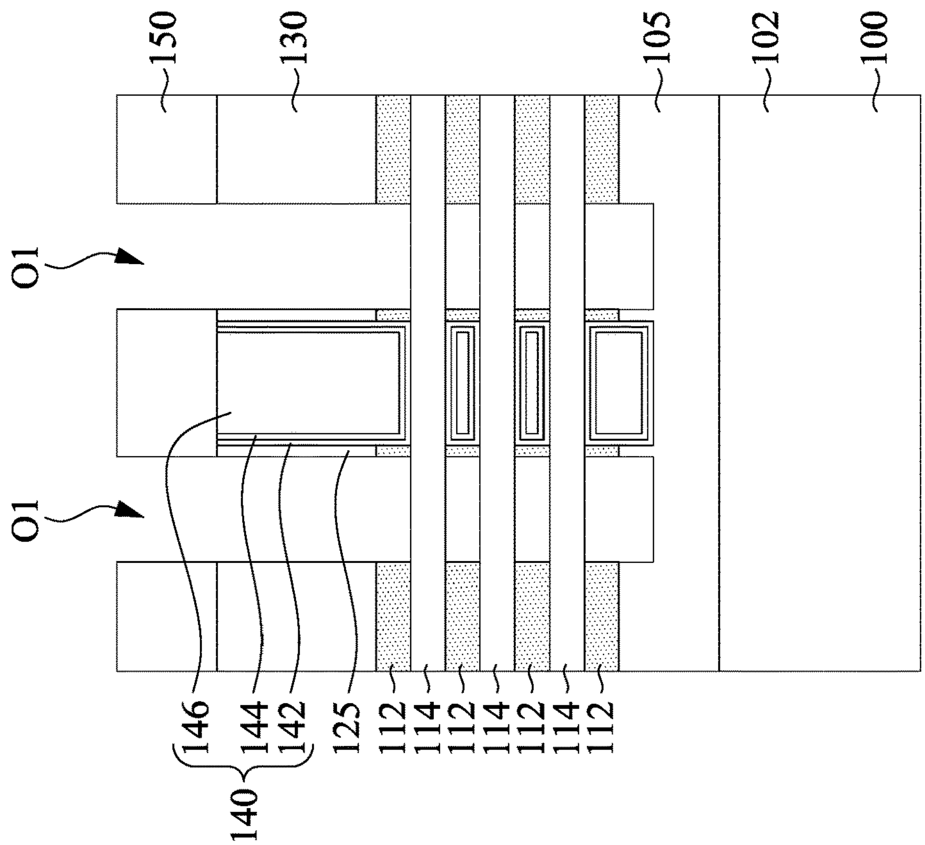
Figure 37A:
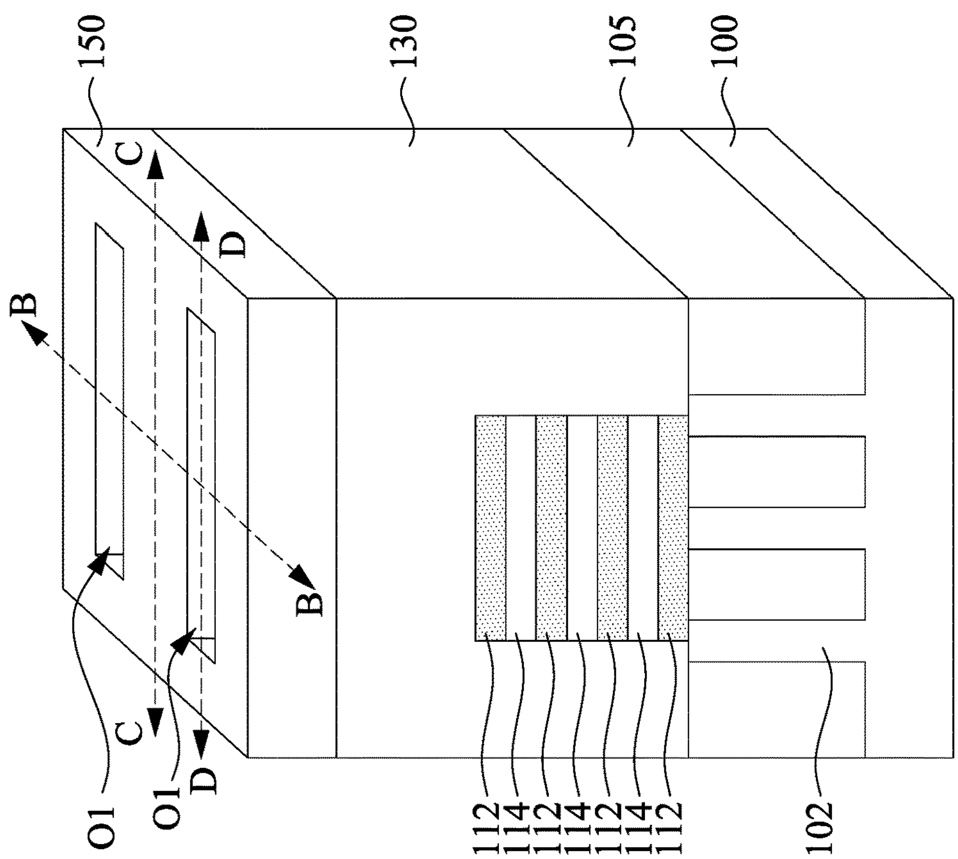
Figure 37D:
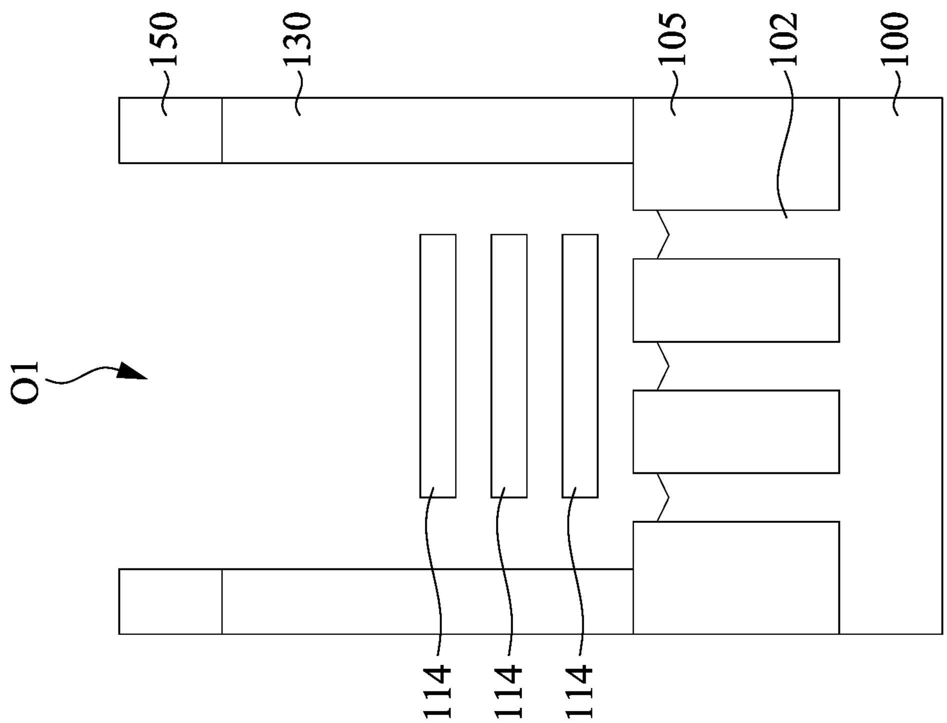
Figure 37C:
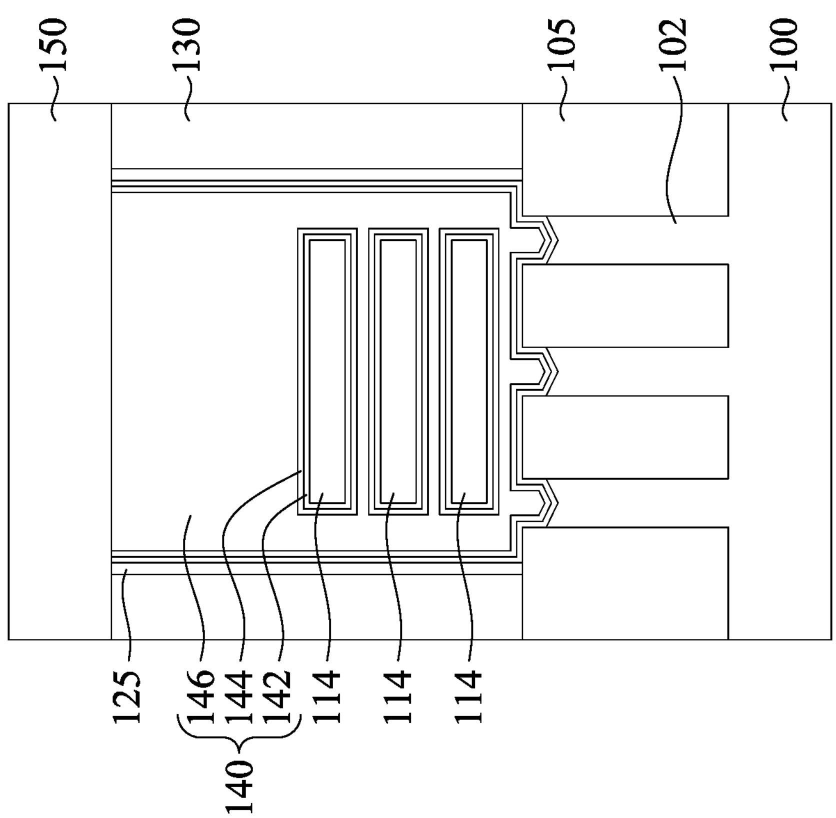

Reference is made to FIGS. 37A to 37D, in which FIG. 37A is a schematic view of a semiconductor device, FIG. 37B is a cross-sectional view along line B-B of FIG. 37A, FIG. 37C is a cross-sectional view along line C-C of FIG.

37A, and FIG. 37D is a cross-sectional view along line D-D of FIG. 37A. The structure of FIGS. 36A to 36D may undergo the processes as described in FIGS. 12A to 14D, and the resulting structure is shown in FIGS. 37A to 37D. In greater details, the first semiconductor layers 112 are removed through the source/drain openings O1 by an etching process. In some embodiments where the first semiconductor layers 112 and the semiconductor strips 102 are made of a same material, such as silicon. The semiconductor strips 102 may also be etched during etching the first semiconductor layers 112. Accordingly, top surfaces of the semiconductor strips 102 may be lowered as a result of the etching process, and then recesses may be formed in the dielectric layer 105. Moreover, as shown in the cross-sectional view of FIG. 37D, each semiconductor strip 102 may include a notched top surface after the etching process is completed.

Figure 38A:
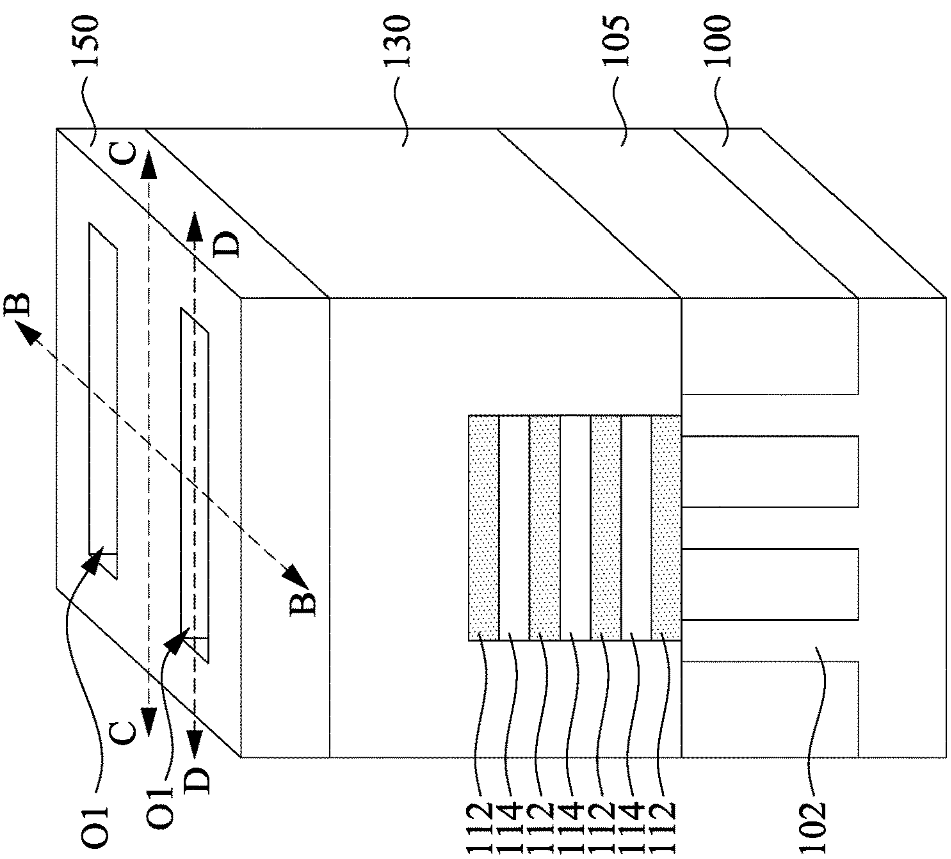
Figure 38B:
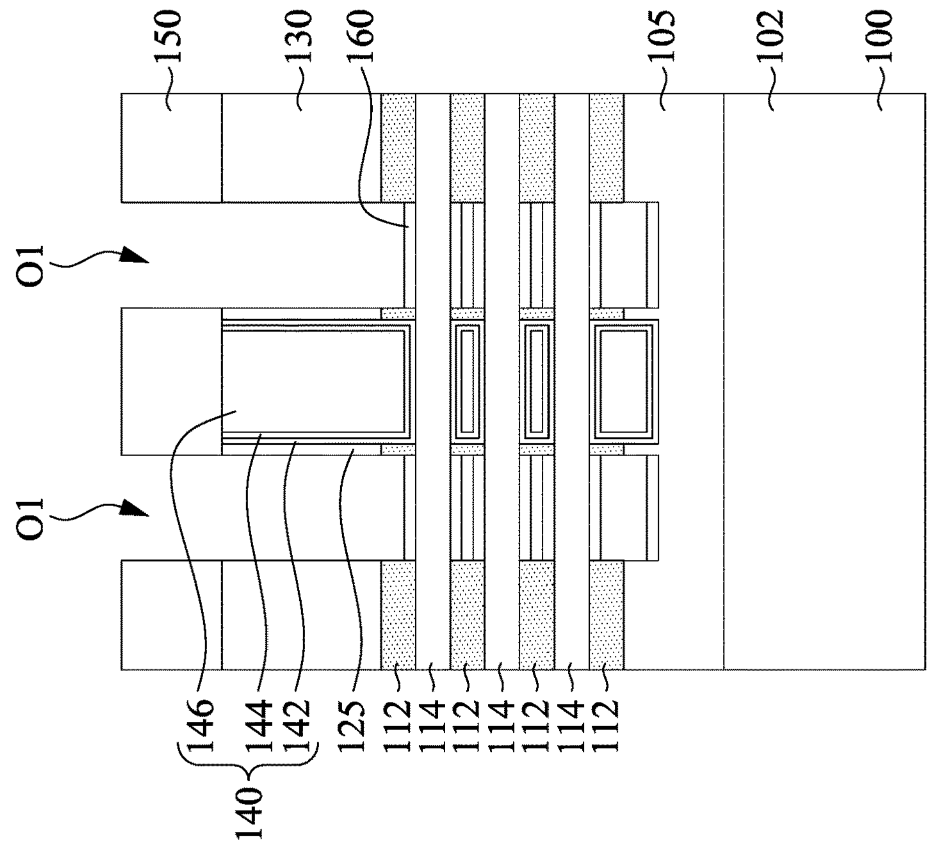
Figure 38D:
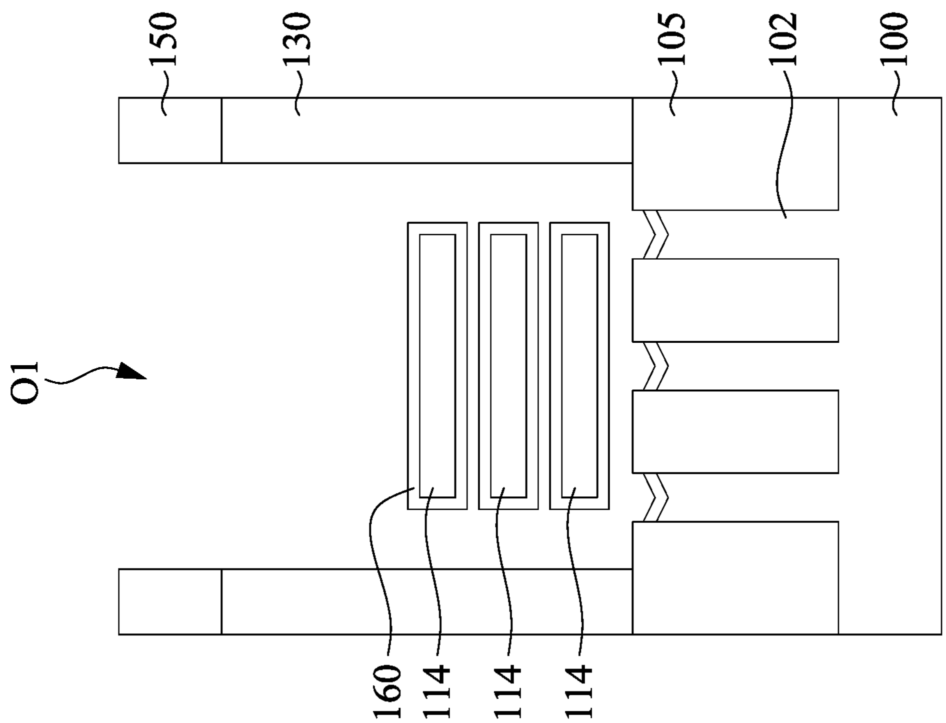
Figure 38C:
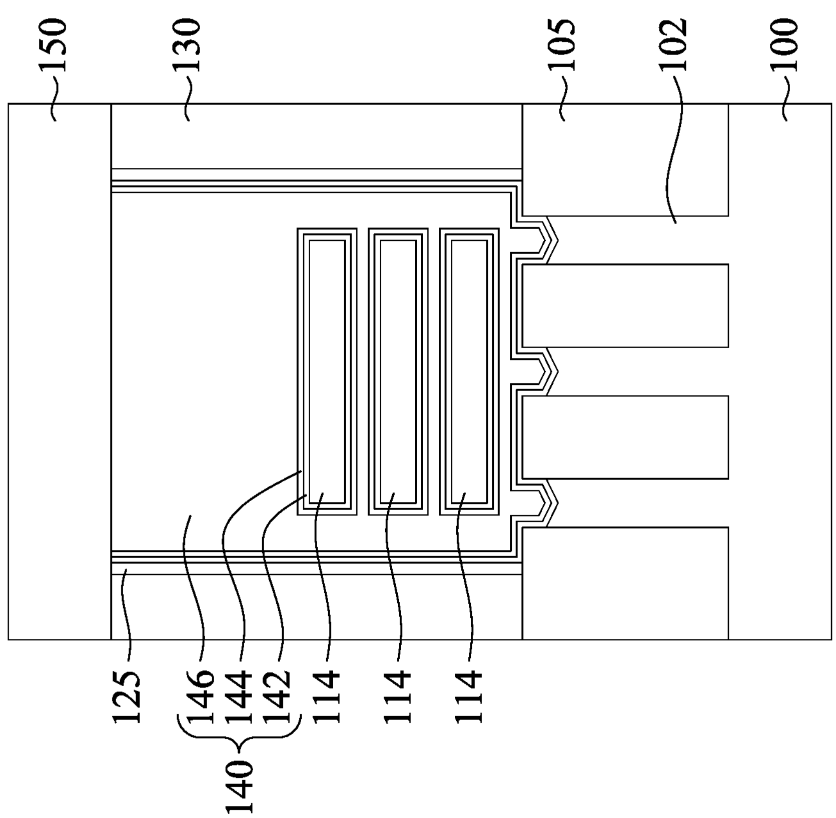

Reference is made to FIGS. 38A to 38D, in which FIG. 38A is a schematic view of a semiconductor device, FIG. 38B is a cross-sectional view along line B-B of FIG. 38A, FIG. 38C is a cross-sectional view along line C-C of FIG. 38A, and FIG. 38D is a cross-sectional view along line D-D of FIG. 38A. Source/drain epitaxy structures 160 are formed over the exposed second semiconductor layers 114. In some embodiments, source/drain epitaxy structures 160 may also be formed on the exposed surfaces of the semiconductor strips 102.

Figure 39A:
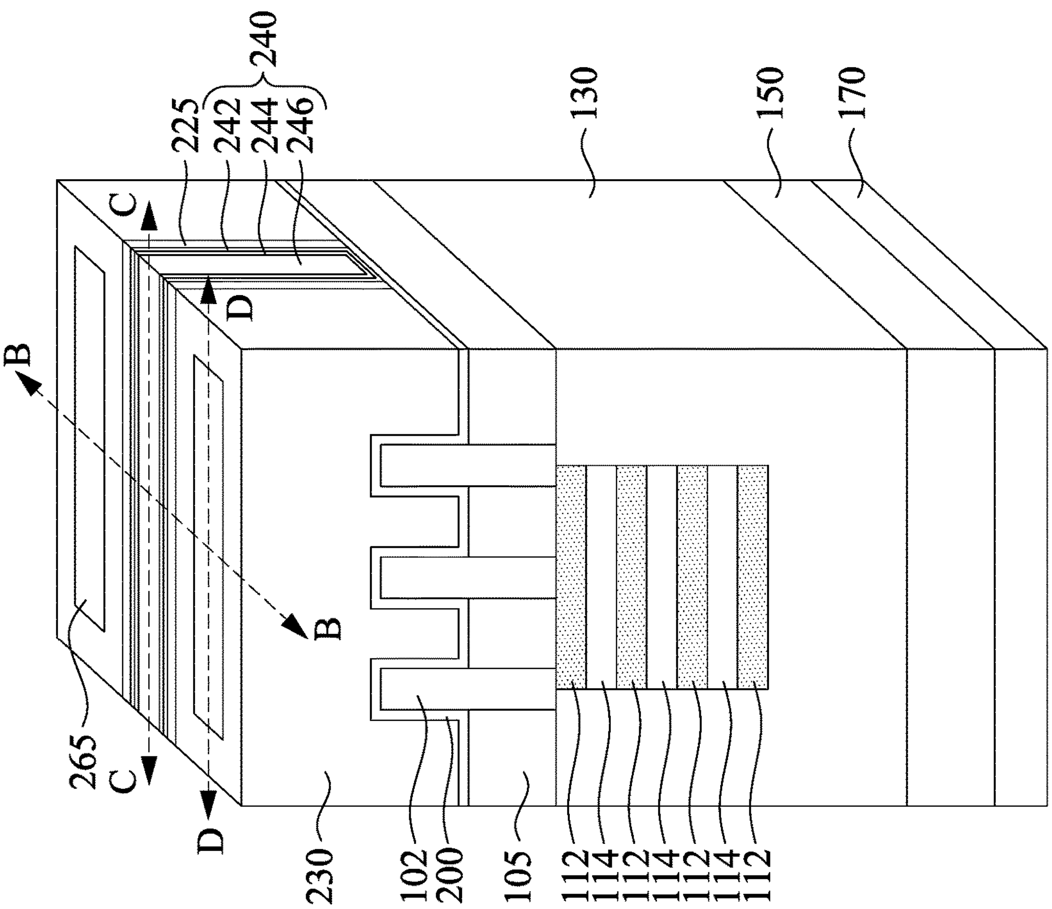
Figure 39B:
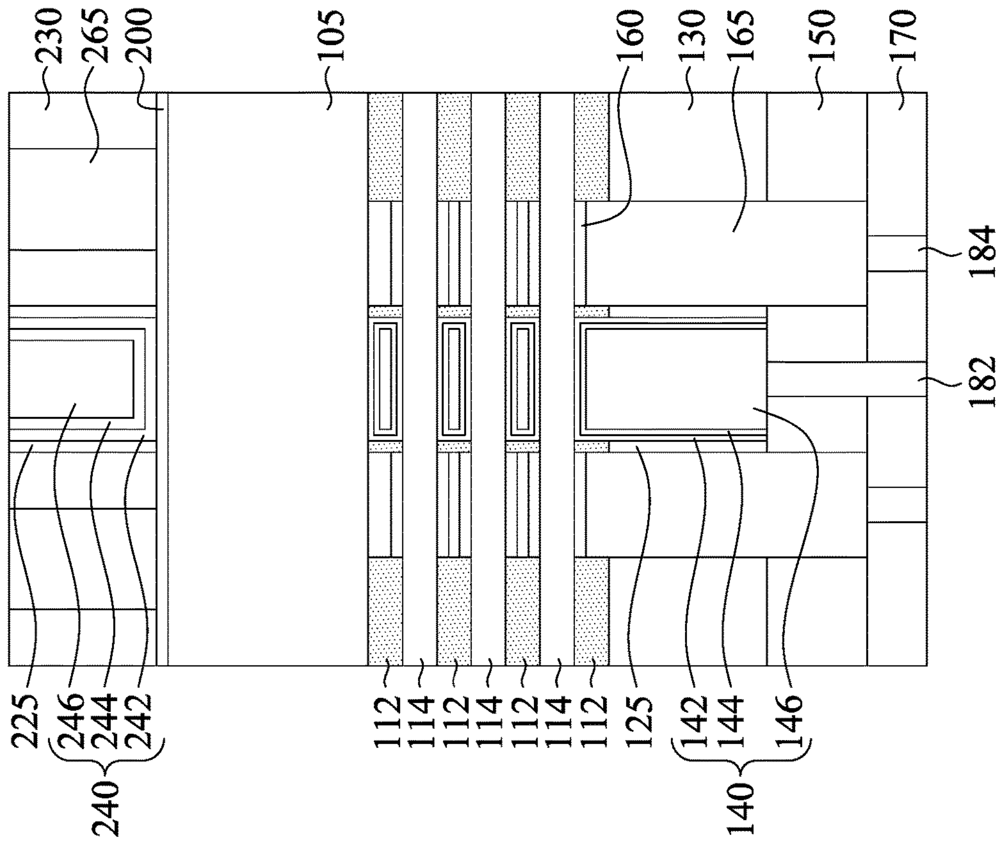
Figure 39C:
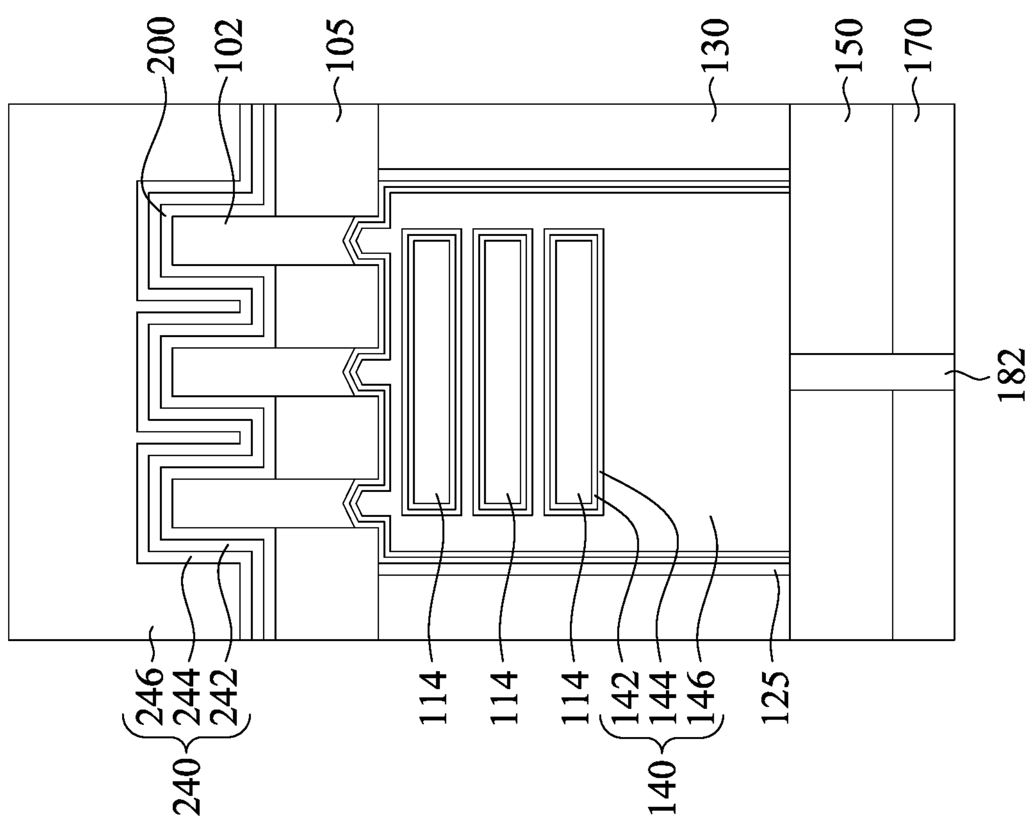
Figure 39D:
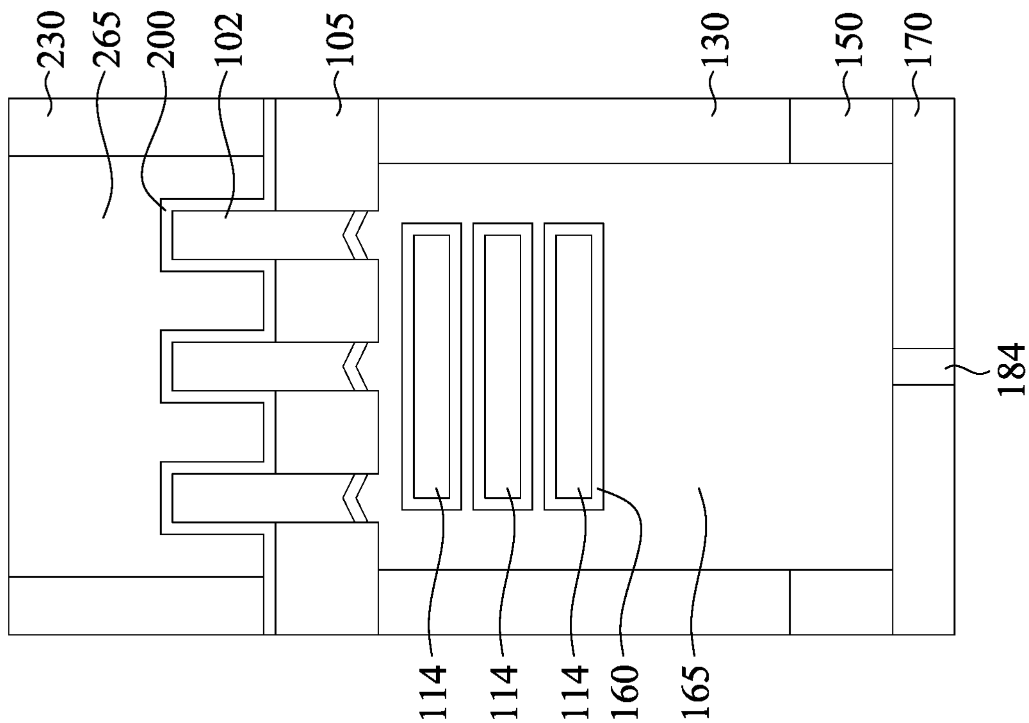

Reference is made to FIGS. 39A to 39D, in which FIG. 39A is a schematic view of a semiconductor device, FIG. 39B is a cross-sectional view along line B-B of FIG. 39A, FIG. 39C is a cross-sectional view along line C-C of FIG. 39A, and FIG. 39D is a cross-sectional view along line D-D of FIG. 39A. The structure of FIGS. 38A to 38D may undergo the processes as described in FIGS. 17A to 25D, and the resulting structure is shown in FIGS. 39A to 39D. In particular, at least a surface of each semiconductor strip 102 may include notched cross-sectional view. Moreover, the notched surface of each semiconductor strip 102 may be in contact with the gate structure 140 (see FIG. 39C) and may be in contact with the source/drain epitaxy structures 160 (see FIG. 39D).

FIGS. 40A to 44D show various stages of manufacturing operations for a semiconductor device according to some embodiments of the present disclosure. It is noted that the semiconductor device of FIGS. 44A to 44D is similar to the semiconductor device as described with respect to FIGS. 1A to 25D. Accordingly, similar elements are labeled the same, and relevant details will not be repeated for brevity.

Figure 40B:
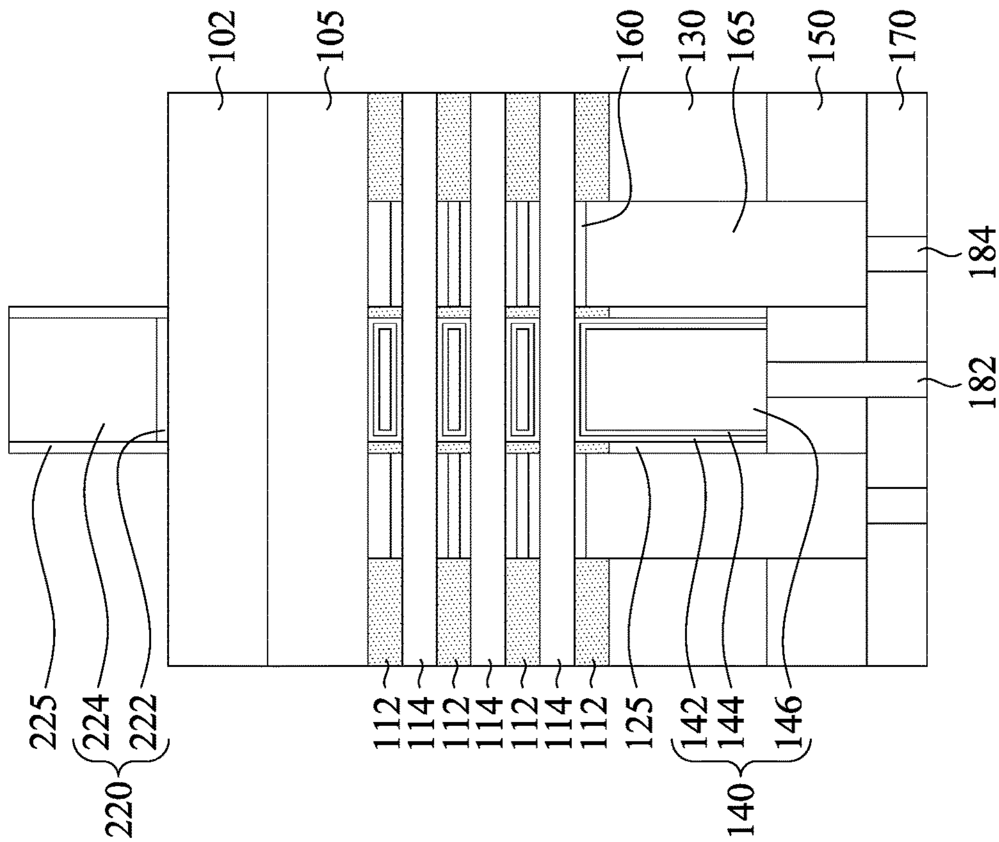
FIGS. 40A to 44D show various stages of manufacturing operations for a semiconductor device according to some embodiments of the present disclosure.
Figure 40A:
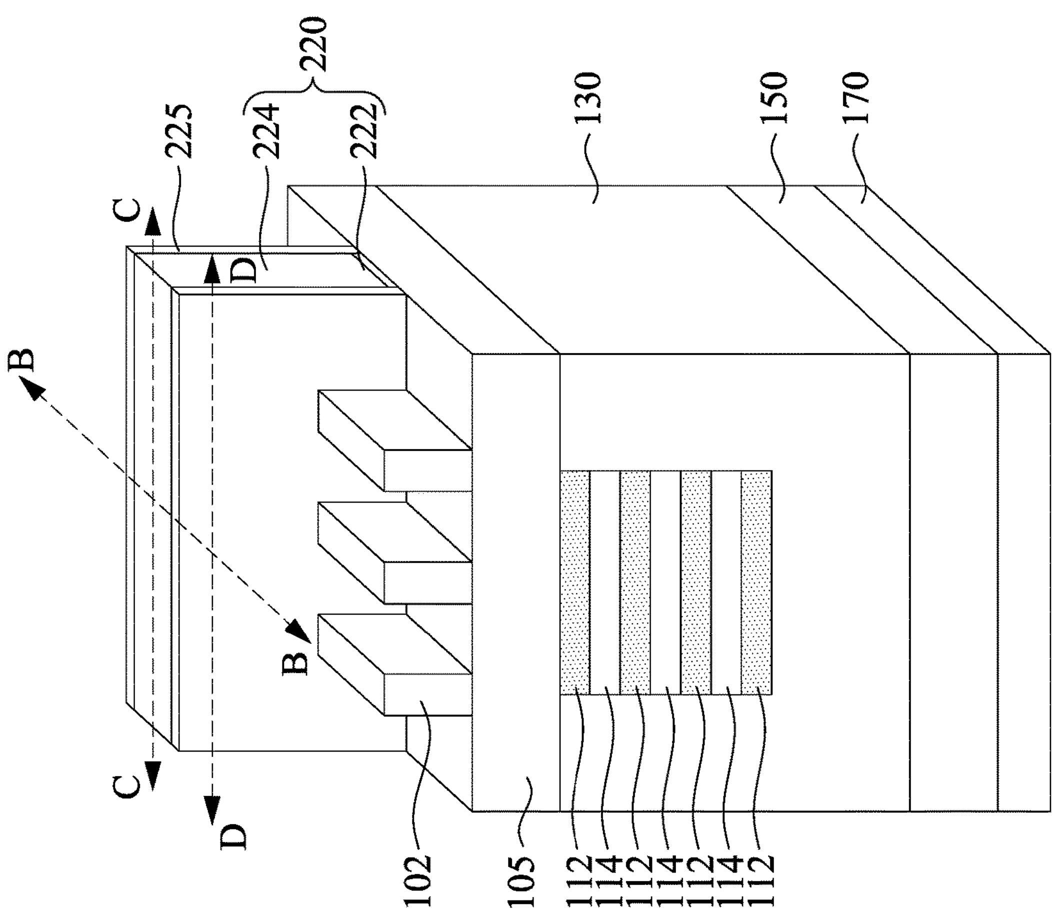
Figure 40C:
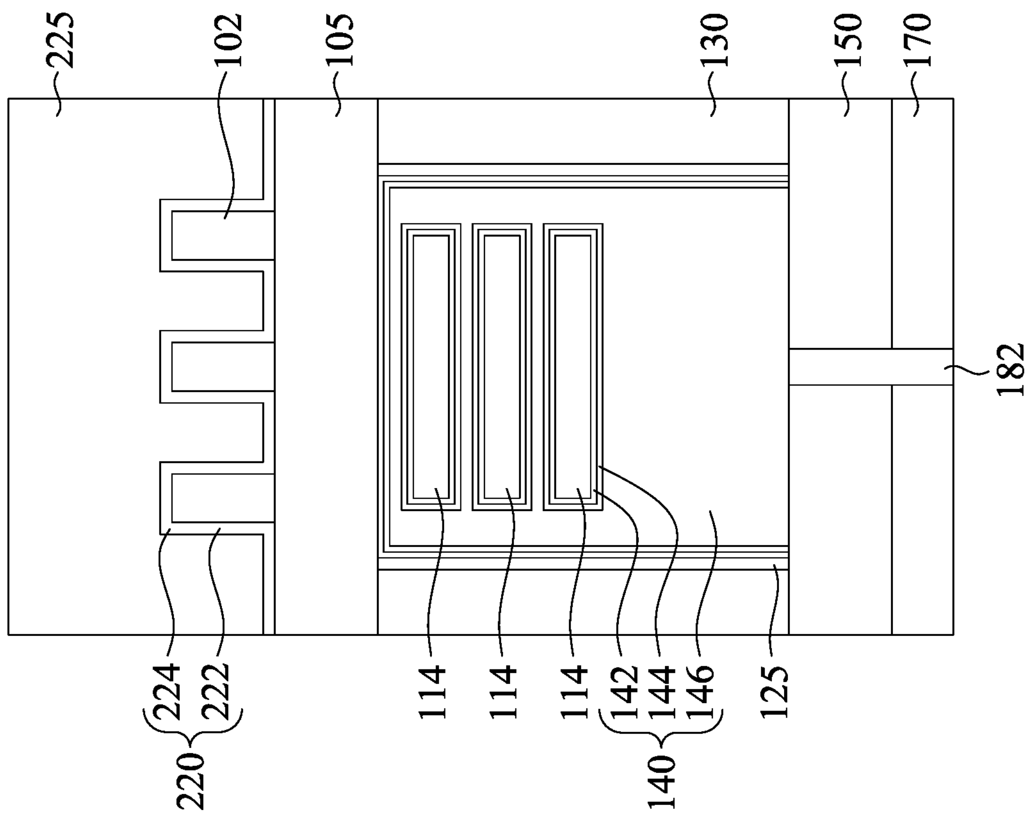
Figure 40D:
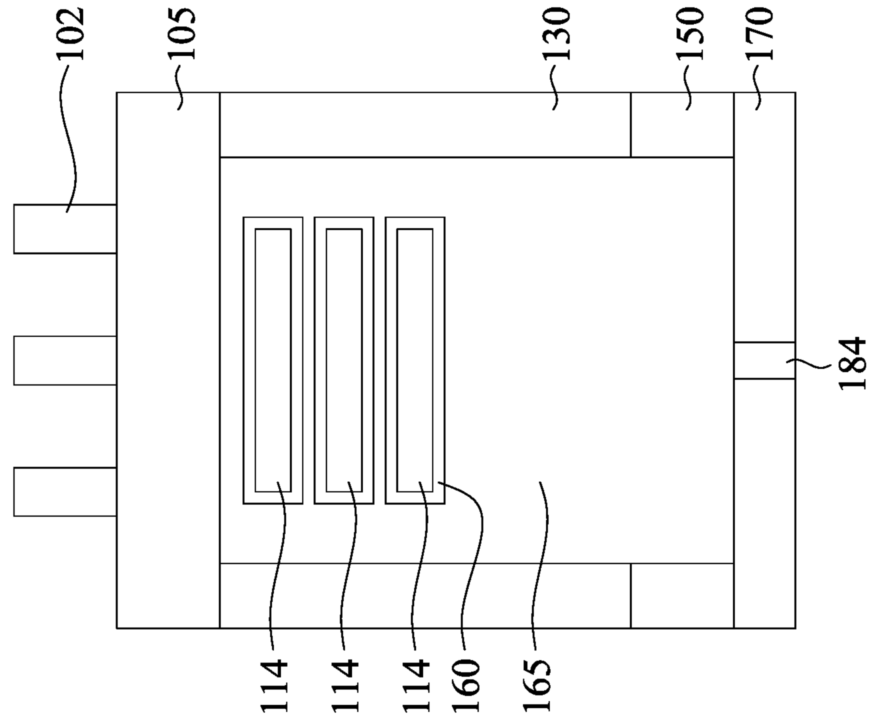

Reference is made to FIGS. 40A to 40D, in which FIG. 40A is a schematic view of a semiconductor device, FIG. 40B is a cross-sectional view along line B-B of FIG. 40A, FIG. 40C is a cross-sectional view along line C-C of FIG. 40A, and FIG. 40D is a cross-sectional view along line D-D of FIG. 40A. FIGS. 40A to 40D are similar to FIGS. 23A to 23D, and the difference between the structure of FIGS. 40A to 40D and the structure of FIGS. 23A to 23D is that the semiconductive oxide layer 200 of FIGS. 23A to 23D are omitted in FIGURES. FIGS. 40A to 40D. Accordingly, the dummy gate structure 220 may be formed in contact with the exposed semiconductor strips 102. In the embodiments of FIGS. 40A to 40D, the semiconductor strips 102 may act as channel layer of a semiconductor device.

Figure 41B:
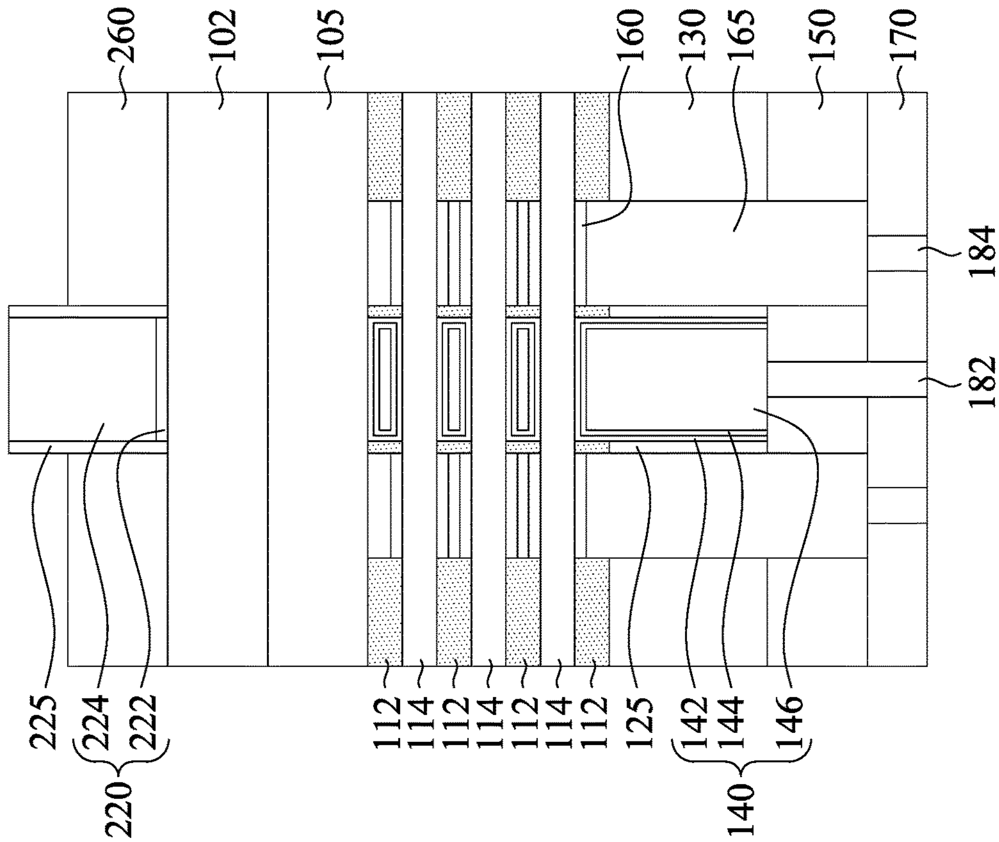
Figure 41A:
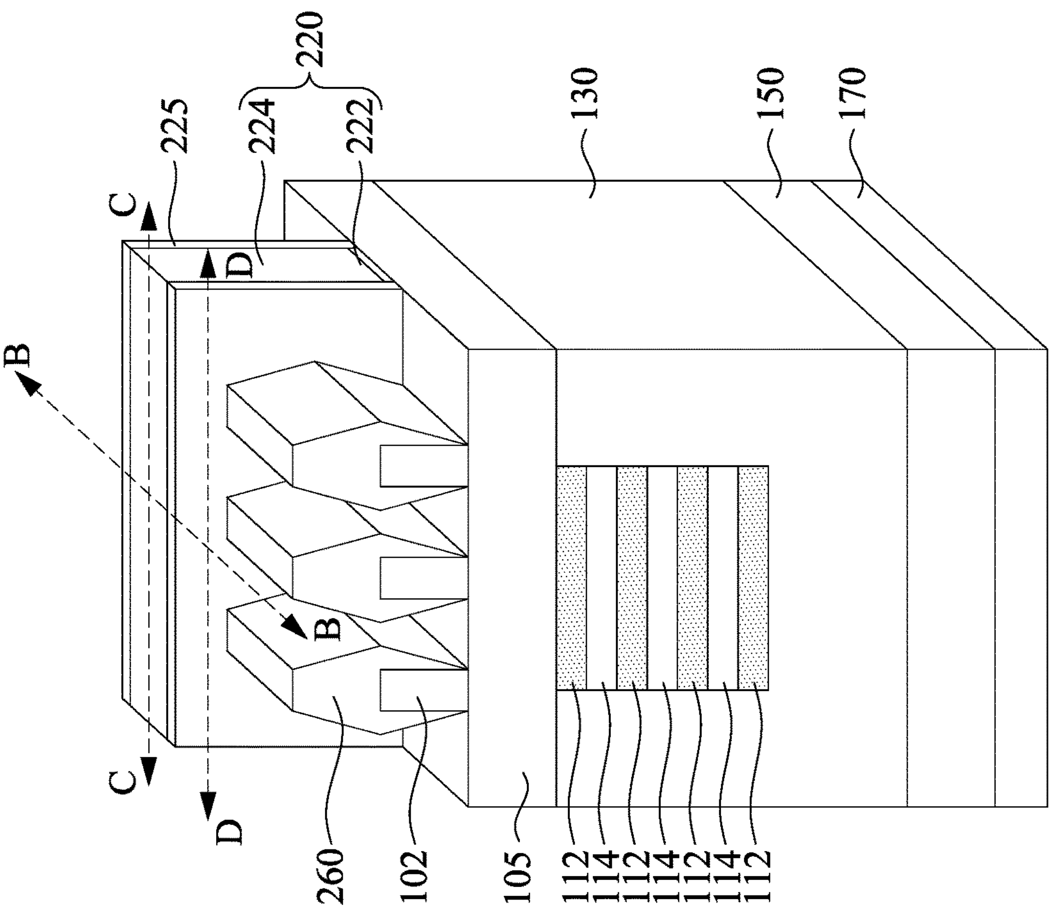
Figure 41D:
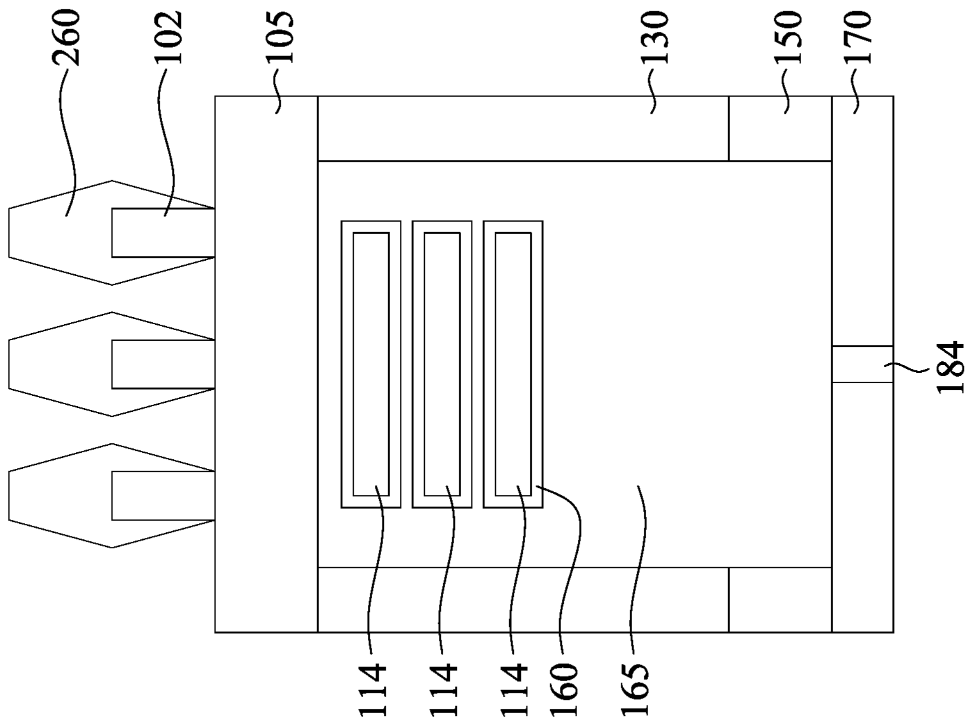
Figure 41C:
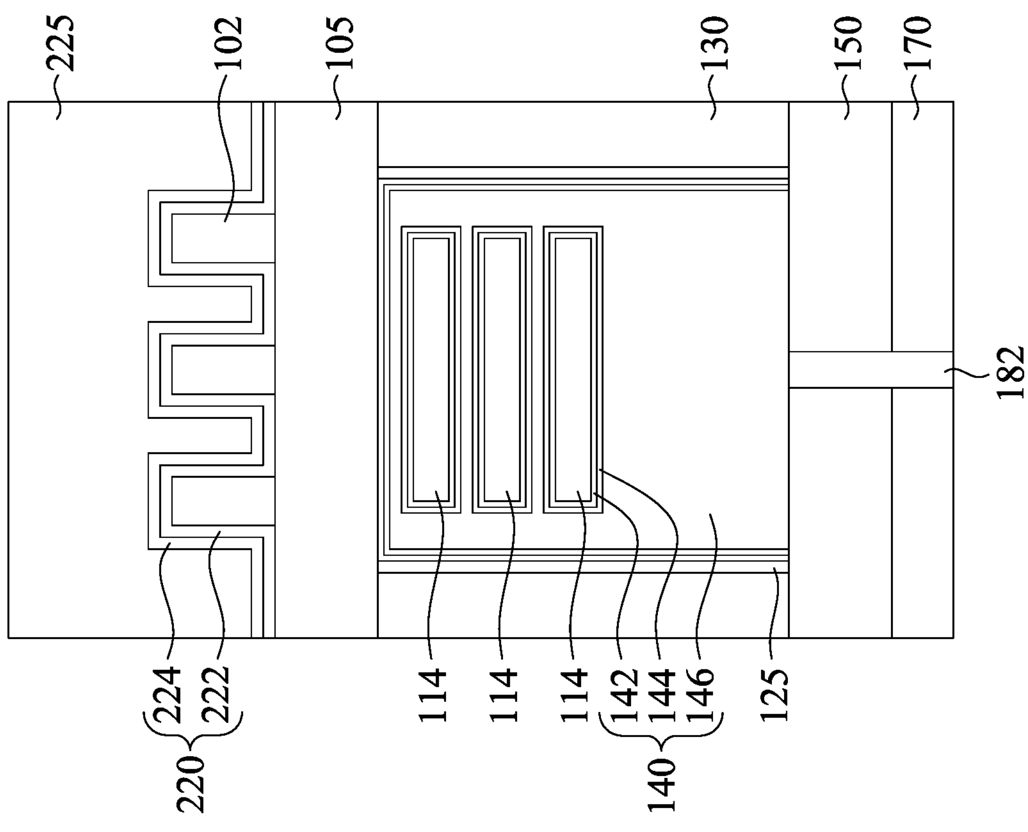

Reference is made to FIGS. 41A to 41D, in which FIG. 41A is a schematic view of a semiconductor device, FIG. 41B is a cross-sectional view along line B-B of FIG. 41A, FIG. 41C is a cross-sectional view along line C-C of FIG. 41A, and FIG. 41D is a cross-sectional view along line D-D of FIG. 41A. Source/drain epitaxy structures 260 are formed over portions of the semiconductor strips 102 that are uncovered by the dummy gate structure 220 and the gate spacers 225. In some embodiments, an etching process may be performed to remove portions of the semiconductor strips 102 prior to forming the source/drain epitaxy structures 260. In some embodiments, the source/drain epitaxy structures 260 may be formed by selective epitaxial growth (SEG). In various embodiments, the epitaxy structures 260 may include Ge, Si, GaAs, AlGaAs, SiGe, GaAsP, SiP, or other suitable material. In some embodiments, the epitaxy structures 260 may be doped with n-type dopants. In some embodiments, the epitaxy structures 260 and the epitaxy structures 160 may include different conductivity types. For example, the source/drain epitaxy structures 260 may be doped with n-type dopants, while the source/drain epitaxy structures 160 may be doped with p-type dopants.

Figure 42B:
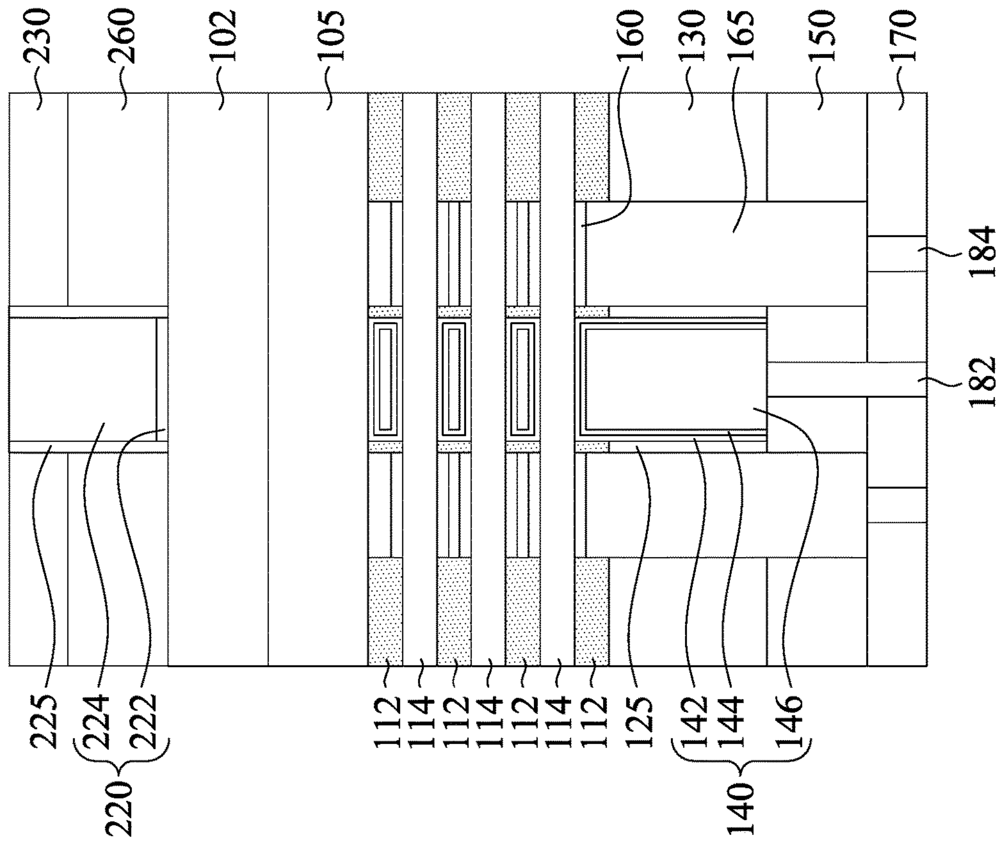
Figure 42A:
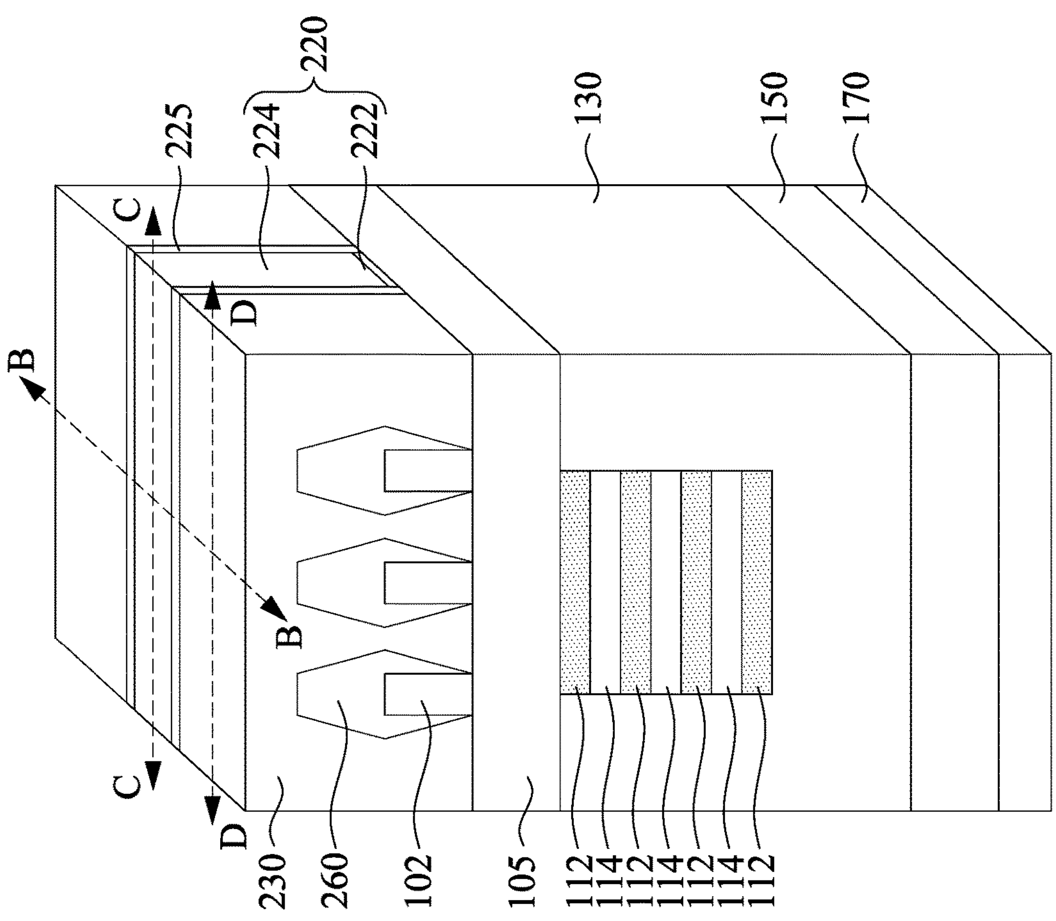
Figure 42D:
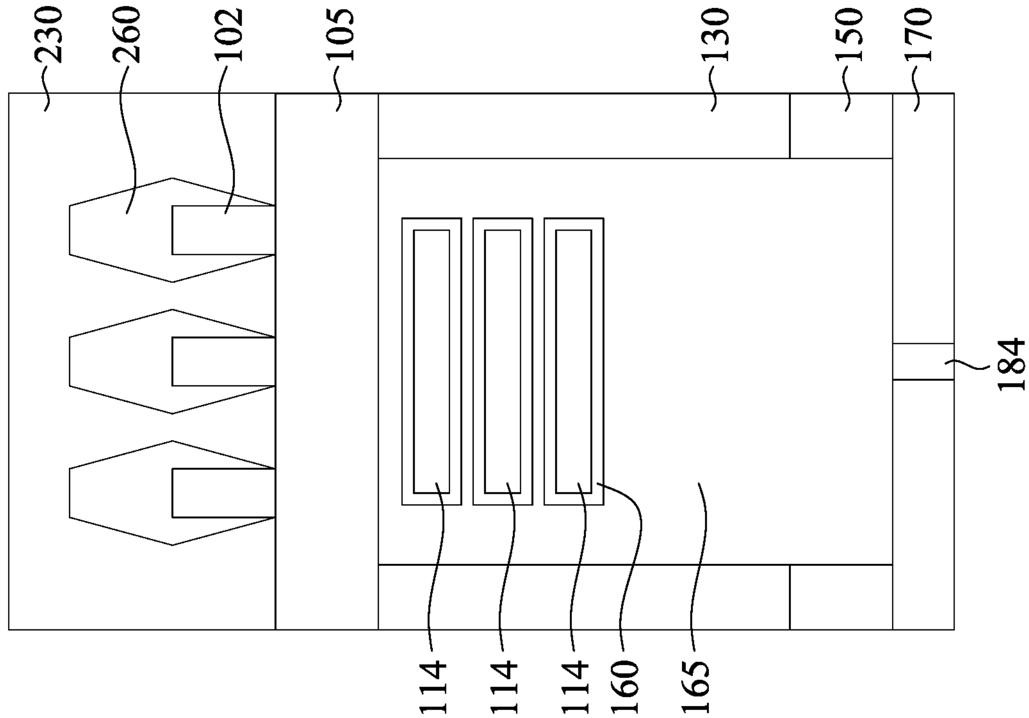
Figure 42C:
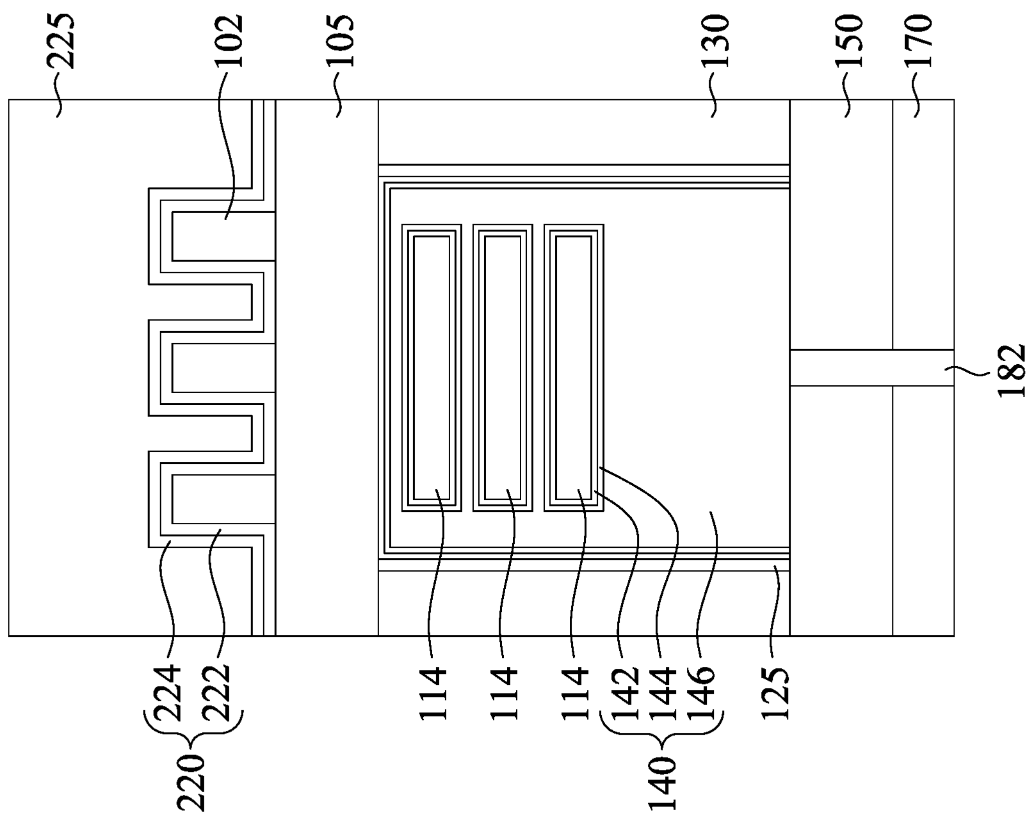

Reference is made to FIGS. 42A to 42D, in which FIG. 42A is a schematic view of a semiconductor device, FIG. 42B is a cross-sectional view along line B-B of FIG. 42A, FIG. 42C is a cross-sectional view along line C-C of FIG. 42A, and FIG. 42D is a cross-sectional view along line D-D of FIG. 42A. An interlayer dielectric (ILD) layer 230 is deposited over the semiconductor strips 102 and laterally surrounding the dummy gate structure 220. In some embodiments, ILD layer 230 may be deposited over the source/drain epitaxy structures 260. In some other embodiments, a contact etch stop layer (not shown) may be deposited prior to depositing the ILD layer 230. The contact etch stop layer may be formed of silicon nitride, silicon carbide, or the like, or a combination thereof.

Figure 43B:
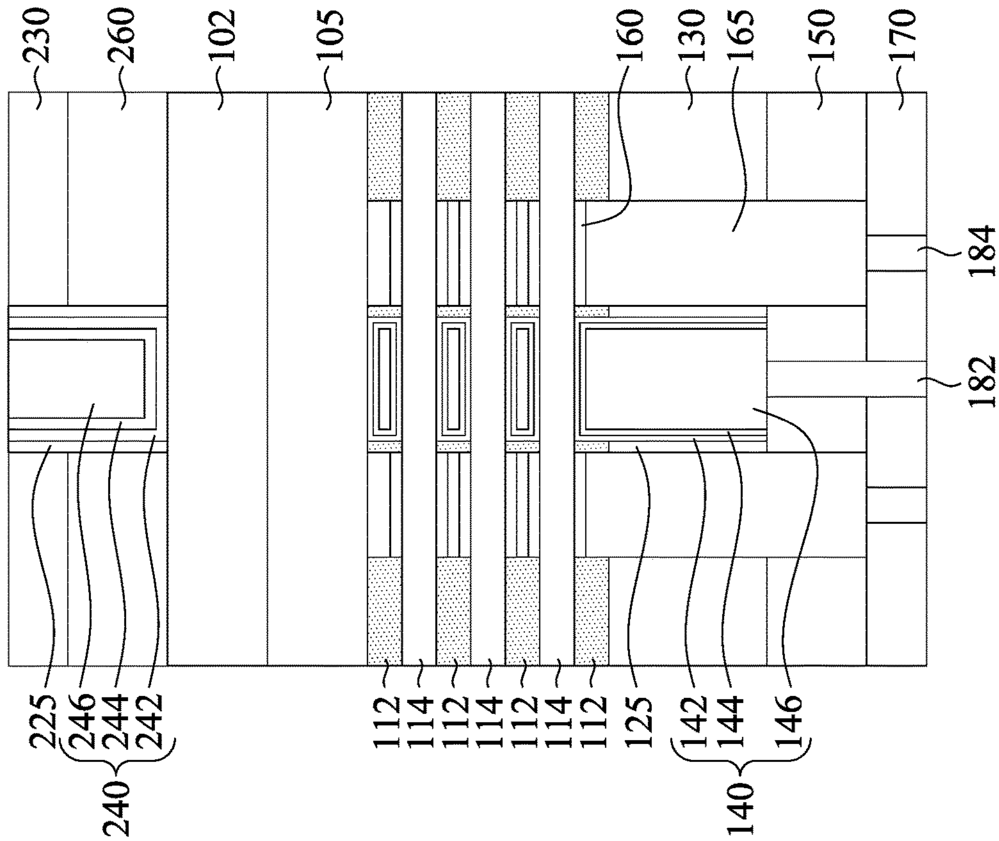
Figure 43A:
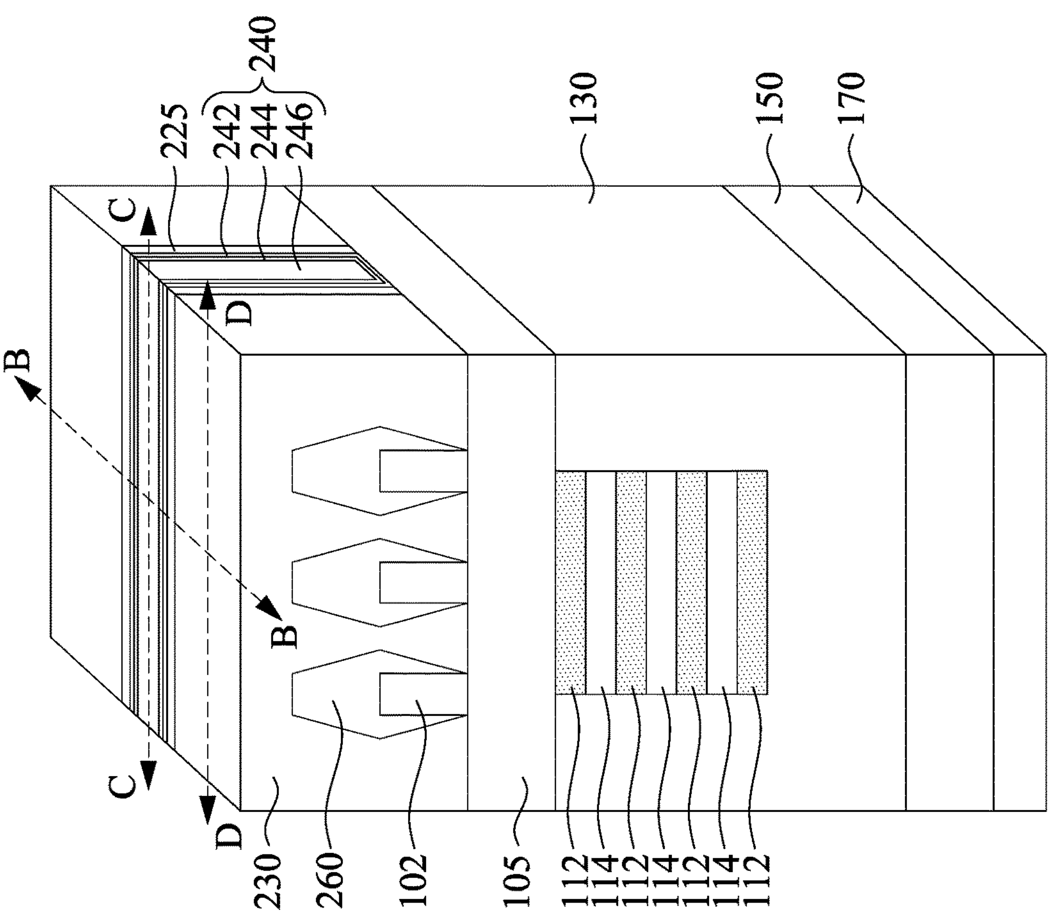
Figure 43D:
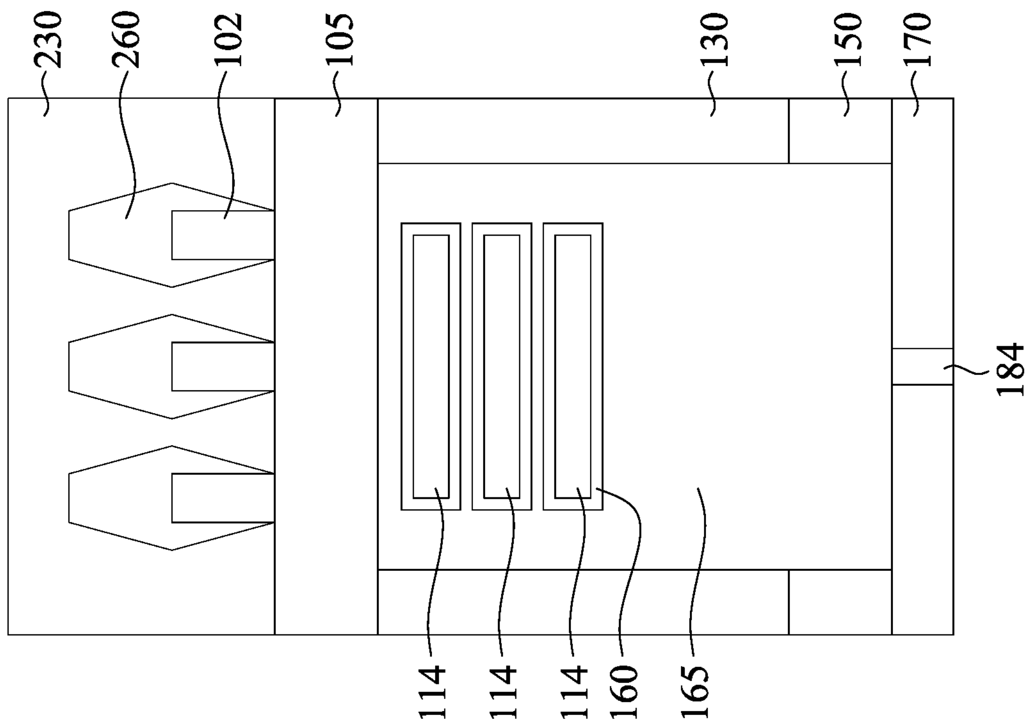
Figure 43C:
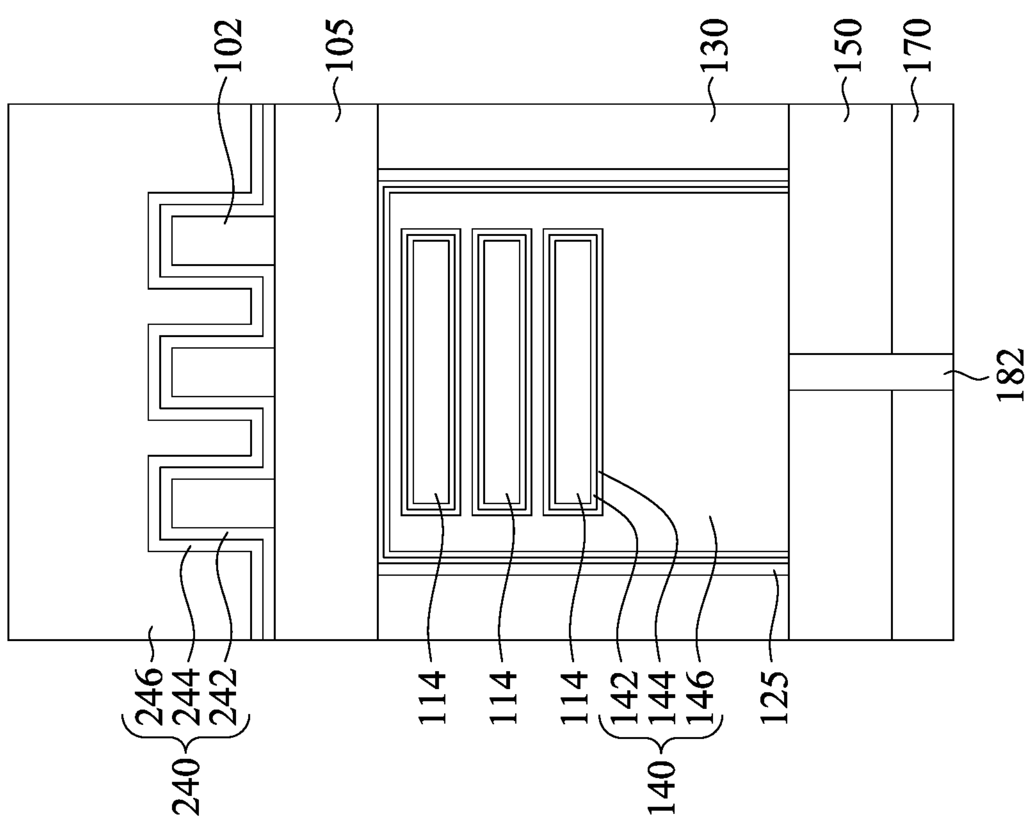

Reference is made to FIGS. 43A to 43D, in which FIG. 43A is a schematic view of a semiconductor device, FIG. 43B is a cross-sectional view along line B-B of FIG. 43A, FIG. 43C is a cross-sectional view along line C-C of FIG. 43A, and FIG. 43D is a cross-sectional view along line D-D of FIG. 43A. The dummy gate structure 220 is replaced with a gate structure 240. For example, the dummy gate structure 220 may be removed to form a gate trench between the gate spacers 225, and then the gate structure 240 may be formed in the gate trench. In some embodiments, the gate structure 240 may include a gate dielectric layer 242, a work function metal layer 244 over the gate dielectric layer 242, and a gate electrode 246 over the work function metal layer 244.

Figure 44A:
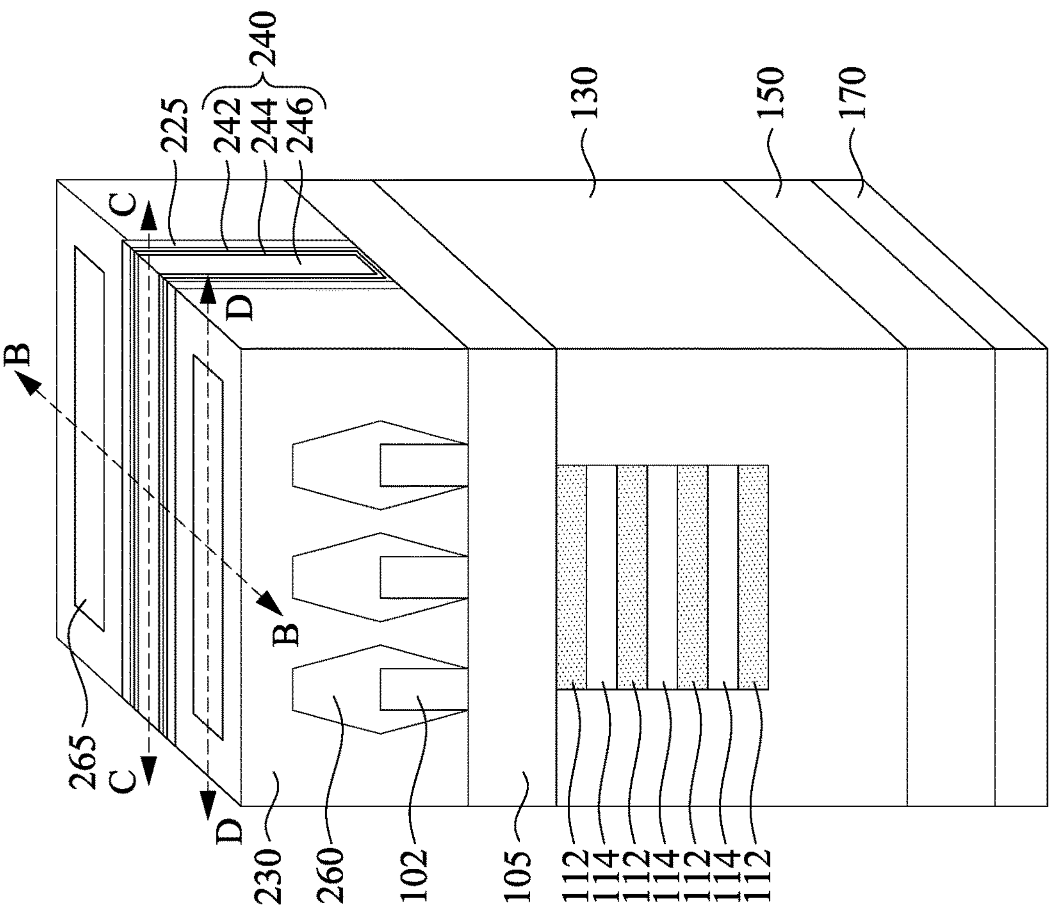
Figure 44B:
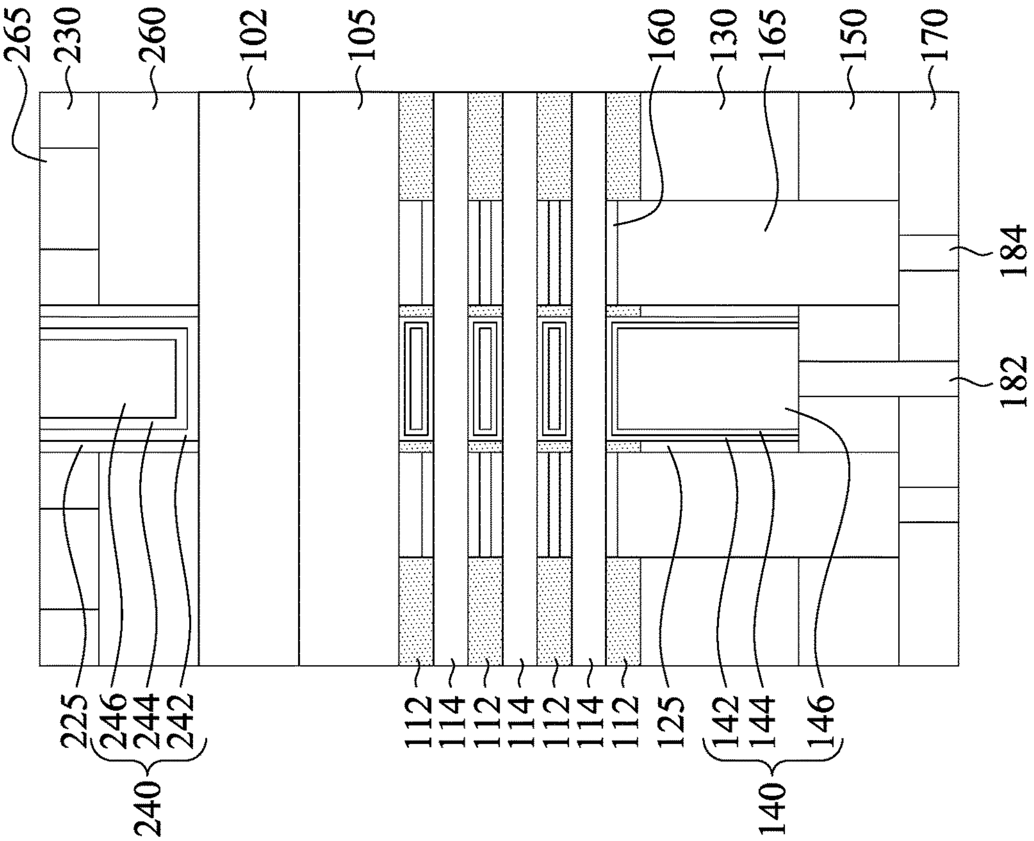
Figure 44D:
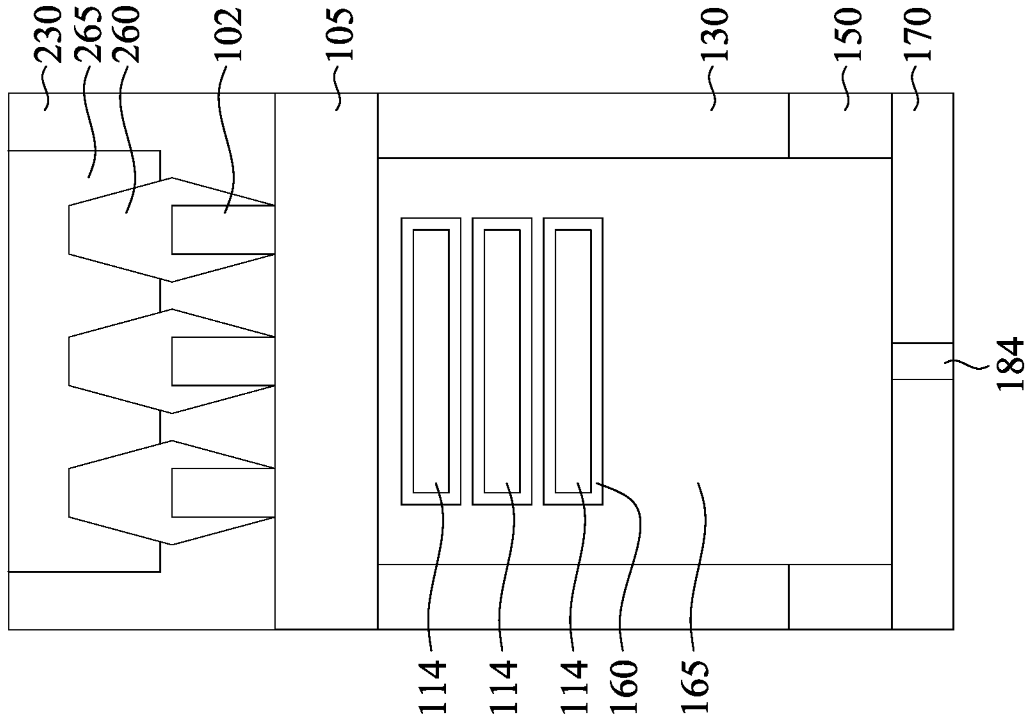
Figure 44C:
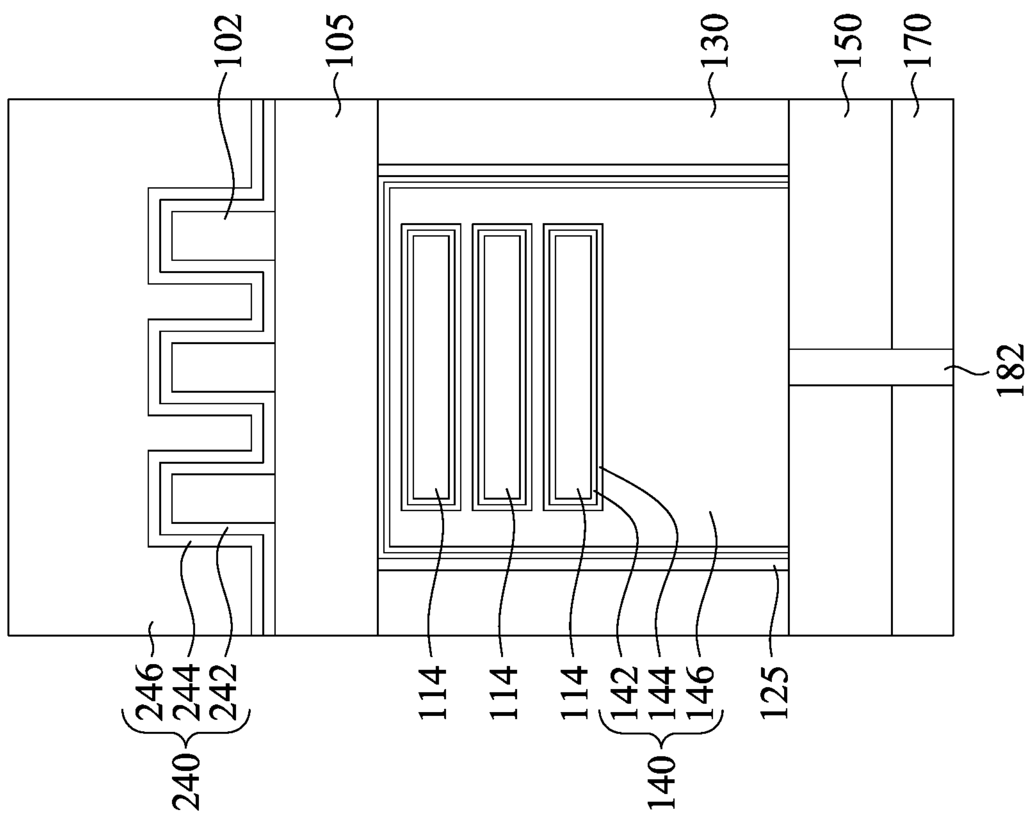

Reference is made to FIGS. 44A to 44D, in which FIG. 44A is a schematic view of a semiconductor device, FIG. 44B is a cross-sectional view along line B-B of FIG. 44A, FIG. 44C is a cross-sectional view along line C-C of FIG. 44A, and FIG. 44D is a cross-sectional view along line D-D of FIG. 44A. Source/drain contacts 265 are formed in the ILD layer 230. In some embodiments, the source/drain contacts 265 may be formed by, for example, etching the ILD layer 230 to form openings exposing the source/drain epitaxy structures 260, filling the openings with conductive material, and then performing a CMP process to remove excess conductive material. In some embodiments, the source/drain contacts 265 may be in contact with the source/drain epitaxy structures 260.

FIGS. 45A to 48D show various stages of manufacturing operations for a semiconductor device according to some embodiments of the present disclosure. It is noted that the semiconductor device of FIGS. 45A to 48D is similar to the semiconductor device as described with respect to FIGS. 1A to 25D. Accordingly, similar elements are labeled the same, and relevant details will not be repeated for brevity.

Figure 45B:
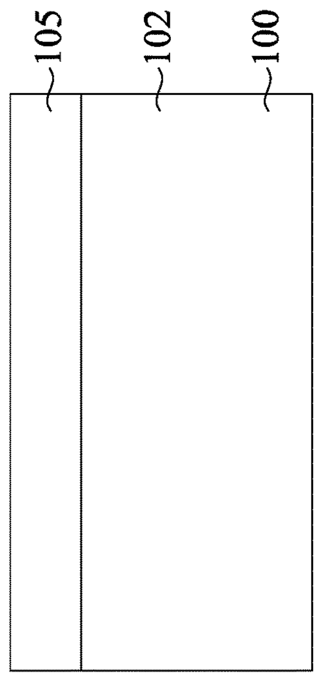
FIGS. 45A to 48D show various stages of manufacturing operations for a semiconductor device according to some embodiments of the present disclosure.
Figure 45A:
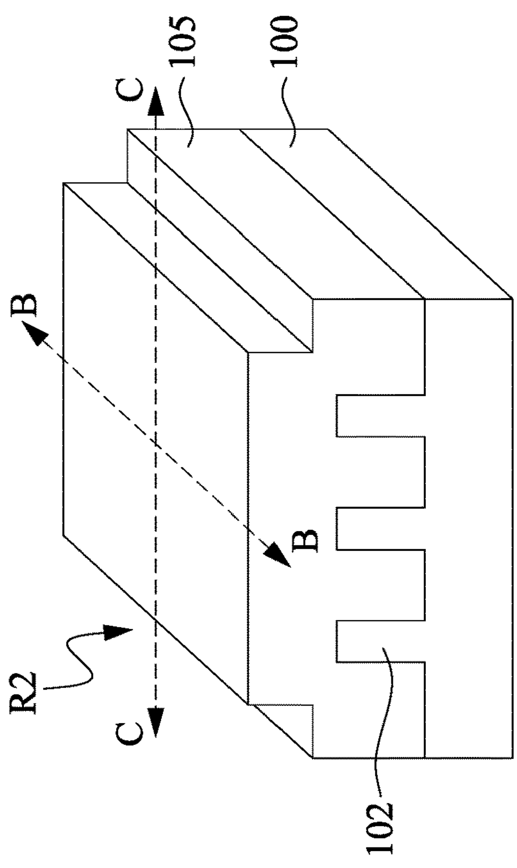
Figure 45C:
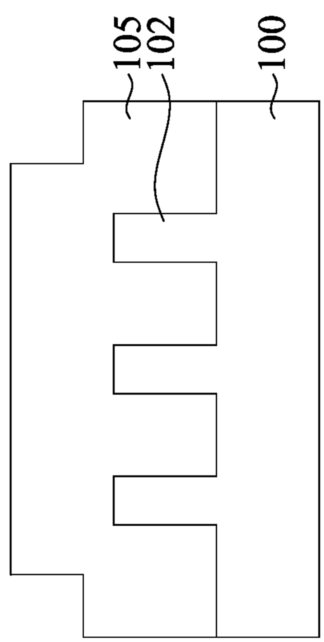

Reference is made to FIGS. 45A to 45C, in which FIG. 45A is a schematic view of a semiconductor device, FIG. 45B is a cross-sectional view along line B-B of FIG. 45A, and FIG. 45C is a cross-sectional view along line C-C of FIG. 45A. An etching process is performed to the structure shown in FIGS. 3A to 3C, so as to form recesses R2 in the dielectric layer 105. In some embodiments, the recesses R2 may be formed by, for example, forming a patterned mask over the dielectric layer 105, patterned mask having openings exposing the dielectric layer 105, etching the dielectric layer 105 through the openings of the patterned mask, and the removing the patterned mask after the etching process is completed.

Figure 46B:
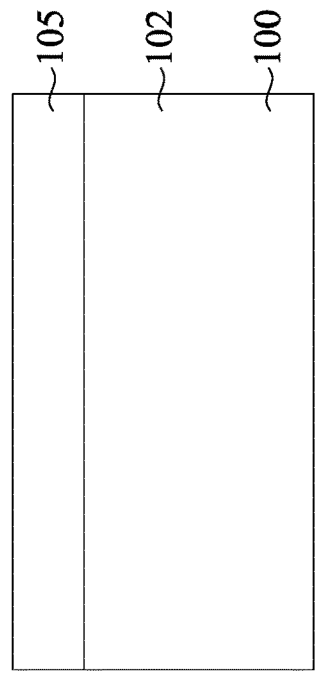
Figure 46A:
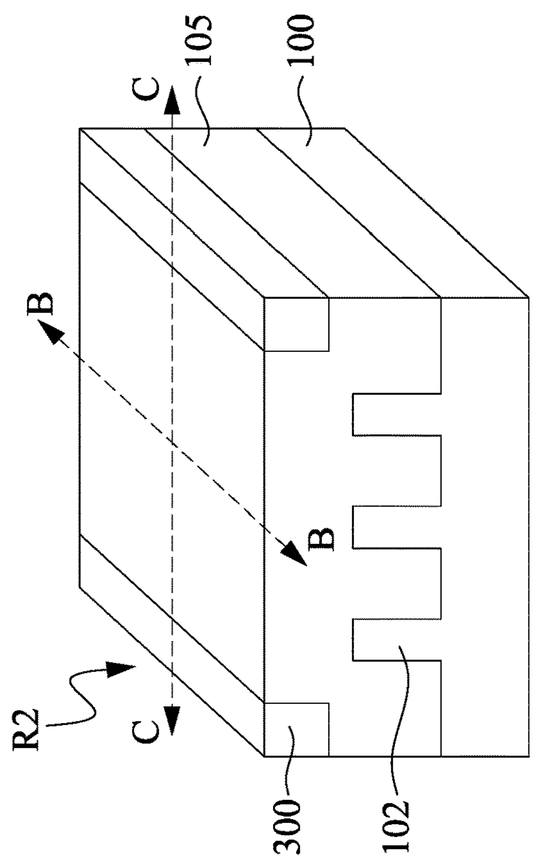
Figure 46C:
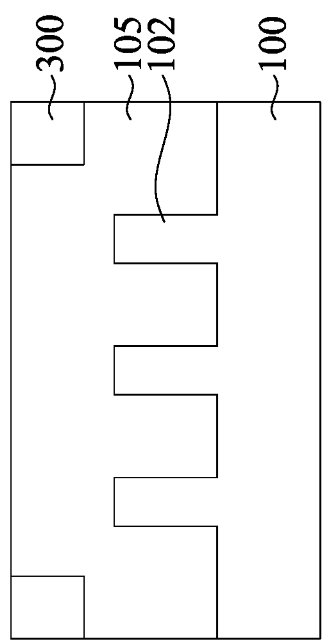

Reference is made to FIGS. 46A to 46C, in which FIG. 46A is a schematic view of a semiconductor device, FIG. 46B is a cross-sectional view along line B-B of FIG. 46A, and FIG. 46C is a cross-sectional view along line C-C of FIG. 46A. Metal lines 300 are formed in the recesses R2 of the dielectric layer 105. In some embodiments, the metal lines 300 may be formed by, for example, depositing a metal layer over the dielectric layer 105 and overfilling the recesses R2 of the dielectric layer 105, and then performing a CMP process to remove excess metal layer until the dielectric layer 105 is exposed. In some embodiments, the metal lines 300 may include one or more layers of Co, Ni, W, Ti, Ta, Cu, Al, TiN and TaN, or any other suitable material.

Figure 47A:
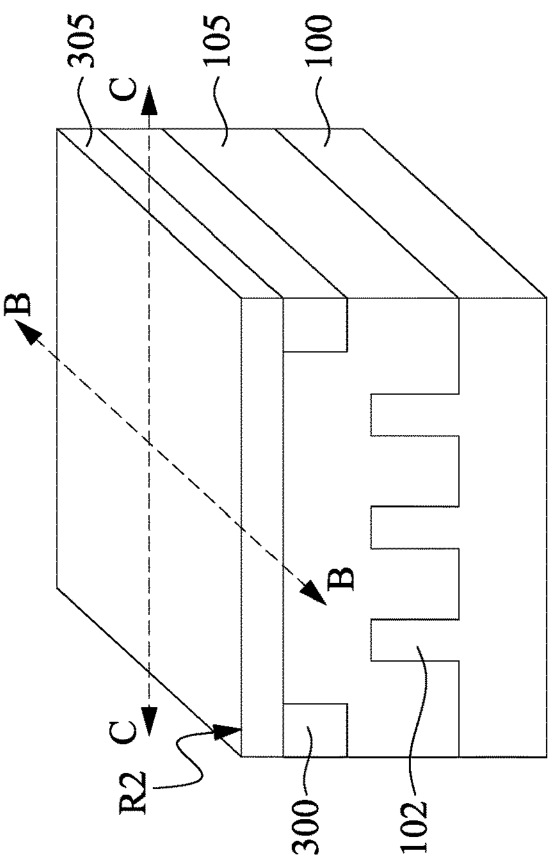
Figure 47B:
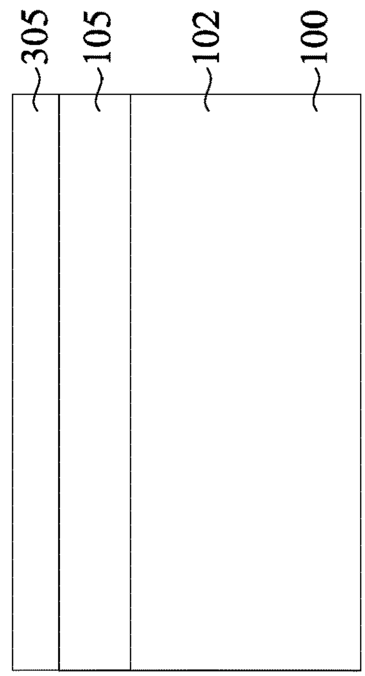
Figure 47C:
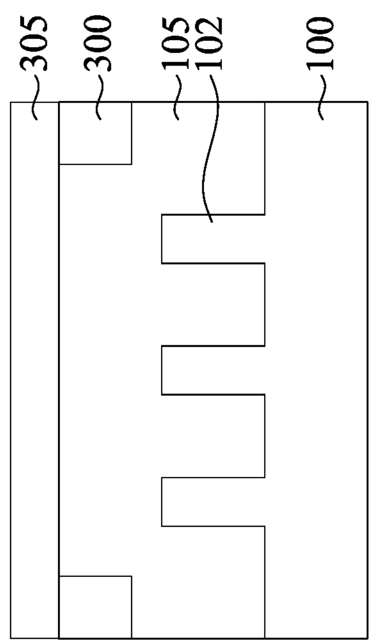

Reference is made to FIGS. 47A to 47C, in which FIG. 47A is a schematic view of a semiconductor device, FIG. 47B is a cross-sectional view along line B-B of FIG. 47A, and FIG. 47C is a cross-sectional view along line C-C of FIG. 47A. A dielectric layer 305 is deposited over the dielectric layer 105 and covering the metal lines 300. The dielectric layer 305 may include silicon oxide, silicon nitride, silicon oxynitride (SiON), SiCN, fluorine-doped silicate glass (FSG), or a low-K dielectric material. In some embodiments, the dielectric layer 305 may be formed by LPCVD (low pressure chemical vapor deposition), plasma-CVD or flowable CVD or any other suitable film formation methods. In some embodiments, the dielectric layers 105 and 305 may be made of a same material. In some embodiments, the dielectric layers 105 and 305 may also be referred to as a composite dielectric layer, in which the metal lines 300 are embedded in the composite dielectric layer.

Figure 48B:
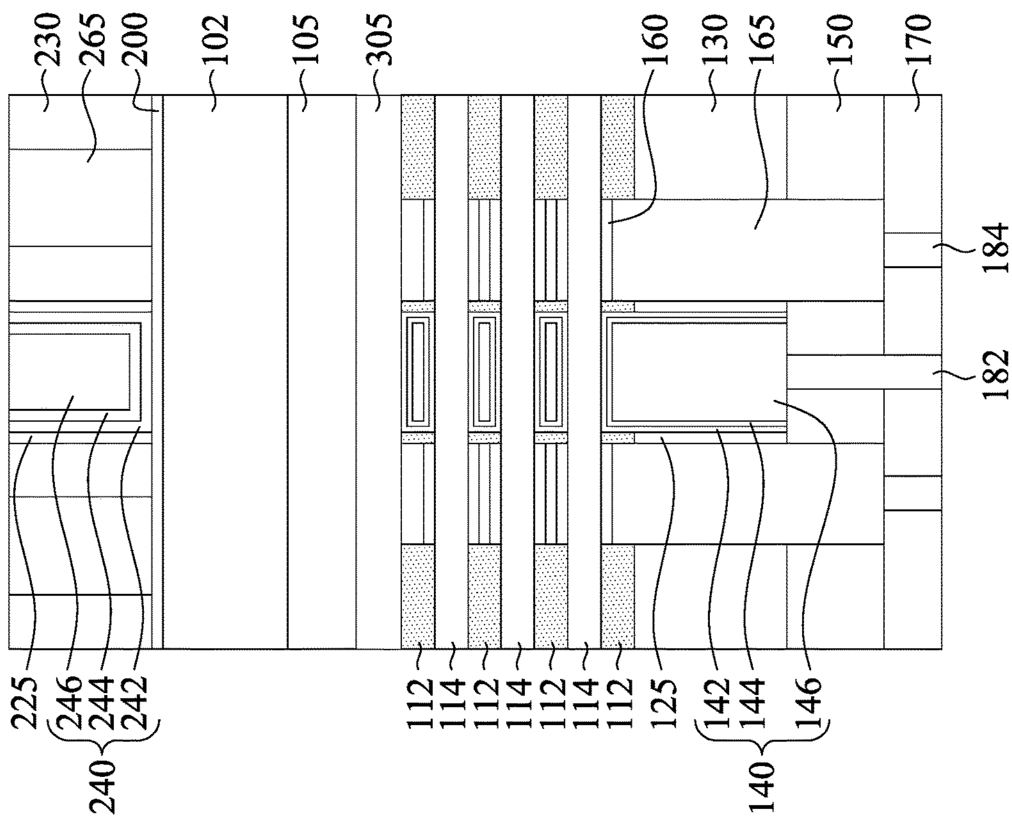
Figure 48A:
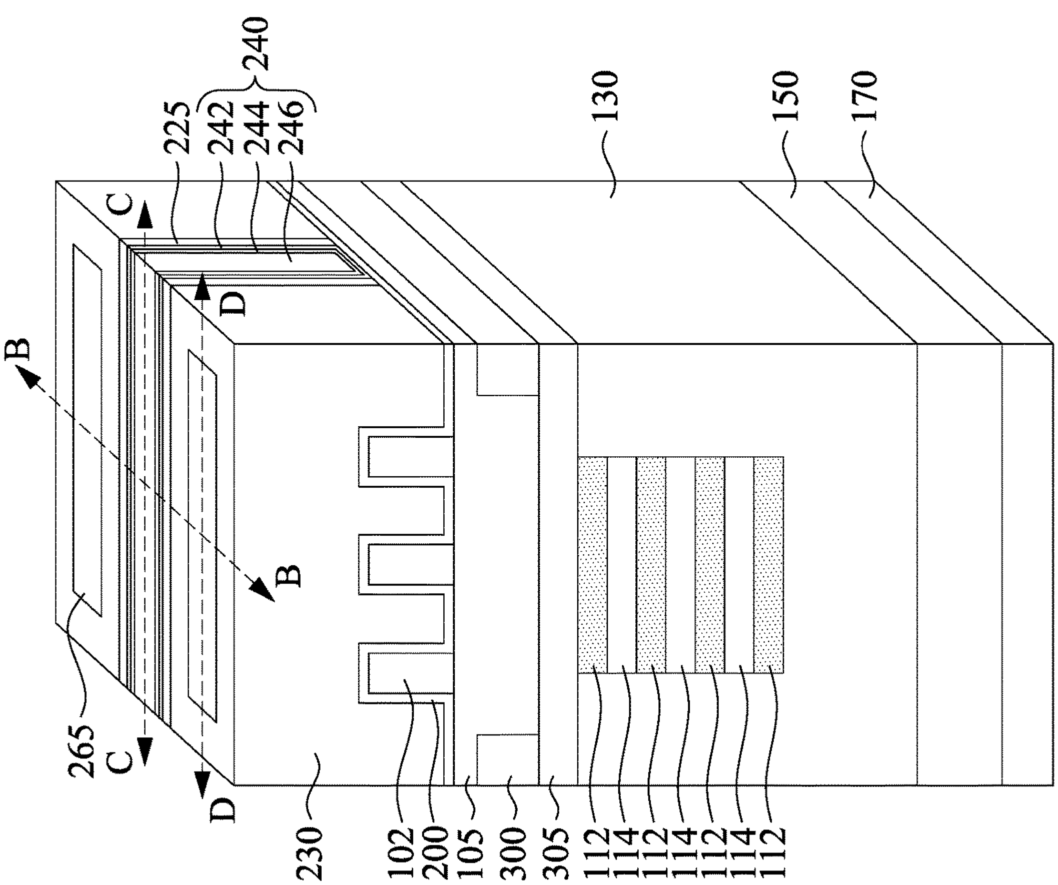
Figure 48D:
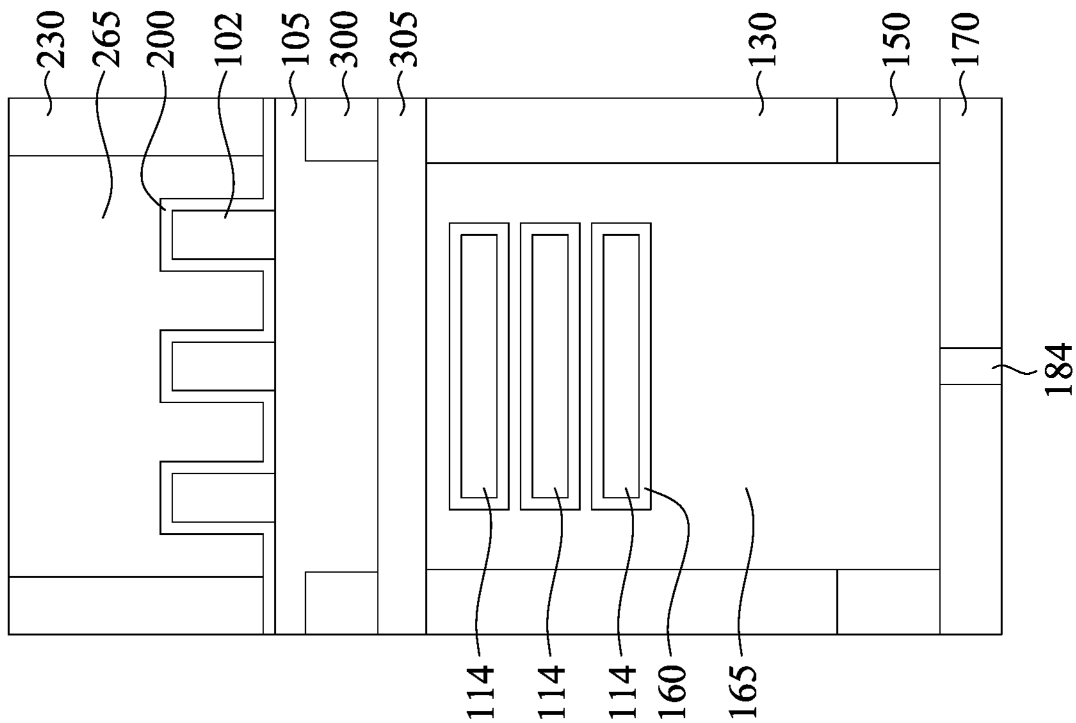
Figure 48C:
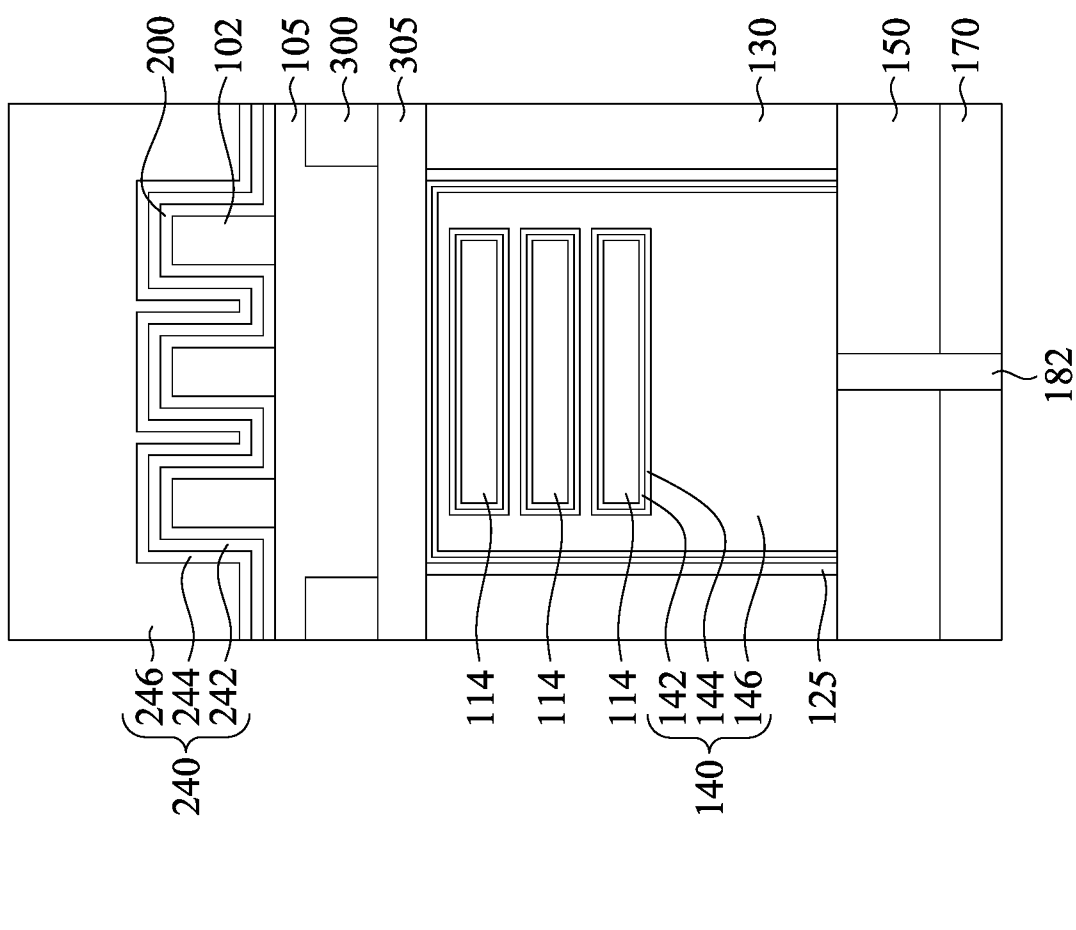

Reference is made to FIGS. 48A to 48D, in which FIG. 48A is a schematic view of a semiconductor device, FIG. 48B is a cross-sectional view along line B-B of FIG. 48A, FIG. 48C is a cross-sectional view along line C-C of FIG. 48A, and FIG. 48D is a cross-sectional view along line D-D of FIG. 48A. The structure of FIG. 47A to 47C may undergo the process as described in FIGS. 4A to 25D, and the resulting structure is shown in FIG. 48A to 48D. In greater details, the metal lines 300 formed embedded in the dielectric layers 105 and 305 can act as signal routing between the first transistor and the second transistor on opposite sides of the dielectric layer 306. With such configuration, the device can be scaled down, which is beneficial for increasing device density.

Based on the above discussions, it can be seen that the present disclosure offers advantages. It is understood, however, that other embodiments may offer additional advantages, and not all advantages are necessarily disclosed herein, and that no particular advantage is required for all embodiments. Embodiments of the present disclosure provide a method for forming a CFET, in which a first transistor and a second transistor of the CFET are formed on opposite sides of a dielectric layer. This may improve the quality of each of the first and transistors. If both transistors of the CFET are formed on a same side of a dielectric layer (or a substrate), the transistor at bottom tier may sustain the processing of the top tier transistor, which may deteriorate the quality of the bottom tier transistor. Moreover, in some embodiments the first transistor is a p-type transistor and the second transistor is an n-type transistor. The p-type transistor may include high-mobility channel materials such as Ge or Ge-rich SiGe, which may include a higher thermal budget. Embodiments of the present disclosure also provide a CFET structure by using semiconductive oxide as a channel layer of the n-type device of the CFET, which results in that the n-type device has a higher thermal budget. Accordingly, after forming the p-type transistor, the n-type transistor can be formed with a lower processing temperature than the p-type transistor, which can prevent the p-type transistor from thermal damage during processing the n-type transistor. Moreover, fin structures are formed prior to forming the semiconductive oxide channel layer of the n-type device of the CFET, such that the semiconductive oxide channel layer can be formed along the fin structures, so as to increase area of channel regions of the n-type device of the CFET.

In some embodiments of the present disclosure, a method includes forming a first dielectric layer over a substrate; forming a first transistor over a first side of the first dielectric layer, in which forming the first transistor includes forming a semiconductor layer over the first side of the first dielectric layer; forming a first gate structure over the semiconductor layer; and forming source/drain epitaxy structures over the semiconductor layer and on opposite sides of the first gate structure; removing the substrate to expose a second side of the first dielectric layer opposite to the first side of the second dielectric layer; and forming a second transistor over the second side of the first dielectric layer, in which forming the second transistor includes forming a semiconductive oxide layer over the second side of the first dielectric layer; forming a second gate structure over the semiconductive oxide layer; and forming source/drain contacts over the semiconductive oxide layer and on opposite sides of the second gate structure.

In some embodiments, the method further includes prior to forming the first dielectric layer, patterning the substrate to form a semiconductor strip protruding over the substrate, in which removing the substrate is performed to expose the semiconductor strip; and etching back the dielectric layer from the second side of the dielectric layer to expose sidewalls of the semiconductor strip, in which the semiconductive oxide layer is formed lining the semiconductor strip.

In some embodiments, the method further includes prior to forming semiconductive oxide layer, depositing a second dielectric layer lining semiconductor strip.

In some embodiments, the method further includes patterning the first dielectric layer from the second side of the first dielectric layer to form a dielectric strip, in which the semiconductive oxide layer is formed lining the dielectric strip.

In some embodiments, the source/drain contacts are formed in contact with the semiconductive oxide layer.

In some embodiments, the method further includes prior to forming the first transistor, forming a metal line in the first dielectric layer.

In some embodiments, the semiconductive oxide layer includes gallium zinc oxide (IGZO), indium tin oxide (ITO), indium tungsten oxide (IWO), indium zinc oxide (IZO), zinc tin oxide (ZTO), indium silicon zinc oxide (ISiZO), indium germanium zinc oxide (IGeZO), or magnesium aluminum oxide (MAZO).

In some embodiments of the present disclosure, a method includes forming a fin structure over a substrate; forming a first dielectric layer over the substrate and covering the fin structure; forming first semiconductor layers over a first side of the first dielectric layer; forming a first gate structure wrapping around each of the first semiconductor layers; forming first source/drain epitaxy structures over the second semiconductor layers and on opposite sides of the first gate structure; removing the substrate to expose a second side of the first dielectric layer opposite to the first side of the first dielectric layer; etching back the first dielectric layer from the second side of the first dielectric layer to expose sidewalls of the fin structure; forming a second gate structure over the semiconductor fin; and forming source/drain contacts over the semiconductor fin and on opposite sides of the second gate structure.

In some embodiments, the method further includes forming a semiconductive oxide layer lining the fin structure.

In some embodiments, the method further includes prior to forming the semiconductive oxide layer, forming a second dielectric layer lining the fin structure.

In some embodiments, the method further includes prior to forming first semiconductor layers, performing a chemical mechanism polishing (CMP) to the first dielectric layer to expose the fin structure.

In some embodiments, forming the first semiconductor layers further includes forming second semiconductor layers, such that first and second semiconductor layers are alternately stacked over the substrate, and the method further includes removing the second semiconductor layers prior to forming the first gate structure, in which removing the second semiconductor layers includes removing a portion of the fin structure to form a recess in the first dielectric layer.

In some embodiments, a top surface of a remaining portion of the fin structure has a notched cross-sectional view.

In some embodiments, the method further includes forming second source/drain epitaxy structures over the fin structure and on opposite sides of the second gate structure.

In some embodiments, the second source/drain epitaxy structures are doped with n-type dopants, and the first source/drain epitaxy structures are doped with p-type dopants.

In some embodiments of the present disclosure, a semiconductor device includes a dielectric layer, a p-type transistor over a first side of the dielectric layer, and an n-type transistor over a second side of the dielectric layer opposite to the first side of the dielectric layer. The p-type transistor includes a semiconductor channel layer, a first gate structure over the semiconductor channel layer, and source/drain epitaxy structures on opposite sides of the first gate structure. The n-type transistor includes a semiconductive oxide channel layer, a second gate structure over the semiconductive oxide channel layer, and source/drain contacts on opposite sides of the second gate structure.

In some embodiments, the semiconductive oxide layer includes gallium zinc oxide (IGZO), indium tin oxide (ITO), indium tungsten oxide (IWO), indium zinc oxide (IZO), zinc tin oxide (ZTO), indium silicon zinc oxide (ISiZO), indium germanium zinc oxide (IGeZO), or magnesium aluminum oxide (MAZO).

In some embodiments, the semiconductor device further includes a fin structure on the second side of the dielectric layer, in which the semiconductive oxide channel layer lines the fin structure.

In some embodiments, the semiconductor device further includes a dielectric liner between the fin structure and the semiconductive oxide channel layer.

In some embodiments, the first gate structure is in contact with four sides of the semiconductor channel layer in a cross-sectional view.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a first dielectric layer over a substrate;

forming a first transistor over a first side of the first dielectric layer, wherein forming the first transistor comprises:

forming a semiconductor layer over the first side of the first dielectric layer;

forming a first gate structure over the semiconductor layer; and forming source/drain epitaxy structures over the semiconductor layer and on opposite sides of the first gate structure;

removing the substrate to expose a second side of the first dielectric layer opposite to the first side of the first dielectric layer; and forming a second transistor over the second side of the first dielectric layer, wherein forming the second transistor comprises:

forming a semiconductive oxide layer over the second side of the first dielectric layer;

forming a second gate structure over the semiconductive oxide layer; and forming source/drain contacts over the semiconductive oxide layer and on opposite sides of the second gate structure.

2. The method of claim 1, further comprising:

prior to forming the first dielectric layer, patterning the substrate to form a semiconductor strip protruding over the substrate, wherein removing the substrate is performed to expose the semiconductor strip; and etching back the first dielectric layer from the second side of the first dielectric layer to expose sidewalls of the semiconductor strip, wherein the semiconductive oxide layer is formed lining the semiconductor strip.

3. The method of claim 2, further comprising prior to forming the semiconductive oxide layer, depositing a second dielectric layer lining the semiconductor strip.

4. The method of claim 1, further comprising patterning the first dielectric layer from the second side of the first dielectric layer to form a dielectric strip, wherein the semiconductive oxide layer is formed lining the dielectric strip.

5. The method of claim 1, wherein the source/drain contacts are formed in contact with the semiconductive oxide layer.

6. The method of claim 1, further comprising prior to forming the first transistor, forming a metal line in the first dielectric layer.

7. The method of claim 1, wherein the semiconductive oxide layer comprises gallium zinc oxide (IGZO), indium tin oxide (ITO), indium tungsten oxide (IWO), indium zinc oxide (IZO), zinc tin oxide (ZTO), indium silicon zinc oxide (ISiZO), indium germanium zinc oxide (IGeZO), or magnesium aluminum oxide (MAZO), or combinations of thereof.

8. A method, comprising:

forming a fin structure over a substrate;

forming a first dielectric layer over the substrate and covering the fin structure;

forming first semiconductor layers over a first side of the first dielectric layer;

forming a first gate structure wrapping around each of the first semiconductor layers;

forming first source/drain epitaxy structures over the first semiconductor layers and on opposite sides of the first gate structure;

removing the substrate to expose a second side of the first dielectric layer opposite to the first side of the first dielectric layer;

etching back the first dielectric layer from the second side of the first dielectric layer to expose sidewalls of the fin structure;

forming a second gate structure over the fin structure; and forming source/drain contacts over the fin structure and on opposite sides of the second gate structure.

9. The method of claim 8, further comprising forming a semiconductive oxide layer lining the fin structure.

10. The method of claim 9, further comprising, prior to forming the semiconductive oxide layer, forming a second dielectric layer lining the fin structure.

11. The method of claim 8, further comprising, prior to forming the first semiconductor layers, performing a chemical mechanism polishing (CMP) to the first dielectric layer to expose the fin structure.

12. The method of claim 11, wherein forming the first semiconductor layers further comprises forming second semiconductor layers, such that the first and second semiconductor layers are alternately stacked over the substrate, and the method further comprises removing the second semiconductor layers prior to forming the first gate structure, wherein removing the second semiconductor layers comprises removing a portion of the fin structure to form a recess in the first dielectric layer.

13. The method of claim 12, wherein a top surface of a remaining portion of the fin structure has a notched cross-sectional view.

14. The method of claim 8, further comprising forming second source/drain epitaxy structures over the fin structure and on opposite sides of the second gate structure.

15. The method of claim 14, wherein the second source/drain epitaxy structures are doped with n-type dopants, and the first source/drain epitaxy structures are doped with p-type dopants.

16. A method, comprising:

forming a p-type transistor over a first side of a dielectric layer, wherein the p-type transistor comprises:

a semiconductor channel layer;

a first gate structure over the semiconductor channel layer; and source/drain epitaxy structures on opposite sides of the first gate structure; and forming an n-type transistor over a second side of the dielectric layer opposite to the first side of the dielectric layer, wherein the n-type transistor comprises:

a semiconductive oxide channel layer;

a second gate structure over the semiconductive oxide channel layer; and source/drain contacts on opposite sides of the second gate structure.

17. The method of claim 16, wherein the semiconductive oxide channel layer comprises gallium zinc oxide (IGZO), indium tin oxide (ITO), indium tungsten oxide (IWO), indium zinc oxide (IZO), zinc tin oxide (ZTO), indium silicon zinc oxide (ISiZO), indium germanium zinc oxide (IGeZO), or magnesium aluminum oxide (MAZO).

18. The method of claim 16, further comprises forming a fin structure on the second side of the dielectric layer, wherein the semiconductive oxide channel layer lines the fin structure.

19. The method of claim 18, further comprises forming a dielectric liner over the fin structure, such that the dielectric liner is between the fin structure and the semiconductive oxide channel layer.

20. The method of claim 16, wherein the first gate structure is in contact with four sides of the semiconductor channel layer in a cross-sectional view.

* * * * *